US012622169B2

(12) United States Patent
Tani et al.

(10) Patent No.: US 12,622,169 B2
(45) Date of Patent: May 5, 2026

(54) PHOTOELECTRIC CONVERSION ELEMENT, IMAGING ELEMENT, OPTICAL SENSOR, AND COMPOUND

(71) Applicant: FUJIFILM Corporation, Tokyo (JP)

(72) Inventors: Yukio Tani, Kanagawa (JP); Hiroki Sugiura, Kanagawa (JP); Yasunori Yonekuta, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 600 days.

(21) Appl. No.: 17/975,633

(22) Filed: Oct. 28, 2022

(65) Prior Publication Data

US 2023/0121151 A1 Apr. 20, 2023

Related U.S. Application Data

(63) Continuation of application No. PCT/JP2021/016995, filed on Apr. 28, 2021.

(30) Foreign Application Priority Data

Apr. 30, 2020 (JP) ................................ 2020-080089
Jun. 30, 2020 (JP) ................................ 2020-113345
(Continued)

(51) Int. Cl.
*H10K 85/60* (2023.01)
*H10H 20/851* (2025.01)
(Continued)

(52) U.S. Cl.
CPC ....... *H10K 85/655* (2023.02); *H10H 20/8512* (2025.01); *H10K 30/00* (2023.02);
(Continued)

(58) Field of Classification Search
CPC ....................................................... H01K 30/00
See application file for complete search history.

(56) References Cited

U.S. PATENT DOCUMENTS

2018/0273760 A1 9/2018 Rosselli
2019/0140189 A1* 5/2019 Yoshioka ............. H10K 85/653
2019/0371863 A1* 12/2019 Hasegawa .............. H04N 25/76

FOREIGN PATENT DOCUMENTS

CN 103664995 3/2014
CN 104177380 12/2014
(Continued)

OTHER PUBLICATIONS

"International Search Report (Form PCT/ISA/210) of PCT/JP2021/016995," mailed on Aug. 3, 2021, with English translation thereof, pp. 1-6.

(Continued)

*Primary Examiner* — Chanceity N Robinson
(74) *Attorney, Agent, or Firm* — JCIPRNET

(57) ABSTRACT

A photoelectric conversion element with an excellent sensitivity, an imaging element, an optical sensor, and a compound are provided. The photoelectric conversion element includes, in the following order, a conductive film, a photoelectric conversion film, and a transparent conductive film, in which the photoelectric conversion film contains a compound represented by Formula (1) and a coloring agent.

A-D-A (1)

41 Claims, 1 Drawing Sheet

(30) Foreign Application Priority Data

Aug. 25, 2020 (JP) ................................ 2020-141929
Jan. 12, 2021 (JP) ................................ 2021-002864

(51) Int. Cl.

*H10K 30/00* (2023.01)
*H10K 30/30* (2023.01)
*H10K 85/10* (2023.01)

(52) U.S. Cl.

CPC .......... *H10K 85/111* (2023.02); *H10K 85/113* (2023.02); *H10K 30/30* (2023.02)

(56) References Cited

FOREIGN PATENT DOCUMENTS

| | | | | |
|---|---|---|---|---|
| CN | 104177382 | 12/2014 | | |
| CN | 110343235 | 10/2019 | | |
| JP | 2018510845 | 4/2018 | | |
| JP | 2018093191 | 6/2018 | | |
| JP | 2018093191 A * | 6/2018 | ............. | H04N 25/63 |

OTHER PUBLICATIONS

"Written Opinion of the International Searching Authority (Form PCT/ISA/237) of PCT/JP2021/016995," mailed on Aug. 3, 2021, with English translation thereof, pp. 1-8.

"Search Report of Europe Counterpart Application", issued on Oct. 20, 2023, p. 1-p. 6.

"Office Action of Japan Counterpart Application", issued on Oct. 3, 2023, with English translation thereof, p. 1-p. 5.

* cited by examiner

PHOTOELECTRIC CONVERSION ELEMENT, IMAGING ELEMENT, OPTICAL SENSOR, AND COMPOUND

CROSS-REFERENCE TO RELATED APPLICATIONS

This application is a Continuation of PCT International Application No. PCT/JP2021/016995 filed on Apr. 28, 2021, which claims priority under 35 U.S.C. § 119(a) to Japanese Patent Application No. 2020-080089 filed on Apr. 30, 2020, Japanese Patent Application No. 2020-113345 filed on Jun. 30, 2020, Japanese Patent Application No. 2020-141929 filed on Aug. 25, 2020, and Japanese Patent Application No. 2021-002864 filed on Jan. 12, 2021. Each of the above applications is hereby expressly incorporated by reference, in its entirety, into the present application.

BACKGROUND OF THE INVENTION

1. Field of the Invention

The present invention relates to a photoelectric conversion element, an imaging element, an optical sensor, and a compound.

2. Description of the Related Art

In recent years, the development of an element (for example, an imaging element) having a photoelectric conversion film has been progressing.

For example, a predetermined molecule as an active material of an organic image sensor is disclosed in JP2018-510845A.

SUMMARY OF THE INVENTION

In recent years, along with the demand for improving the performance of imaging elements, optical sensors, and the like, further improvements are required for various characteristics required for photoelectric conversion elements used therein.

For example, further improvements for sensitivity (photoelectric conversion efficiency) in the photoelectric conversion elements are required.

The present inventors have examined a photoelectric conversion element obtained by using the material disclosed in JP2018-510845A, and have confirmed that there is a room for improving a sensitivity (for example, sensitivity for blue light such as light having a wavelength of 450 nm or light having a wavelength of 480 nm) in such a photoelectric conversion element.

In view of the above circumstances, an object of the present invention is to provide a photoelectric conversion element with an excellent sensitivity.

Another object of the present invention is to provide an imaging element, an optical sensor, and a compound related to the above photoelectric conversion element.

The present inventors have conducted extensive studies on the above-described problems, and as a result, the inventors have found that it is possible to solve the above-described problems by configurations described below and have completed the present invention.

[1]

A photoelectric conversion element comprising, in the following order: a conductive film; a photoelectric conversion film; and a transparent conductive film, in which the photoelectric conversion film contains a compound represented by Formula 1) and a coloring agent,

A-D-A (1)

in Formula (1), D is a group represented by any of Formula (1-1) to Formula (1-15), A is a group represented by any of Formula (3-1) to Formula (3-14), where, two A's present in Formula (1) are each a group having the same structure, (1-1)

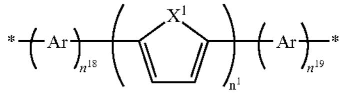

(1-2)

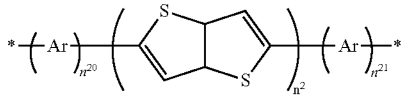

(1-3)

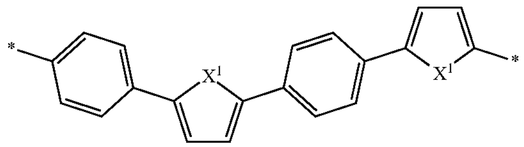

(1-4)

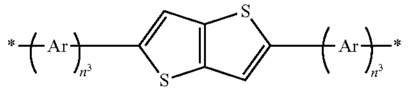

(1-5)

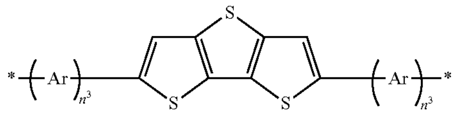

(1-6)

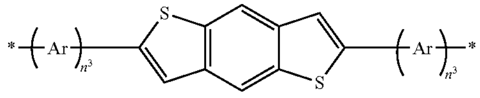

(1-7)

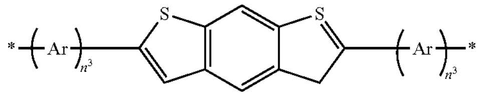

(1-8)

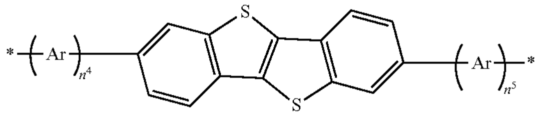

(1-9)

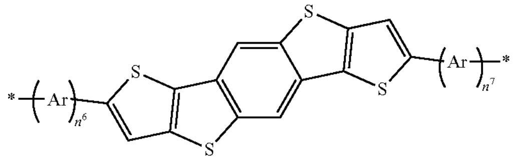

(1-10)

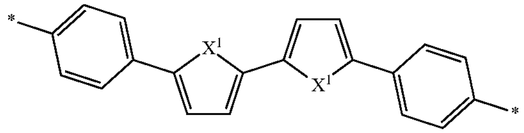

-continued (1-11)

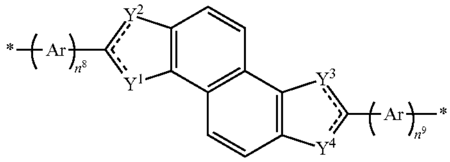

(1-12)

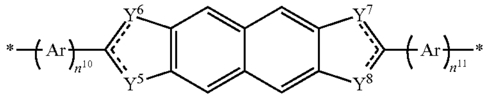

(1-13)

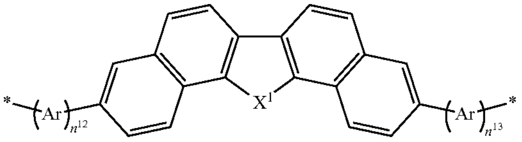

(1-14)

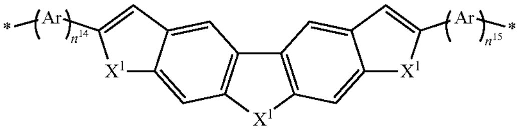

(1-15)

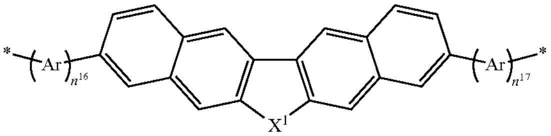

in Formula (1-1) to Formula (1-15), * represents a bonding position, $X^1$ represents a sulfur atom, an oxygen atom, a selenium atom, or a tellurium atom, one of $Y^1$ and $Y^2$ represents a sulfur atom, an oxygen atom, a selenium atom, or a tellurium atom, and another one represents —CH═, one of $Y^3$ and $Y^4$ represents a sulfur atom, an oxygen atom, a selenium atom, or a tellurium atom, and another one represents —CH═, one of $Y^5$ and $Y^6$ represents a sulfur atom, an oxygen atom, a selenium atom, or a tellurium atom, and another one represents —CH═, one of $Y^7$ and $Y^8$ represents a sulfur atom, an oxygen atom, a selenium atom, or a tellurium atom, and another one represents —CH═, $n^1$ represents an integer of 3 to 5, $n^2$ represents an integer of 3 to 5, $n^3$ represents an integer of 0 to 2, where, at least one of two $n^3$'s present in each of Formula (1-4) to Formula (1-7) represents an integer of 1 or 2, $n^4$ to $n^{21}$ each independently represent an integer of 0 to 2, Ar in Formula (1-1) and Formula (1-2) is a group represented by Formula (2-3), Ar in Formula (1-4) is a group represented by any of Formula (2-1) to Formula (2-3), Ar in Formula (1-5) to Formula (1-9) and Formula (1-11) to Formula (1-15) is a group represented by any of Formula (2-1) to Formula (2-4), (2-1)

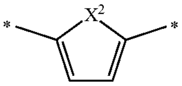

(2-2)

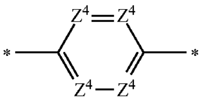

(2-3)

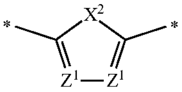

(2-4)

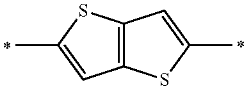

in Formula (2-1) to Formula (2-4), * represents a bonding position, $X^2$ represents a sulfur atom, an oxygen atom, a selenium atom, or a tellurium atom, $Z^1$ represents —CH═ or —N═, where, at least one of two $Z^1$'s in Formula (2-3) is —N═, $Z^4$ represents —CH═ or —N═, one or more of —CH═ included in a ring structure in a group represented by D in Formula (1) may be substituted with —$CR^3$═, $R^3$ represents a halogen atom, (3-1)

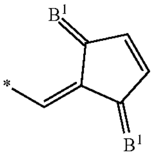

(3-2)

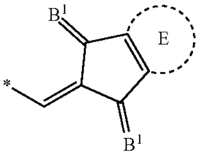

(3-3)

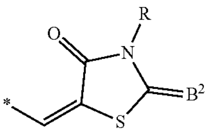

(3-4)

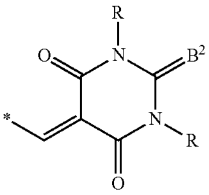

(3-5)

*—ArL—CN

-continued (3-6)

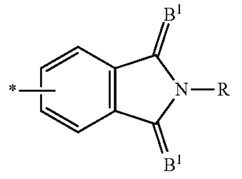

(3-7)

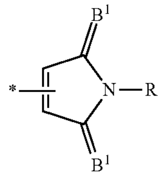

(3-8)

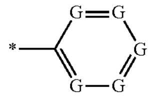

(3-9)

$*-\mathrm{ArL}-(\mathrm{CF}_3)_{m1}$ (3-10)

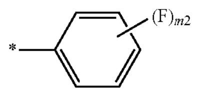

(3-11)

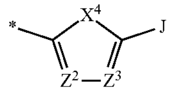

(3-12)

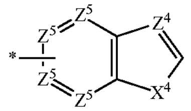

(3-13)

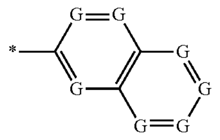

(3-14)

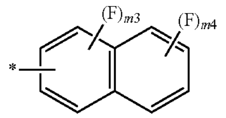

ArL =

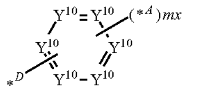

(Ar1)

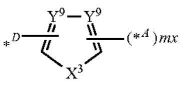

(Ar2)

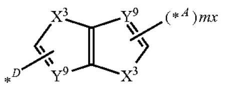

(Ar3)

in Formula (3-1) to Formula (3-14), * represents a bonding position, $B^1$ and $B^2$ each independently represent a sulfur atom, an oxygen atom, $=C(CN)_2$, or $=C(CN)(CO_2R^1)$, $R^1$ represents an alkyl group having 1 or 2 carbon atoms, which may have a halogen atom as a substituent, E represents an aromatic ring, which may have a group selected from the group consisting of a halogen atom, a methyl group, an ethyl group, and a methoxy group, as a substituent, where the methyl group, the ethyl group, and the methoxy group each may further have a halogen atom as a substituent, R represents an alkyl group having 1 or 2 carbon atoms, which may have a halogen atom as a substituent, G represents $-CR^G=$ or $-N=$, $R^G$ represents a hydrogen atom, a halogen atom, or a cyano group, where, at least one of five G's in Formula (3-8) is $-N=$, and at least one of seven G's in Formula (3-13) is $-N=$, m1 represents an integer of 1 to 5, m2 represents an integer of 1 to 5, m3 represents an integer of 0 to 3, m4 represents an integer of 0 to 4, where, in Formula (3-14), m3+m4 is 1 or more, one or more of $-CH=$ included in a ring structure in a group represented by Formula (3-10) and Formula (3-14) may be substituted with $-CR^4=$, $R^4$ represents a halogen atom other than a fluorine atom, $X^4$ represents a sulfur atom, an oxygen atom, a selenium atom, or a tellurium atom, $Z^2$ to $Z^5$ each independently represent $-CR^Z=$ or $-N=$, $R^Z$ represents a hydrogen atom or a halogen atom, where, at least one of $Z^2$ and $Z^3$ in Formula (3-11) is $-N=$, and one of four $Z^5$'s in Formula (3-12) is a substituent including a carbon atom, J represents a hydrogen atom, a halogen atom, an aryl group, a heteroaryl group, or an alkyl group having 1 or 2 carbon atoms, which may have a halogen atom as a substituent, the aryl group and the heteroaryl group that are represented by J may have one or both of a halogen atom and an alkyl group having 1 or 2 carbon atoms, which has a halogen atom as a further substituent, J and $Z^3$ may be bonded to each other to form an aromatic ring, which may have a halogen atom as a substituent, in a case where J and $Z^3$ are bonded to each other to form the aromatic ring, both $Z^2$ and $Z^3$ may be other than $-N=$, ArL is a group represented by any of Formula (Ar1) to Formula (Ar3), in Formula (Ar1) to Formula (Ar3), $*^D$ represents a bonding position with respect to a group represented by D, and $*^A$ represents a bonding position with respect to a group other than the group represented by D, mx is 1 in a group represented by any of Formula (Ar1) to Formula (Ar3) as ArL in Formula (3-5), and is the same value as m1 in a group represented by any of Formula (Ar1) to Formula (Ar3) as ArL in Formula (3-9), $X^3$ represents a sulfur atom, an oxygen atom, a selenium atom, or a tellurium atom, $Y^9$ represents $-CH=$, $-CR^2=$, or $-N=$, $R^2$ represents a halogen atom or an alkyl group having 1 or 2 carbon atoms, which may have a halogen atom as a substituent, $Y^{10}$ represents $-CH=$ or $-CR^3=$, $R^3$ represents a halogen atom, in a case where A is a group represented by Formula (3-5) and D is a group represented by Formula (1-8) in which $n^4$ and $n^5$ are each independently an integer of 1 or 2 and all Ar's are a group represented by Formula (2-1), ArL in Formula (3-5) is a group represented by Formula (Ar1) or Formula (Ar3), in a case where A is a group represented by Formula (3-8), D is a group represented by Formula (1-1) to Formula (1-7), a group represented by Formula (1-8) in which $n^4$ and $n^5$ are each independently an integer of 1 or 2 and Ar is a group represented by Formula (2-3), a group represented by Formula (1-9), a group represented by Formula (1-11) in which $n^8$ and $n^9$ are each independently an integer of 1 or 2 and Ar is a group represented by Formula (2-3), a group represented by Formula (1-12) or Formula (1-13), a group represented by Formula (1-14) in which $n^{14}$ and $n^{15}$ are each independently an integer of 1 or 2, or a group represented by Formula (1-15), in a case where A is a group represented by Formula (3-9), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2, a group represented by Formula (1-6) in which $n^3$ is an integer of 1 or 2, a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-10), a group represented by Formula (1-11) in which $n^8$ and $n^9$ are each independently an integer of 1 or 2, a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, in a case where A is a group represented by Formula (3-10), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2 and Ar is a group represented by Formula (2-3), a group represented by Formula (1-6) in which $n^3$ is an integer of 1 or 2 and Ar is a group represented by Formula (2-3) or Formula (2-4), a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-11) in which $n^8$ and $n^9$ are each independently an integer of 1 or 2 and Ar is a group represented by Formula (2-3), a group represented by Formula (1-12) in which $n^{10}$ and $n^{11}$ are each independently an integer 12 and 13 are each independently of 1 or 2, a group represented by Formula (1-13) in which $n^{12}$ an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, in a case where A is a group represented by Formula (3-11) and D is a group represented by Formula (1-8), J and $Z^3$ in Formula (3-11) may not be bonded to each other to form an aromatic ring, in a case where A is a group represented by Formula (3-11) and D is a group represented by Formula (1-11) in which $n^8$ and $n^9$ both are 0, J and $Z^3$ in Formula (3-11) may not be bonded to each other to form an aromatic ring, in a case where A is a group represented by Formula (3-11), and D is a group represented by Formula (1-12) in which $n^{10}$ and $n^{11}$ both are 1 and all Ar's are a group represented by Formula (2-2), J and $Z^3$ in Formula (3-11) may not be bonded to each other to form an aromatic ring, in a case where A is a group represented by Formula (3-12), D is a group represented by Formula (1-1) to Formula (1-7), a group represented by Formula (1-8) in which $n^4$ and $n^5$ are each independently an integer of 1 or 2, a group represented by Formula (1-9) or Formula (1-10), a group represented by Formula (1-11) in which $n^8$ and $n^9$ are each independently an integer of 1 or 2 and Ar is a group represented by Formula (2-3) or Formula (2-4), or a group represented by Formula (1-12) to Formula (1-15), when A is a group represented by Formula (3-12) and D is a group represented by Formula (1-12), a case that $n^{10}$ and $n^{11}$ both are 1, and all Ar's are a group represented by Formula (2-2) is excluded, and in a case where A is a group represented by Formula (3-13), D is a group represented by Formula (1-1) to Formula (1-7), a group represented by Formula (1-8) in which $n^4$ and $n^5$ are each independently an integer of 1 or 2 and Ar is a group represented by Formula (2-3) or Formula (2-4), a group represented by Formula (1-9) or Formula (1-10), a group represented by Formula (1-11) in which $n^8$ and $n^9$ are each independently an integer of 1 or 2 and Ar is a group represented by Formula (2-1), Formula (2-3) or Formula (2-4), or a group represented by Formula (1-12) to Formula (1-15).

[2]

The photoelectric conversion element according to [1], in which the D is a group represented by any of Formula (1-5) to Formula (1-7), Formula (1-9), and Formula (1-12) to Formula (1-15).

[3]

The photoelectric conversion element according to [1] or [2], in which the D is a group represented by any of Formula (1-9) and Formula (1-12) to Formula (1-15).

[4]

The photoelectric conversion element according to any one of [1] to [3], in which the D is a group represented by any of Formula (1-9), Formula (1-12), Formula (1-13), and Formula (1-15).

[5]

The photoelectric conversion element according to any one of [1] to [4], in which the D is a group represented by any of Formula (1-12), Formula (1-13), and Formula (1-15).

[6]

The photoelectric conversion element according to any one of [1] to [5], in which the D is a group represented by Formula (1-12).

[7]

The photoelectric conversion element according to any one of [1] to [6], in which the A is a group represented by any of Formula (3-1) to Formula (3-3), and Formula (3-5) to Formula (3-14).

[8]

The photoelectric conversion element according to any one of [1] to [7], in which the A is a group represented by any of Formula (3-5) and Formula (3-8) to Formula (3-14).

[9]

The photoelectric conversion element according to any one of [1] to [8], in which the A is a group represented by any of Formula (3-8) and Formula (3-10) to Formula (3-14).

[10]

The photoelectric conversion element according to any one of [1] to [9], in which the A is a group represented by any of Formula (3-10) to Formula (3-12), and Formula (3-14).

[11]

The photoelectric conversion element according to any one of [1] to [10], in which the A is a group represented by any of Formula (3-11) and Formula (3-12).

[12]

The photoelectric conversion element according to any one of [1] to [11], in which the A is a group represented by Formula (3-11).

[13]

The photoelectric conversion element according to any one of [1] to [12], in which the compound represented by Formula (1) has a molecular weight of 400 to 900.

[14]

The photoelectric conversion element according to any one of [1] to [13], in which the photoelectric conversion film is a mixture layer formed in a state where the compound represented by Formula (1) and the coloring agent are mixed.

[15]

A photoelectric conversion element comprising, in the following order: a conductive film; a photoelectric conversion film; and a transparent conductive film, in which the photoelectric conversion film contains a compound represented by Formula (1A) and a coloring agent, (1A)

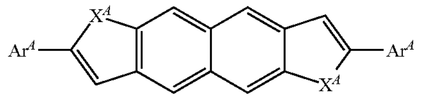

in Formula (1A), $X^A$ represents a sulfur atom or an oxygen atom, $Ar^A$ represents a group represented by any of Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), where, two $X^A$'s present in Formula (1A) are each a group having the same structure, and two $Ar^A$'s present in Formula (1A) are each a group having the same structure, (4-1)

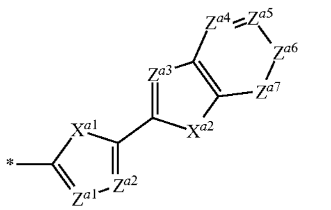

(4-2)

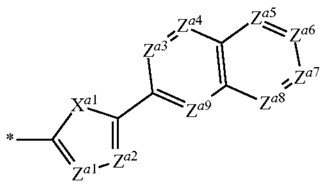

-continued (4-3)

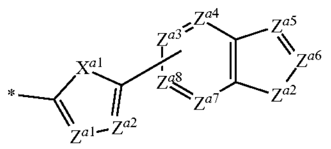

(4-4)

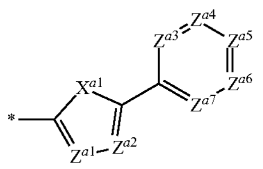

(4-5)

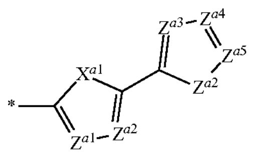

(4-6)

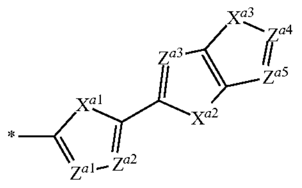

(4-7)

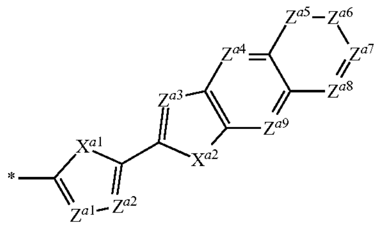

(4-8)

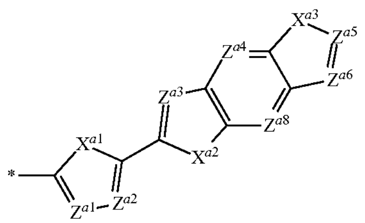

(5-1)

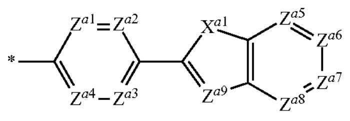

(5-2)

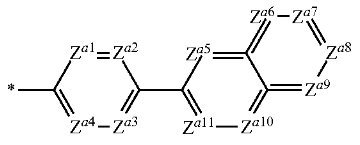

(5-3)

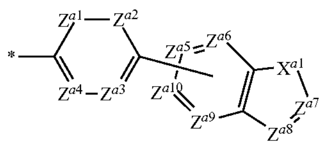

-continued
(5-4)
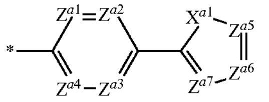
(5-5)
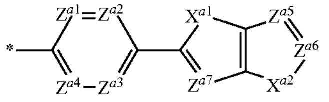
(5-6)
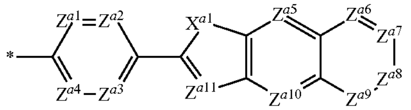
(5-7)
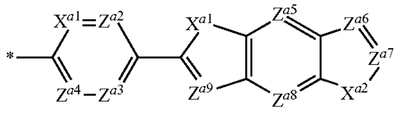
(6-1)
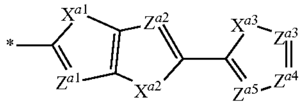
(6-2)
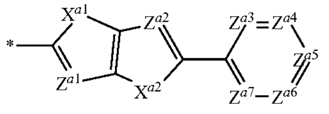
(7-1)
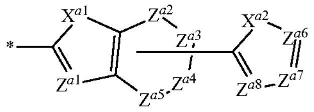
(7-2)
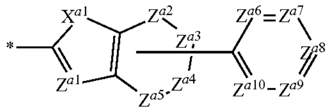
(8-1)
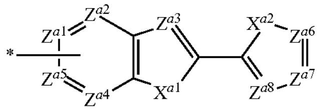
(8-2)
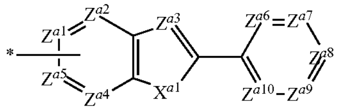
(9-1)
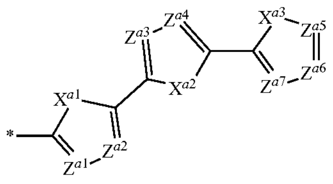
(9-2)
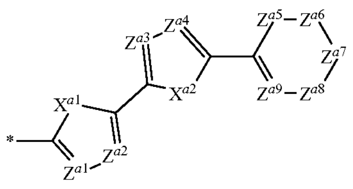
-continued
(9-3)
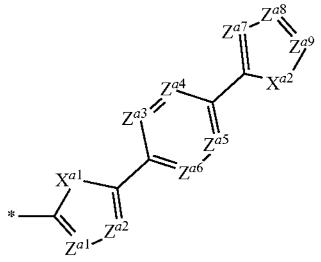
(9-4)
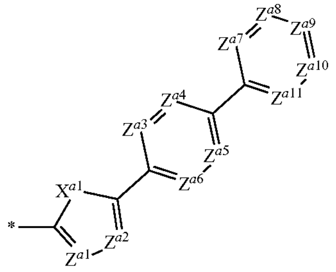
(9-5)
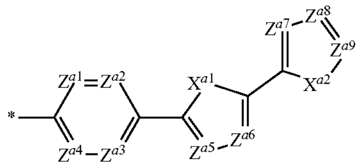
(9-6)
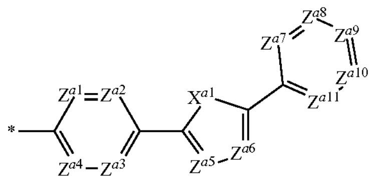
(9-7)
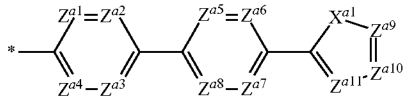
(9-8)
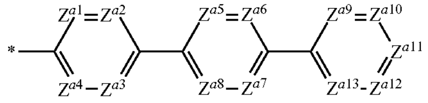
(10-1)
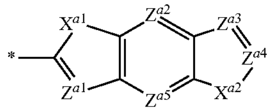
(10-2)
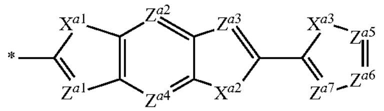
(10-3)
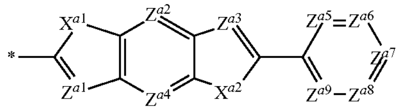

-continued (11-1)

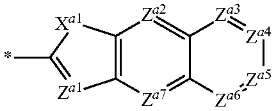

in Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), * represents a bonding position, $X^{a1}$ to $X^{a3}$ each independently represent a sulfur atom or an oxygen atom, $Z^{a1}$ to $Z^{a13}$ each independently represent —CH═, —CF═, or —N═, in Formula (4-1), at least one of $Z^{a1}$ to $Z^{a7}$ is —CF═ or —N═, in Formula (4-2), at least one of $Z^{a1}$ to $Z^{a9}$ is —CF═ or —N═, in Formula (4-3), at least one of $Z^{a1}$ to $Z^{a8}$ is —CF═ or —N═, in Formula (4-4), at least one of $Z^{a1}$ to $Z^{a7}$ is —CF═ or —N═, in Formula (4-5), at least one of $Z^{a1}$ to $Z^{a5}$ is —CF═ or —N═, in Formula (4-6), at least one of $Z^{a1}$ to $Z^{a5}$ is —CF═ or —N═, in Formula (4-7), at least one of $Z^{a1}$ to $Z^{a9}$ is —CF═ or —N═, in Formula (4-8), at least one of $Z^{a1}$ to $Z^{a7}$ is —CF═ or —N═, in Formula (5-1), at least one of $Z^{a1}$ to $Z^{a9}$ is —CF═ or —N═, in Formula (5-2), at least one of $Z^{a1}$ to $Z^{a11}$ is —CF═ or —N═, in Formula (5-3), at least one of $Z^{a1}$ to $Z^{a10}$ is —CF═ or —N═, in Formula (5-4), at least one of $Z^{a1}$ to $Z^{a7}$ is —CF═ or —N═, in Formula (5-5), at least one of $Z^{a1}$ to $Z^{a7}$ is —CF═ or —N═, in Formula (5-6), at least one of $Z^{a1}$ to $Z^{a11}$ is —CF═ or —N═, in Formula (5-7), at least one of $Z^{a1}$ to $Z^{a9}$ is —CF═ or —N═, in Formula (6-1), at least one of $Z^{a1}$ to $Z^{a5}$ is —CF═ or —N═, in Formula (6-2), at least one of $Z^{a1}$ to $Z^{a7}$ is —CF═ or —N═, in Formula (7-1), at least one of $Z^{a1}$ to $Z^{a8}$ is —CF═ or —N═, in Formula (7-2), at least one of $Z^{a1}$ to $Z^{a10}$ is —CF═ or —N═, in Formula (8-1), at least one of $Z^{a1}$ to $Z^{a8}$ is —CF═ or —N═, in Formula (8-2), at least one of $Z^{a1}$ to $Z^{a10}$ is —CF═ or —N═, in Formula (9-1), at least one of $Z^{a1}$ to $Z^{a7}$ is —CF═ or —N═, in Formula (9-2), at least one of $Z^{a1}$ to $Z^{a9}$ is —CF═ or —N═, in Formula (9-3), at least one of $Z^{a1}$ to $Z^{a9}$ is —CF═ or —N═, in Formula (9-4), at least one of $Z^{a1}$ to $Z^{a11}$ is —CF═ or —N═, in Formula (9-5), at least one of $Z^{a1}$ to $Z^{a9}$ is —CF═ or —N═, in Formula (9-6), at least one of $Z^{a1}$ to $Z^{a11}$ is —CF═ or —N═, in Formula (9-7), at least one of $Z^{a1}$ to $Z^{a11}$ is —CF═ or —N═, in Formula (9-8), at least one of $Z^{a1}$ to $Z^{a13}$ is —CF═ or —N═, in Formula (10-1), at least one of $Z^{a1}$ to $Z^{a5}$ is —CF═ or —N═, in Formula (10-2), at least one of $Z^{a1}$ to $Z^{a7}$ is —CF═ or —N═, in Formula (10-3), at least one of $Z^{a1}$ to $Z^{a9}$ is —CF═ or —N═, in Formula (11-1), at least one of $Z^{a1}$ to $Z^{a7}$ is —CF═ or —N═.

[16]

The photoelectric conversion element according to [15], in which the $Ar^4$ is a group represented by any of Formula (4-1) to Formula (4-8), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1).

[17]

The photoelectric conversion element according to [15] or [16], in which the $Ar^4$ is a group represented by any of Formula (4-1) to Formula (4-8), Formula (6-1) and Formula (6-2), and Formula (9-1) to Formula (9-8).

[18]

The photoelectric conversion element according to any one of [15] to [17], in which the compound represented by Formula (1A) has a molecular weight of 400 to 900.

[19]

The photoelectric conversion element according to any one of [15] to [18], in which the photoelectric conversion film is a mixture layer formed in a state where the compound represented by Formula (1A) and the coloring agent are mixed.

[20]

The photoelectric conversion element according to any one of [1] to [19], further comprising one or more interlayers between the conductive film and the transparent conductive film, in addition to the photoelectric conversion film.

[21]

The photoelectric conversion element according to any one of [1] to [20], in which the photoelectric conversion film further contains a n-type semiconductor material.

[22]

The photoelectric conversion element according to [21], in which the n-type semiconductor material includes fullerenes selected from the group consisting of a fullerene and a derivative thereof.

[23]

An imaging element comprising the photoelectric conversion element according to any one of [1] to [22].

[24]

An optical sensor comprising the photoelectric conversion element according to any one of [1] to [22].

[25]

A compound represented by Formula (1),

A-D-A (1)

in Formula (1), D is a group represented by any of Formula (1-1) to Formula (1-9) and Formula (1-11) to Formula (1-15), A is a group represented by any of Formula (3-1) to Formula (3-14), where, two A's present in Formula (1) are each a group having the same structure, (1-1)

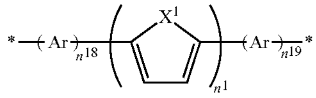

(1-2)

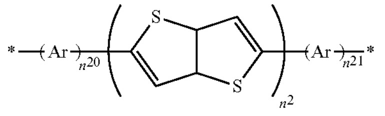

(1-3)

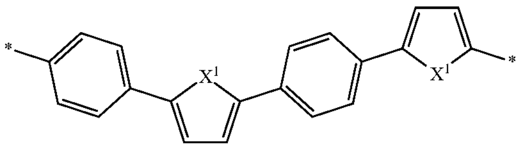

(1-4)

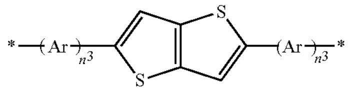

-continued (1-5)

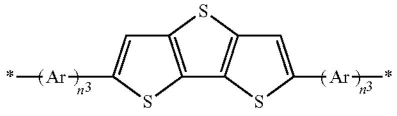

(1-6)

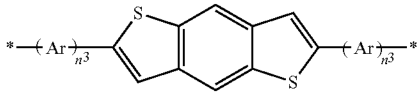

(1-7)

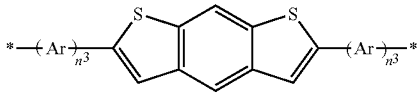

(1-8)

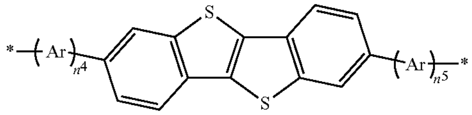

(1-9)

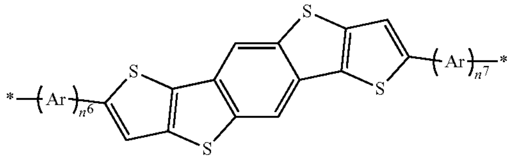

(1-11)

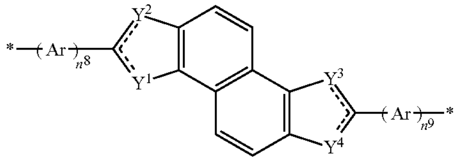

(1-12)

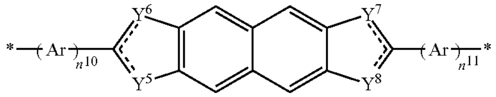

(1-13)

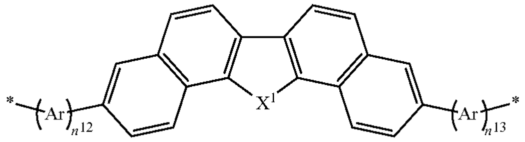

(1-14)

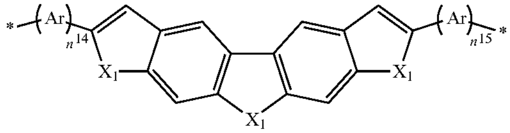

(1-15)

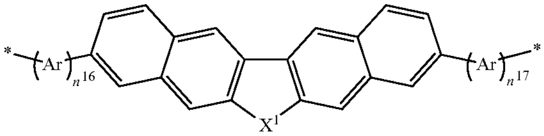

in Formula (1-1) to Formula (1-15), * represents a bonding position, $X^1$ represents a sulfur atom, an oxygen atom, a selenium atom, or a tellurium atom, one of $Y^1$ and $Y^2$ represents a sulfur atom, an oxygen atom, a selenium atom, or a tellurium atom, and another one represents —CH=, one of $Y^3$ and $Y^4$ represents a sulfur atom, an oxygen atom, a selenium atom, or a tellurium atom, and another one represents —CH=, one of $Y^5$ and $Y^6$ represents a sulfur atom, an oxygen atom, a selenium atom, or a tellurium atom, and another one represents —CH=, one of $Y^7$ and $Y^8$ represents a sulfur atom, an oxygen atom, a selenium atom, or a tellurium atom, and another one represents —CH=, $n^1$ represents an integer of 3 to 5, $n^2$ represents an integer of 3 to 5, $n^3$ represents an integer of 0 to 2, where, at least one of two $n^3$'s present in each of Formula (1-4) to Formula (1-7) represents an integer of 1 or 2, $n^4$ to $n^{21}$ each independently represent an integer of 0 to 2, Ar in Formula (1-1) and Formula (1-2) is a group represented by Formula (2-3), Ar in Formula (1-4) is a group represented by any of Formula (2-1) to Formula (2-3), Ar in Formula (1-5) to Formula (1-9) and Formula (1-11) to Formula (1-15) is a group represented by any of Formula (2-1) to Formula (2-4), (2-1)

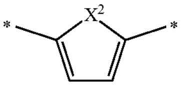

(2-2)

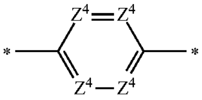

(2-3)

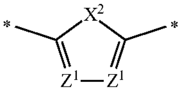

(2-4)

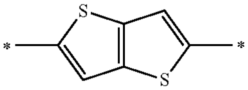

in Formula (2-1) to Formula (2-4), * represents a bonding position, $X^2$ represents a sulfur atom, an oxygen atom, a selenium atom, or a tellurium atom, $Z^1$ represents —CH= or —N=, where, at least one of two $Z^1$'s in Formula (2-3) is —N=, $Z^4$ represents —CH= or —N=, one or more of —CH= included in a ring structure in a group represented by D in Formula (1) may be substituted with —$CR^3$=, $R^3$ represents a halogen atom, (3-1)

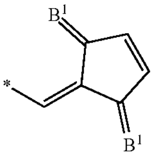

-continued (3-2)

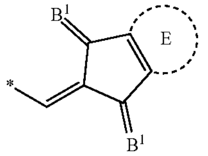

(3-3)

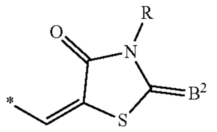

(3-4)

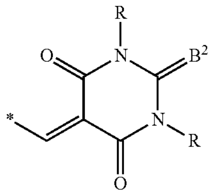

(3-5)

*—ArL—CN (3-6)

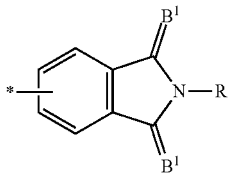

(3-7)

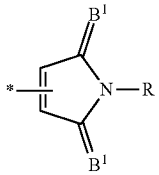

(3-8)

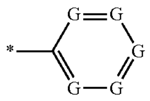

(3-9)

*—ArL—$(CF_3)_{m1}$ (3-10)

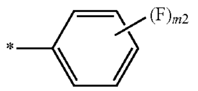

(3-11)

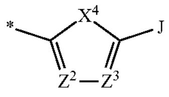

(3-12)

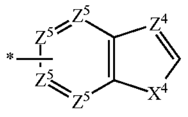

(3-13)

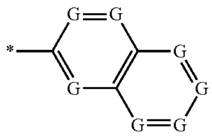

-continued (3-14)

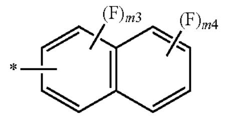

ArL =

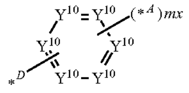

(Ar1)

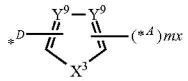

(Ar2)

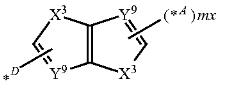

(Ar3)

in Formula (3-1) to Formula (3-14), * represents a bonding position, $B^1$ and $B^2$ each independently represent a sulfur atom, an oxygen atom, $=C(CN)_2$, or $=C(CN)(CO_2R^1)$, $R^1$ represents an alkyl group having 1 or 2 carbon atoms, which may have a halogen atom as a substituent, E represents an aromatic ring, which may have a group selected from the group consisting of a halogen atom, a methyl group, an ethyl group, and a methoxy group, as a substituent, where the methyl group, the ethyl group, and the methoxy group each may further have a halogen atom as a substituent, R represents an alkyl group having 1 or 2 carbon atoms, which may have a halogen atom as a substituent, G represents $—CR^G=$ or $—N=$, $R^G$ represents a hydrogen atom, a halogen atom, or a cyano group, where, at least one of five G's in Formula (3-8) is $—N=$, and at least one of seven G's in Formula (3-13) is $—N=$, m1 represents an integer of 1 to 5, m2 represents an integer of 1 to 5, m3 represents an integer of 0 to 3, m4 represents an integer of 0 to 4, where, in Formula (3-14), m3+m4 is 1 or more, one or more of $—CH=$ included in a ring structure in a group represented by Formula (3-10) and Formula (3-14) may be substituted with $—CR^4=$, $R^4$ represents a halogen atom other than a fluorine atom, $X^4$ represents a sulfur atom, an oxygen atom, a selenium atom, or a tellurium atom, $Z^2$ to $Z^5$ each independently represent $—CR^Z=$ or $—N=$, $R^Z$ represents a hydrogen atom or a halogen atom, where, at least one of $Z^2$ and $Z^3$ in Formula (3-11) is $—N=$, and one of four $Z^5$'s in Formula (3-12) is a substituent including a carbon atom, J represents a hydrogen atom, a halogen atom, an aryl group, a heteroaryl group, or an alkyl group having 1 or 2 carbon atoms, which may have a halogen atom as a substituent, the aryl group and the heteroaryl group that are represented by J may have one or both of a halogen atom and an alkyl group having 1 or 2 carbon atoms, which has a halogen atom as a further substituent, J and $Z^3$ may be bonded to each other to form an aromatic ring, which may have a halogen atom as a substituent, in a case where J and $Z^3$ are bonded to each other to form the aromatic ring, both $Z^2$ and $Z^3$ may be other than $—N=$, ArL is a group represented by any of Formula (Ar1) to Formula (Ar3), in Formula (Ar1) to Formula (Ar3), $*^D$ represents a bonding position with respect to a group represented by D, and $*^A$ represents a bonding position with respect to a group other than the group represented by D, mx is 1 in a group represented by any of Formula (Ar1) to Formula (Ar3) as ArL in Formula (3-5), and is the same value as m1 in a group represented by any of Formula (Ar1) to Formula (Ar3) as ArL in Formula (3-9), $X^3$ represents a sulfur atom, an oxygen atom, a selenium atom, or a tellurium atom, $Y^9$ represents —CH═, —$CR^2$═, or —N═, $R^2$ represents a halogen atom or an alkyl group having 1 or 2 carbon atoms, which may have a halogen atom as a substituent, $Y^{10}$ represents —CH═ or —$CR^3$═, $R^3$ represents a halogen atom, in a case where A is a group represented by Formula (3-5) and D is a group represented by Formula (1-8) in which $n^4$ and $n^5$ are each independently an integer of 1 or 2 and all Ar's are a group represented by Formula (2-1), ArL in Formula (3-5) is a group represented by Formula (Ar1) or Formula (Ar3), in a case where A is a group represented by Formula (3-8), D is a group represented by Formula (1-1) to Formula (1-7), a group represented by Formula (1-8) in which $n^4$ and $n^5$ are each independently an integer of 1 or 2 and Ar is a group represented by Formula (2-3), a group represented by Formula (1-9), a group represented by Formula (1-11) in which $n^8$ and $n^9$ are each independently an integer of 1 or 2 and Ar is a group represented by Formula (2-3), a group represented by Formula (1-12) or Formula (1-13), a group represented by Formula (1-14) in which $n^{14}$ and $n^{15}$ are each independently an integer of 1 or 2, or a group represented by Formula (1-15), in a case where A is a group represented by Formula (3-9), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2, a group represented by Formula (1-6) in which $n^3$ is an integer of 1 or 2, a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-11) in which $n^8$ and $n^9$ are each independently an integer of 1 or 2, a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, in a case where A is a group represented by Formula (3-10), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2 and Ar is a group represented by Formula (2-3), a group represented by Formula (1-6) in which $n^3$ is an integer of 1 or 2 and Ar is a group represented by Formula (2-3) or Formula (2-4), a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-11) in which $n^8$ and $n^9$ are each independently an integer of 1 or 2 and Ar is a group represented by Formula (2-3), a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, in a case where A is a group represented by Formula (3-11) and D is a group represented by Formula (1-8), J and $Z^3$ in Formula (3-11) may not be bonded to each other to form an aromatic ring, in a case where A is a group represented by Formula (3-11) and D is a group represented by Formula (1-11) in which $n^8$ and $n^9$ both are 0, J and $Z^3$ in Formula (3-11) may not be bonded to each other to form an aromatic ring, in a case where A is a group represented by Formula (3-11), and D is a group represented by Formula (1-12) in which $n^{10}$ and $n^{11}$ both are 1 and all Ar's are a group represented by Formula (2-2), J and $Z^3$ in Formula (3-11) may not be bonded to each other to form an aromatic ring, in a case where A is a group represented by Formula (3-12), D is a group represented by Formula (1-1) to Formula (1-7), a group represented by Formula (1-8) in which $n^4$ and $n^5$ are each independently an integer of 1 or 2, a group represented by Formula (1-9), a group represented by Formula (1-11) in which $n^8$ and $n^9$ are each independently an integer of 1 or 2 and Ar is a group represented by Formula (2-3) or Formula (2-4), or a group represented by Formula (1-12) to Formula (1-15), when A is a group represented by Formula (3-12) and D is a group represented by Formula (1-12), a case that $n^{10}$ and $n^{11}$ both are 1, and all Ar's are a group represented by Formula (2-2) is excluded, and in a case where A is a group represented by Formula (3-13), D is a group represented by Formula (1-1) to Formula (1-7), a group represented by Formula (1-8) in which $n^4$ and $n^5$ are each independently an integer of 1 or 2 and Ar is a group represented by Formula (2-3) or Formula (2-4), a group represented by Formula (1-9), a group represented by Formula (1-11) in which $n^8$ and $n^9$ are each independently an integer of 1 or 2 and Ar is a group represented by Formula (2-1), Formula (2-3) or Formula (2-4), or a group represented by Formula (1-12) to Formula (1-15).

[26]

The compound according to [25], in which the D is a group represented by any of Formula (1-5) to Formula (1-7), Formula (1-9), and Formula (1-12) to Formula (1-15).

[27]

The compound according to [25] or [26], in which the D is a group represented by any of Formula (1-9) and Formula (1-12) to Formula (1-15).

[28]

The compound according to any one of [25] to [27], in which the D is a group represented by any of Formula (1-9), Formula (1-12), Formula (1-13), and Formula (1-15).

[29]

The compound according to any one of [25] to [28], in which the D is a group represented by any of Formula (1-12), Formula (1-13), and Formula (1-15).

[30]

The compound according to any one of [25] to [29], in which the D is a group represented by Formula (1-12).

[31]

The compound according to any one of [25] to [30], in which the A is a group represented by any of Formula (3-1) to Formula (3-3), and Formula (3-5) to Formula (3-14).

[32]

The compound according to any one of [25] to [31], in which the A is a group represented by any of Formula (3-5) and Formula (3-8) to Formula (3-14).

[33]

The compound according to any one of [25] to [32], in which the A is a group represented by any of Formula (3-8) and Formula (3-10) to Formula (3-14).

[34]

The compound according to any one of [25] to [33], in which the A is a group represented by any of Formula (3-10) to Formula (3-12), and Formula (3-14).

[35]

The compound according to any one of [25] to [34], in which the A is a group represented by any of Formula (3-11) and Formula (3-12).

[36]

The compound according to any one of [25] to [35], in which the A is a group represented by Formula (3-11).

[37]

The compound according to any one of [25] to [36], in which the compound represented by Formula (1) has a molecular weight of 400 to 900.

[38]

A compound represented by Formula (1A), (1A)

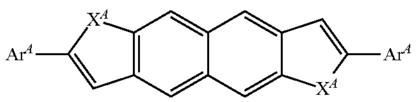

in Formula (1A), $X^A$ represents a sulfur atom or an oxygen atom, $Ar^A$ represents a group represented by any of Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), where, two $X^A$'s present in Formula (1A) are each a group having the same structure, and two $Ar^A$'s present in Formula (1A) are each a group having the same structure, (4-1)

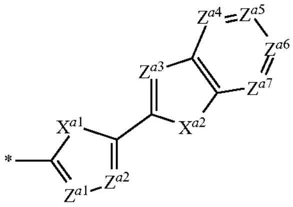

(4-2)

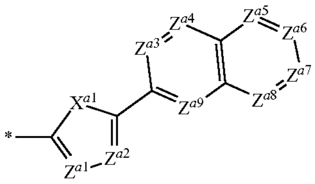

(4-3)

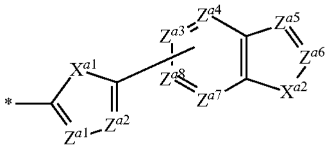

(4-4)

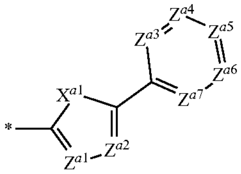

(4-5)

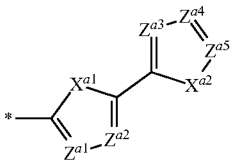

(4-6)

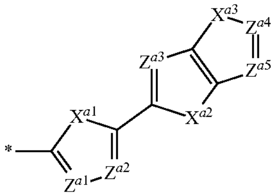

(4-7)

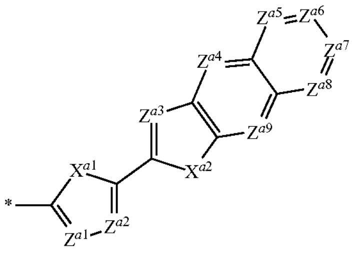

(4-8)

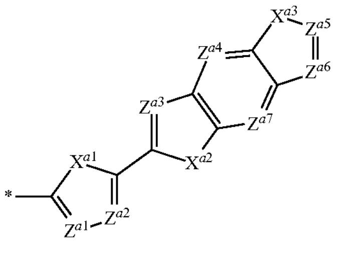

-continued
(5-1)
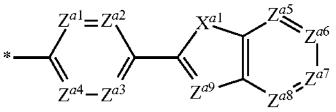
(5-2)
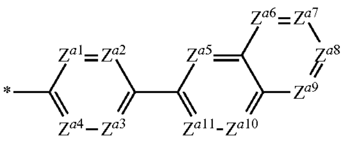
(5-3)
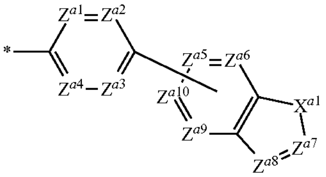
(5-4)
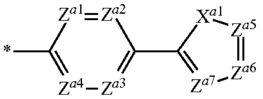
(5-5)
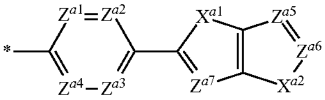
(5-6)
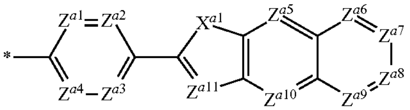
(5-7)
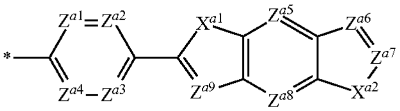
(6-1)
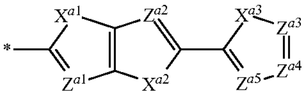
(6-2)
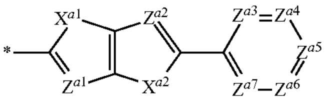
(7-1)
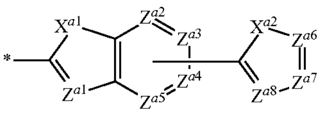
(7-2)
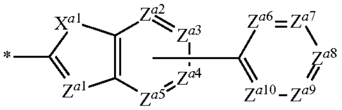
(8-1)
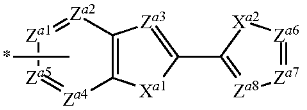
-continued
(8-2)
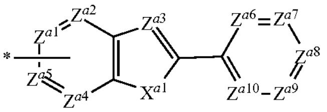
(9-1)
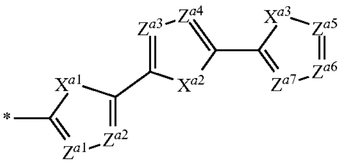
(9-2)
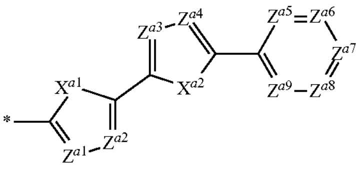
(9-3)
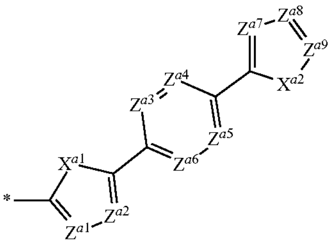
(9-4)
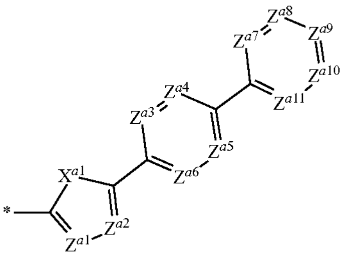
(9-5)
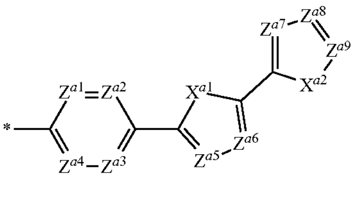
(9-6)
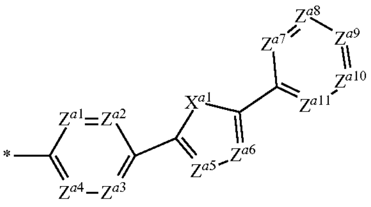
(9-7)
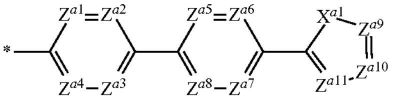
(9-8)
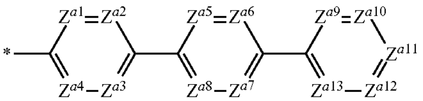

-continued (10-1)

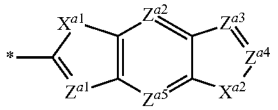

(10-2)

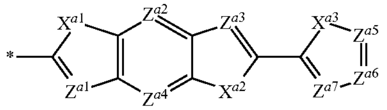

(10-3)

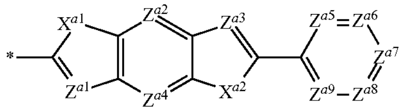

(11-1)

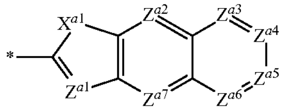

in Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), * represents a bonding position, $X^{a1}$ to $X^{a3}$ each independently represent a sulfur atom or an oxygen atom, $Z^{a1}$ to $Z^{a13}$ each independently represent —CH═, —CF═, or —N═, in Formula (4-1), at least one of $Z^{a1}$ to $Z^{a7}$ is —CF═ or —N═, in Formula (4-2), at least one of $Z^{a1}$ to $Z^{a9}$ is —CF═ or —N═, in Formula (4-3), at least one of $Z^{a1}$ to $Z^{a8}$ is —CF═ or —N═, in Formula (4-4), at least one of $Z^{a1}$ to $Z^{a7}$ is —CF═ or —N═, in Formula (4-5), at least one of $Z^{a1}$ to $Z^{a5}$ is —CF═ or —N═, in Formula (4-6), at least one of $Z^{a1}$ to $Z^{a5}$ is —CF═ or —N═, in Formula (4-7), at least one of $Z^{a1}$ to $Z^{a9}$ is —CF═ or —N═, in Formula (4-8), at least one of $Z^{a1}$ to $Z^{a7}$ is —CF═ or —N═, in Formula (5-1), at least one of $Z^{a1}$ to $Z^{a9}$ is —CF═ or —N═, in Formula (5-2), at least one of $Z^{a1}$ to $Z^{a11}$ is —CF═ or —N═, in Formula (5-3), at least one of $Z^{a1}$ to $Z^{a10}$ is —CF═ or —N═, in Formula (5-4), at least one of $Z^{a1}$ to $Z^{a7}$ is —CF═ or —N═, in Formula (5-5), at least one of $Z^{a1}$ to $Z^{a7}$ is —CF═ or —N═, in Formula (5-6), at least one of $Z^{a1}$ to $Z^{a11}$ is —CF═ or —N═, in Formula (5-7), at least one of $Z^{a1}$ to $Z^{a9}$ is —CF═ or —N═, in Formula (6-1), at least one of $Z^{a1}$ to $Z^{a5}$ is —CF═ or —N═, in Formula (6-2), at least one of $Z^{a1}$ to $Z^{a7}$ is —CF═ or —N═, in Formula (7-1), at least one of $Z^{a1}$ to $Z^{a8}$ is —CF═ or —N═, in Formula (7-2), at least one of $Z^{a1}$ to $Z^{a10}$ is —CF═ or —N═, in Formula (8-1), at least one of $Z^{a1}$ to $Z^{a8}$ is —CF═ or —N═, in Formula (8-2), at least one of $Z^{a1}$ to $Z^{a10}$ is —CF═ or —N═, in Formula (9-1), at least one of $Z^{a1}$ to $Z^{a7}$ is —CF═ or —N═, in Formula (9-2), at least one of $Z^{a1}$ to $Z^{a9}$ is —CF═ or —N═, in Formula (9-3), at least one of $Z^{a1}$ to $Z^{a9}$ is —CF═ or —N═, in Formula (9-4), at least one of $Z^{a1}$ to $Z^{a11}$ is —CF═ or —N═, in Formula (9-5), at least one of $Z^{a1}$ to $Z^{a9}$ is —CF═ or —N═, in Formula (9-6), at least one of $Z^{a1}$ to $Z^{a11}$ is —CF═ or —N═, in Formula (9-7), at least one of $Z^{a1}$ to $Z^{a11}$ is —CF═ or —N═, in Formula (9-8), at least one of $Z^{a1}$ to $Z^{a13}$ is —CF═ or —N═, in Formula (10-1), at least one of $Z^{a1}$ to $Z^{a5}$ is —CF═ or —N═, in Formula (10-2), at least one of $Z^{a1}$ to $Z^{a7}$ is —CF═ or —N═, in Formula (10-3), at least one of $Z^{a1}$ to $Z^{a9}$ is —CF═ or —N═, in Formula (11-1), at least one of $Z^{a1}$ to $Z^{a7}$ is —CF═ or —N═.

[39]

The compound according to [38], in which the $Ar^{A}$ is a group represented by any of Formula (4-1) to Formula (4-8), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1).

[40]

The compound according to [38] or [39], in which the $Ar^{A}$ is a group represented by any of Formula (4-1) to Formula (4-8), Formula (6-1) and Formula (6-2), and Formula (9-1) to Formula (9-8).

[41]

The compound according to any one of [38] to [40], in which the compound represented by Formula (1A) has a molecular weight of 400 to 900.

According to the present invention, it is possible to provide the photoelectric conversion element with an excellent sensitivity.

In addition, according to the present invention, it is possible to provide the imaging element, the optical sensor, and the compound related to the photoelectric conversion element.

DESCRIPTION OF THE PREFERRED EMBODIMENTS

Figure 1:
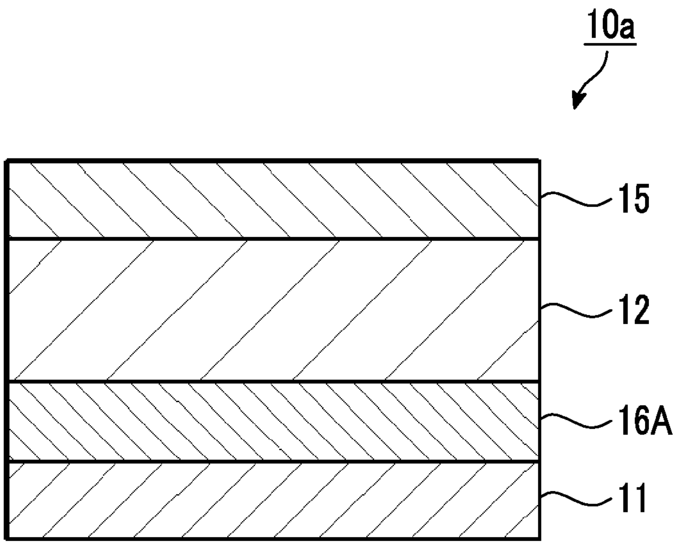
FIG. 1 is a schematic cross-sectional view illustrating a configuration example of a photoelectric conversion element.

Hereinafter, suitable embodiments of a photoelectric conversion element according to the embodiment of the present invention will be described.

In the present specification, examples of the halogen atom include a fluorine atom, a chlorine atom, a bromine atom, and an iodine atom.

In the present specification, in a case where a plurality of identical symbols indicating a kind or the number of groups are present in Formula (General Formula), which indicates a chemical structure, contents of these plurality of identical symbols indicating a kind or the number of groups are independent of each other, and the contents of the identical symbols may be the same or different from each other unless otherwise specified.

In addition, in the present specification, the numerical range represented by "to" means a range including numerical values denoted before and after "to" as a lower limit value and an upper limit value.

In the present specification, a hydrogen atom may be a light hydrogen atom (an ordinary hydrogen atom) or a deuterium atom (a double hydrogen atom and the like).

[Photoelectric Conversion Element]

The photoelectric conversion element according to an embodiment of the present invention includes a conductive film, a photoelectric conversion film, and a transparent conductive film in this order, in which the photoelectric conversion film contains a compound represented by Formula (1) (hereinafter, referred to as a "specific compound") and a coloring agent.

The mechanism capable of solving the above problems by adopting such a configuration of the photoelectric conversion element according to the embodiment of the present invention is not always clear, but the present inventors have presumed as follows.

That is, in the specific compound, a group represented by A acts as an acceptor, and a group represented by D acts as a donor in the molecule. Here, the specific compound has a form in which one donor is sandwiched between two identical acceptors. Since the donor moiety is unsubstituted or halogen-substituted, the hole transport in the photoelectric conversion film is smooth. Furthermore, since the acceptor moiety is positioned at a molecular weight terminal, electron transfer in the photoelectric conversion film is smooth. Accordingly, it is considered that such a feature synergistically contributes to the improvement of the sensitivity (sensitivity to a wavelength of 450 nm or a wavelength of 480 nm) of the photoelectric conversion element. In addition, it is also considered that the fact that the acceptor and the donor are selected from the groups having appropriate electron accepting properties or electron donating properties, respectively, also contributes to the improvement of the sensitivity (sensitivity to a wavelength of 450 nm or a wavelength of 480 nm).

In addition, the photoelectric conversion element according to the embodiment of the present invention has good responsiveness (responsiveness to a wavelength of 450 nm or a wavelength of 480 nm), preventing properties of variation in response, and preventing properties of variation in sensitivity.

Hereinafter, the fact that at least one or more of sensitivity of the photoelectric conversion element (sensitivity to a wavelength of 450 nm or a wavelength of 480 nm), responsiveness (responsiveness to a wavelength of 450 nm or a wavelength of 480 nm), preventing properties of variation in response, and preventing properties of variation in sensitivity are excellent is also simply referred to as "the present invention exhibits a more excellent effect".

FIG. 1 is a schematic cross-sectional view of one embodiment of a photoelectric conversion element according to the embodiment of the present invention.

A photoelectric conversion element 10*a* illustrated in FIG. 1 has a configuration in which a conductive film (hereinafter, also referred to as a lower electrode) 11 functioning as a lower electrode, an electron blocking film 16A, a photoelectric conversion film 12 containing the specific compound described later, and a transparent conductive film (hereinafter, also referred to as an upper electrode) 15 functioning as an upper electrode are laminated in this order.

Figure 2:
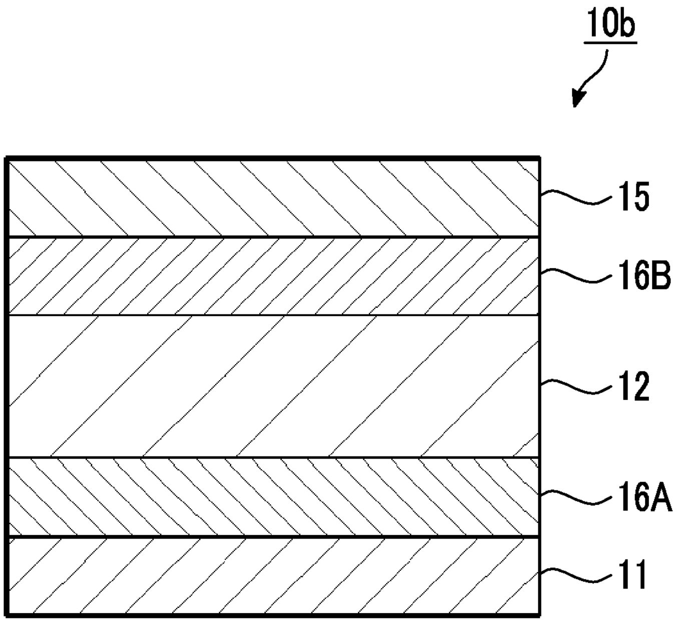
FIG. 2 is a schematic cross-sectional view illustrating a configuration example of the photoelectric conversion element.

FIG. 2 illustrates a configuration example of another photoelectric conversion element. A photoelectric conversion element 10*b* illustrated in FIG. 2 has a configuration in which the electron blocking film 16A, the photoelectric conversion film 12, a positive hole blocking film 16B, and the upper electrode 15 are laminated on the lower electrode 11 in this order. The lamination order of the electron blocking film 16A, the photoelectric conversion film 12, and the positive hole blocking film 16B in FIGS. 1 and 2 may be appropriately changed according to the application and the characteristics.

In the photoelectric conversion element 10*a* (or 10*b*), it is preferable that light is incident on the photoelectric conversion film 12 through the upper electrode 15.

In a case where the photoelectric conversion element 10*a* (or 10*b*) is used, a voltage can be applied. In this case, it is preferable that the lower electrode 11 and the upper electrode 15 form a pair of electrodes, and a voltage of $1\times10^{-5}$ to $1\times10^{7}$ V/cm is applied between the pair of electrodes. From the viewpoint of the performance and power consumption, the applied voltage is more preferably $1\times10^{-4}$ to $1\times10^{7}$ V/cm, and still more preferably $1\times10^{-3}$ to $5\times10^{6}$ V/cm.

Regarding a voltage application method, in FIGS. 1 and 2, it is preferable that the voltage is applied such that the electron blocking film 16A side is a cathode and the photoelectric conversion film 12 side is an anode. In a case where the photoelectric conversion element 10*a* (or 10*b*) is used as an optical sensor, or also in a case where the photoelectric conversion element 10*a* (or 10*b*) is incorporated in an imaging element, the voltage can be applied by the same method.

As described in detail below, the photoelectric conversion element 10*a* (or 10*b*) can be suitably applied to applications of the imaging element.

Hereinafter, the form of each layer constituting the photoelectric conversion element according to the embodiment of the present invention will be described in detail.

[Photoelectric Conversion Film]

The photoelectric conversion film is a film containing a specific compound.

Examples of the embodiment of the specific compound include a first embodiment described below and a second embodiment described below.

Hereinafter, each embodiment of the specific compound will be described in detail.

First Embodiment of Specific Compound

A first embodiment of the specific compound is a compound represented by Formula (1) described below.

$$\text{A-D-A} \qquad (1)$$

In Formula (1), D is a group represented by any of Formula (1-1) to Formula (1-15).

(1-1)

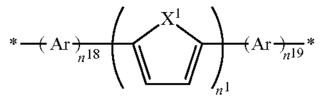

(1-2)

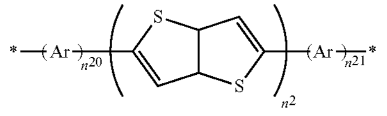

(1-3)

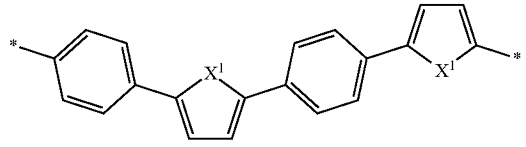

(1-4)

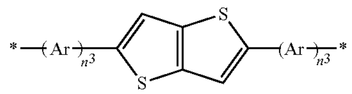

(1-5)

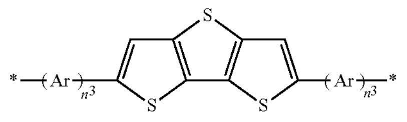

-continued (1-6)

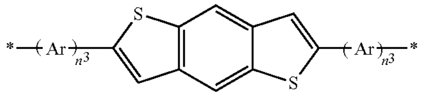

(1-7)

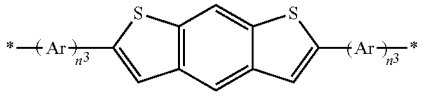

(1-8)

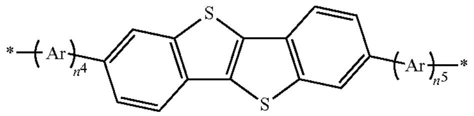

(1-9)

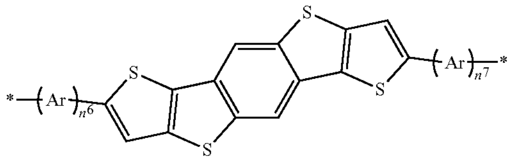

(1-10)

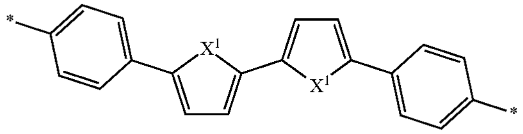

(1-11)

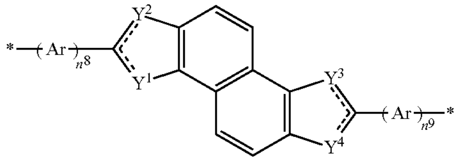

(1-12)

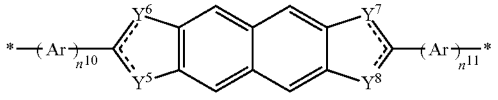

(1-13)

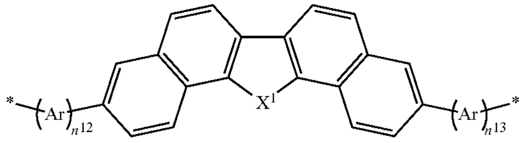

(1-14)

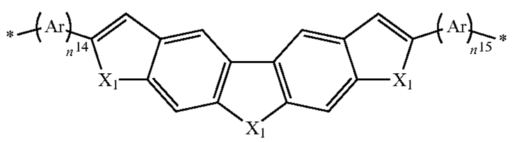

(1-15)

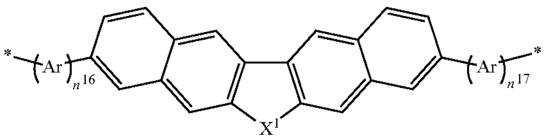

In Formula (1-1) to Formula (1-15), * represents a bonding position.

$X^1$ in Formula (1-1), Formula (1-3), Formula (1-10), Formula (1-13), Formula (1-14), and Formula (1-15) represents a sulfur atom, an oxygen atom, a selenium atom, or a tellurium atom. $X^1$ is preferably a sulfur atom or an oxygen atom, and more preferably a sulfur atom.

In Formula (1-11), one of $Y^1$ and $Y^2$ represents a sulfur atom, an oxygen atom, a selenium atom, or a tellurium atom, and the other one represents —CH=.

$Y^1$ and $Y^2$ may be in a form in which $Y^1$ represents a sulfur atom, an oxygen atom, a selenium atom, or a tellurium atom, and $Y^2$ represents —CH=, or may be in a form in which $Y^2$ represents a sulfur atom, an oxygen atom, a selenium atom, or a tellurium atom, and $Y^1$ represents —CH=.

A 5-membered ring containing $Y^1$ and $Y^2$ in Formula (1-11) is an aromatic ring.

In Formula (1-11), one of $Y^3$ and $Y^4$ represents a sulfur atom, an oxygen atom, a selenium atom, or a tellurium atom, and the other one represents —CH=.

$Y^3$ and $Y^4$ may be in a form in which $Y^3$ represents a sulfur atom, an oxygen atom, a selenium atom, or a tellurium atom, and $Y^4$ represents —CH=, or may be in a form in which $Y^4$ represents a sulfur atom, an oxygen atom, a selenium atom, or a tellurium atom, and $Y^3$ represents —CH=.

A 5-membered ring containing $Y^3$ and $Y^4$ in Formula (1-11) is an aromatic ring.

In Formula (1-12), one of $Y^5$ and $Y^6$ represents a sulfur atom, an oxygen atom, a selenium atom, or a tellurium atom, and the other one represents —CH=.

$Y^5$ and $Y^6$ may be in a form in which $Y^5$ represents a sulfur atom, an oxygen atom, a selenium atom, or a tellurium atom, and $Y^6$ represents —CH=, or may be in a form in which $Y^6$ represents a sulfur atom, an oxygen atom, a selenium atom, or a tellurium atom, and $Y^5$ represents —CH=.

A 5-membered ring containing $Y^5$ and $Y^6$ in Formula (1-12) is an aromatic ring.

In Formula (1-12), one of $Y^7$ and $Y^8$ represents a sulfur atom, an oxygen atom, a selenium atom, or a tellurium atom, and the other one represents —CH=.

$Y^7$ and $Y^8$ may be in a form in which $Y^7$ represents a sulfur atom, an oxygen atom, a selenium atom, or a tellurium atom, and $Y^8$ represents —CH=, or may be in a form in which $Y^8$ represents a sulfur atom, an oxygen atom, a selenium atom, or a tellurium atom, and $Y^7$ represents —CH=.

A 5-membered ring containing $Y^7$ and $Y^8$ in Formula (1-12) is an aromatic ring.

In Formula (1-1), $n^1$ represents an integer of 3 to 5.

In Formula (1-1), $n^{18}$ and $n^{19}$ each independently represent an integer of 0 to 2.

It is also preferable that $n^{18}$ and $n^{19}$ have the same value as each other.

In a case where both $n^{18}$ and $n^{19}$ are 1, it is also preferable that groups represented by two "—Ar—*" present in Formula (1-1) have the same structure as each other.

In a case where both $n^{18}$ and $n^{19}$ are 2, it is also preferable that groups represented by two "—Ar—Ar—*" present in Formula (1-1) have the same structure as each other.

In Formula (1-2), $n^2$ represents an integer of 3 to 5.

In Formula (1-2), $n^{20}$ and $n^{21}$ each independently represent an integer of 0 to 2.

It is also preferable that $n^2$ and $n^{21}$ have the same value as each other.

In a case where both $n^{20}$ and $n^{21}$ are 1, it is also preferable that groups represented by two "—Ar—*" present in Formula (1-2) have the same structure as each other.

In a case where both $n^{20}$ and $n^{21}$ are 2, it is also preferable that groups represented by two "—Ar—Ar—*" present in Formula (1-2) have the same structure as each other.

In Formula (1-4) to Formula (1-7), $n^3$ represents an integer of 0 to 2.

Here, at least one of two $n^3$'s present in each of Formula (1-4) to Formula (1-7) represents an integer of 1 or 2.

It is also preferable that two $n^3$'s present in each of Formula (1-4) to Formula (1-7) both represent an integer of 1 or 2.

It is also preferable that two $n^3$'s present in each of Formula (1-4) to Formula (1-7) both have the same value as each other.

In a case where two $n^3$'s present in each of Formula (1-4) to Formula (1-7) both are 1, groups represented by two "—Ar—*" present in each of Formula (1-4) to Formula (1-7) preferably have the same structure as each other.

In a case where two $n^3$'s present in each of Formula (1-4) to Formula (1-7) both are 2, groups represented by two "—Ar—Ar—*" present in each of Formula (1-4) to Formula (1-7) preferably have the same structure as each other.

In Formula (1-8), $n^4$ and $n^5$ each independently represent an integer of 0 to 2.

It is also preferable that $n^4$ and $n^5$ have the same value as each other.

In a case where both $n^4$ and $n^5$ are 1, it is also preferable that groups represented by two "—Ar—*" present in Formula (1-8) have the same structure as each other.

In a case where both $n^4$ and $n^5$ are 2, it is also preferable that groups represented by two "—Ar—Ar—*" present in Formula (1-8) have the same structure as each other.

In Formula (1-9), $n^6$ and $n^7$ each independently represent an integer of 0 to 2.

It is also preferable that $n^6$ and $n^7$ have the same value as each other.

In a case where both $n^6$ and $n^7$ are 1, it is also preferable that groups represented by two "—Ar—*" present in Formula (1-9) have the same structure as each other.

In a case where both $n^6$ and $n^7$ are 2, it is also preferable that groups represented by two "—Ar—Ar—*" present in Formula (1-9) have the same structure as each other.

In Formula (1-11), $n^8$ and $n^9$ each independently represent an integer of 0 to 2.

It is also preferable that $n^8$ and $n^9$ have the same value as each other.

In a case where both $n^8$ and $n^9$ are 1, it is also preferable that groups represented by two "—Ar—*" present in Formula (1-11) have the same structure as each other.

In a case where both $n^8$ and $n^9$ are 2, it is also preferable that groups represented by two "—Ar—Ar—*" present in Formula (1-11) have the same structure as each other.

In Formula (1-12), $n^{10}$ and $n^{11}$ each independently represent an integer of 0 to 2.

It is also preferable that $n^{10}$ and $n^{11}$ have the same value as each other.

In a case where both $n^{10}$ and $n^{11}$ are 1, it is also preferable that groups represented by two "—Ar—*" present in Formula (1-12) have the same structure as each other.

In a case where both $n^{10}$ and $n^{11}$ are 2, it is also preferable that groups represented by two "—Ar—Ar—*" present in Formula (1-12) have the same structure as each other.

In Formula (1-13), $n^{12}$ and $n^{13}$ each independently represent an integer of 0 to 2.

It is also preferable that $n^{12}$ and $n^{13}$ have the same value as each other.

In a case where both $n^{12}$ and $n^{13}$ are 1, it is also preferable that groups represented by two "—Ar—*" present in Formula (1-13) have the same structure as each other.

In a case where both $n^{12}$ and $n^{13}$ are 2, it is also preferable that groups represented by two "—Ar—Ar—*" present in Formula (1-13) have the same structure as each other.

In Formula (1-14), $n^{14}$ and $n^{15}$ each independently represent an integer of 0 to 2.

It is also preferable that $n^{14}$ and $n^{15}$ have the same value as each other.

In a case where both $n^{14}$ and $n^{15}$ are 1, it is also preferable that groups represented by two "—Ar—*" present in Formula (1-14) have the same structure as each other.

In a case where both $n^{14}$ and $n^{15}$ are 2, it is also preferable that groups represented by two "—Ar—Ar—*" present in Formula (1-14) have the same structure as each other.

In Formula (1-15), $n^{16}$ and $n^{17}$ each independently represent an integer of 0 to 2.

It is also preferable that $n^{16}$ and $n^{17}$ have the same value as each other.

In a case where both $n^{16}$ and $n^{17}$ are 1, it is also preferable that groups represented by two "—Ar—*" present in Formula (1-15) have the same structure as each other.

In a case where both $n^{16}$ and $n^{17}$ are 2, it is also preferable that groups represented by two "—Ar—Ar—*" present in Formula (1-15) have the same structure as each other.

One or more (for example, 1 to 12) of —CH═ contained in a ring structure of an aromatic ring specified in Formula (1-1) to Formula (1-15) may be substituted with $—CR^3═$ ($R^3$ is a halogen atom).

In Formula (1-3) and Formula (1-10), the aromatic ring specified above refers to all moieties in Formula. In addition, in Formula (1-1), Formula (1-2), Formula (1-4) to Formula (1-9), and Formula (1-11) to Formula (1-15), the above-specified aromatic rings refer to all moieties other than Ar in Formulae.

$Y^1$ to $Y^8$ in a case of —CH═ are also contained in the above-mentioned "—CH═ contained in a ring structure of an aromatic ring specified".

For example, the group represented by Formula (1-1) may be a group represented by Formula (1-1F) below, and the group represented by Formula (1-11) may be a group represented by Formula (1-11F) below.

Meanings of the symbols in Formula (1-1F) and Formula (1-11F) are the same as the corresponding symbols in Formula (1-1) and Formula (1-11), respectively.

(1-1F)

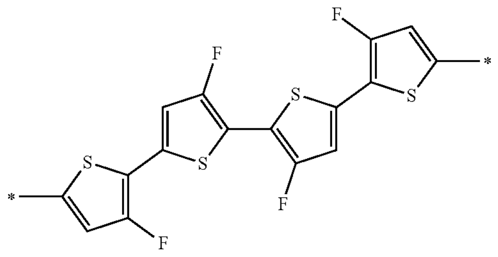

-continued (1-11F)

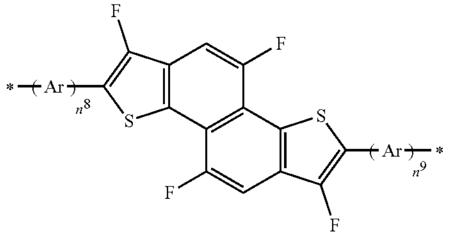

Ar in Formula (1-1) and Formula (1-2) is a group represented by Formula (2-3),

Ar in Formula (1-4) is a group represented by any of Formula (2-1) to Formula (2-3), Ar in Formula (1-5) to Formula (1-9) and Formula (1-11) to Formula (1-15) is a group represented by any of Formula (2-1) to Formula (2-4), In a case where the group represented by "—Ar—Ar—*" is present in Formula (1-4) to Formula (1-9) and Formula (1-11) to Formula (1-15), Ar on the opposite side to * (Ar not directly bonded to A in Formula (1)) and Ar on the * side (Ar directly bonded to A in Formula (1)) are each independently present, and may be groups represented by the same Formulae as each other or groups represented by different Formulae from each other.

(2-1)

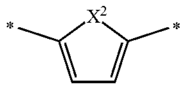

(2-2)

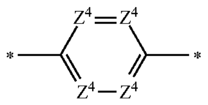

(2-3)

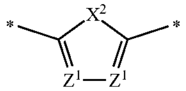

(2-4)

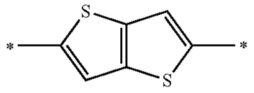

In Formula (2-1) to Formula (2-4), * represents a bonding position.

In Formula (2-1) and Formula (2-3), $X^2$ represents a sulfur atom, an oxygen atom, a selenium atom, or a tellurium atom.

In Formula (2-2), $Z^4$ represents —CH═ or —N═. Among four $Z^4$'s in Formula (2-2), zero to four $Z^4$'s are —N═.

In Formula (2-3), $Z^1$ represents —CH═ or —N═. Here, at least one of two $Z^1$'s in Formula (2-3) is —N═. Among the two $Z^1$'s in Formula (2-3), only $Z^1$ on a mother nucleus side in D may be —N═, only $Z^1$ on the opposite side to the mother nucleus is —N═, or both may be —N═. Among the two $Z^1$'s, at least $Z^1$ on the opposite side to the mother nucleus is preferably —N═.

The mother nucleus in D means a structure other than Ar in Formula (1-1) to Formula (1-2), Formula (1-4) to Formula (1-9), or Formula (1-11) to Formula (1-15).

One or more (for example, 1 and 2) of —CH═ constituting a group represented by Formula (2-1) may be substituted with —$CR^3$═ (where, $R^3$ is a halogen atom).

One or more (for example, 1 to 4) of —CH═ constituting a group represented by Formula (2-2) may be substituted with —$CR^3$═ (where, $R^3$ is a halogen atom).

One —CH═ constituting a group represented by Formula (2-3) may be substituted with —$CR^3$═ (where, $R^3$ is a halogen atom).

One or more (for example, 1 and 2) of —CH═ constituting a group represented by Formula (2-4) may be substituted with —$CR^3$═ (where, $R^3$ is a halogen atom).

Examples of Ar include a thiophene-2,5-diyl group, a furan-2,5-diyl group, a selenophen-2,5-diyl group, a para-phenylene group, a thiazole-2,5-diyl group, and 1,3,4-thiadiazol-diyl group.

One or more (for example, 1 to 20) of —CH═ contained in a ring structure of a group (a group represented by Formula (1-1) to Formula (1-15)) represented by D in Formula (1) may be substituted with —$CR^3$═.

$R^3$ represents a halogen atom.

The —CH═ contained in the ring structure may be —CH═ contained in a group represented by Ar, may be —CH═ capable of formed by $Y^1$ to $Y^8$, or may be —CH═ on any other moiety.

$R^3$ is preferably a fluorine atom, a chlorine atom, or a bromine atom, more preferably a fluorine atom or a chlorine atom, and still more preferably a fluorine atom.

From the viewpoint that the preventing properties of variation in sensitivity of the photoelectric conversion element are more excellent, D in Formula (1) is preferably a group represented by any of Formula (1-5) to Formula (1-7), Formula (1-9), and Formula (1-12) to Formula (1-15), more preferably a group represented by any of Formula (1-9) and Formula (1-12) to Formula (1-15), still more preferably a group represented by any of Formula (1-9), Formula (1-12), Formula (1-13), and Formula (1-15), still more preferably a group represented by any of Formula (1-12), Formula (1-13), and Formula (1-15), and particularly preferably a group represented by Formula (1-12).

In Formula (1), A is a group represented by any of Formula (3-1) to Formula (3-14).

Here, two A's present in Formula (1) are each a group having the same structure.

The fact that the two presenting A's are groups having the same structure means that the two presenting A's are not only groups represented by the same Formulae but also the contents of the groups represented by symbols in Formula are the same as each other.

(3-1)

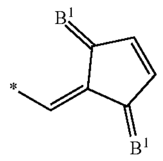

(3-2)

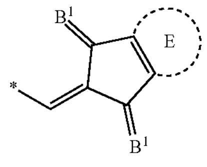

-continued

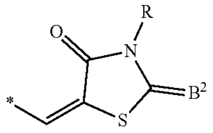

(3-3)

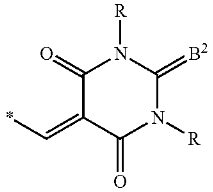

(3-4)

*—ArL—CN (3-5)

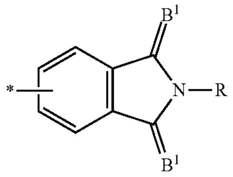

(3-6)

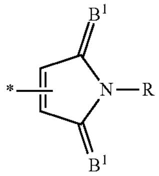

(3-7)

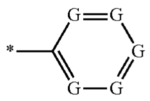

(3-8)

*—ArL—$(CF_3)_{m1}$ (3-9)

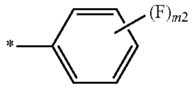

(3-10)

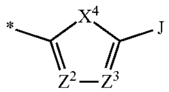

(3-11)

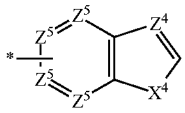

(3-12)

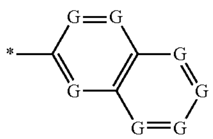

(3-13)

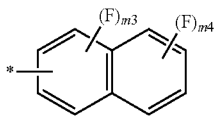

(3-14)

-continued

ArL =

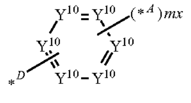

(Ar1)

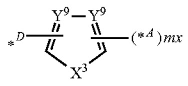

(Ar2)

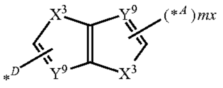

(Ar3)

in Formula (3-1) to Formula (3-14), * represents a bonding position, $B^1$ in Formula (3-1), Formula (3-2), Formula (3-6), and Formula (3-7), and $B^2$ in Formula (3-3) and Formula (3-4) each independently represent a sulfur atom, an oxygen atom, $=C(CN)_2$, or $=C(CN)(CO_2R^1)$.

$R^1$ represents an alkyl group having 1 or 2 carbon atoms, which may have a halogen atom as a substituent. The halogen atom that the alkyl group may have as a substituent is preferably a fluorine atom, a chlorine atom, or a bromine atom, more preferably a fluorine atom or a chlorine atom, and still more preferably a fluorine atom.

In Formula (3-2), E represents an aromatic ring, which may have a group selected from the group consisting of a halogen atom, a methyl group, an ethyl group, and a methoxy group, as a substituent.

The aromatic ring may be monocyclic or polycyclic.

The number of ring member atoms of the aromatic ring is preferably 5 to 15.

The aromatic ring may be an aromatic hydrocarbon ring or an aromatic heterocyclic ring.

Examples of the aromatic hydrocarbon ring include a benzene ring, a naphthalene ring, an anthracene ring, and a phenanthrene ring. Examples of the aromatic heterocycle ring include a quinoxaline ring, a pyrazine ring, a pyrrole ring, a furan ring, a thiophene ring, an imidazole ring, and an oxazole ring.

The number of substituents (groups selected from the group consisting of a halogen atom, a methyl group, an ethyl group, and a methoxy group) contained in the aromatic ring is, for example, 0 to 10.

The methyl group, the ethyl group, and the methoxy group, which may be contained in the aromatic ring, each may further have a halogen atom as a substituent.

R in Formula (3-3), Formula (3-4), Formula (3-6), and Formula (3-7) represents an alkyl group having 1 or 2 carbon atoms, which may have a halogen atom as a substituent.

The halogen atom that the alkyl group may have as a substituent is preferably a fluorine atom, a chlorine atom, or a bromine atom, more preferably a fluorine atom or a chlorine atom, and still more preferably a fluorine atom. The alkyl group preferably has one carbon atom.

In Formula (3-8), G represents $—CR^G=$ or $—N=$. $R^G$ represents a hydrogen atom, a halogen atom, or a cyano group.

Here, at least one (for example, 1 to 4) of five G's in Formula (3-8) is $—N=$.

Examples of the group represented by Formula (3-8) include a pyridinyl group, a pyrimidinyl group, a pyridazinyl group, a pyrazinyl group, a triazinyl group (1,2,3-triazinyl group, 1,2,4-triazinyl group, 1,3,5-triazinyl group, and other triazinyl groups), and a tetrazinyl group (1,2,4,5-tetrazinyl group and other tetrazinyl groups), which may have a group selected from the group consisting of a halogen atom as a substituent and a cyano group as a substituent. Among these, the group represented by Formula (3-8) is preferably a pyrimidinyl group, which may have a group selected from the group consisting of a halogen atom as a substituent and a cyano group as a substituent.

It is also preferable that G at the para-position with respect to the bonding position of Formula (3-8) is —$CR^G$═ in which $R^G$ is a halogen atom or a cyano group.

In Formula (3-9), m1 represents an integer of 1 to 5. m1 preferably represents an integer of 1 to 4, more preferably represents an integer of 1 to 3, and still more preferably represents an integer of 1 or 2.

In a case where ArL in Formula (3-9) is a group represented by Formula (Ar2) or Formula (Ar3), m1 represents an integer of 1 to 3, and an integer of 1 or 2 is preferable.

Formula (Ar1) to Formula (Ar3) will be described later in detail.

In Formula (3-10), m2 represents an integer of 1 to 5. m2 preferably represents an integer of 1 to 4, and more preferably represents an integer of 1 to 3.

One or more (for example, 1 to (5−m2), and preferably 1 and 2) of —CH═ contained in a ring structure of a group represented by Formula (3-10) may be substituted with —$CR^4$═. $R^4$ represents a halogen atom (chlorine atom) other than a fluorine atom.

In other words, the group represented by Formula (3-10) is a phenyl group having m2 fluorine atoms and a halogen atom other than 0 to (5−m2) fluorine atoms as substituents.

In Formula (3-11), $X^4$ represents a sulfur atom, an oxygen atom, a selenium atom, or a tellurium atom.

$Z^2$ and $Z^3$ each independently represent —$CR^Z$═ or —N═. $R^Z$ represents a hydrogen atom or a halogen atom (such as a fluorine atom). Here, at least one of $Z^2$ and $Z^3$ in Formula (3-11) is —N═.

Among $Z^2$ and $Z^3$ in Formula (3-11), only $Z^2$ may be —N═, only $Z^3$ may be —N═, or both $Z^2$ and $Z^3$ may be —N═. At least $Z^2$ is preferably —N═.

J represents a hydrogen atom, a halogen atom, an aryl group, a heteroaryl group, or an alkyl group having 1 or 2 carbon atoms, which may have a halogen atom as a substituent. The aryl group and the heteroaryl group that are represented by J may have one or both of a halogen atom and an alkyl group, which has a halogen atom as a further substituent and has 1 or 2 carbon atoms.

The aryl group may be monocyclic or polycyclic, and the number of ring member atoms is preferably 6 to 12. Examples of the aryl group include a phenyl group and a naphthyl group.

The heteroaryl group may be monocyclic or polycyclic, and the number of ring member atoms is preferably 5 to 12. The number of heteroatoms contained in the heteroaryl group is preferably 1 to 5. Examples of the heteroatom include a sulfur atom, an oxygen atom, a selenium atom, and a tellurium atom.

In Formula (3-11), J and $Z^3$ may be bonded to each other to form an aromatic ring, which may have a halogen atom as a substituent.

The aromatic ring formed by bonding J and $Z^3$ to each other is an aromatic ring condensed into a monocyclic structure of a 5-membered ring containing $X^4$, $Z^2$, and $Z^3$ specified in Formula (3-11).

The aromatic ring formed by bonding J and $Z^3$ to each other may be monocyclic or polycyclic. In addition, the fact that the aromatic ring is polycyclic means that monocyclic structures including $X^4$, $Z^2$, and $Z^3$ specified in Formula (3-11) are not counted as the number of rings, and separately, means that J and $Z^3$ are bonded to each other to form an aromatic ring (such as a naphthalene ring) composed of two or more (for example, 2 or 3 rings).

The number of ring member atoms of the aromatic ring formed by bonding J and $Z^3$ to each other is preferably 5 to 12.

The aromatic ring formed by bonding J and $Z^3$ to each other may be an aromatic hydrocarbon ring or a heteroaromatic ring. In a case where the aromatic ring is a heteroaromatic ring, the number of heteroatoms is preferably 1 to 5. Examples of the heteroatom include a sulfur atom, an oxygen atom, a selenium atom, and a tellurium atom.

Examples of the aromatic ring formed by bonding J and $Z^3$ to each other include a benzene ring.

The aromatic ring formed by bonding J and $Z^3$ to each other may have a halogen atom (a fluorine atom or other halogen atoms) as a substituent. In a case where the aromatic ring group has a halogen atom as a substituent, the number thereof is preferably 1 to 4.

In a case where J and $Z^3$ are bonded to each other to form an aromatic ring, both $Z^2$ and $Z^3$ may be other than —N═.

For example, Formula (3-11) may be a 2-benzothiazolyl group or a benzo[b]thiophene-2-yl group as a whole. The benzene ring moiety of these groups may have a halogen atom (fluorine atom or other halogen atoms) as a substituent.

A group represented by Formula (3-11) is preferably a group represented by Formula (3-11-1) or a group represented by Formula (3-11-2).

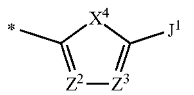

(3-11-1)

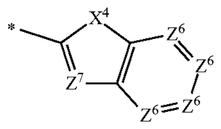

(3-11-2)

In Formula (3-11-1) and Formula (3-11-2), * represents a bonding position.

In Formula (3-11-1), $X^4$ represents a sulfur atom, an oxygen atom, a selenium atom, or a tellurium atom.

In Formula (3-11-1), $Z^2$ and $Z^3$ each independently represent —$CR^Z$═ or —N═. $R^Z$ represents a hydrogen atom or a halogen atom (such as a fluorine atom). Here, at least one of $Z^2$ and $Z^3$ in Formula (3-11-1) is —N═.

In Formula (3-11-1), J represents a hydrogen atom, a halogen atom, an aryl group, a heteroaryl group, or an alkyl group having 1 to 2 carbon atoms, which may have a halogen atom as a substituent, and a hydrogen atom, a halogen atom, an aryl group, or a heteroaryl group is preferable, a hydrogen atom, an aryl group, or a heteroaryl group is more preferable, and an aryl group or a heteroaryl group is still more preferable.

The aryl group and the heteroaryl group that are represented by $J^1$ may have one or both of a halogen atom and an alkyl group, which has a halogen atom as a further substituent and has 1 or 2 carbon atoms. The aryl group and the heteroaryl group represented by $J^1$ are each preferably unsubstituted or preferably have a halogen atom as a substituent, and are more preferably unsubstituted.

$J^1$ in Formula (3-11-1) and $Z^3$ may not be bonded to each other.

$J^1$ in Formula (3-11-1) is identical to J in Formula (3-11) except that $J^1$ and $Z^3$ may not be bonded to each other.

In Formula (3-11-2), $X^4$ represents a sulfur atom, an oxygen atom, a selenium atom, or a tellurium atom.

In Formula (3-11-2), $Z^6$ and $Z^7$ each independently represent —$CR^Z$═ or —N═. $R^Z$ represents a hydrogen atom or a halogen atom (such as a fluorine atom).

0 to 5 out of a total of five groups in $Z^6$ and $Z^7$ are each —N═. In a case where neither $Z^6$ nor $Z^7$ is —N═ and Ar is present in D, at least one (for example, 1 to 4) Ar is preferably a group represented by Formula (2-2) or a group represented by Formula (2-3), in which at least one (for example, 1 to 4) in $Z^4$'s is preferably —N═, and is more preferably a group represented by Formula (2-3).

In addition, the term "Ar present in D" means that a group represented by Ar is present in a group represented by D. For example, in a case where D is a group represented by Formula (1-12) and at least one of $n^{10}$ and $n^{11}$ is a group representing an integer of 1 or 2, it can be said that "Ar is present in D".

In Formula (3-12), $X^4$ represents a sulfur atom, an oxygen atom, a selenium atom, or a tellurium atom.

$Z^4$ and $Z^5$ each independently represent —$CR^Z$═ or —N═. $R^Z$ represents a hydrogen atom or a halogen atom (such as a fluorine atom). Here, one of four $Z^5$'s in Formula (3-12) is a substituent including a carbon atom. That is, one of the four $Z^5$'s in Formula (3-12) is a carbon atom bonded to D in Formula (1).

In addition, 0 to 4 out of a total of five groups in $Z^4$ and $Z^5$ are each —N═. In a case where neither $Z^4$ nor $Z^5$ is —N═ and Ar is present in D, at least one (for example, 1 to 4) Ar is preferably a group represented by Formula (2-2) or a group represented by Formula (2-3), in which at least one (for example, 1 to 4) in $Z^4$'s is preferably —N═, and is more preferably a group represented by Formula (2-3).

In Formula (3-13), G represents —$CR^G$═ or —N═. $R^G$ represents a hydrogen atom, a halogen atom, or a cyano group.

At least one (for example, 1 to 7) of seven G's in Formula (3-13) is —N═.

An example of a group represented by Formula (3-13) includes a quinolinyl group (2-quinolinyl group or other quinolinyl groups), which may have a group selected from the group consisting of a halogen atom and a cyano group as a substituent.

In Formula (3-14), m3 represents an integer of 0 to 3.

m4 represents an integer of 0 to 4.

However, in Formula (3-14), (m3+m4) is 1 or more (for example, 1 to 7), preferably 1 to 4, and more preferably 1 to 3.

One or more (for example, 1 to (7-m3-m4), and preferably 1 and 2) of —CH═ contained in a ring structure of a group represented by Formula (3-14) may be substituted with —$CR^4$═. $R^4$ represents a halogen atom (chlorine atom) other than a fluorine atom.

In other words, the group represented by Formula (3-14) is a naphthyl group having (m3+m4) fluorine atoms and a halogen atom other than 0 to (7-m3-m4) fluorine atoms as substituents.

In Formula (3-5) and Formula (3-9), ArL is a group represented by any of Formula (Ar1) to Formula (Ar3).

In Formula (Ar1) to Formula (Ar3), $*^D$ represents a bonding position with respect to a group represented by D. $*^D$ is identical to a bonding position (*) specified in Formula (3-5) and Formula (3-9).

In Formula (Ar1) to Formula (Ar3), $*^A$ represents a bonding position with respect to a group other than the group represented by D.

That is, $*^A$ in ArL (a group represented by any of Formula (Ar1) to Formula (Ar3)) in Formula (3-5) is a bonding position with CN in Formula (3-5).

In addition, $*^A$ in ArL (a group represented by any of Formula (Ar1) to Formula (Ar3)) in Formula (3-9) is a bonding position with $CF_3$ in Formula (3-9).

In Formula (Ar1) to Formula (Ar3), mx is 1 in a group represented by any of Formula (Ar1) to Formula (Ar3) as ArL in Formula (3-5), and is the same value as m1 in a group represented by any of Formula (Ar1) to Formula (Ar3) as ArL in Formula (3-9).

In Formula ($Ar^1$), $Y^{10}$ represents —CH═ or —$CR^3$═. $R^3$ represents a halogen atom (preferably a fluorine atom).

In a case where $Y^{10}$ is —CH═, a hydrogen atom in $Y^{10}$ that is —CH═ described above may be substituted to be a bonding position ($*^A$ and/or $*^D$)

In other words, $Y^{10}$ is —$CR^3$═, —C($*^A$)═, —C($*^D$)═, or unsubstituted —$CH_2$═.

Then, in six $Y^{10}$'s in Formula (Ar1), one is —C($*^D$)═, mx is —C($*^A$)═, and the remaining (5-mx) is a group selected from the group consisting of —$CR^3$═ and unsubstituted —CH═.

In a case where ArL is a group represented by Formula (Ar1), in a group represented by Formula (3-5), the two bonding positions ($*^A$ and $*^D$) in Formula (Ar1) are preferably present at para-positions with respect to each other.

In Formula (Ar2) and Formula (Ar3), $X^3$ represents a sulfur atom, an oxygen atom, a selenium atom, or a tellurium atom.

In Formula (Ar2) and Formula (Ar3), $Y^9$ represents —CH═, —$CR^2$═, or —N═. $R^2$ represents a halogen atom or an alkyl group having 1 or 2 carbon atoms, which may have a halogen atom as a substituent.

In a case where $Y^9$ is —CH═, a hydrogen atom in $Y^9$ that is —CH═ described above may be substituted to be a bonding position ($*^A$ and/or $*^D$).

In other words, $Y^9$ is —$CR^2$═, —C($*^A$)═, —C($*^D$)═, or unsubstituted —$CH_2$═.

That is, among a total of four of two —CH2═ and two $Y^9$'s in Formula (Ar2), one is —C($*^D$)═, and mx is —C($*^A$)═.

Similarly, among a total of four of two —CH2═ and two $Y^9$'s in Formula (Ar3), one is —C($*^D$)═, and mx is —C($*^A$)═.

For example, the group represented by Formula (3-5) may be a group represented by Formula (3-5A) below, and the group represented by Formula (3-9) may be a group represented by Formula (3-9A) below.

(3-5A)

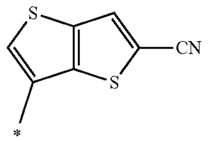

(3-9A)

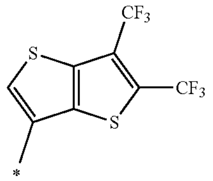

From the viewpoint that the present invention exhibits a more excellent effect, A in Formula (1) is preferably a group represented by any of Formula (3-2), Formula (3-3), Formula (3-5), Formula (3-6), and Formula (3-8), and more preferably a group represented by any of Formula (3-3), Formula (3-5), Formula (3-6), and Formula (3-8).

Here, in the specific compound, a combination of the group represented by D and the group represented by A has certain conditions (hereinafter, also simply referred to as "combination requirements").

The combination requirements will be described below.

In a case where A is a group represented by Formula (3-5) and D is a group represented by Formula (1-8) in which $n^4$ and $n^5$ are each independently an integer of 1 or 2 and all Ar's are a group represented by Formula (2-1), ArL in Formula (3-5) is a group represented by Formula (Ar1) or Formula (Ar3).

In a case where A is a group represented by Formula (3-8), D is a group represented by Formula (1-1) to Formula (1-7), a group represented by Formula (1-8) in which $n^4$ and $n^5$ are each independently an integer of 1 or 2 and Ar is a group represented by Formula (2-3), a group represented by Formula (1-9), a group represented by Formula (1-11) in which $n^8$ and $n^9$ are each independently an integer of 1 or 2 and Ar is a group represented by Formula (2-3), a group represented by Formula (1-12) or Formula (1-13), a group represented by Formula (1-14) in which $n^{14}$ and $n^{15}$ are each independently an integer of 1 or 2, or a group represented by Formula (1-15).

In a case where A is a group represented by Formula (3-9), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2, a group represented by Formula (1-6) in which $n^3$ is an integer of 1 or 2, a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^1$ and $n^7$ are each independently an integer of 1 or 2, a group represented by Formula (1-10), a group represented by Formula (1-11) in which $n^8$ and $n^9$ are each independently an integer of 1 or 2, a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2.

In a case where A is a group represented by Formula (3-10), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2 and Ar is a group represented by Formula (2-3), a group represented by Formula (1-6) in which $n^3$ is an integer of 1 or 2 and Ar is a group represented by Formula (2-3) or Formula (2-4), a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-11) in which $n^8$ and $n^9$ are each independently an integer of 1 or 2 and Ar is a group represented by Formula (2-3), a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2.

In a case where A is a group represented by Formula (3-11) and D is a group represented by Formula (1-8), J and $Z^3$ in Formula (3-11) may not be bonded to each other to form an aromatic ring.

In a case where A is a group represented by Formula (3-11) and D is a group represented by Formula (1-11) in which $n^8$ and $n^9$ both are 0, J and $Z^3$ in Formula (3-11) may not be bonded to each other to form an aromatic ring.

In a case where A is a group represented by Formula (3-11), and D is a group represented by Formula (1-12) in which $n^{10}$ and $n^{11}$ both are 1 and all Ar's are a group represented by Formula (2-2), J and $Z^3$ in Formula (3-11) may not be bonded to each other to form an aromatic ring.

In a case where A is a group represented by Formula (3-12), D is a group represented by Formula (1-1) to Formula (1-7), a group represented by Formula (1-8) in which $n^4$ and $n^5$ are each independently an integer of 1 or 2, a group represented by Formula (1-9) or Formula (1-10), a group represented by Formula (1-11) in which $n^8$ and $n^9$ are each independently an integer of 1 or 2 and Ar is a group represented by Formula (2-3) or Formula (2-4), or a group represented by Formula (1-12) to Formula (1-15).

when A is a group represented by Formula (3-12) and D is a group represented by Formula (1-12), a case that $n^{10}$ and $n^{11}$ both are 1, and all Ar's are a group represented by Formula (2-2) is excluded.

In a case where A is a group represented by Formula (3-13), D is a group represented by Formula (1-1) to Formula (1-7), a group represented by Formula (1-8) in which $n^4$ and $n^5$ are each independently an integer of 1 or 2 and Ar is a group represented by Formula (2-3) or Formula (2-4), a group represented by Formula (1-9) or Formula (1-10), a group represented by Formula (1-11) in which $n^8$ and $n^9$ are each independently an integer of 1 or 2 and Ar is a group represented by Formula (2-3) or Formula (2-4), a group represented by Formula (1-12) in which $n^{10}$ and $n^{11}$ are each independently an integer of 1 or 2 and Ar is a group represented by Formula (2-1), Formula (2-3), or Formula (2-4), or a group represented by Formula (1-13) to Formula (1-15).

In the case of the above-described "group in which Ar directly bonded to A is represented by Formula (2-3)", two Ar's among all Ar's, which are directly bonded to A, may be groups represented by Formula (2-3). Any group may be present. In addition, Ar represented by Formula (2-3) may or may not be present. In a case where Ar's that are not directly bonded to A are present, all of them may be groups represented by Formula (2-3), or some or all of them may be groups represented by any other Formula than Formula (2-3).

In a case where A is a group represented by Formula (3-1) to Formula (3-4), Formula (3-6), Formula (3-7), and Formula (3-14), D may any of Formula (1-1) to Formula (1-15), which is not particularly limited.

The above described descriptions are the combination requirements.

In a case where a specific compound has a partial structure that can correspond to any of a group represented by Formula (3-8) and a group represented by Formula (3-11), the specific compound is construed as a specific compound having a group represented by Formula (3-8) as a group represented by A as long as it does not deviate the combination requirements described above.

In a case where a specific compound has a partial structure that can correspond to any of a group represented by Formula (3-9) and a group represented by Formula (3-11), the specific compound is construed as a specific compound having a group represented by Formula (3-9) as a group represented by A as long as it does not deviate the combination requirements described above.

In a case where a specific compound has a partial structure that can correspond to any of a group represented by Formula (3-10) and a group represented by Formula (3-11), the specific compound is construed as a specific compound having a group represented by Formula (3-10) as a group represented by A as long as it does not deviate the combination requirements described above.

In a case where a specific compound has a partial structure that can correspond to any of a group represented by Formula (3-12) and a group represented by Formula (3-11), the specific compound is construed as a specific compound having a group represented by Formula (3-12) as a group represented by A as long as it does not deviate the combination requirements described above.

In a case where a specific compound has a partial structure that can correspond to any of a group represented by Formula (3-13) and a group represented by Formula (3-11), the specific compound is construed as a specific compound having a group represented by Formula (3-13) as a group represented by A as long as it does not deviate the combination requirements described above.

In a case where a specific compound has a partial structure that can correspond to any of a group represented by Formula (3-14) and a group represented by Formula (3-11), the specific compound is construed as a specific compound having a group represented by Formula (3-14) as a group represented by A as long as it does not deviate the combination requirements described above.

In a case where a specific compound has a partial structure that can correspond to any of a group represented by Formula (3-14) and a group represented by Formula (3-13), the specific compound is construed as a specific compound having a group represented by Formula (3-14) as a group represented by A as long as it does not deviate the combination requirements described above.

From the viewpoint that the preventing properties of variation in sensitivity of the photoelectric conversion element are more excellent, A in Formula (1) is preferably a group represented by any of Formula (3-1) to Formula (3-3), and Formula (3-5) to Formula (3-14), more preferably a group represented by any of Formula (3-5) and Formula (3-8) to Formula (3-14), still more preferably a group represented by any of Formula (3-8), and Formula (3-10) to Formula (3-14), particularly preferably a group represented by any of Formula (3-10) to Formula (3-12), Formula (3-13), and Formula (3-14), still particularly preferably a group represented by any of Formula (3-11) and Formula (3-12), and most preferably a group represented by Formula (3-11).

Examples of the combination of D and A in the specific compound include the following examples.

In Formula (1), in a case where D is a group represented by Formula (1-1), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-3), Formula (3-5), Formula (3-6), and Formula (3-8) is preferable.

In Formula (1), in a case where D is a group represented by Formula (1-2), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-5) is preferable.

In Formula (1), in a case where D is a group represented by Formula (1-3), A may be a group represented by any of Formula (3-1) to Formula (3-8), and Formula (3-11) to Formula (3-14) as long as the combination requirements described above are satisfied.

In Formula (1), in a case where D is a group represented by Formula (1-4), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-5) is preferable.

In Formula (1), in a case where D is a group represented by Formula (1-5), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-2), Formula (3-3), Formula (3-5), Formula (3-8), Formula (3-9), and Formula (3-11) is preferable, the group represented by any of Formula (3-2), Formula (3-3), and Formula (3-5) is more preferable, and the group represented by any of Formula (3-3) and Formula (3-5) is still more preferable.

However, in a case where D is a group represented by Formula (1-5) and A is a group represented by Formula (3-2), Ar in Formula (1-5) is preferably a group represented by Formula (2-1), in which $X^2$ is an oxygen atom.

In Formula (1), in a case where D is a group represented by Formula (1-6), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-11) is preferable.

In Formula (1), in a case where D is a group represented by Formula (1-7), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-7) is preferable.

In Formula (1), in a case where D is a group represented by Formula (1-8), A may be a group represented by any of Formula (3-1) to Formula (3-14) as long as the combination requirements described above are satisfied.

In Formula (1), in a case where D is a group represented by Formula (1-9), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-5), Formula (3-9), and Formula (3-10) is preferable, and the group represented by Formula (3-5) is more preferable.

In addition, in a case where D is a group represented by Formula (1-9) and A is a group represented by Formula (3-8), Ar in Formula (1-9) is preferably a group represented by Formula (2-2), or Formula (3-8) is preferably a pyrimidin-5-yl group.

In Formula (1), in a case where D is a group represented by Formula (1-10), A may be a group represented by any of Formula (3-1) to Formula (3-7), Formula (3-9), and Formula (3-11) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-2) is preferable.

In Formula (1), in a case where D is a group represented by Formula (1-11), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-5) is preferable.

In Formula (1), in a case where D is a group represented by Formula (1-12), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-8), Formula (3-9), Formula (3-10), Formula (3-11), Formula (3-12), and Formula (3-13) is preferable.

In Formula (1), in a case where D is a group represented by Formula (1-13), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-5) is preferable.

In Formula (1), in a case where D is a group represented by Formula (1-14), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-8), Formula (3-9), and Formula (3-10) is preferable.

In Formula (1), in a case where D is a group represented by Formula (1-15), A may be a group represented by any of Formula (3-1) to Formula (3-14) as long as the combination requirements described above are satisfied. From the viewpoint that the sensitivity, the responsiveness, and/or the preventing properties of variation in response of the photoelectric conversion element are more excellent, the group represented by any of Formula (3-8) is preferable.

Hereinafter, specific examples of the group represented by D in Formula (1) will be described. In the following, "*" and "•" each represent a bonding position.

d-1-1

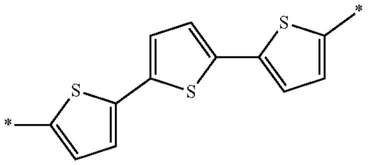

d-1-2

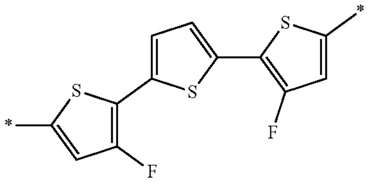

d-1-3

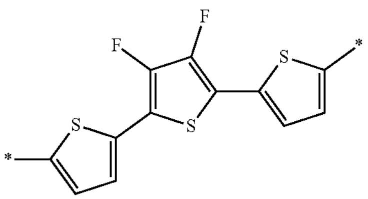

d-1-4

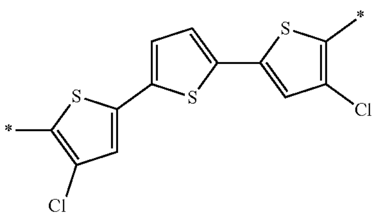

d-1-5

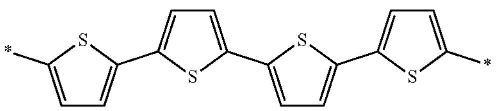

d-1-6

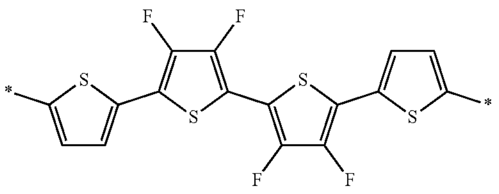

-continued
d-1-7
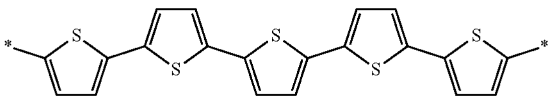
d-1-8
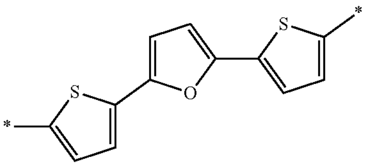
d-1-9
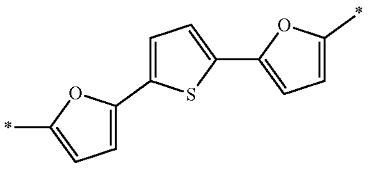
d-1-10
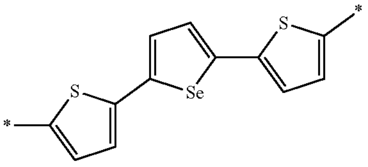
d-1-11
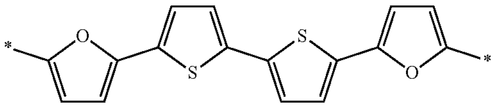
d-2-1
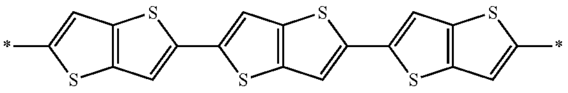
d-2-2
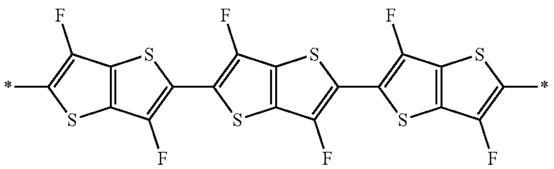
d-2-3
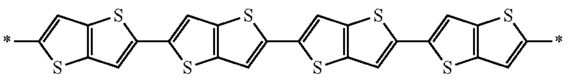
d-2-4
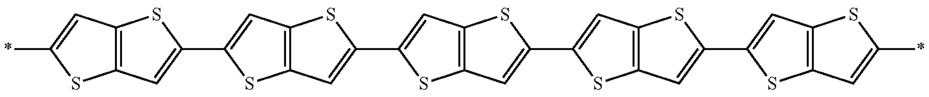
d-3-1
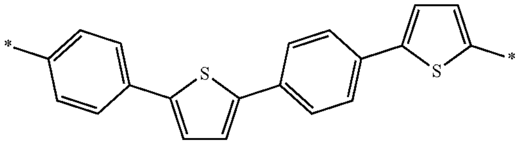
d-3-2
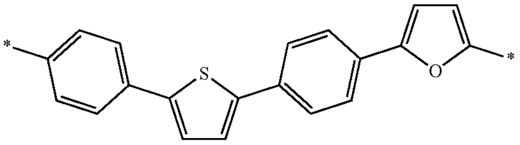
d-3-3
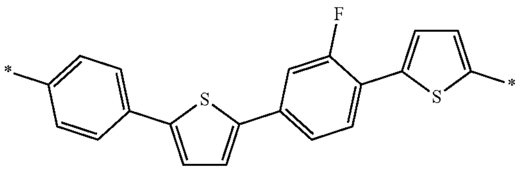
d-3-4
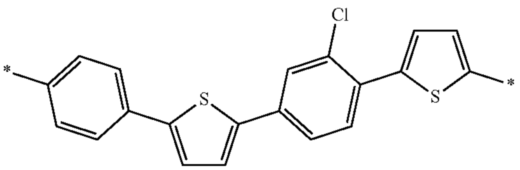
d-4-1
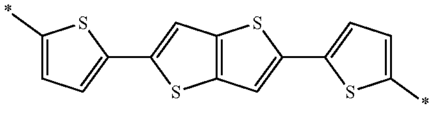
d-4-2
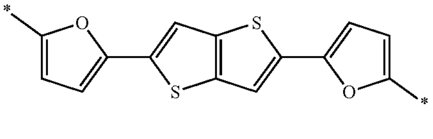
d-4-3
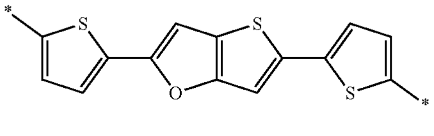
d-4-4
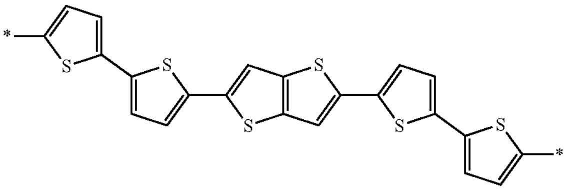

-continued
d-4-5
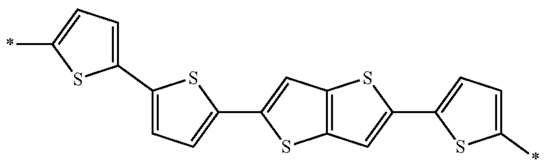
d-4-6
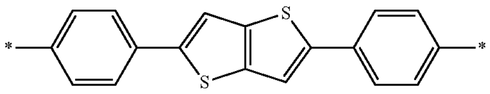
d-4-7
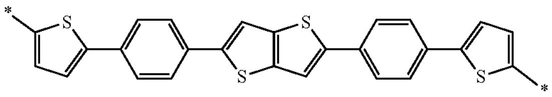
d-4-8
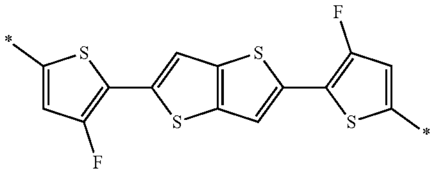
d-4-9
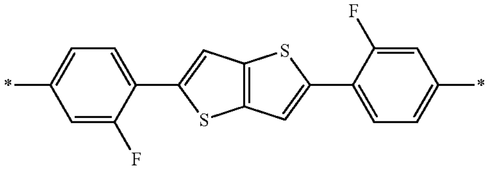
d-4-10
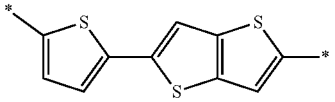
d-4-11
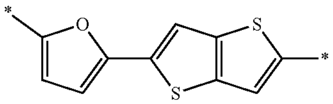
d-5-1
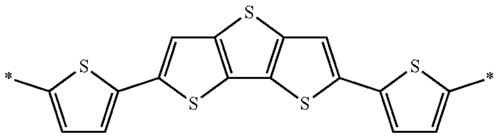
d-5-2
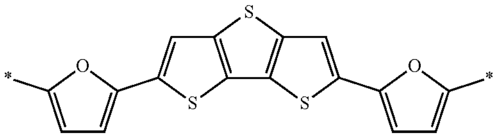
d-5-3
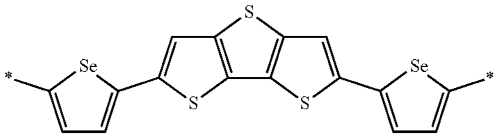
d-5-4
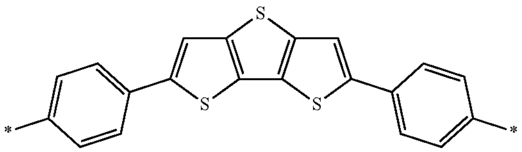
d-5-5
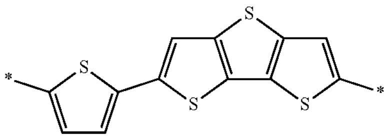
d-5-6
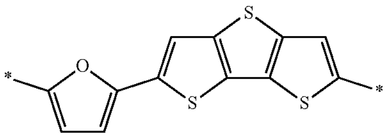
d-5-7
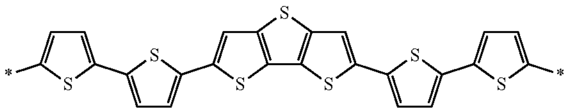
d-5-8
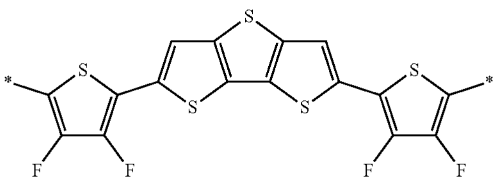
d-6-1
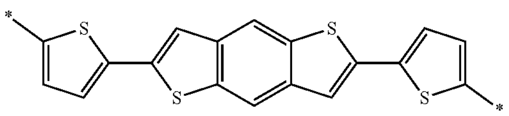
d-6-2
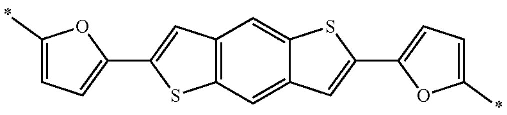
d-6-3
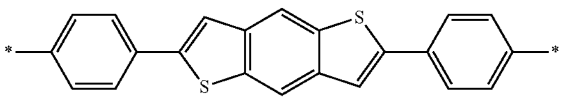

-continued
d-6-4
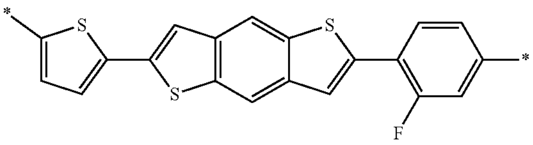
d-7-1
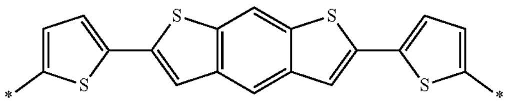
d-7-2
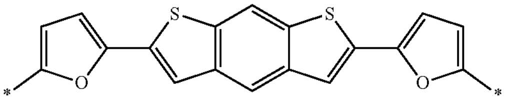
d-7-3
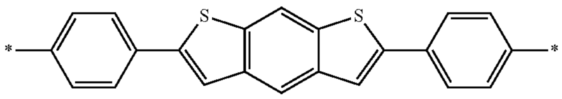
d-7-4
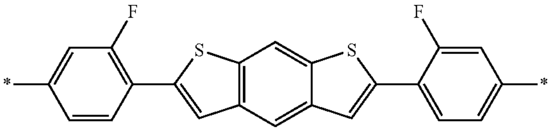
d-8-1
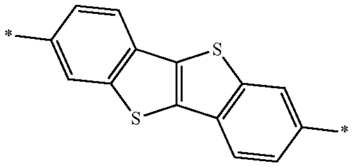
d-8-2
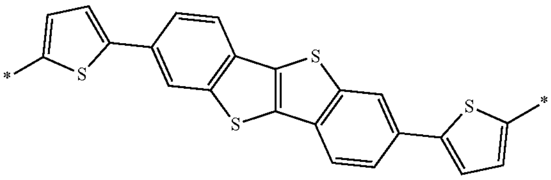
d-8-3
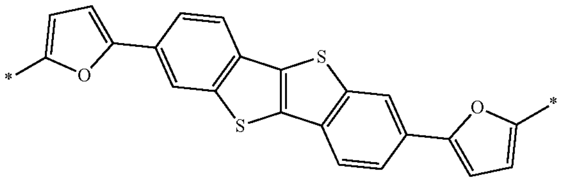
d-8-4
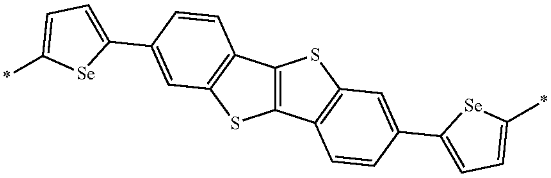
d-8-5
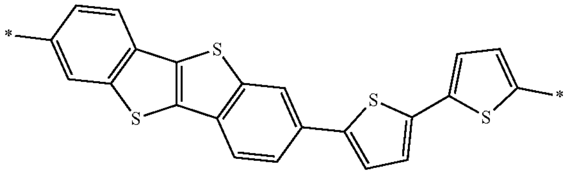
d-8-6
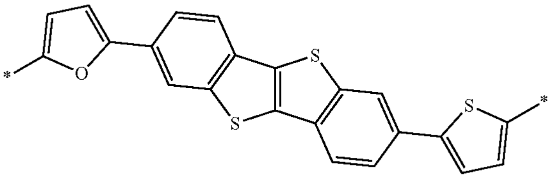
d-8-7
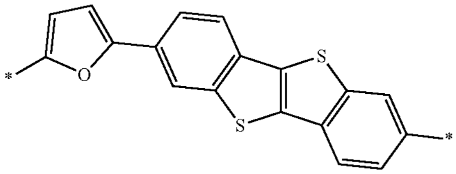
d-8-8
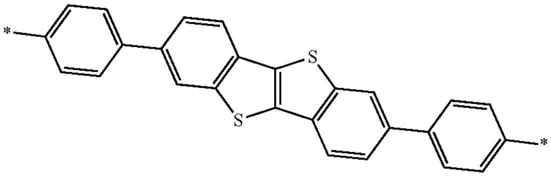
d-8-9
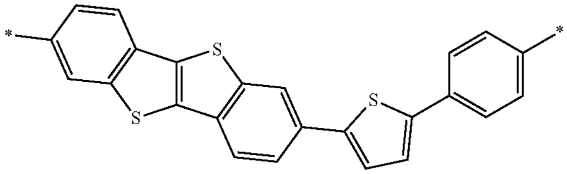
d-8-10
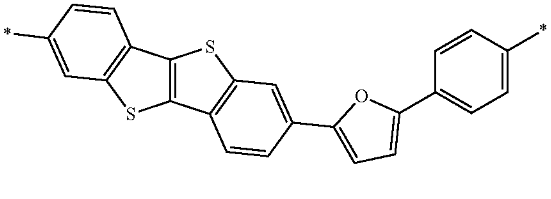
d-8-11
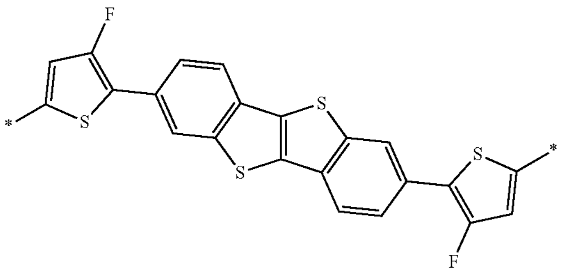

-continued
d-9-1
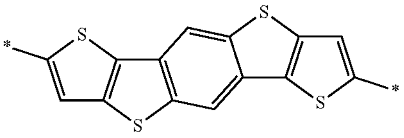
d-9-3
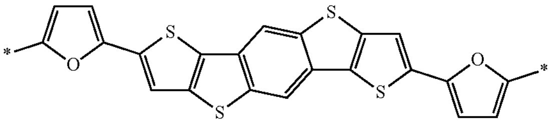
d-9-5
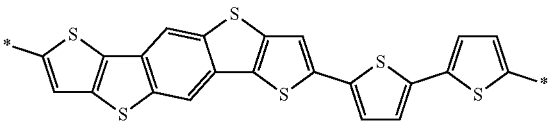
d-9-7
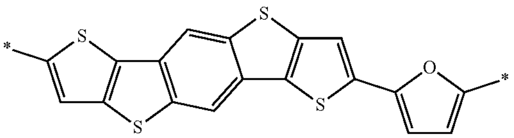
d-9-9
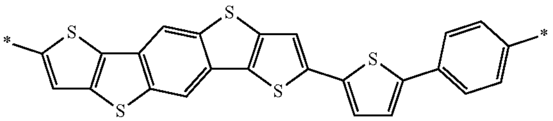
d-9-11
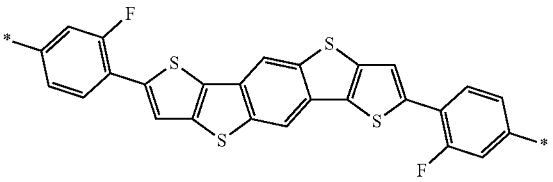
d-10-2
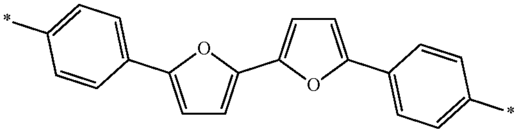
d-11-1
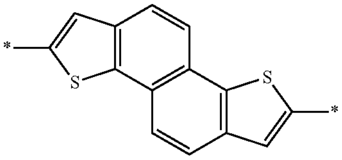
d-11-3
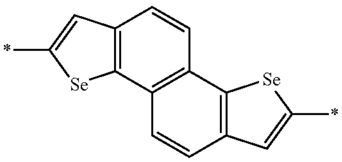
d-9-2
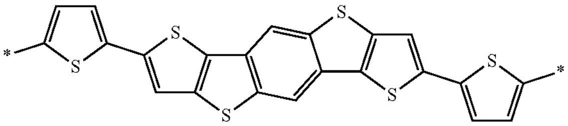
d-9-4
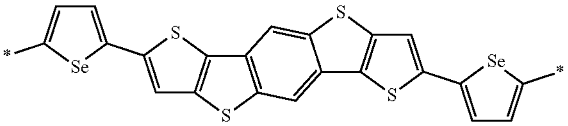
d-9-6
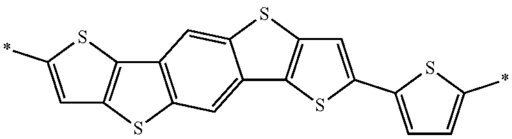
d-9-8
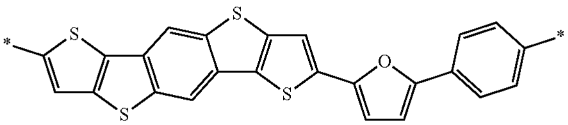
d-9-10
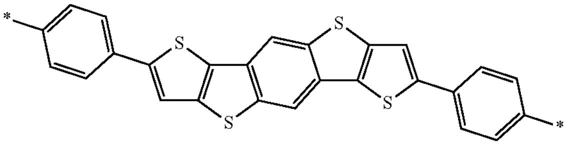
d-10-1
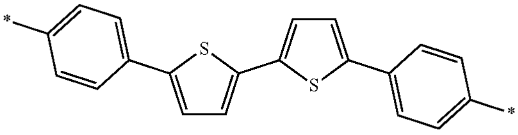
d-10-3
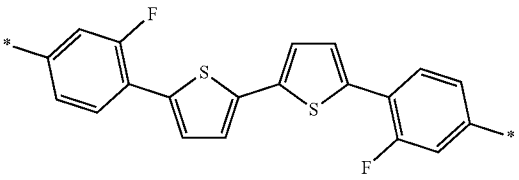
d-11-2
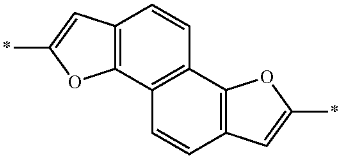
d-11-4
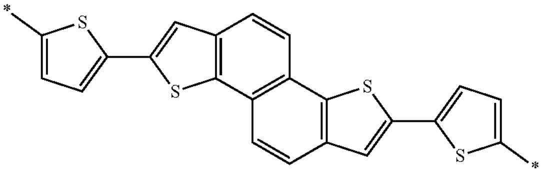

-continued
d-11-5
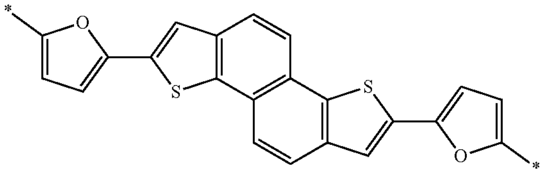
d-11-6
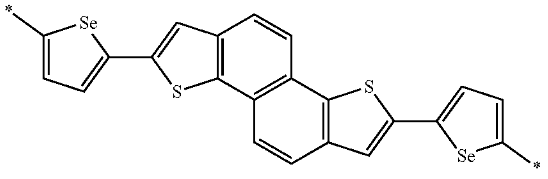
d-11-7
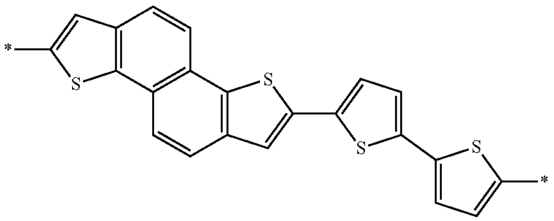
d-11-8
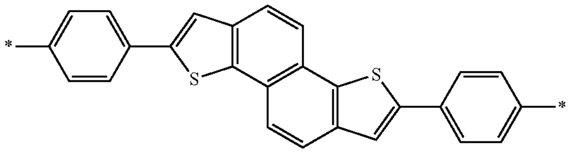
d-11-9
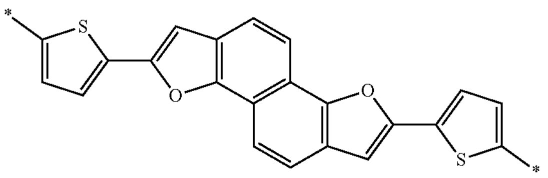
d-11-10
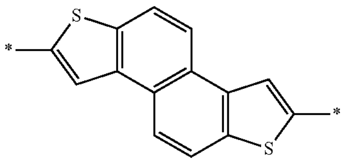
d-11-11
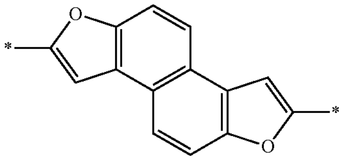
d-11-12
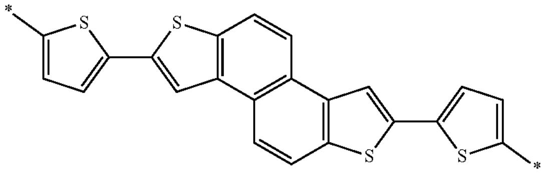
d-11-13
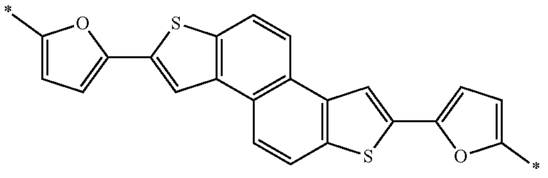
d-11-14
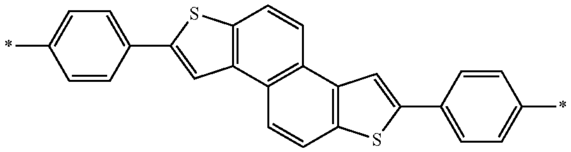
d-11-15
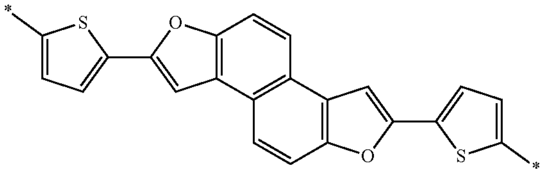
d-12-1
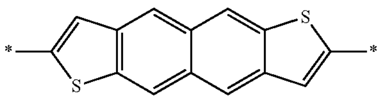
d-12-2
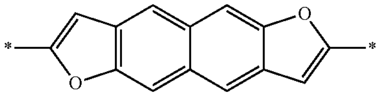
d-12-3
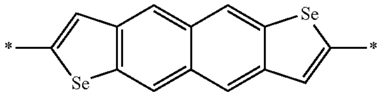
d-12-4
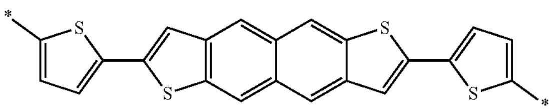
d-12-5
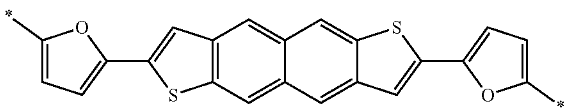

-continued
d-12-6
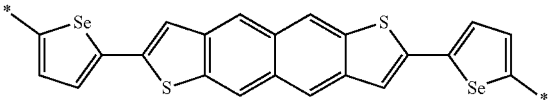
d-12-7
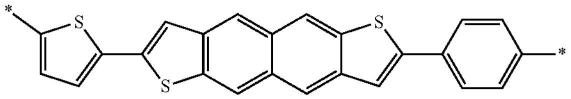
d-12-8
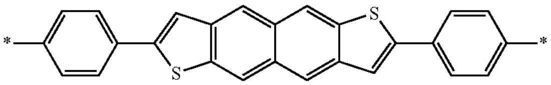
d-12-9
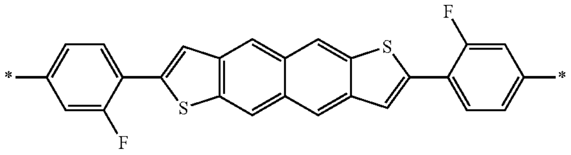
d-12-10
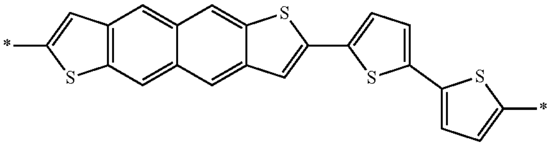
d-12-11
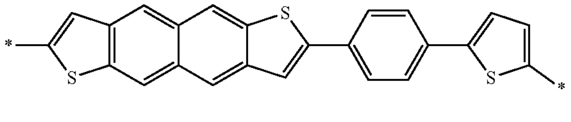
d-12-12
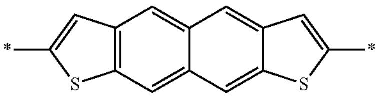
d-12-13
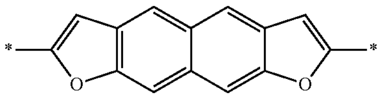
d-12-14
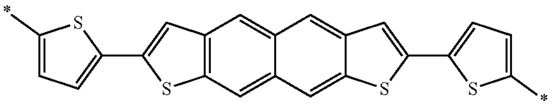
d-13-1
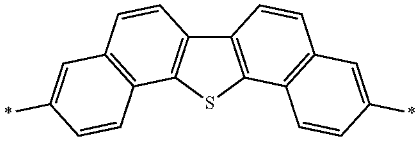
d-13-2
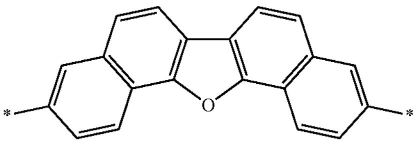
d-13-3
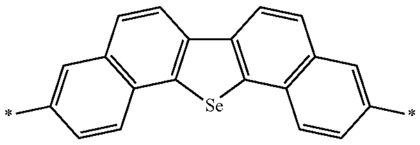
d-13-4
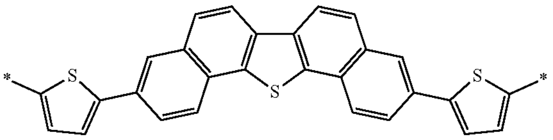
d-13-5
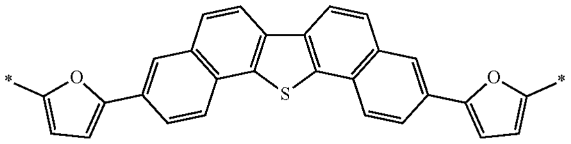
d-13-6
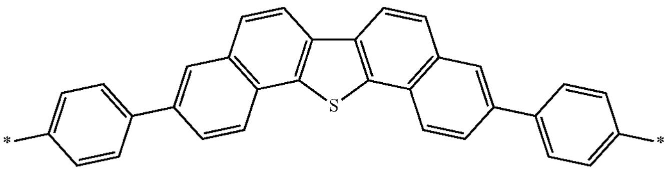
d-13-7
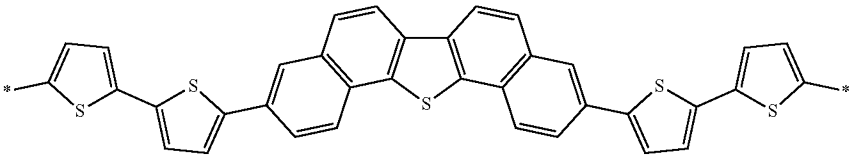
d-14-1
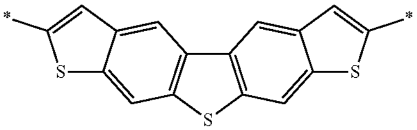
d-14-2
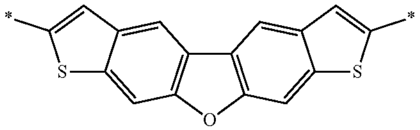

-continued
d-14-3
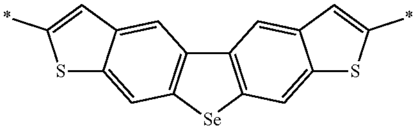
d-14-4
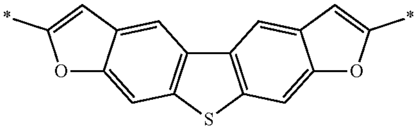
d-14-5
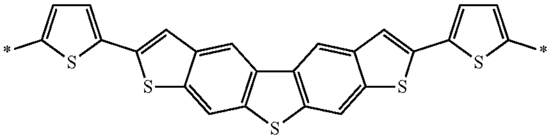
d-14-6
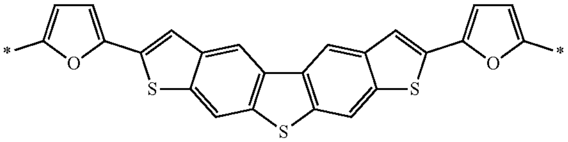
d-14-7
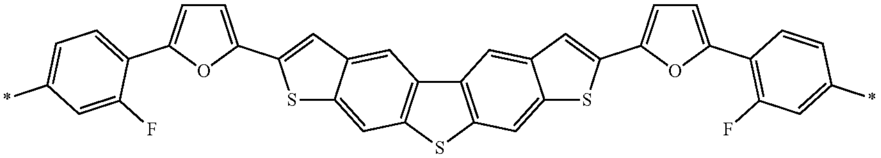
d-14-8
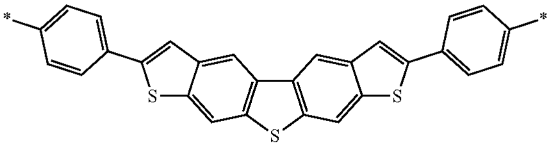
d-14-9
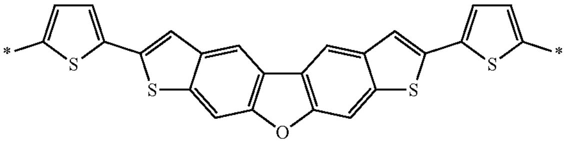
d-14-10
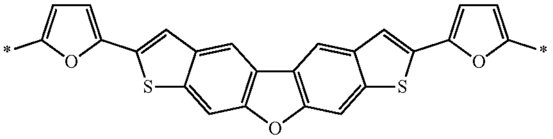
d-14-11
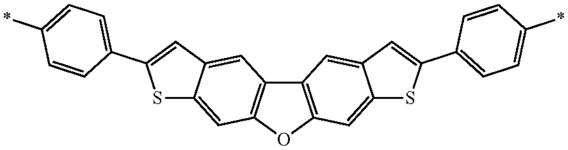
d-15-1
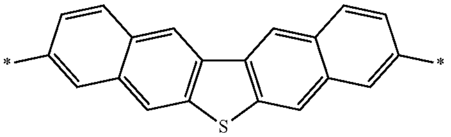
d-15-2
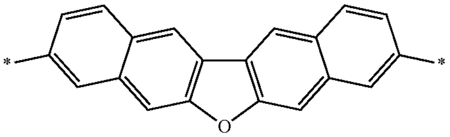
d-15-3
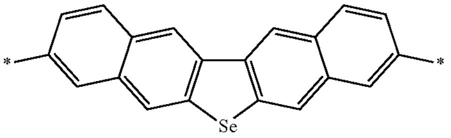
d-15-4
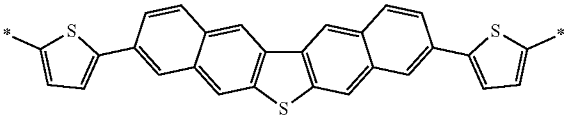
d-15-5
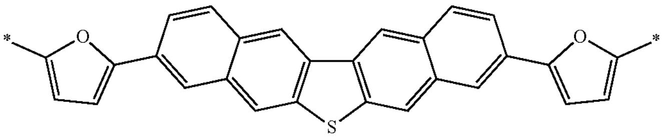
d-15-6
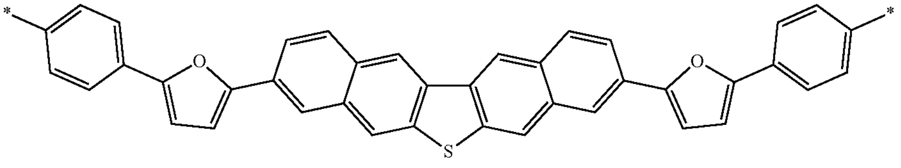

-continued
d-15-7
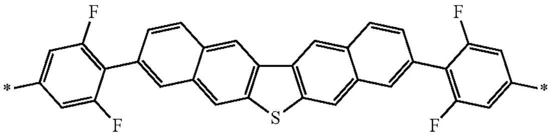
d-16-1
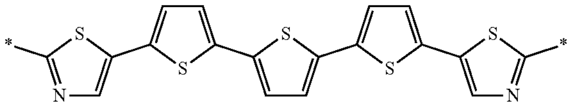
d-16-2
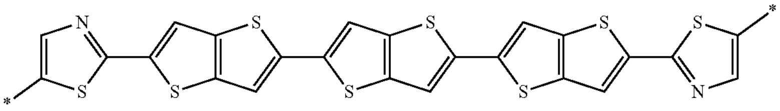
d-16-3
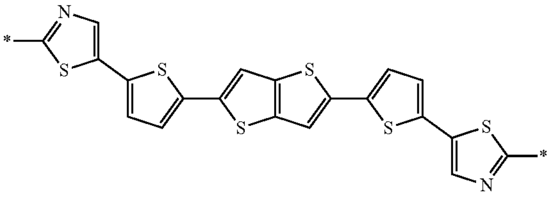
d-16-4
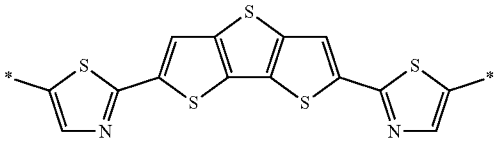
d-16-5
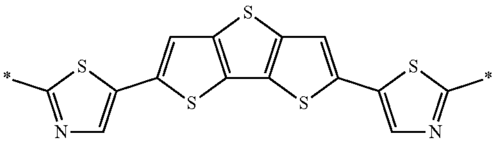
d-16-6
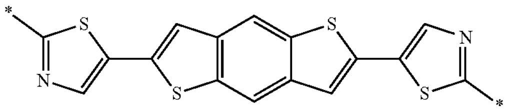
d-16-7
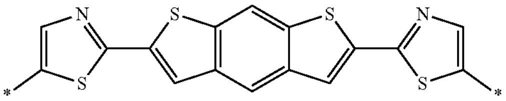
d-16-8
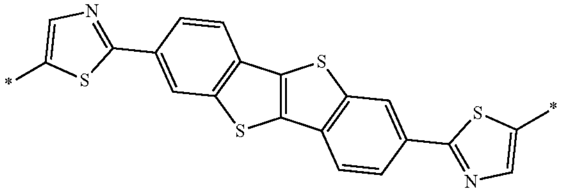
d-16-9
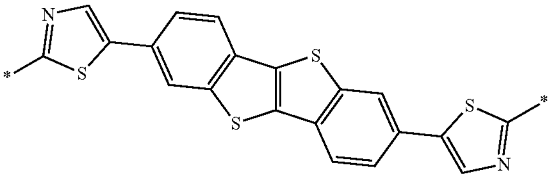
d-16-10
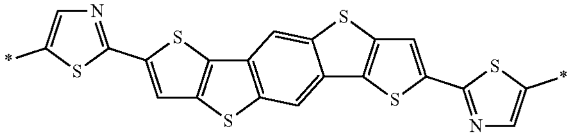
d-16-11
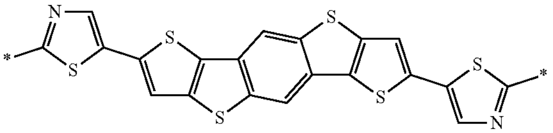
d-16-12
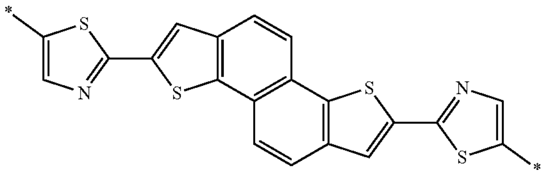
d-16-13
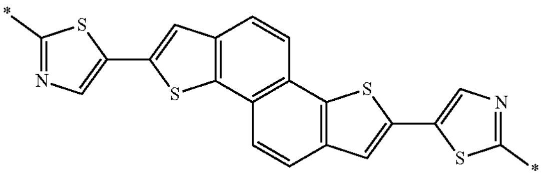
d-16-14
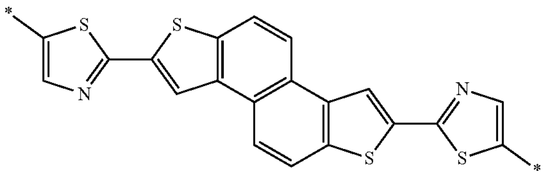

-continued
d-16-15
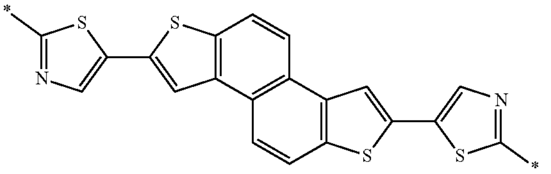
d-16-16
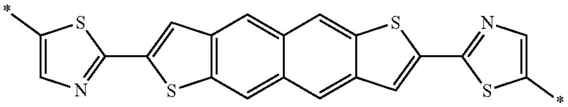
d-16-17
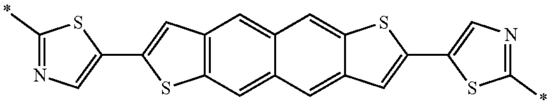
d-16-18
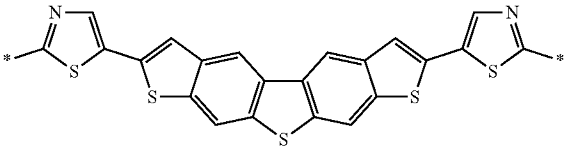
d-17-1
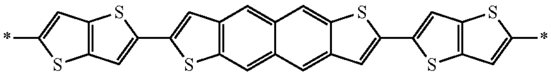
d-17-2
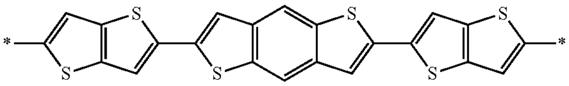
d-17-3
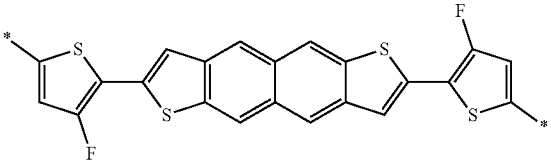
d-17-4
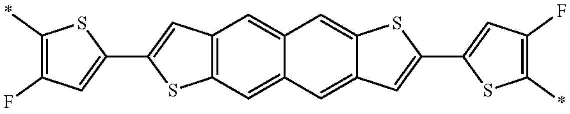
d-17-5
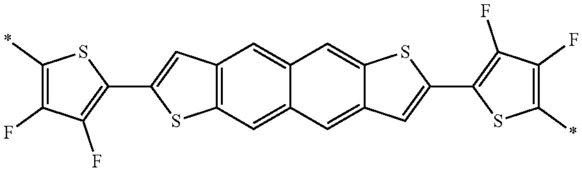
Hereinafter, specific examples of the group represented by A in Formula (1) will be described. In the following, "*" and "•" each represent a bonding position.
a-1-1
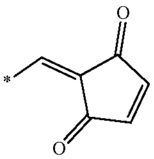
a-1-2
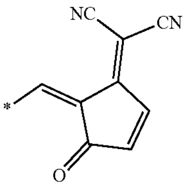
a-1-3
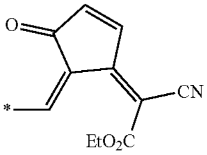
-continued
a-2-1
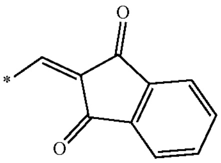
a-2-2
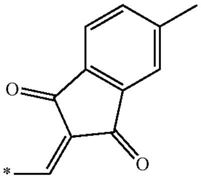
a-2-3
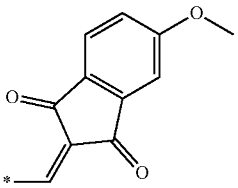

-continued
a-2-4
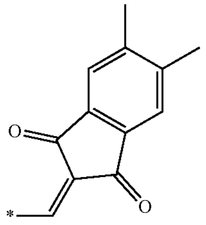
a-2-5
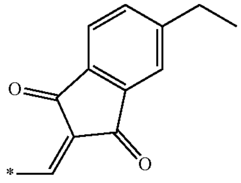
a-2-6
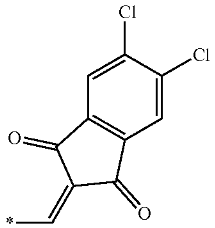
a-2-7
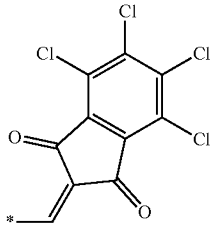
a-2-8
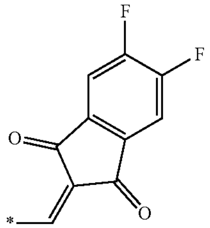
a-2-9
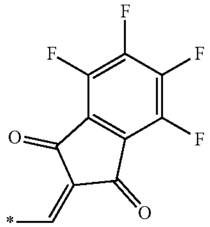
a-2-10
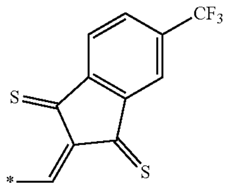
-continued
a-2-11
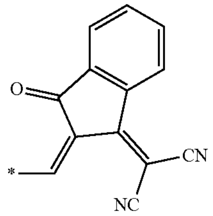
a-2-12
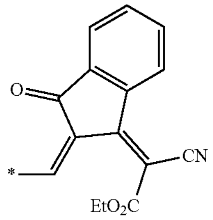
a-2-13
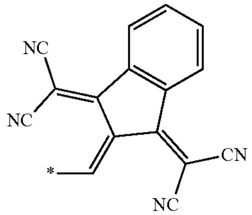
a-3-1
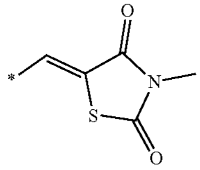
a-3-2
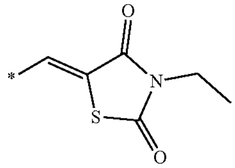
a-3-3
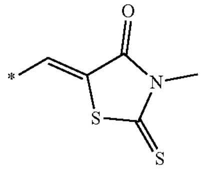
a-3-4
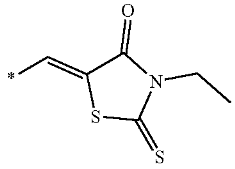
a-3-5
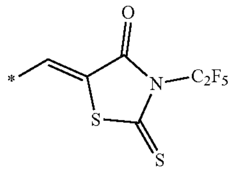

-continued
a-3-6
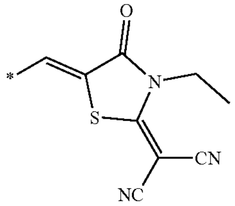
a-3-7
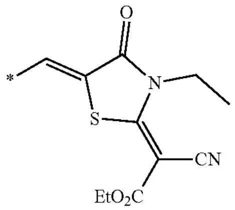
a-4-1
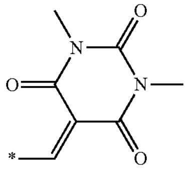
a-4-2
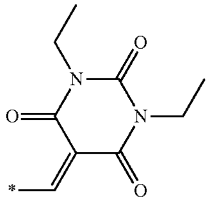
a-4-3
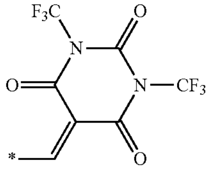
a-4-4
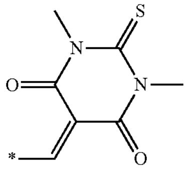
a-4-5
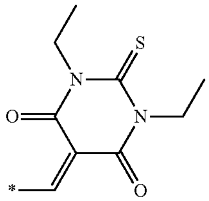
a-4-6
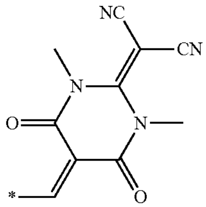
-continued
a-5-1
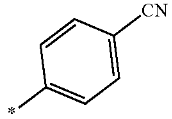
a-5-2
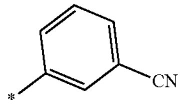
a-5-3
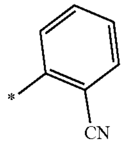
a-5-4
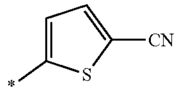
a-5-5
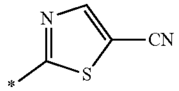
a-5-6
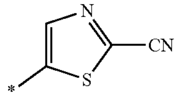
a-5-7
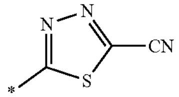
a-5-8
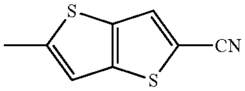
a-5-9
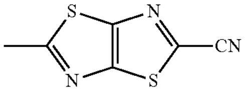
a-6-1
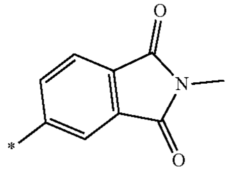
a-6-2
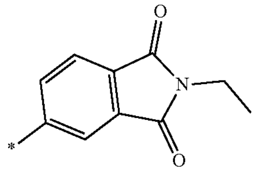
a-6-3
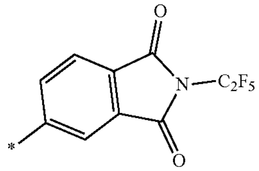

-continued
a-6-4
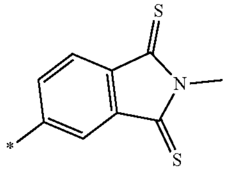
a-6-5
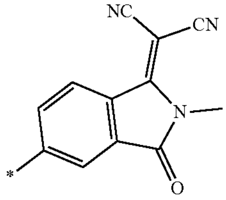
a-6-6
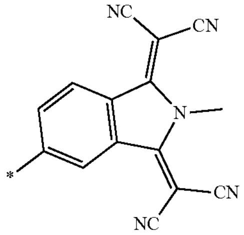
a-6-7
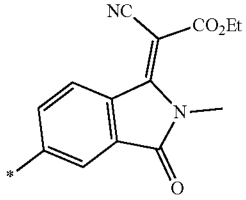
a-8-1
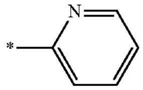
a-8-2
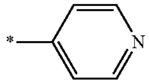
a-8-3
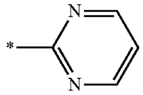
a-8-4
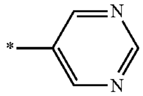
a-8-5
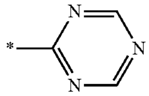
a-8-6
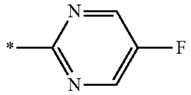
a-8-7
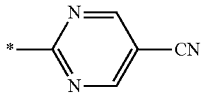
-continued
a-8-8
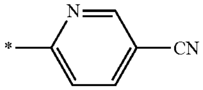
a-8-9
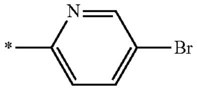
a-8-10
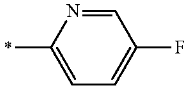
a-8-11
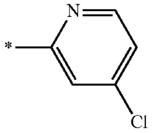
a-9-1
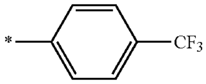
a-9-2
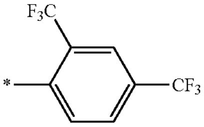
a-9-3
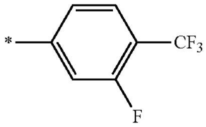
a-9-4
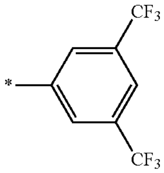
a-9-5
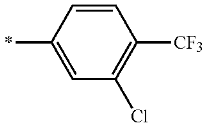
a-9-6
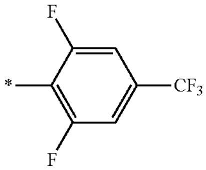
a-9-7
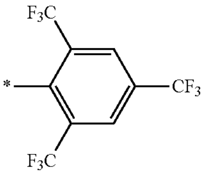
a-9-8
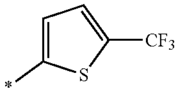

-continued
a-9-9
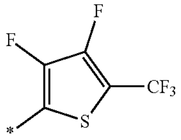
a-9-10
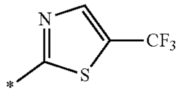
a-9-11
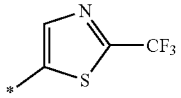
a-9-12
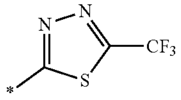
a-9-13
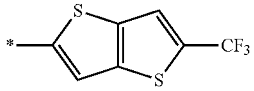
a-9-14
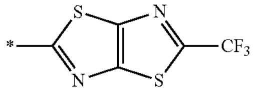
a-10-1
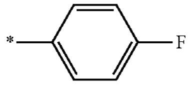
a-10-2
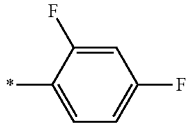
a-10-3
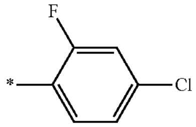
a-10-4
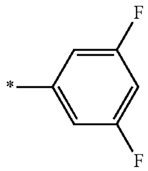
a-10-5
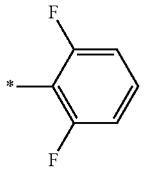
a-10-6
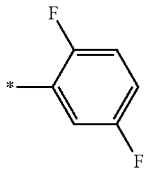
-continued
a-10-7
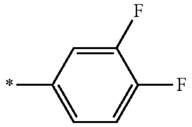
a-10-8
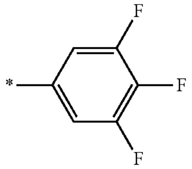
a-10-9
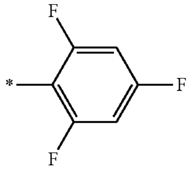
a-10-10
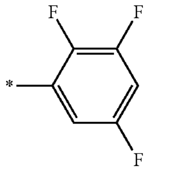
a-10-11
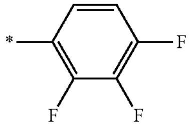
a-10-12
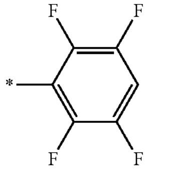
a-10-13
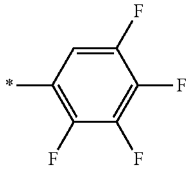
a-10-14
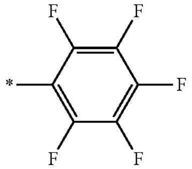
a-11-1
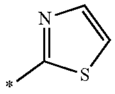
a-11-2
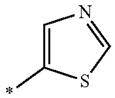

-continued
a-11-3
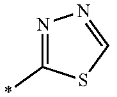
a-11-4
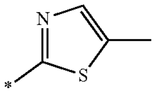
a-11-5
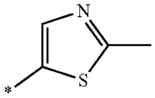
a-11-6
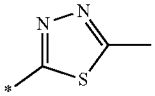
a-11-7
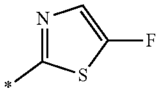
a-11-8
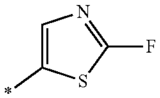
a-11-9
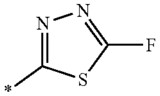
a-11-10
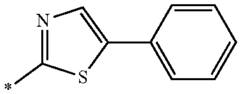
a-11-11
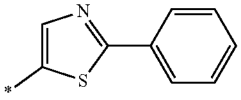
a-11-12
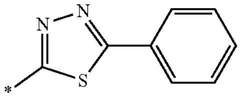
a-11-13
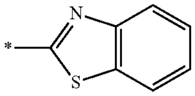
a-12-1
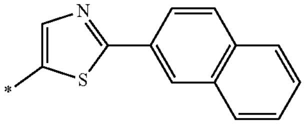
a-12-2
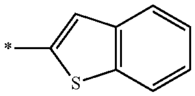
a-12-3
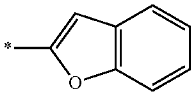
-continued
a-12-4
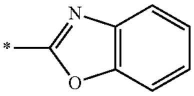
a-12-5
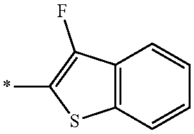
a-12-6
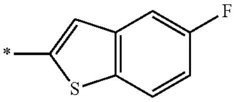
a-12-7
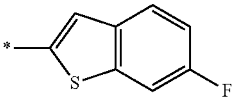
a-12-8
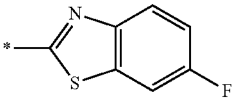
a-12-9
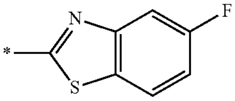
a-12-10
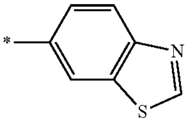
a-12-11
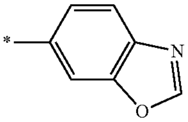
a-12-12
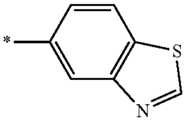
a-12-13
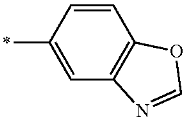
a-12-14
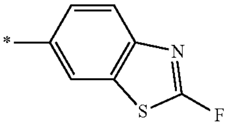
a-13-1
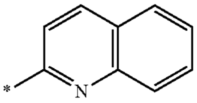
a-13-2
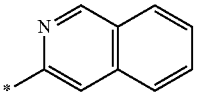

-continued a-13-3

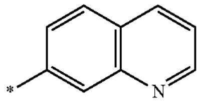

a-13-4

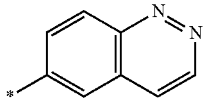

a-13-5

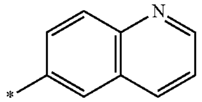

a-13-6

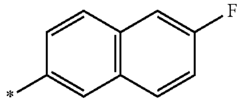

a-13-7

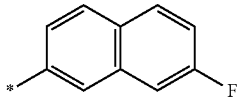

a-13-8

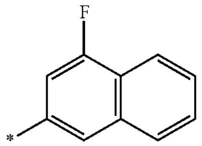

a-13-9

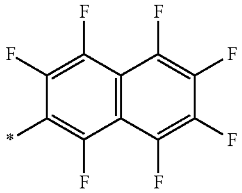

Hereinafter, specific examples of the specific compound (the compound represented by Formula (1)) will be described.

The specific compound is a compound represented by "A-D-A".

In the following Table, compound names are described in the "No." column, structures of groups represented by D in the above-described "A-D-A" are described in the "D" column, and structures of groups represented by A in the above-described "A-D-A" are described in the "A" column.

The specific structures of the groups described in the "D" column are as shown as the specific examples of the groups represented by D.

The specific structures of the groups described in the "A" column are as shown as the specific examples of the groups represented by A.

For example, a compound "p-1-1" has, as the group represented by D in Formula (1), a group d-1-1 represented by a specific example of the group represented by D, and has, as the group represented by A, a group of a-1-1 represented by a specific example of the group represented by A.

TABLE 1

| No. | D | A |
|---|---|---|
| p-1-1 | d-1-1 | a-1-1 |
| p-1-2 | d-1-1 | a-1-2 |
| p-1-3 | d-1-1 | a-1-3 |
| p-1-4 | d-1-1 | a-2-1 |
| p-1-5 | d-1-1 | a-2-2 |
| p-1-6 | d-1-1 | a-2-3 |
| P-1-7 | d-1-1 | a-2-4 |
| p-1-8 | d-1-1 | a-2-5 |
| p-1-9 | d-1-1 | a-2-6 |
| p-1-10 | d-1-1 | a-2-7 |
| p-1-11 | d-1-1 | a-2-8 |
| p-1-12 | d-1-1 | a-2-9 |
| p-1-13 | d-1-1 | a-2-10 |
| p-1-14 | d-1-1 | a-2-11 |
| p-1-15 | d-1-1 | a-2-12 |
| p-1-16 | d-1-1 | a-2-13 |
| p-1-17 | d-1-1 | a-3-1 |
| p-1-18 | d-1-1 | a-3-2 |
| p-1-19 | d-1-1 | a-3-3 |
| p-1-20 | d-1-1 | a-3-4 |
| p-1-21 | d-1-1 | a-3-5 |
| p-1-22 | d-1-1 | a-3-6 |
| p-1-23 | d-1-1 | a-3-7 |
| p-1-24 | d-1-1 | a-4-1 |
| p-1-25 | d-1-1 | a-4-2 |
| p-1-26 | d-1-1 | a-4-3 |
| p-1-27 | d-1-1 | a-4-4 |
| p-1-28 | d-1-1 | a-4-5 |
| p-1-29 | d-1-1 | a-4-6 |
| p-l-30 | d-1-1 | a-5-1 |
| p-1-31 | d-1-1 | a-5-2 |
| p-1-32 | d-1-1 | a-5-3 |
| p-1-33 | d-1-1 | a-5-4 |
| p-1-34 | d-1-1 | a-5-5 |
| p-1-35 | d-1-1 | a-5-6 |
| p-1-36 | d-1-1 | a-5-7 |
| p-1-37 | d-1-1 | a-5-8 |
| p-1-38 | d-1-1 | a-5-9 |
| p-1-39 | d-1-1 | a-6-1 |
| p-1-40 | d-1-1 | a-6-2 |
| p-1-41 | d-1-1 | a-6-3 |
| p-1-42 | d-1-1 | a-6-4 |
| p-1-43 | d-1-1 | a-6-5 |
| p-1-44 | d-1-1 | a-6-6 |
| p-1-45 | d-1-1 | a-6-7 |
| p-1-46 | d-1-1 | a-7-1 |
| p-1-47 | d-1-1 | a-7-2 |
| p-1-48 | d-1-1 | a-7-3 |
| p-1-49 | d-1-1 | a-7-4 |
| p-1-50 | d-1-1 | a-7-5 |
| p-1-51 | d-1-1 | a-7-6 |
| p-1-52 | d-1-1 | a-7-7 |
| p-1 -53 | d-1-1 | a-8-1 |
| p-1-54 | d-1-1 | a-8-2 |
| p-1-55 | d-1-1 | a-8-3 |
| p-1 -56 | d-1-1 | a-8-4 |
| p-1-57 | d-1-1 | a-8-5 |
| p-1-58 | d-1-1 | a-8-6 |
| p-1 -59 | d-1-1 | a-8-7 |
| p-1-60 | d-1-1 | a-8-8 |
| p-1-61 | d-1-1 | a-8-9 |
| p-1-62 | d-1-1 | a-8-10 |
| p-1-63 | d-1-1 | a-8-11 |
| p-1-64 | d-1-2 | a-1-1 |
| p-1-65 | d-1-2 | a-2-1 |
| p-1-66 | d-1-2 | a-3-1 |
| p-1-67 | d-1-2 | a-4-1 |
| p-1-68 | d-1-2 | a-5-1 |
| p-1-69 | d-1-2 | a-6-1 |
| p-1-70 | d-1-2 | a-7-1 |
| p-1-71 | d-1-2 | a-8-1 |
| p-1-72 | d-1-3 | a-1-1 |
| p-1-73 | d-1-3 | a-2-1 |
| p-1-74 | d-1-3 | a-3-1 |
| p-1-75 | d-1-3 | a-4-1 |
| p-1-76 | d-1-3 | a-5-1 |
| p-1-77 | d-1-3 | a-6-1 |
| p-1-78 | d-1-3 | a-7-1 |

TABLE 1-continued

| No. | D | A |
|---|---|---|
| p-1-79 | d-1-3 | a-8-1 |
| p-l-80 | d-1-4 | a-1-1 |
| p-1-81 | d-1-4 | a-2-1 |
| p-1-82 | d-1-4 | a-3-1 |
| p-1-83 | d-1-4 | a-4-1 |
| p-1-84 | d-1-4 | a-5-1 |
| p-1-85 | d-1-4 | a-6-1 |
| p-1-86 | d-1-4 | a-7-1 |
| p-1-87 | d-1-4 | a-8-1 |
| p-1-88 | d-1-5 | a-1-1 |
| p-1-89 | d-1-5 | a-1-2 |
| p-1-90 | d-1-5 | a-1-3 |
| p-1-91 | d-1-5 | a-2-1 |
| p-1-92 | d-1 -5 | a-2-2 |
| p-1-93 | d-1-5 | a-2-3 |
| p-1-94 | d-1-5 | a-2-4 |
| p-1-95 | d-1-5 | a-2-5 |
| p-1-96 | d-1-5 | a-2-6 |
| p-1-97 | d-1-5 | a-2-7 |
| p-1-98 | d-1-5 | a-2-8 |
| p-1-99 | d-1-5 | a-2-9 |
| p-1-100 | d-1-5 | a-2-10 |
| p-1-101 | d-1-5 | a-2-11 |
| p-1-102 | d-1-5 | a-2-12 |
| p-1-103 | d-1-5 | a-2-13 |
| p-1-104 | d-1-5 | a-3-1 |
| p-1-105 | d-1-5 | a-3-2 |
| p-1-106 | d-1-5 | a-3-3 |
| p-1-107 | d-1 -5 | a-3-4 |
| p-1-108 | d-1-5 | a-3-5 |
| p-1-109 | d-1-5 | a-3-6 |
| p-1-110 | d-1 -5 | a-3-7 |
| p-1-111 | d-1-5 | a-4-1 |
| p-1-112 | d-1-5 | a-4-2 |
| p-1-113 | d-1 -5 | a-4-3 |
| p-1-114 | d-1-5 | a-4-4 |
| p-1-115 | d-1 -5 | a-4-5 |
| p-1-116 | d-1-5 | a-4-6 |
| p-1-117 | d-1-5 | a-5-1 |
| p-1-118 | d-1-5 | a-5-2 |
| p-1-119 | d-1-5 | a-5-3 |
| p-1-120 | d-1-5 | a-5-4 |
| p-1-121 | d-1-5 | a-5-5 |
| p-1-122 | d-1-5 | a-5-6 |
| p-1-123 | d-1-5 | a-5-7 |
| p-1-124 | d-1-5 | a-5-8 |
| p-1-125 | d-1-5 | a-5-9 |
| p-1-126 | d-1-5 | a-6-1 |
| p-1-127 | d-1-5 | a-6-2 |
| p-1-128 | d-1-5 | a-6-3 |
| p-1-129 | d-1-5 | a-6-4 |
| p-1-130 | d-1-5 | a-6-5 |
| p-1-131 | d-1-5 | a-6-6 |
| p-1-132 | d-1-5 | a-6-7 |
| p-1-133 | d-1-5 | a-7-1 |
| p-1-134 | d-1 -5 | a-7-2 |
| p-1-135 | d-1-5 | a-7-3 |

TABLE 2

| No. | D | A |
|---|---|---|
| p-1-136 | d-1-5 | a-7-4 |
| p-1-137 | d-1-5 | a-7-5 |
| p-1-1 38 | d-1-5 | a-7-6 |
| p-1-139 | d-1-5 | a-7-7 |
| p-1-140 | d-1-5 | a-8-1 |
| p-1-141 | d-1-5 | a-8-2 |
| p-1-142 | d-1-5 | a-8-3 |
| p-1-143 | d-1-5 | a-8-4 |
| p-1-144 | d-1-5 | a-8-5 |
| p-1-145 | d-1-5 | a-8-6 |
| p-1-146 | d-1-5 | a-8-7 |
| p-1-147 | d-1-5 | a-8-8 |
| p-1-148 | d-1-5 | a-8-9 |

TABLE 2-continued

| No. | D | A |
|---|---|---|
| p-1-149 | d-1-5 | a-8-10 |
| p-1-150 | d-1-5 | a-8-11 |
| p-1-151 | d-1-6 | a-1-1 |
| p-1-1 52 | d-1-6 | a- 2-1 |
| p-1-153 | d-1-6 | a-3-1 |
| p-1-154 | d-1-6 | a-4-1 |
| p-1-155 | d-1-6 | a-5-1 |
| p-1-156 | d-1-6 | a-6-1 |
| p-1-157 | d-1-6 | a-7-1 |
| p-1-158 | d-1-6 | a-8-1 |
| p-1-159 | d-1-7 | a-1-1 |
| 0-1-160 | d-1-7 | a-2-1 |
| p-1-161 | d-1-7 | a-3-1 |
| p-1-162 | d-1-7 | a-4-1 |
| p-1-163 | d-1-7 | a-5-1 |
| p-1-164 | d-1-7 | a-6-1 |
| p-1-165 | d-1-7 | a-7-1 |
| p-1-166 | d-1-7 | a-8-1 |
| p-1-167 | d-1-8 | a-1-1 |
| p-1-168 | d-1-8 | a-2-1 |
| p-1-169 | d-1-8 | a-3-1 |
| p-1-170 | d-1-8 | a-4-1 |
| p-1-171 | d-1-8 | a-5-1 |
| p-1-172 | d-1-8 | a-6-1 |
| p-1-173 | d-1-8 | a-7-1 |
| p-1-174 | d-1-8 | a-8-1 |
| p-1-175 | d-1-9 | a-1-1 |
| p-1-176 | d-1-9 | a-2-1 |
| p-1-177 | d-1-9 | a-3-1 |
| p-1-178 | d-1-9 | a-4-1 |
| p-1-179 | d-1-9 | a-5-1 |
| p-1-180 | d-1-9 | a-6-1 |
| p-1-181 | d-1-9 | a-7-1 |
| p-1-182 | d-1-9 | a-8-1 |
| p-1-183 | d-1-10 | a-1-1 |
| p-1-184 | d-1-10 | a-2-1 |
| p-1-185 | d-1-10 | a-3-1 |
| p-1-186 | d-1-10 | a-4-1 |
| p-1-187 | d-1-10 | a-5-1 |
| p-1-188 | d-1-10 | a-6-1 |
| p-1-189 | d-1-10 | a-7-1 |
| p-1-190 | d-1-10 | a-8-1 |
| p-1-191 | d-1-11 | a-1-1 |
| p-1-192 | d-1-11 | a-2-1 |
| p-1-193 | d-1-11 | a-3-1 |
| p-1-194 | d-1-11 | a-4-1 |
| p-1-195 | d-1-11 | a-5-1 |
| p-1-196 | d-1-11 | a-6-1 |
| p-1-197 | d-1-11 | a-7-1 |
| p-1-198 | d-1-11 | a-8-1 |
| p-2-1 | d-2-1 | a-1-1 |
| p-2-2 | d-2-1 | a-1-2 |
| p-2-3 | d-2-1 | a-1-3 |
| p-2-4 | d-2-1 | a-2-1 |
| p-2-5 | d-2-1 | a-2-2 |
| p-2-6 | d-2-1 | a-2-3 |
| p-2-7 | d-2-1 | a-2-4 |
| p-2-8 | d-2-1 | a-2-5 |
| p-2-9 | d-2-1 | a-2-6 |
| p-2¯10 | d-2-1 | a-2-7 |
| p-2-11 | d-2-1 | a-2-8 |
| p-2-12 | d-2-1 | a-2-9 |
| p-2-13 | d-2-1 | a-2-10 |
| p-2-14 | d-2-1 | a-2-11 |
| p-2-15 | d-2-1 | a-2-12 |
| p-2-16 | d-2-1 | a-2-13 |
| p-2-17 | d-2-1 | a-3-1 |
| p-2-18 | d-2-1 | a-3-2 |
| p-2-19 | d-2-1 | a-3-3 |
| p-2-20 | d-2-1 | a-3-4 |
| p-2-21 | d-2-1 | a-3-5 |
| p-2-22 | d-2-1 | a-3-6 |
| p-2-23 | d-2-1 | a-3-7 |
| p-2-24 | d-2-1 | a-4-1 |
| p-2-25 | d-2-1 | a-4-2 |
| p-2-26 | d-2-1 | a-4-3 |
| p-2-27 | d-2-1 | a-4-4 |
| p-2-28 | d-2-1 | a-4-5 |

TABLE 2-continued

| No. | D | A |
|---|---|---|
| p-2-29 | d-2-1 | a-4-6 |
| p-2-30 | d-2-1 | a-5-1 |
| p-2-31 | d-2-1 | a-5-2 |
| p-2-32 | d-2-1 | a-5-3 |
| p-2-33 | d-2-1 | a-5-4 |
| p-2-34 | d-2-1 | a-5-5 |
| p-2-35 | d-2-1 | a-5-6 |
| p-2-36 | d-2-1 | a-5-7 |
| p-2-37 | d-2-1 | a-5-8 |
| p-2-38 | d-2-1 | a-5-9 |
| p-2-39 | d-2-1 | a-6-1 |
| p-2-40 | d-2-1 | a-6-2 |
| p-2-41 | d-2-1 | a-6-3 |
| p-2-42 | d-2-1 | a-6-4 |
| p-2-43 | d-2-1 | a-6-5 |
| p-2-44 | d-2-1 | a-6-6 |
| p-2-45 | d-2-1 | a-6-7 |

TABLE 3

| No. | D | A |
|---|---|---|
| p-2-46 | d-2-1 | a-7-1 |
| p-2-47 | d-2-1 | a-7-2 |
| p-2-48 | d-2-1 | a-7-3 |
| p-2-49 | d-2-1 | a-7-4 |
| p-2-50 | d-2-1 | a-7-5 |
| p-2-51 | d-2-1 | a-7-6 |
| p-2-52 | d-2-1 | a-7-7 |
| p-2-53 | d-2-1 | a-8-1 |
| p-2-54 | d-2-1 | a-8-2 |
| p-2-55 | d-2-1 | a-8-3 |
| p-2-56 | d-2-1 | a-8-4 |
| p-2-57 | d-2-1 | a-8-5 |
| p-2-58 | d-2-1 | a-8-6 |
| p-2-59 | d-2-1 | a-8-7 |
| p-2-60 | d-2-1 | a-8-8 |
| p-2-61 | d-2-1 | a-8-9 |
| p-2-62 | d-2-1 | a-8-10 |
| p-2-63 | d-2-1 | a-8-11 |
| p-2-64 | d-2-2 | a-1 -1 |
| p-2-65 | d-2-2 | a-2-1 |
| p-2-66 | d-2-2 | a-3-1 |
| p-2-67 | d-2-2 | a-4-1 |
| p-2-68 | d-2-2 | a-5-1 |
| p-2-69 | d-2-2 | a-6-1 |
| p-2-70 | d-2-2 | a-7-1 |
| p-2-71 | d-2-2 | a-8-1 |
| p-2-72 | d-2-3 | a-1-1 |
| p-2-73 | d-2-3 | a-2-1 |
| p-2-74 | d-2-3 | a-3-1 |
| p-2-75 | d-2-3 | a-4-1 |
| p-2-76 | d-2-3 | a-5-1 |
| p-2-77 | d-2-3 | a-6-1 |
| p-2-78 | d-2-3 | a-7-1 |
| p-2-79 | d-2-3 | a-8-1 |
| p-2-80 | d-2-4 | a-1-1 |
| p-2-81 | d-2-4 | a-2-1 |
| p-2-82 | d-2-4 | a-3-1 |
| p-2-83 | d-2-4 | a-4-1 |
| p-2-84 | d-2-4 | a-5-1 |
| p-2-85 | d-2-4 | a-6-1 |
| p-2-86 | d-2-4 | a-7-1 |
| p-2-87 | d-2-4 | a-8-1 |
| p-3-1 | d-3-1 | a-1-1 |
| p-3-2 | d-3-1 | a-1-2 |
| P-3-3 | d-3-1 | a-1-3 |
| p-3-4 | d-3-1 | a-2-1 |
| p-3-5 | d-3-1 | a-2-2 |
| p-3-6 | d-3-1 | a-2-3 |
| p-3-7 | d-3-1 | a-2-4 |
| p-3-8 | d-3-1 | a-2-5 |
| p-3-9 | d-3-1 | a-2-6 |
| p-3-10 | d-3-1 | a-2-7 |
| p-3-11 | d-3-1 | a-2-8 |

TABLE 3-continued

| No. | D | A |
|---|---|---|
| p-3-12 | d-3-1 | a-2-9 |
| p-3-13 | d-3-1 | a-2-10 |
| p-3-14 | d-3-1 | a-2-11 |
| p-3-15 | d-3-1 | a-2-12 |
| p-3-16 | d-3-1 | a-2-13 |
| p-3-17 | d-3-1 | a-3-1 |
| p-3-18 | d-3-1 | a-3-2 |
| p-3-19 | d-3-1 | a-3-3 |
| p-3-20 | d-3-1 | a-3-4 |
| p-3-21 | d-3-1 | a-3-5 |
| p-3-22 | d-3-1 | a-3-6 |
| p-3-23 | d-3-1 | a-3-7 |
| p-3-24 | d-3-1 | a-4-1 |
| p-3-25 | d-3-1 | a-4-2 |
| P-3-26 | d-3-1 | a-4-3 |
| p-3-27 | d-3-1 | a-4-4 |
| p-3-28 | d-3-1 | a-4-5 |
| p-3-29 | d-3-1 | a-4-6 |
| p-3-30 | d-3-1 | a-5-1 |
| p-3-31 | d-3-1 | a-5-2 |
| p-3-32 | d-3-1 | a-5-3 |
| p-3-33 | d-3-1 | a-5-4 |
| p-3-34 | d-3-1 | a-5-5 |
| p-3-35 | d-3-1 | a-5-6 |
| p-3-36 | d-3-1 | a-5-7 |
| p-3-37 | d-3-1 | a-5-8 |
| p-3-38 | d-3-1 | a-5-9 |
| p-3-39 | d-3-1 | a-6-1 |
| p-3-40 | d-3-1 | a-6-2 |
| p-3-41 | d-3-1 | a-6-3 |
| p-3-42 | d-3-1 | a-6-4 |
| p-3-44 | d-3-1 | a-6-6 |
| p-3-45 | d-3-1 | a-6-7 |
| p-3-46 | d-3-1 | a-7-1 |
| p-3-47 | d-3-1 | a-7-2 |
| p-3-48 | d-3-1 | a-7-3 |
| p-3-49 | d-3-1 | a-7-4 |
| p-3-50 | d-3-1 | a-7-5 |
| p-3-51 | d-3-1 | a-7-6 |
| p-3-52 | d-3-1 | a-7-7 |
| p-3-53 | d-3-1 | a-8-1 |
| p-3-54 | d-3-1 | a-8-2 |
| p-3-55 | d-3-1 | a-8-3 |
| p-3-56 | d-3-1 | a-8-4 |
| p-3-57 | d-3-1 | a-8-5 |
| p-3-58 | d-3-1 | a-8-6 |
| p-3-59 | d-3-1 | a-8-7 |
| p-3-60 | d-3-1 | a-8-8 |
| p-3-61 | d-3-1 | a-8-9 |
| p-3-62 | d-3-1 | a-8-10 |
| p-3-63 | d-3-1 | a-8-11 |
| p-3-64 | d-3-2 | a-1-1 |
| p-3-65 | d-3-2 | a-2-1 |
| p-3-66 | d-3-2 | a-3-1 |
| p-3-67 | d-3-2 | a-4-1 |
| p-3-68 | d-3-2 | a-5-1 |
| p-3-69 | d-3-2 | a-6-1 |
| p-3-70 | d-3-2 | a-7-1 |
| p-3-71 | d-3-2 | a-8-1 |
| p-3-72 | d-3-3 | a-1-1 |
| p-3-73 | d-3-3 | a-2-1 |
| p-3-74 | d-3-3 | a-3-1 |
| p-3-75 | d-3-3 | a-4-1 |
| p-3-76 | d-3-3 | a-5-1 |
| p-3-77 | d-3-3 | a-6-1 |
| p-3-78 | d-3-3 | a-7-1 |
| p-3-79 | d-3-3 | a-8-1 |
| p-3-80 | d-3-4 | a-1-1 |
| p-3-81 | d-3-4 | a-2-1 |
| p-3-82 | d-3-4 | a-3-1 |
| p-3-83 | d-3-4 | a-4-1 |
| p-3-84 | d-3-4 | a-5-1 |
| p-3-85 | d-3-4 | a-6-1 |
| p-3-86 | d-3-4 | a-7-1 |
| p-3-87 | d-3-4 | a-8-1 |

TABLE 4

| No. | D | A |
|---|---|---|
| p-4-1 | d-4-1 | a-1-1 |
| p-4-2 | d-4-1 | a-1-2 |
| p-4-3 | d-4-1 | a-1-3 |
| p-4-4 | d-4-1 | a-2-1 |
| p-4-5 | d-4-1 | a-2-2 |
| p-4-6 | d-4-1 | a-2-3 |
| p-4-7 | d-4-1 | a-2-4 |
| p-4-8 | d-4-1 | a-2-5 |
| p-4-9 | d-4-1 | a-2-6 |
| p-4-10 | d-4-1 | a-2-7 |
| p-4-11 | d-4-1 | a-2-8 |
| p-4-12 | d-4-1 | a-2-9 |
| p-4-13 | d-4-1 | a-2-10 |
| p-4-14 | d-4-1 | a-2-11 |
| p-4-15 | d-4-1 | a-2-12 |
| p-4-16 | d-4-1 | a-2-13 |
| p-4-17 | d-4-1 | a-3-1 |
| p-4-18 | d-4-1 | a-3-2 |
| p-4-19 | d-4-1 | a-3-3 |
| p-4-20 | d-4-1 | a-3-4 |
| p-4-21 | d-4-1 | a-3-5 |
| p-4-22 | d-4-1 | a-3-6 |
| p-4-23 | d-4-1 | a-3-7 |
| p-4-24 | d-4-1 | a-4-1 |
| p-4-25 | d-4-1 | a-4-2 |
| p-4-26 | d-4-1 | a-4-3 |
| p-4-27 | d-4-1 | a-4-4 |
| p-4-28 | d-4-1 | a-4-5 |
| p-4-29 | d-4-1 | a-4-6 |
| p-4-30 | d-4-1 | a-5-1 |
| p-4-31 | d-4-1 | a-5-2 |
| p-4-32 | d-4-1 | a-5-3 |
| p-4-33 | d-4-1 | a-5-4 |
| p-4-34 | d-4-1 | a-5-5 |
| p-4-35 | d-4-1 | a-5-6 |
| p-4-36 | d-4-1 | a-5-7 |
| p-4-37 | d-4-1 | a-5-8 |
| p-4-38 | d-4-1 | a-5-9 |
| p-4-39 | d-4-1 | a-6-1 |
| p-4-40 | d-4-1 | a-6-2 |
| p-4-41 | d-4-1 | a-6-3 |
| p-4-42 | d-4-1 | a-6-4 |
| p-4-43 | d-4-1 | a-6-5 |
| p-4-44 | d-4-1 | a-6-6 |
| p-4-45 | d-4-1 | a-6-7 |
| p-4-46 | d-4-1 | a-7-1 |
| p-4-47 | d-4-1 | a-7-2 |
| p-4-48 | d-4-1 | a-7-3 |
| p-4-49 | d-4-1 | a-7-4 |
| p-4-50 | d-4-1 | a-7-5 |
| p-4-51 | d-4-1 | a-7-6 |
| p-4-52 | d-4-1 | a-7-7 |
| p-4-53 | d-4-1 | a-8-1 |
| p-4-54 | d-4-1 | a-8-2 |
| p-4-55 | d-4-1 | a-8-3 |
| p-4-56 | d-4-1 | a-8-4 |
| p-4-57 | d-4-1 | a-8-5 |
| p-4-58 | d-4-1 | a-8-6 |
| p-4-59 | d-4-1 | a-8-7 |
| p-4-60 | d-4-1 | a-8-8 |
| p-4-61 | d-4-1 | a-8-9 |
| p-4-62 | d-4-1 | a-8-10 |
| p-4-63 | d-4-1 | a-8-11 |
| p-4-64 | d-4-2 | a-1-1 |
| p-4-65 | d-4-2 | a-2-1 |
| p-4-66 | d-4-2 | a-3-1 |
| p-4-67 | d-4-2 | a-4-1 |
| p-4-68 | d-4-2 | a-5-1 |
| p-4-69 | d-4-2 | a-6-1 |
| p-4-70 | d-4-2 | a-7-1 |
| p-4-71 | d-4-2 | a-8-1 |
| p-4-72 | d-4-3 | a-1-1 |
| p-4-73 | d-4-3 | a-2-1 |
| p-4-74 | d-4-3 | a-3-1 |
| p-4-75 | d-4-3 | a-4-1 |
| p-4-76 | d-4-3 | a-5-1 |
| p-4-77 | d-4-3 | a-6-1 |
| p-4-78 | d-4-3 | a-7-1 |

TABLE 4-continued

| No. | D | A |
|---|---|---|
| p-4-79 | d-4-3 | a-8-1 |
| p-4-80 | d-4-4 | a-1-1 |
| p-4-81 | d-4-4 | a-2-1 |
| p-4-82 | d-4-4 | a-3-1 |
| p-4-83 | d-4-4 | a-4-1 |
| p-4-84 | d-4-4 | a-5-1 |
| p-4-85 | d-4-4 | a-6-1 |
| p-4-86 | d-4-4 | a-7-1 |
| p-4-87 | d-4-4 | a-8-1 |
| p-4-88 | d-4-5 | a-1-1 |
| p-4-89 | d-4-5 | a-2-1 |
| p-4-90 | d-4-5 | a-3-1 |
| p-4-91 | d-4-5 | a-4-1 |
| p-4-92 | d-4-5 | a-5-1 |
| p-4-93 | d-4-5 | a-6-1 |
| p-4-94 | d-4-5 | a-7-1 |
| p-4-95 | d-4-5 | a-8-1 |
| p-4-96 | d-4-6 | a-1-1 |
| p-4-97 | d-4-6 | a-2-1 |
| p-4-98 | d-4-6 | a-3-1 |
| p-4-99 | d-4-6 | a-4-1 |
| p-4-100 | d-4-6 | a-5-1 |
| p-4-101 | d-4-6 | a-6-1 |
| p-4-102 | d-4-6 | a-7-1 |
| p-4-103 | d-4-6 | a-8-1 |
| p-4-104 | d-4-7 | a-1-1 |
| p-4-105 | d-4-7 | a-2-1 |
| p-4-106 | d-4-7 | a-3-1 |
| p-4-107 | d-4-7 | a-4-1 |
| p-4-108 | d-4-7 | a-5-1 |
| p-4-109 | d-4-7 | a-6-1 |
| p-4-110 | d-4-7 | a-7-1 |
| p-4-111 | d-4-7 | a-8-1 |
| p-4-112 | d-4-8 | a-1-1 |
| p-4-113 | d-4-8 | a-2-1 |
| p-4-114 | d-4-8 | a-3-1 |
| p-4-115 | d-4-8 | a-4-1 |
| p-4-116 | d-4-8 | a-5-1 |
| p-4-117 | d-4-8 | a-6-1 |
| p-4-118 | d-4-8 | a-7-1 |
| p-4-119 | d-4-8 | a-8-1 |
| p-4-120 | d-4-9 | a-1-1 |
| p-4-121 | d-4-9 | a-2-1 |
| p-4-122 | d-4-9 | a-3-1 |
| p-4-123 | d-4-9 | a-4-1 |
| p-4-124 | d-4-9 | a-5-1 |
| p-4-125 | d-4-9 | a-6-1 |
| p-4-126 | d-4-9 | a-7-1 |
| p-4-127 | d-4-9 | a-8-1 |
| p-4-128 | d-4-10 | a-1-1 |
| p-4-129 | d-4-10 | a-2-1 |
| p-4-130 | d-4-10 | a-3-1 |
| p-4-131 | d-4-10 | a-4-1 |
| p-4-132 | d-4-10 | a-5-1 |
| p-4-133 | d-4-10 | a-6-1 |
| p-4-134 | d-4-10 | a-7-1 |
| p-4-135 | d-4-10 | a-8-1 |

TABLE 5

| No. | D | A |
|---|---|---|
| p-4-136 | d-4-11 | a-1-1 |
| p-4-137 | d-4-11 | a-2-1 |
| p-4-138 | d-4-11 | a-3-1 |
| p-4-139 | d-4-11 | a-4-1 |
| p-4-140 | d-4-11 | a-5-1 |
| p-4-141 | d-4-11 | a-6-1 |
| p-4-142 | d-4-11 | a-7-1 |
| p-4-143 | d-4-11 | a-8-1 |
| p-5-1 | d-5-1 | a-1-1 |
| p-5-2 | d-5-1 | a-1-2 |
| p-5-3 | d-5-1 | a-1-3 |
| p-5-4 | d-5-1 | a-2-1 |
| p-5-5 | d-5-1 | a-2-2 |

TABLE 5-continued

| No. | D | A |
|---|---|---|
| p-5-6 | d-5-1 | a-2-3 |
| p-5-7 | d-5-1 | a-2-4 |
| p-5-8 | d-5-1 | a-2-5 |
| p-5-9 | d-5-1 | a-2-6 |
| p-5-10 | d-5-1 | a-2-7 |
| p-5-11 | d-5-1 | a-2-8 |
| p-5-12 | d-5-1 | a-2-9 |
| p-5-13 | d-5-1 | a-2-10 |
| p-5-14 | d-5-1 | a-2-11 |
| p-5-15 | d-5-1 | a-2-12 |
| p-5-16 | d-5-1 | a-2-13 |
| p-5-17 | d-5-1 | a-3-1 |
| p-5-18 | d-5-1 | a-3-2 |
| p-5-19 | d-5-1 | a-3-3 |
| p-5-20 | d-5-1 | a-3-4 |
| p-5-21 | d-5-1 | a-3-5 |
| p-5-22 | d-5-1 | a-3-6 |
| p-5-23 | d-5-1 | a-3-7 |
| p-5-24 | d-5-1 | a-4-1 |
| p-5-25 | d-5-1 | a-4-2 |
| p-5-26 | d-5-1 | a-4-3 |
| p-5-27 | d-5-1 | a-4-4 |
| p-5-28 | d-5-1 | a-4-5 |
| p-5-29 | d-5-1 | a-4-6 |
| p-5-30 | d-5-1 | a-5-1 |
| p-5-31 | d-5-1 | a-5-2 |
| p-5-32 | d-5-1 | a-5-3 |
| p-5-33 | d-5-1 | a-5-4 |
| p-5-34 | d-5-1 | a-5-5 |
| p-5-35 | d-5-1 | a-5-6 |
| p-5-36 | d-5-1 | a-5-7 |
| p-5-37 | d-5-1 | a-5-8 |
| p-5-38 | d-5-1 | a-5-9 |
| p-5-39 | d-5-1 | a-6-1 |
| p-5-40 | d-5-1 | a-6-2 |
| p-5-41 | d-5-1 | a-6-3 |
| p-5-42 | d-5-1 | a-6-4 |
| p-5-43 | d-5-1 | a-6-5 |
| p-5-44 | d-5-1 | a-6-6 |
| p-5-45 | d-5-1 | a-6-7 |
| p-5-46 | d-5-1 | a-7-1 |
| p-5-47 | d-5-1 | a-7-2 |
| p-5-48 | d-5-1 | a-7-3 |
| p-5-49 | d-5-1 | a-7-4 |
| p-5-50 | d-5-1 | a-7-5 |
| p-5-51 | d-5-1 | a-7-6 |
| p-5-52 | d-5-1 | a-7-7 |
| p-5-53 | d-5-1 | a-8-1 |
| p-5-54 | d-5-1 | a-8-2 |
| p-5-55 | d-5-1 | a-8-3 |
| p-5-56 | d-5-1 | a-8-4 |
| p-5-57 | d-5-1 | a-8-5 |
| p-5-58 | d-5-1 | a-8-6 |
| p-5-59 | d-5-1 | a-8-7 |
| p-5-60 | d-5-1 | a-8-8 |
| p-5-61 | d-5-1 | a-8-9 |
| p-5-62 | d-5-1 | a-8-10 |
| p-5-63 | d-5-1 | a-8-11 |
| p-5-64 | d-5-2 | a-1-1 |
| p-5-65 | d-5-2 | a-2-1 |
| p-5-66 | d-5-2 | a-3-1 |
| p-5-67 | d-5-2 | a-4-1 |
| p-5-68 | d-5-2 | a-5-1 |
| p-5-69 | d-5-2 | a-6-1 |
| p-5-70 | d-5-2 | a-7-1 |
| p-5-71 | d-5-2 | a-8-1 |
| p-5-72 | d-5-3 | a-1-1 |
| p-5-73 | d-5-3 | a-2-1 |
| p-5-74 | d-5-3 | a-3-1 |
| p-5-75 | d-5-3 | a-4-1 |
| p-5-76 | d-5-3 | a-5-1 |
| p-5-77 | d-5-3 | a-6-1 |
| p-5-78 | d-5-3 | a-7-1 |
| p-5-79 | d-5-3 | a-8-1 |
| p-5-80 | d-5-4 | a-1-1 |
| p-5-81 | d-5-4 | a-1-2 |
| p-5-82 | d-5-4 | a-1-3 |
| p-5-83 | d-5-4 | a-2-1 |

TABLE 5-continued

| No. | D | A |
|---|---|---|
| p-5-84 | d-5-4 | a-2-2 |
| p-5-85 | d-5-4 | a-2-3 |
| p-5-86 | d-5-4 | a-2-4 |
| p-5-87 | d-5-4 | a-2-5 |
| p-5-88 | d-5-4 | a-2-6 |
| p-5-89 | d-5-4 | a-2-7 |
| p-5-90 | d-5-4 | a-2-8 |

TABLE 6

| No. | D | A |
|---|---|---|
| p-5-91 | d-5-4 | a-2-9 |
| p-5-92 | d-5-4 | a-2-10 |
| p-5-93 | d-5-4 | a-2-11 |
| p-5-94 | d-5-4 | a-2-12 |
| p-5-95 | d-5-4 | a-2-13 |
| p-5-96 | d-5-4 | a-3-1 |
| p-5-97 | d-5-4 | a-3-2 |
| p-5-98 | d-5-4 | a-3-3 |
| p-5-99 | d-5-4 | a-3-4 |
| p-5-100 | d-5-4 | a-3-5 |
| p-5-101 | d-5-4 | a-3-6 |
| p-5-102 | d-5-4 | a-3-7 |
| p-5-103 | d-5-4 | a-4-1 |
| p-5-104 | d-5-4 | a-4-2 |
| p-5-105 | d-5-4 | a-4-3 |
| p-5-106 | d-5-4 | a-4-4 |
| p-5-107 | d-5-4 | a-4-5 |
| p-5-108 | d-5-4 | a-4-6 |
| p-5-109 | d-5-4 | a-5-1 |
| p-5-110 | d-5-4 | a-5-2 |
| p-5-111 | d-5-4 | a-5-3 |
| p-5-112 | d-5-4 | a-5-4 |
| p-5-113 | d-5-4 | a-5-5 |
| p-5-114 | d-5-4 | a-5-6 |
| p-5-115 | d-5-4 | a-5-7 |
| p-5-116 | d-5-4 | a-5-8 |
| p-5-117 | d-5-4 | a-5-9 |
| p-5-118 | d-5-4 | a-6-1 |
| p-5-119 | d-5-4 | a-6-2 |
| p-5-120 | d-5-4 | a-6-3 |
| p-5-121 | d-5-4 | a-6-4 |
| p-5-122 | d-5-4 | a-6-5 |
| p-5-123 | d-5-4 | a-6-6 |
| p-5-124 | d-5-4 | a-6-7 |
| p-5-125 | d-5-4 | a-7-1 |
| p-5-126 | d-5-4 | a-7-2 |
| p-5-127 | d-5-4 | a-7-3 |
| p-5-128 | d-5-4 | a-7-4 |
| p-5-129 | d-5-4 | a-7-5 |
| p-5-130 | d-5-4 | a-7-6 |
| p-5-131 | d-5-4 | a-7-7 |
| p-5-132 | d-5-4 | a-8-1 |
| p-5-133 | d-5-4 | a-8-2 |
| p-5-134 | d-5-4 | a-8-3 |
| p-5-135 | d-5-4 | a-8-4 |
| p-5-136 | d-5-4 | a-8-5 |
| p-5-137 | d-5-4 | a-8-6 |
| p-5-138 | d-5-4 | a-8-7 |
| p-5-139 | d-5-4 | a-8-8 |
| p-5-140 | d-5-4 | a-8-9 |
| p-5-141 | d-5-4 | a-8-10 |
| p-5-142 | d-5-4 | a-8-11 |
| p-5-143 | d-5-5 | a-1-1 |
| p-5-144 | d-5-5 | a-2-1 |
| p-5-145 | d-5-5 | a-3-1 |
| p-5-146 | d-5-5 | a-4-1 |
| p-5-147 | d-5-5 | a-5-1 |
| p-5-148 | d-5-5 | a-6-1 |
| p-5-149 | d-5-5 | a-7-1 |
| p-5-150 | d-5-5 | a-8-1 |
| p-5-151 | d-5-6 | a-1-1 |
| p-5-152 | d-5-6 | a-2-1 |
| p-5-153 | d-5-6 | a-3-1 |

TABLE 6-continued

| No. | D | A |
|---|---|---|
| p-5-154 | d-5-6 | a-4-1 |
| p-5-155 | d-5-6 | a-5-1 |
| p-5-156 | d-5-6 | a-6-1 |
| p-5-157 | d-5-6 | a-7-1 |
| p-5-158 | d-5-6 | a-8-1 |
| p-5-159 | d-5-7 | a-1-1 |
| p-5-160 | d-5-7 | a-2-1 |
| p-5-161 | d-5-7 | a-3-1 |
| p-5-162 | d-5-7 | a-4-1 |
| p-5-163 | d-5-7 | a-5-1 |
| p-5-164 | d-5-7 | a-6-1 |
| p-5-165 | d-5-7 | a-7-1 |
| p-5-166 | d-5-7 | a-8-1 |
| p-5-167 | d-5-8 | a-1-1 |
| p-5-168 | d-5-8 | a-2-1 |
| p-5-169 | d-5-8 | a-3-1 |
| p-5-170 | d-5-8 | a-4-1 |
| p-5-171 | d-5-8 | a-5-1 |
| p-5-172 | d-5-8 | a-6-1 |
| p-5-173 | d-5-8 | a-7-1 |
| p-5-174 | d-5-8 | a-8-1 |
| p-6-1 | d-6-1 | a-1-1 |
| p-6-2 | d-6-1 | a-1-2 |
| p-6-3 | d-6-1 | a-1-3 |
| p-6-4 | d-6-1 | a-2-1 |
| p-6-5 | d-6-1 | a-2-2 |
| p-6-6 | d-6-1 | a-2-3 |
| p-6-7 | d-6-1 | a-2-4 |
| p-6-8 | d-6-1 | a-2-5 |
| p-6-9 | d-6-1 | a-2-6 |
| p-6-10 | d-6-1 | a-2-7 |
| p-6-11 | d-6-1 | a-2-8 |
| p-6-12 | d-6-1 | a-2-9 |
| p-6-13 | d-6-1 | a-2-10 |
| p-6-14 | d-6-1 | a-2-11 |
| p-6-15 | d-6-1 | a-2-12 |
| p-6-16 | d-6-1 | a-2-13 |
| p-6-17 | d-6-1 | a-3-1 |
| p-6-18 | d-6-1 | a-3-2 |
| p-6-19 | d-6-1 | a-3-3 |
| p-6-20 | d-6-1 | a-3-4 |
| p-6-21 | d-6-1 | a-3-5 |
| p-6-22 | d-6-1 | a-3-6 |
| p-6-23 | d-6-1 | a-3-7 |
| p-6-24 | d-6-1 | a-4-1 |
| p-6-25 | d-6-1 | a-4-2 |
| p-6-26 | d-6-1 | a-4-3 |
| p-6-27 | d-6-1 | a-4-4 |
| p-6-28 | d-6-1 | a-4-5 |
| p-6-29 | d-6-1 | a-4-6 |
| p-6-30 | d-6-1 | a-5-1 |
| p-6-31 | d-6-1 | a-5-2 |
| p-6-32 | d-6-1 | a-5-3 |
| p-6-33 | d-6-1 | a-5-4 |
| p-6-34 | d-6-1 | a-5-5 |
| p-6-35 | d-6-1 | a-5-6 |
| p-6-36 | d-6-1 | a-5-7 |
| p-6-37 | d-6-1 | a-5-8 |
| p-6-38 | d-6-1 | a-5-9 |
| p-6-39 | d-6-1 | a-6-1 |
| p-6-40 | d-6-1 | a-6-2 |
| p-6-41 | d-6-1 | a-6-3 |
| p-6-42 | d-6-1 | a-6-4 |
| p-6-43 | d-6-1 | a-6-5 |
| p-6-44 | d-6-1 | a-6-6 |
| p-6-45 | d-6-1 | a-6-7 |

TABLE 7

| No. | D | A |
|---|---|---|
| p-6-46 | d-6-1 | a-7-1 |
| p-6-47 | d-6-1 | a-7-2 |
| p-6-48 | d-6-1 | a-7-3 |
| p-6-49 | d-6-1 | a-7-4 |

TABLE 7-continued

| No. | D | A |
|---|---|---|
| p-6-50 | d-6-1 | a-7-5 |
| p-6-51 | d-6-1 | a-7-6 |
| p-6-52 | d-6-1 | a-7-7 |
| p-6-53 | d-6-1 | a-8-1 |
| p-6-54 | d-6-1 | a-8-2 |
| p-6-55 | d-6-1 | a-8-3 |
| p-6-56 | d-6-1 | a-8-4 |
| p-6-57 | d-6-1 | a-8-5 |
| p-6-58 | d-6-1 | a-8-6 |
| p-6-59 | d-6-1 | a-8-7 |
| p-6-60 | d-6-1 | a-8-8 |
| p-6-61 | d-6-1 | a-8-9 |
| P-6-62 | d-6-1 | a-8-10 |
| p-6-63 | d-6-1 | a-8-11 |
| p-6-64 | d-6-2 | a-1-1 |
| p-6-65 | d-6-2 | a-1-2 |
| p-6-66 | d-6-2 | a-1-3 |
| p-6-67 | d-6-2 | a-2-1 |
| p-6-68 | d-6-2 | a-2-2 |
| p-6-69 | d-6-2 | a-2-3 |
| p-6-70 | d-6-2 | a-2-4 |
| p-6-71 | d-6-2 | a-2-5 |
| p-6-72 | d-6-2 | a-2-6 |
| p-6-73 | d-6-2 | a-2-7 |
| p-6-74 | d-6-2 | a-2-8 |
| p-6-75 | d-6-2 | a-2-9 |
| p-6-76 | d-6-2 | a-2-10 |
| p-6-77 | d-6-2 | a-2-11 |
| p-6-78 | d-6-2 | a-2-12 |
| p-6-79 | d-6-2 | a-2-13 |
| p-6-80 | d-6-2 | a-3-1 |
| p-6-81 | d-6-2 | a-3-2 |
| p-6-82 | d-6-2 | a-3-3 |
| p-6-83 | d-6-2 | a-3-4 |
| p-6-84 | d-6-2 | a-3-5 |
| p-6-85 | d-6-2 | a-3-6 |
| p-6-86 | d-6-2 | a-3-7 |
| p-6-87 | d-6-2 | a-4-1 |
| p-6-88 | d-6-2 | a-4-2 |
| p-6-89 | d-6-2 | a-4-3 |
| p-6-90 | d-6-2 | a-4-4 |
| p-6-91 | d-6-2 | a-4-5 |
| p-6-92 | d-6-2 | a-4-6 |
| p-6-93 | d-6-2 | a-5-1 |
| p-6-94 | d-6-2 | a-5-2 |
| p-6-95 | d-6-2 | a-5-3 |
| p-6-96 | d-6-2 | a-5-4 |
| p-6-97 | d-6-2 | a-5-5 |
| p-6-98 | d-6-2 | a-5-6 |
| p-6-99 | d-6-2 | a-5-7 |
| p-6-100 | d-6-2 | a-5-8 |
| p-6-101 | d-6-2 | a-5-9 |
| p-6-102 | d-6-2 | a-6-1 |
| p-6-103 | d-6-2 | a-6-2 |
| p-6-104 | d-6-2 | a-6-3 |
| p-6-105 | d-6-2 | a-6-4 |
| p-6-106 | d-6-2 | a-6-5 |
| p-6-107 | d-6-2 | a-6-6 |
| p-6-108 | d-6-2 | a-6-7 |
| p-6-109 | d-6-2 | a-7-1 |
| p-6-110 | d-6-2 | a-7-2 |
| p-6-111 | d-6-2 | a-7-3 |
| p-6-112 | d-6-2 | a-7-4 |
| p-6-113 | d-6-2 | a-7-5 |
| p-6-114 | d-6-2 | a-7-6 |
| p-6-115 | d-6-2 | a-7-7 |
| p-6-116 | d-6-2 | a-8-1 |
| p-6-117 | d-6-2 | a-8-2 |
| p-6-118 | d-6-2 | a-8-3 |
| p-6-119 | d-6-2 | a-8-4 |
| p-6-120 | d-6-2 | a-8-5 |
| p-6-121 | d-6-2 | a-8-6 |
| p-6-122 | d-6-2 | a-8-7 |
| p-6-123 | d-6-2 | a-8-8 |
| p-6-124 | d-6-2 | a-8-9 |
| p-6-125 | d-6-2 | a-8-10 |
| p-6-126 | d-6-2 | a-8-11 |
| p-6-127 | d-6-3 | a-1-1 |

TABLE 7-continued

| No. | D | A |
|---|---|---|
| p-6-128 | d-6-3 | a-1-2 |
| p-6-129 | d-6-3 | a-1-3 |
| p-6-130 | d-6-3 | a-2-1 |
| p-6-131 | d-6-3 | a-2-2 |
| p-6-132 | d-6-3 | a-2-3 |
| p-6-133 | d-6-3 | a-2-4 |
| p-6-134 | d-6-3 | a-2-5 |
| p-6-135 | d-6-3 | a-2-6 |
| p-6-136 | d-6-3 | a-2-7 |
| p-6-137 | d-6-3 | a-2-8 |
| p-6-138 | d-6-3 | a-2-9 |
| p-6-139 | d-6-3 | a-2-10 |
| p-6-140 | d-6-3 | a-2-11 |
| p-6-141 | d-6-3 | a-2-12 |
| p-6-142 | d-6-3 | a-2-13 |
| p-6-143 | d-6-3 | a-3-1 |
| p-6-144 | d-6-3 | a-3-2 |
| p-6-145 | d-6-3 | a-3-3 |
| p-6-146 | d-6-3 | a-3-4 |
| p-6-147 | d-6-3 | a-3-5 |
| p-6-148 | d-6-3 | a-3-6 |
| p-6-149 | d-6-3 | a-3-7 |
| p-6-150 | d-6-3 | a-4-1 |
| p-6-151 | d-6-3 | a-4-2 |
| p-6-152 | d-6-3 | a-4-3 |
| p-6-153 | d-6-3 | a-4-4 |
| p-6-154 | d-6-3 | a-4-5 |
| p-6-155 | d-6-3 | a-4-6 |
| p-6-156 | d-6-3 | a-5-1 |
| p-6-157 | d-6-3 | a-5-2 |
| p-6-158 | d-6-3 | a-5-3 |
| p-6-159 | d-6-3 | a-5-4 |
| p-6-160 | d-6-3 | a-5-5 |
| p-6-161 | d-6-3 | a-5-6 |
| p-6-162 | d-6-3 | a-5-7 |
| p-6-163 | d-6-3 | a-5-8 |
| p-6-164 | d-6-3 | a-5-9 |
| p-6-165 | d-6-3 | a-6-1 |
| p-6-166 | d-6-3 | a-6-2 |
| p-6-167 | d-6-3 | a-6-3 |
| p-6-168 | d-6-3 | a-6-4 |
| p-6-169 | d-6-3 | a-6-5 |
| p-6-170 | d-6-3 | a-6-6 |
| p-6-171 | d-6-3 | a-6-7 |
| p-6-172 | d-6-3 | a-7-1 |
| p-6-173 | d-6-3 | a-7-2 |
| p-6-174 | d-6-3 | a-7-3 |
| p-6-175 | d-6-3 | a-7-4 |
| p-6-176 | d-6-3 | a-7-5 |
| p-6-177 | d-6-3 | a-7-6 |
| p-6-178 | d-6-3 | a-7-7 |
| p-6-179 | d-6-3 | a-8-1 |
| p-6-180 | d-6-3 | a-8-2 |

TABLE 8

| No. | D | A |
|---|---|---|
| p-6-181 | d-6-3 | a-8-3 |
| p-6-182 | d-6-3 | a-8-4 |
| p-6-183 | d-6-3 | a-8-5 |
| p-6-184 | d-6-3 | a-8-6 |
| p-6-185 | d-6-3 | a-8-7 |
| p-6-186 | d-6-3 | a-8-8 |
| p-6-187 | d-6-3 | a-8-9 |
| p-6-188 | d-6-3 | a-8-10 |
| p-6-189 | d-6-3 | a-8-11 |
| p-6-190 | d-6-4 | a-1-1 |
| p-6-191 | d-6-4 | a-1-2 |
| p-6-192 | d-6-4 | a-1-3 |
| p-6-193 | d-6-4 | a-2-1 |
| p-6-194 | d-6-4 | a-2-2 |
| p-6-195 | d-6-4 | a-2-3 |
| p-6-196 | d-6-4 | a-2-4 |
| p-6-197 | d-6-4 | a-2-5 |

TABLE 8-continued

| No. | D | A |
|---|---|---|
| p-6-198 | d-6-4 | a-2-6 |
| p-6-199 | d-6-4 | a-2-7 |
| p-6-200 | d-6-4 | a-2-8 |
| p-6-201 | d-6-4 | a-2-9 |
| p-6-202 | d-6-4 | a-2-10 |
| p-6-203 | d-6-4 | a-2-11 |
| p-6-204 | d-6-4 | a-2-12 |
| p-6-205 | d-6-4 | a-2-13 |
| p-6-206 | d-6-4 | a-3-1 |
| p-6-207 | d-6-4 | a-3-2 |
| p-6-208 | d-6-4 | a-3-3 |
| p-6-209 | d-6-4 | a-3-4 |
| p-6-210 | d-6-4 | a-3-5 |
| p-6-211 | d-6-4 | a-3-6 |
| p-6-212 | d-6-4 | a-3-7 |
| p-6-213 | d-6-4 | a-4-1 |
| p-6-214 | d-6-4 | a-4-2 |
| p-6-215 | d-6-4 | a-4-3 |
| p-6-216 | d-6-4 | a-4-4 |
| p-6-217 | d-6-4 | a-4-5 |
| p-6-218 | d-6-4 | a-4-6 |
| p-6-219 | d-6-4 | a-5-1 |
| p-6-220 | d-6-4 | a-5-2 |
| p-6-221 | d-6-4 | a-5-3 |
| p-6-222 | d-6-4 | a-5-4 |
| p-6-223 | d-6-4 | a-5-5 |
| p-6-224 | d-6-4 | a-5-6 |
| p-6-225 | d-6-4 | a-5-7 |
| p-6-226 | d-6-4 | a-5-8 |
| p-6-227 | d-6-4 | a-5-9 |
| p-6-228 | d-6-4 | a-6-1 |
| p-6-229 | d-6-4 | a-6-2 |
| p-6-230 | d-6-4 | a-6-3 |
| p-6-231 | d-6-4 | a-6-4 |
| p-6-232 | d-6-4 | a-6-5 |
| p-6-233 | d-6-4 | a-6-6 |
| p-6-234 | d-6-4 | a-6-7 |
| p-6-235 | d-6-4 | a-7-1 |
| p-6-236 | d-6-4 | a-7-2 |
| p-6-237 | d-6-4 | a-7-3 |
| p-6-238 | d-6-4 | a-7-4 |
| p-6-239 | d-6-4 | a-7-5 |
| p-6-240 | d-6-4 | a-7-6 |
| p-6-241 | d-6-4 | a-7-7 |
| p-6-242 | d-6-4 | a-8-1 |
| p-6-243 | d-6-4 | a-8-2 |
| p-6-244 | d-6-4 | a-8-3 |
| p-6-245 | d-6-4 | a-8-4 |
| p-6-246 | d-6-4 | a-8-5 |
| p-6-247 | d-6-4 | a-8-6 |
| p-6-248 | d-6-4 | a-8-7 |
| p-6-249 | d-6-4 | a-8-8 |
| p-6-250 | d-6-4 | a-8-9 |
| p-6-251 | d-6-4 | a-8-10 |
| p-6-252 | d-6-4 | a-8-11 |
| p-7-1 | d-7-1 | a-1-1 |
| p-7-2 | d-7-1 | a-1-2 |
| p-7-3 | d-7-1 | a-1-3 |
| p-7-4 | d-7-1 | a-2-1 |
| p-7-5 | d-7-1 | a-2-2 |
| p-7-6 | d-7-1 | a-2-3 |
| p-7-7 | d-7-1 | a-2-4 |
| p-7-8 | d-7-1 | a-2-5 |
| p-7-9 | d-7-1 | a-2-6 |
| p-7-10 | d-7-1 | a-2-7 |
| p-7-11 | d-7-1 | a-2-8 |
| p-7-12 | d-7-1 | a-2-9 |
| p-7-13 | d-7-1 | a-2-10 |
| p-7-14 | d-7-1 | a-2-11 |
| p-7-15 | d-7-1 | a-2-12 |
| p-7-16 | d-7-1 | a-2-13 |
| p-7-17 | d-7-1 | a-3-1 |
| p-7-18 | d-7-1 | a-3-2 |
| p-7-19 | d-7-1 | a-3-3 |
| p-7-20 | d-7-1 | a-3-4 |
| p-7-21 | d-7-1 | a-3-5 |
| p-7-22 | d-7-1 | a-3-6 |
| p-7-23 | d-7-1 | a-3-7 |

TABLE 8-continued

| No. | D | A |
|---|---|---|
| p-7-24 | d-7-1 | a-4-1 |
| p-7-25 | d-7-1 | a-4-2 |
| p-7-26 | d-7-1 | a-4-3 |
| p-7-27 | d-7-1 | a-4-4 |
| p-7-28 | d-7-1 | a-4-5 |
| p-7-29 | d-7-1 | a-4-6 |
| p-7-30 | d-7-1 | a-5-1 |
| p-7-31 | d-7-1 | a-5-2 |
| p-7-32 | d-7-1 | a-5-3 |
| p-7-33 | d-7-1 | a-5-4 |
| p-7-34 | d-7-1 | a-5-5 |
| p-7-35 | d-7-1 | a-5-6 |
| p-7-36 | d-7-1 | a-5-7 |
| p-7-37 | d-7-1 | a-5-8 |
| p-7-38 | d-7-1 | a-5-9 |
| p-7-39 | d-7-1 | a-6-1 |
| p-7-40 | d-7-1 | a-6-2 |
| p-7-41 | d-7-1 | a-6-3 |
| p-7-42 | d-7-1 | a-6-4 |
| p-7-43 | d-7-1 | a-6-5 |
| p-7-44 | d-7-1 | a-6-6 |
| p-7-45 | d-7-1 | a-6-7 |

TABLE 9

| No. | D | A |
|---|---|---|
| p-7-46 | d-7-1 | a-7-1 |
| p-7-47 | d-7-1 | a-7-2 |
| p-7-48 | d-7-1 | a-7-3 |
| p-7-49 | d-7-1 | a-7-4 |
| p-7-50 | d-7-1 | a-7-5 |
| p-7-51 | d-7-1 | a-7-6 |
| P-7-52 | d-7-1 | a-7-7 |
| p-7-53 | d-7-1 | a-8-1 |
| p-7-54 | d-7-1 | a-8-2 |
| p-7-55 | d-7-1 | a-8-3 |
| p-7-56 | d-7-1 | a-8-4 |
| p-7-57 | d-7-1 | a-8-5 |
| p-7-58 | d-7-1 | a-8-6 |
| p-7-59 | d-7-1 | a-8-7 |
| p-7-60 | d-7-1 | a-8-8 |
| p-7-61 | d-7-1 | a-8-9 |
| p-7-62 | d-7-1 | a-8-10 |
| p-7-63 | d-7-1 | a-8-11 |
| p-7-64 | d-7-2 | a-1-1 |
| p-7-65 | d-7-2 | a-2-1 |
| P-7-66 | d-7-2 | a-3-1 |
| P-7-67 | d-7-2 | a-4-1 |
| p-7-68 | d-7-2 | a-5-1 |
| p-7-69 | d-7-2 | a-6-1 |
| p-7-70 | d-7-2 | a-7-1 |
| p-7-71 | d-7-2 | a-8-1 |
| P-7-72 | d-7-3 | a-1-1 |
| p-7-73 | d-7-3 | a-2-1 |
| p-7-74 | d-7-3 | a-3-1 |
| p-7-75 | d-7-3 | a-4-1 |
| p-7-76 | d-7-3 | a-5-1 |
| p-7-77 | d-7-3 | a-6-1 |
| p-7-78 | d-7-3 | a-7-1 |
| p-7-79 | d-7-3 | a-8-1 |
| p-7-80 | d-7-4 | a-1-1 |
| p-7-81 | d-7-4 | a-2-1 |
| p-7-82 | d-7-4 | a-3-1 |
| p-7-83 | d-7-4 | a-4-1 |
| p-7-84 | d-7-4 | a-5-1 |
| p-7-85 | d-7-4 | a-6-1 |
| p-7-86 | d-7-4 | a-7-1 |
| p-7-87 | d-7-4 | a-8-1 |
| p-8-1 | d-8-1 | a-1-1 |
| p-8-2 | d-8-1 | a-1-2 |
| p-8-3 | d-8-1 | a-1-3 |
| p-8-4 | d-8-1 | a-2-1 |
| p-8-5 | d-8-1 | a-2-2 |
| p-8-6 | d-8-1 | a-2-3 |

TABLE 9-continued

| No. | D | A |
|---|---|---|
| p-8-7 | d-8-1 | a-2-4 |
| P-8-8 | d-8-1 | a-2-5 |
| p-8-9 | d-8-1 | a-2-6 |
| p-8-10 | d-8-1 | a-2-7 |
| p-8-11 | d-8-1 | a-2-8 |
| p-8-12 | d-8-1 | a-2-9 |
| p-8-13 | d-8-1 | a-2-10 |
| p-8-14 | d-8-1 | a-2-11 |
| p-8-15 | d-8-1 | a-2-12 |
| p-8-16 | d-8-1 | a-2-13 |
| p-8-17 | d-8-1 | a-3-1 |
| p-8-18 | d-8-1 | a-3-2 |
| p-8-19 | d-8-1 | a-3-3 |
| p-8-20 | d-8-1 | a-3-4 |
| p-8-21 | d-8-1 | a-3-5 |
| p-8-22 | d-8-1 | a-3-6 |
| p-8-23 | d-8-1 | a-3-7 |
| p-8-24 | d-8-1 | a-4-1 |
| p-8-25 | d-8-1 | a-4-2 |
| p-8-26 | d-8-1 | a-4-3 |
| p-8-27 | d-8-1 | a-4-4 |
| p-8-28 | d-8-1 | a-4-5 |
| p-8-29 | d-8-1 | a-4-6 |
| p-8-30 | d-8-1 | a-5-1 |
| p-8-31 | d-8-1 | a-5-2 |
| p-8-32 | d-8-1 | a-5-3 |
| p-8-33 | d-8-1 | a-5-4 |
| p-8-34 | d-8-1 | a-5-5 |
| p-8-35 | d-8-1 | a-5-6 |
| p-8-36 | d-8-1 | a-5-7 |
| p-8-37 | d-8-1 | a-5-8 |
| p-8-38 | d-8-1 | a-5-9 |
| p-8-39 | d-8-1 | a-6-1 |
| p-8-40 | d-8-1 | a-6-2 |
| p-8-41 | d-8-1 | a-6-3 |
| p-8-42 | d-8-1 | a-6-4 |
| p-8-43 | d-8-1 | a-6-5 |
| p-8-44 | d-8-1 | a-6-6 |
| p-8-45 | d-8-1 | a-6-7 |
| p-8-46 | d-8-1 | a-7-1 |
| p-8-47 | d-8-1 | a-7-2 |
| p-8-48 | d-8-1 | a-7-3 |
| p-8-49 | d-8-1 | a-7-4 |
| p-8-50 | d-8-1 | a-7-5 |
| p-8-51 | d-8-1 | a-7-6 |
| p-8-52 | d-8-1 | a-7-7 |
| p-8-53 | d-8-2 | a-1-1 |
| p-8-54 | d-8-2 | a-1-2 |
| p-8-55 | d-8-2 | a-1-3 |
| p-8-56 | d-8-2 | a-2-1 |
| p-8-57 | d-8-2 | a-2-2 |
| p-8-58 | d-8-2 | a-2-3 |
| p-8-59 | d-8-2 | a-2-4 |
| p-8-60 | d-8-2 | a-2-5 |
| p-8-61 | d-8-2 | a-2-6 |
| p-8-62 | d-8-2 | a-2-7 |
| p-8-63 | d-8-2 | a-2-8 |
| p-8-64 | d-8-2 | a-2-9 |
| p-8-65 | d-8-2 | a-2-10 |
| p-8-66 | d-8-2 | a-2-11 |
| p-8-67 | d-8-2 | a-2-12 |
| p-8-68 | d-8-2 | a-2-13 |
| p-8-69 | d-8-2 | a-3-1 |
| p-8-70 | d-8-2 | a-3-2 |
| p-8-71 | d-8-2 | a-3-3 |
| p-8-72 | d-8-2 | a-3-4 |
| p-8-73 | d-8-2 | a-3-5 |
| p-8-74 | d-8-2 | a-3-6 |
| p-8-75 | d-8-2 | a-3-7 |
| p-8-76 | d-8-2 | a-4-1 |
| p-8-77 | d-8-2 | a-4-2 |
| p-8-78 | d-8-2 | a-4-3 |
| p-8-79 | d-8-2 | a-4-4 |

TABLE 10

| No. | D | A |
|---|---|---|
| p-8-80 | d-8-2 | a-4-5 |
| p-8-81 | d-8-2 | a-4-6 |
| p-8-82 | d-8-2 | a-5-1 |
| p-8-83 | d-8-2 | a-5-2 |
| p-8-84 | d-8-2 | a-5-3 |
| p-8-85 | d-8-2 | a-5-8 |
| p-8-86 | d-8-2 | a-5-9 |
| p-8-87 | d-8-2 | a-6-1 |
| p-8-88 | d-8-2 | a-6-2 |
| p-8-89 | d-8-2 | a-6-3 |
| p-8-90 | d-8-2 | a-6-4 |
| p-8-91 | d-8-2 | a-6-5 |
| p-8-92 | d-8-2 | a-6-6 |
| p-8-93 | d-8-2 | a-6-7 |
| p-8-94 | d-8-2 | a-7-1 |
| p-8-95 | d-8-2 | a-7-2 |
| p-8-96 | d-8-2 | a-7-3 |
| p-8-97 | d-8-2 | a-7-4 |
| p-8-98 | d-8-2 | a-7-5 |
| p-8-99 | d-8-2 | a-7-6 |
| p-8-100 | d-8-2 | a-7-7 |
| p-8-101 | d-8-3 | a-1-1 |
| p-8-102 | d-8-3 | a-1-2 |
| p-8-103 | d-8-3 | a-1-3 |
| p-8-104 | d-8-3 | a-2-1 |
| p-8-105 | d-8-3 | a-2-2 |
| p-8-106 | d-8-3 | a-2-3 |
| p-8-107 | d-8-3 | a-2-4 |
| p-8-108 | d-8-3 | a-2-5 |
| p-8-109 | d-8-3 | a-2-6 |
| p-8-110 | d-8-3 | a-2-7 |
| p-8-111 | d-8-3 | a-2-8 |
| p-8-112 | d-8-3 | a-2-9 |
| p-8-113 | d-8-3 | a-2-10 |
| p-8-114 | d-8-3 | a-2-11 |
| p-8-115 | d-8-3 | a-2-12 |
| p-8-116 | d-8-3 | a-2-13 |
| p-8-117 | d-8-3 | a-3-1 |
| p-8-118 | d-8-3 | a-3-2 |
| p-8-119 | d-8-3 | a-3-3 |
| p-8-120 | d-8-3 | a-3-4 |
| p-8-121 | d-8-3 | a-3-5 |
| p-8-122 | d-8-3 | a-3-6 |
| p-8-123 | d-8-3 | a-3-7 |
| p-8-124 | d-8-3 | a-4-1 |
| p-8-125 | d-8-3 | a-4-2 |
| p-8-126 | d-8-3 | a-4-3 |
| p-8-127 | d-8-3 | a-4-4 |
| p-8-128 | d-8-3 | a-4-5 |
| p-8-129 | d-8-3 | a-4-6 |
| p-8-130 | d-8-3 | a-5-1 |
| p-8-131 | d-8-3 | a-5-2 |
| p-8-132 | d-8-3 | a-5-3 |
| p-8-133 | d-8-3 | a-5-8 |
| p-8-134 | d-8-3 | a-5-9 |
| p-8-135 | d-8-3 | a-6-1 |
| p-8-136 | d-8-3 | a-6-2 |
| p-8-137 | d-8-3 | a-6-3 |
| p-8-138 | d-8-3 | a-6-4 |
| p-8-139 | d-8-3 | a-6-5 |
| p-8-140 | d-8-3 | a-6-6 |
| p-8-141 | d-8-3 | a-6-7 |
| p-8-142 | d-8-3 | a-7-1 |
| p-8-143 | d-8-3 | a-7-2 |
| p-8-144 | d-8-3 | a-7-3 |
| p-8-145 | d-8-3 | a-7-4 |
| p-8-146 | d-8-3 | a-7-5 |
| p-8-147 | d-8-3 | a-7-6 |
| p-8-148 | d-8-3 | a-7-7 |
| p-8-110 | d-8-3 | a-2-7 |
| p-8-149 | d-8-4 | a-1-1 |
| p-8-150 | d-8-4 | a-2-1 |
| p-8-151 | d-8-4 | a-3-1 |
| p-8-152 | d-8-4 | a-4-1 |
| p-8-153 | d-8-4 | a-5-1 |
| p-8-154 | d-8-4 | a-6-1 |
| p-8-155 | d-8-4 | a-7-1 |
| p-8-156 | d-8-5 | a-1-1 |

TABLE 10-continued

| No. | D | A |
|---|---|---|
| p-8-157 | d-8-5 | a-2-1 |
| p-8-158 | d-8-5 | a-3-1 |
| p-8-159 | d-8-5 | a-4-1 |
| p-8-160 | d-8-5 | a-5-1 |
| p-8-161 | d-8-5 | a-6-1 |
| p-8-162 | d-8-5 | a-7-1 |
| p-8-163 | d-8-6 | a-1-1 |
| p-8-164 | d-8-6 | a-2-1 |
| p-8-165 | d-8-6 | a-3-1 |
| p-8-166 | d-8-6 | a-4-1 |
| p-8-167 | d-8-6 | a-5-1 |
| p-8-168 | d-8-6 | a-6-1 |
| p-8-169 | d-8-6 | a-7-1 |
| p-8-170 | d-8-7 | a-1-1 |
| p-8-171 | d-8-7 | a-2-1 |
| p-8-172 | d-8-7 | a-3-1 |
| p-8-173 | d-8-7 | a-4-1 |
| p-8-174 | d-8-7 | a-5-1 |
| p-8-175 | d-8-7 | a-6-1 |
| p-8-176 | d-8-7 | a-7-1 |
| p-8-177 | d-8-8 | a-1-1 |
| p-8-178 | d-8-8 | a-1-2 |
| p-8-179 | d-8-8 | a-1-3 |
| p-8-180 | d-8-8 | a-2-1 |

TABLE 11

| No. | D | A |
|---|---|---|
| p-8-181 | d-8-8 | a-2-2 |
| p-8-182 | d-8-8 | a-2-3 |
| p-8-183 | d-8-8 | a-2-4 |
| p-8-184 | d-8-8 | a-2-5 |
| p-8-185 | d-8-8 | a-2-6 |
| p-8-186 | d-8-8 | a-2-7 |
| p-8-187 | d-8-8 | a-2-8 |
| p-8-188 | d-8-8 | a-2-9 |
| p-8-189 | d-8-8 | a-2-10 |
| p-8-190 | d-8-8 | a-2-11 |
| p-8-191 | d-8-8 | a-2-12 |
| p-8-192 | d-8-8 | a-2-13 |
| p-8-193 | d-8-8 | a-3-1 |
| p-8-194 | d-8-8 | a-3-2 |
| p-8-195 | d-8-8 | a-3-3 |
| p-8-196 | d-8-8 | a-3-4 |
| p-8-197 | d-8-8 | a-3-5 |
| p-8-198 | d-8-8 | a-3-6 |
| p-8-199 | d-8-8 | a-3-7 |
| p-8-200 | d-8-8 | a-4-1 |
| p-8-201 | d-8-8 | a-4-2 |
| p-8-202 | d-8-8 | a-4-3 |
| p-8-203 | d-8-8 | a-4-4 |
| p-8-204 | d-8-8 | a-4-5 |
| p-8-205 | d-8-8 | a-4-6 |
| p-8-206 | d-8-8 | a-5-1 |
| p-8-207 | d-8-8 | a-5-2 |
| p-8-208 | d-8-8 | a-5-3 |
| p-8-209 | d-8-8 | a-5-4 |
| p-8-210 | d-8-8 | a-5-5 |
| p-8-211 | d-8-8 | a-5-6 |
| p-8-212 | d-8-8 | a-5-7 |
| p-8-213 | d-8-8 | a-5-8 |
| p-8-214 | d-8-8 | a-5-9 |
| p-8-215 | d-8-8 | a-6-1 |
| p-8-216 | d-8-8 | a-6-2 |
| p-8-217 | d-8-8 | a-6-3 |
| p-8-218 | d-8-8 | a-6-4 |
| p-8-219 | d-8-8 | a-6-5 |
| p-8-220 | d-8-8 | a-6-6 |
| p-8-221 | d-8-8 | a-6-7 |
| p-8-222 | d-8-8 | a-7-1 |
| p-8-223 | d-8-8 | a-7-2 |
| p-8-224 | d-8-8 | a-7-3 |
| p-8-225 | d-8-8 | a-7-4 |
| p-8-226 | d-8-8 | a-7-5 |

TABLE 11-continued

| No. | D | A |
|---|---|---|
| p-8-227 | d-8-8 | a-7-6 |
| p-8-228 | d-8-8 | a-7-7 |
| p-8-229 | d-8-9 | a-1-1 |
| p-8-230 | d-8-9 | a-2-1 |
| p-8-231 | d-8-9 | a-3-1 |
| p-8-232 | d-8-9 | a-4-1 |
| p-8-233 | d-8-9 | a-5-1 |
| p-8-234 | d-8-9 | a-6-1 |
| p-8-235 | d-8-9 | a-7-1 |
| p-8-236 | d-8-10 | a-1-1 |
| p-8-237 | d-8-10 | a-2-1 |
| p-8-238 | d-8-10 | a-3-1 |
| p-8-239 | d-8-10 | a-4-1 |
| p-8-240 | d-8-10 | a-5-1 |
| p-8-241 | d-8-10 | a-6-1 |
| p-8-242 | d-8-10 | a-7-1 |
| p-8-243 | d-8-11 | a-1-1 |
| p-8-244 | d-8-11 | a-2-1 |
| p-8-245 | d-8-11 | a-3-1 |
| p-8-246 | d-8-11 | a-4-1 |
| p-8-247 | d-8-11 | a-5-1 |
| p-8-248 | d-8-11 | a-6-1 |
| p-8-249 | d-8-11 | a-7-1 |
| p-9-1 | d-9-1 | a-1-1 |
| p-9-2 | d-9-1 | a-1-2 |
| p-9-3 | d-9-1 | a-1-3 |
| p-9-4 | d-9-1 | a-2-1 |
| p-9-5 | d-9-1 | a-2-2 |
| p-9-6 | d-9-1 | a-2-3 |
| p-9-7 | d-9-1 | a-2-4 |
| p-9-8 | d-9-1 | a-2-5 |
| p-9-9 | d-9-1 | a-2-6 |
| p-9-10 | d-9-1 | a-2-7 |
| p-9-11 | d-9-1 | a-2-8 |
| p-9-12 | d-9-1 | a-2-9 |
| p-9-13 | d-9-1 | a-2-10 |
| p-9-14 | d-9-1 | a-2-11 |
| p-9-15 | d-9-1 | a-2-12 |
| p-9-16 | d-9-1 | a-2-13 |
| p-9-17 | d-9-1 | a-3-1 |
| p-9-18 | d-9-1 | a-3-2 |
| p-9-19 | d-9-1 | a-3-3 |
| p-9-20 | d-9-1 | a-3-4 |
| p-9-21 | d-9-1 | a-3-5 |
| p-9-22 | d-9-1 | a-3-6 |
| p-9-23 | d-9-1 | a-3-7 |
| p-9-24 | d-9-1 | a-4-1 |
| p-9-25 | d-9-1 | a-4-2 |
| p-9-26 | d-9-1 | a-4-3 |
| p-9-27 | d-9-1 | a-4-4 |
| p-9-28 | d-9-1 | a-4-5 |
| p-9-29 | d-9-1 | a-4-6 |
| p-9-30 | d-9-1 | a-5-1 |
| p-9-31 | d-9-1 | a-5-2 |
| p-9-32 | d-9-1 | a-5-3 |
| p-9-33 | d-9-1 | a-5-4 |
| p-9-34 | d-9-1 | a-5-5 |
| p-9-35 | d-9-1 | a-5-6 |
| p-9-36 | d-9-1 | a-5-7 |
| p-9-37 | d-9-1 | a-5-8 |
| p-9-38 | d-9-1 | a-5-9 |
| p-9-39 | d-9-1 | a-6-1 |
| p-9-40 | d-9-1 | a-6-2 |
| p-9-41 | d-9-1 | a-6-3 |
| p-9-42 | d-9-1 | a-6-4 |
| p-9-43 | d-9-1 | a-6-5 |
| p-9-44 | d-9-1 | a-6-6 |
| p-9-45 | d-9-1 | a-6-7 |

TABLE 12

| No. | D | A |
|---|---|---|
| p-9-46 | d-9-1 | a-7-1 |
| p-9-47 | d-9-1 | a-7-2 |

TABLE 12-continued

| No. | D | A |
|---|---|---|
| p-9-48 | d-9-1 | a-7-3 |
| p-9-49 | d-9-1 | a-7-4 |
| p-9-50 | d-9-1 | a-7-5 |
| p-9-51 | d-9-1 | a-7-6 |
| p-9-52 | d-9-1 | a-7-7 |
| p-9-53 | d-9-1 | a-8-1 |
| p-9-54 | d-9-1 | a-8-2 |
| p-9-55 | d-9-1 | a-8-3 |
| p-9-56 | d-9-1 | a-8-4 |
| p-9-57 | d-9-1 | a-8-5 |
| p-9-58 | d-9-1 | a-8-6 |
| p-9-59 | d-9-1 | a-8-7 |
| p-9-60 | d-9-1 | a-8-8 |
| p-9-61 | d-9-1 | a-8-9 |
| p-9-62 | d-9-1 | a-8-10 |
| p-9-63 | d-9-1 | a-8-11 |
| p-9-64 | d-9-2 | a-1-1 |
| p-9-65 | d-9-2 | a-1-2 |
| p-9-66 | d-9-2 | a-1-3 |
| p-9-67 | d-9-2 | a-2-1 |
| p-9-68 | d-9-2 | a-2-2 |
| p-9-69 | d-9-2 | a-2-3 |
| p-9-70 | d-9-2 | a-2-4 |
| p-9-71 | d-9-2 | a-2-5 |
| p-9-72 | d-9-2 | a-2-6 |
| p-9-73 | d-9-2 | a-2-7 |
| p-9-74 | d-9-2 | a-2-8 |
| p-9-75 | d-9-2 | a-2-9 |
| p-9-76 | d-9-2 | a-2-10 |
| p-9-77 | d-9-2 | a-2-11 |
| p-9-78 | d-9-2 | a-2-12 |
| p-9-79 | d-9-2 | a-2-13 |
| p-9-80 | d-9-2 | a-3-1 |
| p-9-81 | d-9-2 | a-3-2 |
| p-9-82 | d-9-2 | a-3-3 |
| p-9-83 | d-9-2 | a-3-4 |
| p-9-84 | d-9-2 | a-3-5 |
| p-9-85 | d-9-2 | a-3-6 |
| p-9-86 | d-9-2 | a-3-7 |
| p-9-87 | d-9-2 | a-4-1 |
| p-9-88 | d-9-2 | a-4-2 |
| p-9-89 | d-9-2 | a-4-3 |
| p-9-90 | d-9-2 | a-4-4 |
| p-9-91 | d-9-2 | a-4-5 |
| p-9-92 | d-9-2 | a-4-6 |
| p-9-93 | d-9-2 | a-5-1 |
| p-9-94 | d-9-2 | a-5-2 |
| p-9-95 | d-9-2 | a-5-3 |
| p-9-96 | d-9-2 | a-5-4 |
| p-9-97 | d-9-2 | a-5-5 |
| p-9-98 | d-9-2 | a-5-6 |
| p-9-99 | d-9-2 | a-5-7 |
| p-9-100 | d-9-2 | a-5-8 |
| p-9-101 | d-9-2 | a-5-9 |
| p-9-102 | d-9-2 | a-6-1 |
| p-9-103 | d-9-2 | a-6-2 |
| p-9-104 | d-9-2 | a-6-3 |
| p-9-105 | d-9-2 | a-6-4 |
| p-9-106 | d-9-2 | a-6-5 |
| p-9-107 | d-9-2 | a-6-6 |
| p-9-108 | d-9-2 | a-6-7 |
| p-9-109 | d-9-2 | a-7-1 |
| p-9-110 | d-9-2 | a-7-2 |
| p-9-111 | d-9-2 | a-7-3 |
| p-9-112 | d-9-2 | a-7-4 |
| p-9-113 | d-9-2 | a-7-5 |
| p-9-114 | d-9-2 | a-7-6 |
| p-9-115 | d-9-2 | a-7-7 |
| p-9-116 | d-9-2 | a-8-1 |
| p-9-117 | d-9-2 | a-8-2 |
| p-9-118 | d-9-2 | a-8-3 |
| p-9-119 | d-9-2 | a-8-4 |
| p-9-120 | d-9-2 | a-8-5 |
| p-9-121 | d-9-2 | a-8-6 |
| p-9-122 | d-9-2 | a-8-7 |
| p-9-123 | d-9-2 | a-8-8 |
| p-9-124 | d-9-2 | a-8-9 |
| p-9-125 | d-9-2 | a-8-10 |

TABLE 12-continued

| No. | D | A |
|---|---|---|
| p-9-126 | d-9-2 | a-8-11 |
| p-9-127 | d-9-3 | a-1-1 |
| p-9-128 | d-9-3 | a-1-2 |
| p-9-129 | d-9-3 | a-1-3 |
| p-9-130 | d-9-3 | a-2-1 |
| p-9-131 | d-9-3 | a-2-2 |
| p-9-132 | d-9-3 | a-2-3 |
| p-9-133 | d-9-3 | a-2-4 |
| p-9-134 | d-9-3 | a-2-5 |
| p-9-135 | d-9-3 | a-2-6 |
| p-9-136 | d-9-3 | a-2-7 |
| p-9-137 | d-9-3 | a-2-8 |
| p-9-138 | d-9-3 | a-2-9 |
| p-9-139 | d-9-3 | a-2-10 |
| p-9-140 | d-9-3 | a-2-11 |
| p-9-141 | d-9-3 | a-2-12 |
| p-9-142 | d-9-3 | a-2-13 |
| p-9-143 | d-9-3 | a-3-1 |
| p-9-144 | d-9-3 | a-3-2 |
| p-9-145 | d-9-3 | a-3-3 |
| p-9-146 | d-9-3 | a-3-4 |
| p-9-147 | d-9-3 | a-3-5 |
| p-9-148 | d-9-3 | a-3-6 |
| p-9-149 | d-9-3 | a-3-7 |
| p-9-150 | d-9-3 | a-4-1 |
| p-9-151 | d-9-3 | a-4-2 |
| p-9-152 | d-9-3 | a-4-3 |
| p-9-153 | d-9-3 | a-4-4 |
| p-9-154 | d-9-3 | a-4-5 |
| p-9-155 | d-9-3 | a-4-6 |
| p-9-156 | d-9-3 | a-5-1 |
| p-9-157 | d-9-3 | a-5-2 |
| p-9-158 | d-9-3 | a-5-3 |
| p-9-159 | d-9-3 | a-5-4 |
| p-9-160 | d-9-3 | a-5-5 |
| p-9-161 | d-9-3 | a-5-6 |
| p-9-162 | d-9-3 | a-5-7 |
| p-9-163 | d-9-3 | a-5-8 |
| p-9-164 | d-9-3 | a-5-9 |
| p-9-165 | d-9-3 | a-6-1 |
| p-9-166 | d-9-3 | a-6-2 |
| p-9-167 | d-9-3 | a-6-3 |
| p-9-168 | d-9-3 | a-6-4 |
| p-9-169 | d-9-3 | a-6-5 |
| p-9-170 | d-9-3 | a-6-6 |
| p-9-171 | d-9-3 | a-6-7 |
| p-9-172 | d-9-3 | a-7-1 |
| p-9-173 | d-9-3 | a-7-2 |
| p-9-174 | d-9-3 | a-7-3 |
| p-9-175 | d-9-3 | a-7-4 |
| p-9-176 | d-9-3 | a-7-5 |
| p-9-177 | d-9-3 | a-7-6 |
| p-9-178 | d-9-3 | a-7-7 |
| p-9-179 | d-9-3 | a-8-1 |
| p-9-180 | d-9-3 | a-8-2 |

TABLE 13

| No. | D | A |
|---|---|---|
| p-9-181 | d-9-3 | a-8-3 |
| p-9-182 | d-9-3 | a-8-4 |
| p-9-183 | d-9-3 | a-8-5 |
| p-9-184 | d-9-3 | a-8-6 |
| p-9-185 | d-9-3 | a-8-7 |
| p-9-186 | d-9-3 | a-8-8 |
| p-9-187 | d-9-3 | a-8-9 |
| p-9-188 | d-9-3 | a-8-10 |
| p-9-189 | d-9-3 | a-8-11 |
| p-9-190 | d-9-4 | a-1-1 |
| p-9-191 | d-9-4 | a-2-1 |
| p-9-192 | d-9-4 | a-3-1 |
| p-9-193 | d-9-4 | a-4-1 |
| p-9-194 | d-9-4 | a-5-1 |
| p-9-195 | d-9-4 | a-6-1 |

TABLE 13-continued

| No. | D | A |
|---|---|---|
| p-9-196 | d-9-4 | a-7-1 |
| p-9-197 | d-9-4 | a-8-1 |
| p-9-198 | d-9-5 | a-1-1 |
| p-9-199 | d-9-5 | a-2-1 |
| p-9-200 | d-9-5 | a-3-1 |
| p-9-201 | d-9-5 | a-4-1 |
| p-9-202 | d-9-5 | a-5-1 |
| p-9-203 | d-9-5 | a-6-1 |
| p-9-204 | d-9-5 | a-7-1 |
| p-9-205 | d-9-5 | a-8-1 |
| p-9-206 | d-9-6 | a-1-1 |
| p-9-207 | d-9-6 | a-2-1 |
| p-9-208 | d-9-6 | a-3-1 |
| p-9-209 | d-9-6 | a-4-1 |
| p-9-210 | d-9-6 | a-5-1 |
| p-9-211 | d-9-6 | a-6-1 |
| p-9-212 | d-9-6 | a-7-1 |
| p-9-213 | d-9-6 | a-8-1 |
| p-9-214 | d-9-7 | a-1-1 |
| p-9-215 | d-9-7 | a-2-1 |
| p-9-216 | d-9-7 | a-3-1 |
| p-9-217 | d-9-7 | a-4-1 |
| p-9-218 | d-9-7 | a-5-1 |
| p-9-219 | d-9-7 | a-6-1 |
| p-9-220 | d-9-7 | a-7-1 |
| p-9-221 | d-9-7 | a-8-1 |
| p-9-222 | d-9-8 | a-1-1 |
| p-9-223 | d-9-8 | a-2-1 |
| p-9-224 | d-9-8 | a-3-1 |
| p-9-225 | d-9-8 | a-4-1 |
| p-9-226 | d-9-8 | a-5-1 |
| p-9-227 | d-9-8 | a-6-1 |
| p-9-228 | d-9-8 | a-7-1 |
| p-9-229 | d-9-8 | a-8-1 |
| p-9-230 | d-9-9 | a-1-1 |
| p-9-231 | d-9-9 | a-2-1 |
| p-9-232 | d-9-9 | a-3-1 |
| p-9-233 | d-9-9 | a-4-1 |
| p-9-234 | d-9-9 | a-5-1 |
| p-9-235 | d-9-9 | a-6-1 |
| p-9-236 | d-9-9 | a-7-1 |
| p-9-237 | d-9-9 | a-8-1 |
| p-9-238 | d-9-10 | a-1-1 |
| p-9-239 | d-9-10 | a-2-1 |
| p-9-240 | d-9-10 | a-3-1 |
| p-9-241 | d-9-10 | a-4-1 |
| p-9-242 | d-9-10 | a-5-1 |
| p-9-243 | d-9-10 | a-6-1 |
| p-9-244 | d-9-10 | a-7-1 |
| p-9-245 | d-9-10 | a-8-1 |
| p-9-246 | d-9-10 | a-1-1 |
| p-9-247 | d-9-10 | a-1-2 |
| p-9-248 | d-9-10 | a-1-3 |
| p-9-249 | d-9-10 | a-2-1 |
| p-9-250 | d-9-10 | a-2-2 |
| p-9-251 | d-9-10 | a-2-3 |
| p-9-252 | d-9-10 | a-2-4 |
| p-9-253 | d-9-10 | a-2-5 |
| p-9-254 | d-9-10 | a-2-6 |
| p-9-255 | d-9-10 | a-2-7 |
| p-9-256 | d-9-10 | a-2-8 |
| p-9-257 | d-9-10 | a-2-9 |
| p-9-258 | d-9-10 | a-2-10 |
| p-9-259 | d-9-10 | a-2-11 |
| p-9-260 | d-9-10 | a-2-12 |
| p-9-261 | d-9-10 | a-2-13 |
| p-9-262 | d-9-10 | a-3-1 |
| p-9-263 | d-9-10 | a-3-2 |
| p-9-264 | d-9-10 | a-3-3 |
| p-9-265 | d-9-10 | a-3-4 |
| p-9-266 | d-9-10 | a-3-5 |
| p-9-267 | d-9-10 | a-3-6 |
| p-9-268 | d-9-10 | a-3-7 |
| p-9-269 | d-9-10 | a-4-1 |
| p-9-270 | d-9-10 | a-4-2 |
| p-9-226 | d-9-8 | a-5-1 |
| p-9-227 | d-9-8 | a-6-1 |
| p-9-228 | d-9-8 | a-7-1 |

TABLE 13-continued

| No. | D | A |
|---|---|---|
| p-9-229 | d-9-8 | a-8-1 |
| p-9-230 | d-9-9 | a-1-1 |
| p-9-231 | d-9-9 | a-2-1 |
| p-9-232 | d-9-9 | a-3-1 |
| p-9-233 | d-9-9 | a-4-1 |
| p-9-234 | d-9-9 | a-5-1 |
| p-9-235 | d-9-9 | a-6-1 |
| p-9-236 | d-9-9 | a-7-1 |
| p-9-237 | d-9-9 | a-8-1 |
| p-9-238 | d-9-10 | a-1-1 |
| p-9-239 | d-9-10 | a-2-1 |
| p-9-240 | d-9-10 | a-3-1 |
| p-9-241 | d-9-10 | a-4-1 |
| p-9-242 | d-9-10 | a-5-1 |
| p-9-243 | d-9-10 | a-6-1 |
| p-9-244 | d-9-10 | a-7-1 |
| p-9-245 | d-9-10 | a-8-1 |
| p-9-246 | d-9-10 | a-1-1 |
| p-9-247 | d-9-10 | a-1-2 |
| p-9-248 | d-9-10 | a-1-3 |
| p-9-249 | d-9-10 | a-2-1 |
| p-9-250 | d-9-10 | a-2-2 |
| p-9-251 | d-9-10 | a-2-3 |
| p-9-252 | d-9-10 | a-2-4 |
| p-9-253 | d-9-10 | a-2-5 |
| p-9-254 | d-9-10 | a-2-6 |
| p-9-255 | d-9-10 | a-2-7 |
| p-9-256 | d-9-10 | a-2-8 |
| p-9-257 | d-9-10 | a-2-9 |
| p-9-258 | d-9-10 | a-2-10 |
| p-9-259 | d-9-10 | a-2-11 |
| p-9-260 | d-9-10 | a-2-12 |
| p-9-261 | d-9-10 | a-2-13 |
| p-9-262 | d-9-10 | a-3-1 |
| p-9-263 | d-9-10 | a-3-2 |
| p-9-264 | d-9-10 | a-3-3 |
| p-9-265 | d-9-10 | a-3-4 |
| p-9-266 | d-9-10 | a-3-5 |
| p-9-267 | d-9-10 | a-3-6 |
| p-9-268 | d-9-10 | a-3-7 |
| p-9-269 | d-9-10 | a-4-1 |
| p-9-270 | d-9-10 | a-4-2 |
| p-9-271 | d-9-10 | a-4-3 |
| p-9-272 | d-9-10 | a-4-4 |
| p-9-273 | d-9-10 | a-4-5 |
| p-9-274 | d-9-10 | a-4-6 |
| p-9-275 | d-9-10 | a-5-1 |
| p-9-276 | d-9-10 | a-5-2 |
| p-9-277 | d-9-10 | a-5-3 |
| p-9-278 | d-9-10 | a-5-4 |
| p-9-279 | d-9-10 | a-5-5 |
| p-9-280 | d-9-10 | a-5-6 |
| p-9-281 | d-9-10 | a-5-7 |
| p-9-282 | d-9-10 | a-5-8 |
| p-9-283 | d-9-10 | a-5-9 |
| p-9-284 | d-9-10 | a-6-1 |
| p-9-285 | d-9-10 | a-6-2 |
| p-9-286 | d-9-10 | a-6-3 |
| p-9-287 | d-9-10 | a-6-4 |
| p-9-288 | d-9-10 | a-6-5 |
| p-9-289 | d-9-10 | a-6-6 |
| p-9-290 | d-9-10 | a-6-7 |
| p-9-291 | d-9-10 | a-7-1 |
| p-9-292 | d-9-10 | a-7-2 |
| p-9-293 | d-9-10 | a-7-3 |
| p-9-294 | d-9-10 | a-7-4 |
| p-9-295 | d-9-10 | a-7-5 |
| p-9-296 | d-9-10 | a-7-6 |
| p-9-297 | d-9-10 | a-7-7 |
| p-9-298 | d-9-10 | a-8-1 |
| p-9-299 | d-9-10 | a-8-2 |
| p-9-300 | d-9-10 | a-8-3 |
| p-9-301 | d-9-10 | a-8-4 |
| p-9-302 | d-9-10 | a-8-5 |
| p-9-303 | d-9-10 | a-8-6 |
| p-9-304 | d-9-10 | a-8-7 |
| p-9-305 | d-9-10 | a-8-8 |
| p-9-306 | d-9-10 | a-8-9 |

TABLE 13-continued

| No. | D | A |
|---|---|---|
| p-9-307 | d-9-10 | a-8-10 |
| p-9-308 | d-9-10 | a-8-11 |
| p-9-309 | d-9-11 | a-1-1 |
| p-9-310 | d-9-11 | a-2-1 |
| p-9-311 | d-9-11 | a-3-1 |
| p-9-312 | d-9-11 | a-4-1 |
| p-9-313 | d-9-11 | a-5-1 |
| p-9-314 | d-9-11 | a-6-1 |
| p-9-315 | d-9-11 | a-7-1 |

TABLE 14

| No. | D | A |
|---|---|---|
| p-9-316 | d-9-11 | a-8-1 |
| p-10-1 | d-10-1 | a-1-1 |
| p-10-2 | d-10-1 | a-1-2 |
| p-10-3 | d-10-1 | a-1-3 |
| p-10-4 | d-10-1 | a-2-1 |
| p-10-5 | d-10-1 | a-2-2 |
| p-10-6 | d-10-1 | a-2-3 |
| p-10-7 | d-10-1 | a-2-4 |
| p-10-8 | d-10-1 | a-2-5 |
| p-10-9 | d-10-1 | a-2-6 |
| p-10-10 | d-10-1 | a-2-7 |
| p-10-11 | d-10-1 | a-2-8 |
| p-10-12 | d-10-1 | a-2-9 |
| p-10-13 | d-10-1 | a-2-10 |
| p-10-14 | d-10-1 | a-2-11 |
| p-10-15 | d-10-1 | a-2-12 |
| p-10-16 | d-10-1 | a-2-13 |
| p-10-17 | d-10-1 | a-3-1 |
| p-10-18 | d-10-1 | a-3-2 |
| p-10-19 | d-10-1 | a-3-3 |
| p-10-20 | d-10-1 | a-3-4 |
| p-10-21 | d-10-1 | a-3-5 |
| p-10-22 | d-10-1 | a-3-6 |
| p-10-23 | d-10-1 | a-3-7 |
| p-10-24 | d-10-1 | a-4-1 |
| p-10-25 | d-10-1 | a-4-2 |
| p-10-26 | d-10-1 | a-4-3 |
| p-10-27 | d-10-1 | a-4-4 |
| p-10-28 | d-10-1 | a-4-5 |
| p-10-29 | d-10-1 | a-4-6 |
| p-10-30 | d-10-1 | a-5-1 |
| p-10-31 | d-10-1 | a-5-2 |
| p-10-32 | d-10-1 | a-5-3 |
| p-10-33 | d-10-1 | a-5-4 |
| p-10-34 | d-10-1 | a-5-5 |
| p-10-35 | d-10-1 | a-5-6 |
| p-10-36 | d-10-1 | a-5-7 |
| p-10-37 | d-10-1 | a-5-8 |
| p-10-38 | d-10-1 | a-5-9 |
| p-10-39 | d-10-1 | a-6-1 |
| p-10-40 | d-10-1 | a-6-2 |
| p-10-41 | d-10-1 | a-6-3 |
| p-10-42 | d-10-1 | a-6-4 |
| p-10-43 | d-10-1 | a-6-5 |
| p-10-44 | d-10-1 | a-6-6 |
| p-10-45 | d-10-1 | a-6-7 |
| p-10-46 | d-10-1 | a-7-1 |
| p-10-47 | d-10-1 | a-7-2 |
| p-10-48 | d-10-1 | a-7-3 |
| p-10-49 | d-10-1 | a-7-4 |
| p-10-50 | d-10-1 | a-7-5 |
| p-10-51 | d-10-1 | a-7-6 |
| p-10-52 | d-10-1 | a-7-7 |
| p-10-53 | d-10-2 | a-1-1 |
| p-10-54 | d-10-2 | a-2-1 |
| p-10-55 | d-10-2 | a-3-1 |
| p-10-56 | d-10-2 | a-4-1 |
| p-10-57 | d-10-2 | a-5-1 |
| p-10-58 | d-10-2 | a-6-1 |
| p-10-59 | d-10-2 | a-7-1 |
| p-10-60 | d-10-3 | a-1-1 |

TABLE 14-continued

| No. | D | A |
|---|---|---|
| p-10-61 | d-10-3 | a-2-1 |
| p-10-62 | d-10-3 | a-3-1 |
| p-10-63 | d-10-3 | a-4-1 |
| p-10-64 | d-10-3 | a-5-1 |
| p-10-65 | d-10-3 | a-6-1 |
| p-10-66 | d-10-3 | a-7-1 |

TABLE 15

| No. | D | A |
|---|---|---|
| p-11-1 | d-11-1 | a-1-1 |
| p-11-2 | d-11-1 | a-1-2 |
| P-11-3 | d-11-1 | a-1-3 |
| p-11-4 | d-11-1 | a-2-1 |
| p-11-5 | d-11-1 | a-2-2 |
| p-11-6 | d-11-1 | a-2-3 |
| p-11-7 | d-11-1 | a-2-4 |
| p-11-8 | d-11-1 | a-2-5 |
| p-11-9 | d-11-1 | a-2-6 |
| p-11-10 | d-11-1 | a-2-7 |
| p-11-11 | d-11-1 | a-2-8 |
| p-11-12 | d-11-1 | a-2-9 |
| p-11-13 | d-11-1 | a-2-10 |
| p-11-14 | d-11-1 | a-2-11 |
| p-11-15 | d-11-1 | a-2-12 |
| p-11-16 | d-11-1 | a-2-13 |
| p-11-17 | d-11-1 | a-3-1 |
| p-11-18 | d-11-1 | a-3-2 |
| p-11-19 | d-11-1 | a-3-3 |
| p-11-20 | d-11-1 | a-3-4 |
| P-11-21 | d-11-1 | a-3-5 |
| p-11-22 | d-11-1 | a-3-6 |
| p-11-23 | d-11-1 | a-3-7 |
| p-11-24 | d-11-1 | a-4-1 |
| p-11-25 | d-11-1 | a-4-2 |
| p-11-26 | d-11-1 | a-4-3 |
| p-11-27 | d-11-1 | a-4-4 |
| p-11-28 | d-11-1 | a-4-5 |
| p-11-29 | d-11-1 | a-4-6 |
| p-11-30 | d-11-1 | a-5-1 |
| p-11-31 | d-11-1 | a-5-2 |
| p-11-32 | d-11-1 | a-5-3 |
| p-11-33 | d-11-1 | a-5-4 |
| p-11-34 | d-11-1 | a-5-5 |
| p-11-35 | d-11-1 | a-5-6 |
| p-11-36 | d-11-1 | a-5-7 |
| p-11-37 | d-11-1 | a-5-8 |
| p-11-38 | d-11-1 | a-5-9 |
| p-11-39 | d-11-1 | a-6-1 |
| p-11-40 | d-11-1 | a-6-2 |
| P-11-41 | d-11-1 | a-6-3 |
| p-11-42 | d-11-1 | a-6-4 |
| p-11-43 | d-11-1 | a-6-5 |
| p-11-44 | d-11-1 | a-6-6 |
| p-11-45 | d-11-1 | a-6-7 |
| p-11-46 | d-11-1 | a-7-1 |
| p-11-47 | d-11-1 | a-7-2 |
| p-11-48 | d-11-1 | a-7-3 |
| p-11-49 | d-11-1 | a-7-4 |
| p-11-50 | d-11-1 | a-7-5 |
| p-11-51 | d-11-1 | a-7-6 |
| p-11-52 | d-11-1 | a-7-7 |
| p-11-53 | d-11-2 | a-1-1 |
| p-11-54 | d-11-2 | a-2-1 |
| p-11-55 | d-11-2 | a-3-1 |
| p-11-56 | d-11-2 | a-4-l |
| p-11-57 | d-11-2 | a-5-1 |
| p-11-58 | d-11-2 | a-6-1 |
| p-11-59 | d-11-2 | a-7-1 |
| p-11-60 | d-11-3 | a-1-1 |
| p-11-61 | d-11-3 | a-2-1 |
| p-11-62 | d-11-3 | a-3-1 |
| p-11-63 | d-11-3 | a-4-1 |
| p-11-64 | d-11-3 | a-5-1 |

TABLE 15-continued

| No. | D | A |
|---|---|---|
| p-11-65 | d-11-3 | a-6-1 |
| p-11-66 | d-11-3 | a-7-1 |
| p-11-67 | d-11-4 | a-1-1 |
| p-11-68 | d-11-4 | a-1-2 |
| p-11-69 | d-11-4 | a-1-3 |
| p-11-70 | d-11-4 | a-2-1 |
| p-11-71 | d-11-4 | a-2-2 |
| p-11-72 | d-11-4 | a-2-3 |
| p-11-73 | d-11-4 | a-2-4 |
| p-11-74 | d-11-4 | a-2-5 |
| p-11-75 | d-11-4 | a-2-6 |
| p-11-76 | d-11-4 | a-2-7 |
| p-11-77 | d-11-4 | a-2-8 |
| p-11-78 | d-11-4 | a-2-9 |
| p-11-79 | d-11-4 | a-2-10 |
| p-11-80 | d-11-4 | a-2-11 |
| p-11-81 | d-11-4 | a-2-12 |
| p-11-82 | d-11-4 | a-2-13 |
| p-11-83 | d-11-4 | a-3-1 |
| p-11-84 | d-11-4 | a-3-2 |
| p-11-85 | d-11-4 | a-3-3 |
| p-11-86 | d-11-4 | a-3-4 |
| p-11-87 | d-11-4 | a-3-5 |
| p-11-38 | d-11-4 | a-3-6 |
| p-11-89 | d-11-4 | a-3-7 |
| p-11-90 | d-11-4 | a-4-1 |
| p-11-91 | d-11-4 | a-4-2 |
| p-11-92 | d-11-4 | a-4-3 |
| p-11-93 | d-11-4 | a-4-4 |
| p-11-94 | d-11-4 | a-4-5 |
| p-11-95 | d-11-4 | a-4-6 |
| p-11-96 | d-11-4 | a-5-1 |
| p-11-97 | d-11-4 | a-5-2 |
| p-11-98 | d-11-4 | a-5-3 |
| p-11-99 | d-11-4 | a-5-4 |
| p-11-100 | d-11-4 | a-5-5 |
| p-11-101 | d-11-4 | a-5-6 |
| p-11-102 | d-11-4 | a-5-7 |
| p-11-103 | d-11-4 | a-5-8 |
| p-11-104 | d-11-4 | a-5-9 |
| p-11-105 | d-11-4 | a-6-1 |
| p-11-106 | d-11-4 | a-6-2 |
| p-11-107 | d-11-4 | a-6-3 |
| p-11-108 | d-11-4 | a-6-4 |
| p-11-109 | d-11-4 | a-6-5 |
| p-11-110 | d-11-4 | a-6-6 |
| p-11-111 | d-11-4 | a-6-7 |
| p-11-112 | d-11-4 | a-7-1 |
| p-11-113 | d-11-4 | a-7-2 |
| p-11-114 | d-11-4 | a-7-3 |
| p-11-115 | d-11-4 | a-7-4 |
| p-11-116 | d-11-4 | a-7-5 |
| p-11-117 | d-11-4 | a-7-6 |
| p-11-118 | d-11-4 | a-7-7 |

TABLE 16

| No. | D | A |
|---|---|---|
| p-11-119 | d-11-5 | a-1-1 |
| p-11-120 | d-11-5 | a-1-2 |
| p-11-121 | d-11-5 | a-1-3 |
| p-11-122 | d-11-5 | a-2-1 |
| p-11-123 | d-11-5 | a-2-2 |
| p-11-124 | d-11-5 | a-2-3 |
| p-11-125 | d-11-5 | a-2-4 |
| p-11-126 | d-11-5 | a-2-5 |
| p-11-127 | d-11-5 | a-2-6 |
| p-11-128 | d-11-5 | a-2-7 |
| p-11-129 | d-11-5 | a-2-8 |
| p-11-130 | d-11-5 | a-2-9 |
| p-11-131 | d-11-5 | a-2-10 |
| p-11-132 | d-11-5 | a-2-11 |
| p-11-133 | d-11-5 | a-2-12 |
| p-11-134 | d-11-5 | a-2-13 |

TABLE 16-continued

| No. | D | A |
|---|---|---|
| p-11-135 | d-11-5 | a-3-1 |
| p-11-136 | d-11-5 | a-3-2 |
| p-11-137 | d-11-5 | a-3-3 |
| p-11-138 | d-11-5 | a-3-4 |
| P-11-139 | d-11-5 | a-3-5 |
| p-11-140 | d-11-5 | a-3-6 |
| p-11-141 | d-11-5 | a-3-7 |
| p-11-142 | d-11-5 | a-4-1 |
| p-11-143 | d-11-5 | a-4-2 |
| p-11-144 | d-11-5 | a-4-3 |
| p-11-145 | d-11-5 | a-4-4 |
| p-11-146 | d-11-5 | a-4-5 |
| p-11-147 | d-11-5 | a-4-6 |
| p-11-148 | d-11-5 | a-5-1 |
| p-11-149 | d-11-5 | a-5-2 |
| p-11-150 | d-11-5 | a-5-3 |
| p-11-151 | d-11-5 | a-5-4 |
| p-11-152 | d-11-5 | a-5-5 |
| p-11-153 | d-11-5 | a-5-6 |
| p-11-154 | d-11-5 | a-5-7 |
| p-11-155 | d-11-5 | a-5-8 |
| p-11-156 | d-11-5 | a-5-9 |
| p-11-157 | d-11-5 | a-6-1 |
| p-11-158 | d-11-5 | a-6-2 |
| p-11-159 | d-11-5 | 3-6-3 |
| p-11-160 | d-11-5 | a-6-4 |
| p-11-161 | d-11-5 | a-6-5 |
| p-11-162 | d-11-5 | a-6-6 |
| p-11-163 | d-11-5 | a-6-7 |
| p-11-164 | d-11-5 | a-7-1 |
| p-11-165 | d-11-5 | a-7-2 |
| p-11-166 | d-11-5 | a-7-3 |
| p-11-167 | d-11-5 | a-7-4 |
| p-11-168 | d-11-5 | a-7-5 |
| p-11-169 | d-11-5 | a-7-6 |
| p-11-170 | d-11-5 | a-7-7 |
| p-11-171 | d-11-6 | a-1-1 |
| p-11-172 | d-11-6 | a-2-1 |
| p-11-173 | d-11-6 | a-3-1 |
| p-11-174 | d-11-6 | a-4-1 |
| p-11-175 | d-11-6 | a-5-1 |
| p-11-176 | d-11-6 | a-6-1 |
| p-11-177 | d-11-6 | a-7-1 |
| p-11-178 | d-11-7 | a-1-1 |
| p-11-179 | d-11-7 | a-2-1 |
| p-11-180 | d-11-7 | a-3-1 |
| p-11-181 | d-11-7 | a-4-1 |
| p-11-182 | d-11-7 | a-5-1 |
| p-11-183 | d-11-7 | a-6-1 |
| p-11-184 | d-11-7 | a-7-1 |
| p-11-185 | d-11-8 | a-1-1 |
| p-11-186 | d-11-8 | a-1-2 |
| p-11-187 | d-11-8 | a-1-3 |
| p-11-188 | d-11-8 | a-2-1 |
| p-11-189 | d-11-8 | a-2-2 |
| p-11-190 | d-11-8 | a-2-3 |
| p-11-191 | d-11-8 | a-2-4 |
| p-11-192 | d-11-8 | a-2-5 |
| p-11-193 | d-11-8 | a-2-6 |
| p-11-194 | d-11-8 | a-2-7 |
| p-11-195 | d-11-8 | a-2-8 |
| p-11-196 | d-11-8 | a-2-9 |
| p-11-197 | d-11-8 | a-2-10 |
| p-11-198 | d-11-8 | a-2-11 |
| p-11-199 | d-11-8 | a-2-12 |
| p-11-200 | d-11-8 | a-2-13 |
| p-11-201 | d-11-8 | a-3-1 |
| p-11-202 | d-11-8 | a-3-2 |
| p-11-203 | d-11-8 | a-3-3 |
| p-11-204 | d-11-8 | a-3-4 |
| p-11-205 | d-11-8 | a-3-5 |
| p-11-206 | d-11-8 | a-3-6 |
| p-11-207 | d-11-8 | a-3-7 |
| p-11-208 | d-11-8 | a-4-1 |
| p-11-209 | d-11-8 | a-4-2 |
| p-11-210 | d-11-8 | a-4-3 |
| p-11-211 | d-11-8 | a-4-4 |
| p-11-212 | d-11-8 | a-4-5 |
| p-11-213 | d-11-8 | a-4-6 |
| p-11-214 | d-11-8 | a-5-1 |
| p-11-215 | d-11-8 | a-5-2 |
| p-11-216 | d-11-8 | a-5-3 |
| p-11-217 | d-11-8 | a-5-4 |
| p-11-218 | d-11-8 | a-5-5 |
| p-11-219 | d-11-8 | a-5-6 |
| p-11-220 | d-11-8 | a-5-7 |
| p-11-221 | d-11-8 | a-5-8 |
| p-11-222 | d-11-8 | a-5-9 |
| p-11-223 | d-11-8 | a-6-1 |
| p-11-224 | d-11-8 | a-6-2 |
| p-11-225 | d-11-8 | a-6-3 |
| p-11-226 | d-11-8 | a-6-4 |
| p-11-227 | d-11-8 | a-6-5 |
| p-11-228 | d-11-8 | a-6-6 |
| p-11-229 | d-11-8 | a-6-7 |
| p-11-230 | d-11-8 | a-7-1 |
| p-11-231 | d-11-8 | a-7-2 |
| p-11-232 | d-11-8 | a-7-3 |
| p-11-233 | d-11-8 | a-7-4 |

TABLE 17

| No. | D | A |
|---|---|---|
| p-11-234 | d-11-8 | a-7-5 |
| p-11-235 | d-11-8 | a-7-6 |
| p-11-236 | d-11-8 | a-7-7 |
| p-11-237 | d-11-9 | a-1-1 |
| p-11-238 | d-11-9 | a-2-1 |
| p-11-239 | d-11-9 | a-3-1 |
| p-11-240 | d-11-9 | a-4-1 |
| p-11-241 | d-11-9 | a-5-1 |
| p-11-242 | d-11-9 | a-6-1 |
| p-11-243 | d-11-9 | a-7-1 |
| p-11-244 | d-11-10 | a-1-1 |
| p-11-245 | d-11-10 | a-1-2 |
| p-11-246 | d-11-10 | a-1-3 |
| p-11-247 | d-11-10 | a-2-1 |
| p-11-248 | d-11-10 | a-2-2 |
| p-11-249 | d-11-10 | a-2-3 |
| p-11-250 | d-11-10 | a-2-4 |
| p-11-251 | d-11-10 | a-2-5 |
| p-11-252 | d-11-10 | a-2-6 |
| p-11-253 | d-11-10 | a-2-7 |
| p-11-254 | d-11-10 | a-2-8 |
| p-11-255 | d-11-10 | a-2-9 |
| p-11-256 | d-11-10 | a-2-10 |
| p-11-257 | d-11-10 | a-2-11 |
| p-11-258 | d-11-10 | a-2-12 |
| p-11-259 | d-11-10 | a-2-13 |
| p-11-260 | d-11-10 | a-3-1 |
| p-11-261 | d-11-10 | a-3-2 |
| p-11-262 | d-11-10 | a-3-3 |
| p-11-263 | d-11-10 | a-3-4 |
| p-11-264 | d-11-10 | a-3-5 |
| p-11-265 | d-11-10 | a-3-6 |
| p-11-266 | d-11-10 | a-3-7 |
| p-11-267 | d-11-10 | a-4-1 |
| p-11-268 | d-11-10 | a-4-2 |
| p-11-269 | d-11-10 | a-4-3 |
| p-11-270 | d-11-10 | a-4-4 |
| p-11-271 | d-11-10 | a-4-5 |
| p-11-272 | d-11-10 | a-4-6 |
| p-11-273 | d-11-10 | a-5-1 |
| p-11-274 | d-11-10 | a-5-2 |
| p-11-275 | d-11-10 | a-5-3 |
| p-11-276 | d-11-10 | a-5-4 |
| p-11-277 | d-11-10 | a-5-5 |
| p-11-278 | d-11-10 | a-5-6 |
| p-11-279 | d-11-10 | a-5-7 |
| p-11-280 | d-11-10 | a-5-8 |
| p-11-281 | d-11-10 | a-5-9 |
| p-11-282 | d-11-10 | a-6-1 |

TABLE 17-continued

| No. | D | A |
|---|---|---|
| p-11-283 | d-11-10 | a-6-2 |
| p-11-284 | d-11-10 | a-6-3 |
| p-11-285 | d-11-10 | a-6-4 |
| p-11-286 | d-11-10 | a-6-5 |
| p-11-287 | d-11-10 | a-6-6 |
| p-11-288 | d-11-10 | a-6-7 |
| p-11-289 | d-11-10 | a-7-1 |
| p-11-290 | d-11-10 | a-7-2 |
| p-11-291 | d-11-10 | a-7-3 |
| p-11-292 | d-11-10 | a-7-4 |
| p-11-293 | d-11-10 | a-7-5 |
| p-11-294 | d-11-10 | a-7-6 |
| p-11-295 | d-11-10 | a-7-7 |
| p-11-296 | d-11-11 | a-1-1 |
| p-11-297 | d-11-11 | a-2-1 |
| p-11-298 | d-11-11 | a-3-1 |
| p-11-299 | d-11-11 | a-4-1 |
| p-11-300 | d-11-11 | a-5-1 |
| p-11-267 | d-11-10 | a-4-1 |
| p-11-268 | d-11-10 | a-4-2 |
| p-11-269 | d-11-10 | a-4-3 |
| p-11-270 | d-11-10 | a-4-4 |
| p-11-271 | d-11-10 | a-4-5 |
| p-11-272 | d-11-10 | a-4-6 |
| p-11-273 | d-11-10 | a-5-1 |
| p-11-274 | d-11-10 | a-5-2 |
| p-11-275 | d-11-10 | a-5-3 |
| p-11-276 | d-11-10 | a-5-4 |
| p-11-277 | d-11-10 | a-5-5 |
| p-11-278 | d-11-10 | a-5-6 |
| p-11-279 | d-11-10 | a-5-7 |
| p-11-280 | d-11-10 | a-5-8 |
| p-11-281 | d-11-10 | a-5-9 |
| p-11-282 | d-11-10 | a-6-1 |
| p-11-283 | d-11-10 | a-6-2 |
| p-11-284 | d-11-10 | a-6-3 |
| p-11-285 | d-11-10 | a-6-4 |
| p-11-286 | d-11-10 | a-6-5 |
| p-11-287 | d-11-10 | a-6-6 |
| p-11-288 | d-11-10 | a-6-7 |
| p-11-289 | d-11-10 | a-7-1 |
| p-11-290 | d-11-10 | a-7-2 |
| p-11-291 | d-11-10 | a-7-3 |
| p-11-292 | d-11-10 | a-7-4 |
| p-11-293 | d-11-10 | a-7-5 |
| p-11-294 | d-11-10 | a-7-6 |
| p-11-295 | d-11-10 | a-7-7 |
| p-11-296 | d-11-11 | a-1-1 |
| p-11-297 | d-11-11 | a-2-1 |
| p-11-298 | d-11-11 | a-3-1 |
| p-11-299 | d-11-11 | a-4-1 |
| p-11-300 | d-11-11 | a-5-1 |
| p-11-301 | d-11-11 | a-6-1 |
| p-11-302 | d-11-11 | a-7-1 |
| p-11-303 | d-11-12 | a-1-1 |
| p-11-304 | d-11-12 | a-1-2 |
| p-11-305 | d-11-12 | a-1-3 |
| p-11-306 | d-11-12 | a-2-1 |
| p-11-307 | d-11-12 | a-2-2 |
| p-11-308 | d-11-12 | a-2-3 |
| p-11-309 | d-11-12 | a-2-4 |
| p-11-310 | d-11-12 | a-2-5 |
| p-11-311 | d-11-12 | a-2-6 |
| p-11-312 | d-11-12 | a-2-7 |
| p-11-313 | d-11-12 | a-2-8 |
| p-11-314 | d-11-12 | a-2-9 |
| p-11-315 | d-11-12 | a-2-10 |
| p-11-316 | d-11-12 | a-2-11 |
| p-11-317 | d-11-12 | a-2-12 |
| p-11-318 | d-11-12 | a-2-13 |
| p-11-319 | d-11-12 | a-3-1 |
| p-11-320 | d-11-12 | a-3-2 |
| p-11-321 | d-11-12 | a-3-3 |
| p-11-322 | d-11-12 | a-3-4 |
| p-11-323 | d-11-12 | a-3-5 |
| p-11-324 | d-11-12 | a-3-6 |
| p-11-325 | d-11-12 | a-3-7 |
| p-11-326 | d-11-12 | a-4-1 |
| p-11-327 | d-11-12 | a-4-2 |
| p-11-328 | d-11-12 | a-4-3 |
| p-11-329 | d-11-12 | a-4-4 |
| p-11-330 | d-11-12 | a-4-5 |
| p-11-331 | d-11-12 | a-4-6 |
| p-11-332 | d-11-12 | a-5-1 |
| p-11-333 | d-11-12 | a-5-2 |
| p-11-334 | d-11-12 | a-5-3 |
| p-11-335 | d-11-12 | a-5-4 |
| p-11-336 | d-11-12 | a-5-5 |
| p-11-337 | d-11-12 | a-5-6 |
| p-11-338 | d-11-12 | a-5-7 |
| p-11-339 | d-11-12 | a-5-8 |
| p-11-340 | d-11-12 | a-5-9 |
| p-11-341 | d-11-12 | a-6-1 |
| p-11-342 | d-11-12 | a-6-2 |
| p-11-343 | d-11-12 | a-6-3 |
| p-11-344 | d-11-12 | a-6-4 |

TABLE 18

| No. | D | A |
|---|---|---|
| p-11-345 | d-11-12 | a-6-5 |
| p-11-346 | d-11-12 | a-6-6 |
| p-11-347 | d-11-12 | a-6-7 |
| p-11-348 | d-11-12 | a-7-1 |
| p-11-349 | d-11-12 | a-7-2 |
| p-11-350 | d-11-12 | a-7-3 |
| p-11-351 | d-11-12 | a-7-4 |
| p-11-352 | d-11-12 | a-7-5 |
| p-11-353 | d-11-12 | a-7-6 |
| p-11-354 | d-11-12 | a-7-7 |
| p-11-355 | d-11-13 | a-1-1 |
| p-11-356 | d-11-13 | a-1-2 |
| p-11-357 | d-11-13 | a-1-3 |
| p-11-358 | d-11-13 | a-2-1 |
| p-11-359 | d-11-13 | a-2-2 |
| p-11-360 | d-11-13 | a-2-3 |
| p-11-361 | d-11-13 | a-2-4 |
| p-11-362 | d-11-13 | a-2-5 |
| p-11-363 | d-11-13 | a-2-6 |
| p-11-364 | d-11-13 | a-2-7 |
| p-11-365 | d-11-13 | a-2-8 |
| p-11-366 | d-11-13 | a-2-9 |
| p-11-367 | d-11-13 | a-2-10 |
| p-11-368 | d-11-13 | a-2-11 |
| p-11-369 | d-11-13 | a-2-12 |
| p-11-370 | d-11-13 | a-2-13 |
| p-11-371 | d-11-13 | a-3-1 |
| p-11-372 | d-11-13 | a-3-2 |
| p-11-373 | d-11-13 | a-3-3 |
| p-11-374 | d-11-13 | a-3-4 |
| p-11-375 | d-11-13 | a-3-5 |
| p-11-376 | d-11-13 | a-3-6 |
| p-11-377 | d-11-13 | a-3-7 |
| p-11-378 | d-11-13 | a-4-1 |
| p-11-379 | d-11-13 | a-4-2 |
| p-11-380 | d-11-13 | a-4-3 |
| p-11-381 | d-11-13 | a-4-4 |
| p-11-382 | d-11-13 | a-4-5 |
| p-11-383 | d-11-13 | a-4-6 |
| p-11-384 | d-11-13 | a-5-1 |
| p-11-385 | d-11-13 | a-5-2 |
| p-11-386 | d-11-13 | a-5-3 |
| p-11-387 | d-11-13 | a-5-4 |
| p-11-388 | d-11-13 | a-5-5 |
| p-11-389 | d-11-13 | a-5-6 |
| p-11-390 | d-11-13 | a-5-7 |
| p-11-391 | d-11-13 | a-5-8 |
| p-11-392 | d-11-13 | a-5-9 |
| p-11-393 | d-11-13 | a-6-1 |
| p-11-394 | d-11-13 | a-6-2 |
| p-11-395 | d-11-13 | a-6-3 |
| p-11-396 | d-11-13 | a-6-4 |

TABLE 18-continued

| No. | D | A |
|---|---|---|
| p-11-397 | d-11-13 | a-6-5 |
| p-11-398 | d-11-13 | a-6-6 |
| p-11-399 | d-11-13 | a-6-7 |
| p-11-400 | d-11-13 | a-7-1 |
| p-11-401 | d-11-13 | a-7-2 |
| p-11-402 | d-11-13 | a-7-3 |
| p-11-403 | d-11-13 | a-7-4 |
| p-11-404 | d-11-13 | a-7-5 |
| p-11-405 | d-11-13 | a-7-6 |
| p-11-406 | d-11-13 | a-7-7 |
| p-11-407 | d-11-14 | a-1-1 |
| p-11-408 | d-11-14 | a-1-2 |
| p-11-409 | d-11-14 | a-1-3 |
| p-11-410 | d-11-14 | a-2-1 |
| p-11-411 | d-11-14 | a-2-2 |
| p-11-412 | d-11-14 | a-2-3 |
| p-11-413 | d-11-14 | a-2-4 |
| p-11-414 | d-11-14 | a-2-5 |
| p-11-415 | d-11-14 | a-2-6 |
| p-11-416 | d-11-14 | a-2-7 |
| p-11-417 | d-11-14 | a-2-8 |
| p-11-418 | d-11-14 | a-2-9 |
| p-11-419 | d-11-14 | a-2-10 |
| p-11-420 | d-11-14 | a-2-11 |
| p-11-421 | d-11-14 | a-2-12 |
| p-11-422 | d-11-14 | a-2-13 |
| p-11-423 | d-11-14 | a-3-1 |
| p-11-424 | d-11-14 | a-3-2 |
| p-11-425 | d-11-14 | a-3-3 |
| p-11-426 | d-11-14 | a-3-4 |
| p-11-427 | d-11-14 | a-3-5 |
| p-11-428 | d-11-14 | a-3-6 |
| p-11-429 | d-11-14 | a-3-7 |
| p-11-430 | d-11-14 | a-4-1 |
| p-11-431 | d-11-14 | a-4-2 |
| p-11-432 | d-11-14 | a-4-3 |
| p-11-433 | d-11-14 | a-4-4 |
| p-11-434 | d-11-14 | a-4-5 |
| p-11-435 | d-11-14 | a-4-6 |
| p-11-436 | d-11-14 | a-5-1 |
| p-11-437 | d-11-14 | a-5-2 |
| p-11-438 | d-11-14 | a-5-3 |
| p-11-439 | d-11-14 | a-5-4 |
| p-11-440 | d-11-14 | a-5-5 |
| p-11-441 | d-11-14 | a-5-6 |
| p-11-442 | d-11-14 | a-5-7 |
| p-11-443 | d-11-14 | a-5-8 |
| p-11-444 | d-11-14 | a-5-9 |
| p-11-445 | d-11-14 | a-6-1 |
| p-11-446 | d-11-14 | a-6-2 |
| p-11-447 | d-11-14 | a-6-3 |
| p-11-448 | d-11-14 | a-6-4 |
| p-11-449 | d-11-14 | a-6-5 |
| p-11-450 | d-11-14 | a-6-6 |
| p-11-451 | d-11-14 | a-6-7 |
| p-11-452 | d-11-14 | a-7-1 |
| p-11-453 | d-11-14 | a-7-2 |
| p-11-454 | d-11-14 | a-7-3 |
| p-11-455 | d-11-14 | a-7-4 |
| p-11-456 | d-11-14 | a-7-5 |
| p-11-457 | d-11-14 | a-7-6 |

TABLE 19

| No. | D | A |
|---|---|---|
| p-11-458 | d-11-14 | a-7-7 |
| p-11-459 | d-11-15 | a-1-1 |
| p-11-460 | d-11-15 | a-2-1 |
| p-11-461 | d-11-15 | a-3-1 |
| p-11-462 | d-11-15 | a-4-1 |
| p-11-463 | d-11-15 | a-5-1 |
| p-11-464 | d-11-15 | a-6-1 |
| p-11-465 | d-11-15 | a-7-1 |
| p-12-1 | d-12-1 | a-1-1 |

TABLE 19-continued

| No. | D | A |
|---|---|---|
| p-12-2 | d-12-1 | a-1-2 |
| p-12-3 | d-12-1 | a-1-3 |
| p-12-4 | d-12-1 | a-2-1 |
| p-12-5 | d-12-1 | a-2-2 |
| p-12-6 | d-12-1 | a-2-3 |
| p-12-7 | d-12-1 | a-2-4 |
| p-12-8 | d-12-1 | a-2-5 |
| p-12-9 | d-12-1 | a-2-6 |
| p-12-10 | d-12-1 | a-2-7 |
| p-12-11 | d-12-1 | a-2-8 |
| p-12-12 | d-12-1 | a-2-9 |
| p-12-13 | d-12-1 | a-2-10 |
| p-12-14 | d-12-1 | a-2-11 |
| p-12-15 | d-12-1 | a-2-12 |
| p-12-16 | d-12-1 | a-2-13 |
| p-12-17 | d-12-1 | a-3-1 |
| p-12-18 | d-12-1 | a-3-2 |
| p-12-19 | d-12-1 | a-3-3 |
| p-12-20 | d-12-1 | a-3-4 |
| p-12-21 | d-12-1 | a-3-5 |
| p-12-22 | d-12-1 | a-3-6 |
| p-12-23 | d-12-1 | a-3-7 |
| p-12-24 | d-12-1 | a-4-1 |
| p-12-25 | d-12-1 | a-4-2 |
| p-12-26 | d-12-1 | a-4-3 |
| p-12-27 | d-12-1 | a-4-4 |
| p-12-28 | d-12-1 | a-4-5 |
| p-12-29 | d-12-1 | a-4-6 |
| p-12-30 | d-12-1 | a-5-1 |
| p-12-31 | d-12-1 | a-5-2 |
| p-12-32 | d-12-1 | a-5-3 |
| p-12-33 | d-12-1 | a-5-4 |
| p-12-34 | d-12-1 | a-5-5 |
| p-12-35 | d-12-1 | a-5-6 |
| p-12-36 | d-12-1 | a-5-7 |
| p-12-37 | d-12-1 | a-5-8 |
| p-12-38 | d-12-1 | a-5-9 |
| p-12-39 | d-12-1 | a-6-1 |
| p-12-40 | d-12-1 | a-6-2 |
| p-12-41 | d-12-1 | a-6-3 |
| p-12-42 | d-12-1 | a-6-4 |
| p-12-43 | d-12-1 | a-6-5 |
| p-12-44 | d-12-1 | a-6-6 |
| p-12-45 | d-12-1 | a-6-7 |
| p-12-46 | d-12-1 | a-7-1 |
| p-12-47 | d-12-1 | a-7-2 |
| p-12-48 | d-12-1 | a-7-3 |
| p-12-49 | d-12-1 | a-7-4 |
| p-12-50 | d-12-1 | a-7-5 |
| p-12-51 | d-12-1 | a-7-6 |
| p-12-52 | d-12-1 | a-7-7 |
| p-12-53 | d-12-1 | a-8-1 |
| p-12-54 | d-12-1 | a-8-2 |
| p-12-55 | d-12-1 | a-8-3 |
| p-12-56 | d-12-1 | a-8-4 |
| p-12-57 | d-12-1 | a-8-5 |
| p-12-58 | d-12-1 | a-8-6 |
| p-12-59 | d-12-1 | a-8-7 |
| p-12-60 | d-12-1 | a-8-8 |
| p-12-61 | d-12-1 | a-8-9 |
| p-12-62 | d-12-1 | a-8-10 |
| p-12-63 | d-12-1 | a-8-11 |
| p-12-64 | d-12-2 | a-1-1 |
| p-12-65 | d-12-2 | a-2-1 |
| p-12-66 | d-12-2 | a-3-1 |
| p-12-67 | d-12-2 | a-4-1 |
| p-12-68 | d-12-2 | a-5-1 |
| p-12-69 | d-12-2 | a-6-1 |
| p-12-70 | d-12-2 | a-7-1 |
| p-12-71 | d-12-2 | a-8-1 |
| p-12-72 | d-12-3 | a-1-1 |
| p-12-73 | d-12-3 | a-2-1 |
| p-12-74 | d-12-3 | a-3-1 |
| p-12-75 | d-12-3 | a-4-1 |
| p-12-76 | d-12-3 | a-5-1 |
| p-12-77 | d-12-3 | a-6-1 |
| p-12-78 | d-12-3 | a-7-1 |
| p-12-79 | d-12-3 | a-8-1 |

TABLE 19-continued

| No. | D | A |
|---|---|---|
| p-12-80 | d-12-4 | a-1-1 |
| p-12-81 | d-12-4 | a-1-2 |
| p-12-82 | d-12-4 | a-1-3 |
| p-12-83 | d-12-4 | a-2-1 |
| p-12-84 | d-12-4 | a-2-2 |
| p-12-85 | d-12-4 | a-2-3 |
| p-12-86 | d-12-4 | a-2-4 |
| p-12-87 | d-12-4 | a-2-5 |
| p-12-88 | d-12-4 | a-2-6 |
| p-12-89 | d-12-4 | a-2-7 |
| p-12-90 | d-12-4 | a-2-8 |

TABLE 20

| No. | D | A |
|---|---|---|
| p-12-91 | d-12-4 | a-2-9 |
| p-12-92 | d-12-4 | a-2-10 |
| p-12-93 | d-12-4 | a-2-11 |
| p-12-94 | d-12-4 | a-2-12 |
| p-12-95 | d-12-4 | a-2-13 |
| p-12-96 | d-12-4 | a-3-1 |
| p-12-97 | d-12-4 | a-3-2 |
| p-12-98 | d-12-4 | a-3-3 |
| p-12-99 | d-12-4 | a-3-4 |
| p-12-100 | d-12-4 | a-3-5 |
| p-12-101 | d-12-4 | a-3-6 |
| p-12-102 | d-12-4 | a-3-7 |
| p-12-103 | d-12-4 | a-4-1 |
| p-12-104 | d-12-4 | a-4-2 |
| p-12-105 | d-12-4 | a-4-3 |
| p-12-106 | d-12-4 | a-4-4 |
| p-12-107 | d-12-4 | a-4-5 |
| p-12-108 | d-12-4 | a-4-6 |
| p-12-109 | d-12-4 | a-5-1 |
| p-12-110 | d-12-4 | a-5-2 |
| p-12-111 | d-12-4 | a-5-3 |
| p-12-112 | d-12-4 | a-5-4 |
| p-12-113 | d-12-4 | a-5-5 |
| p-12-114 | d-12-4 | a-5-6 |
| p-12-115 | d-12-4 | a-5-7 |
| p-12-116 | d-12-4 | a-5-8 |
| p-12-117 | d-12-4 | a-5-9 |
| p-12-118 | d-12-4 | a-6-1 |
| p-12-119 | d-12-4 | a-6-2 |
| p-12-120 | d-12-4 | a-6-3 |
| p-12-121 | d-12-4 | a-6-4 |
| p-12-122 | d-12-4 | a-6-5 |
| p-12-123 | d-12-4 | a-6-6 |
| p-12-124 | d-12-4 | a-6-7 |
| p-12-125 | d-12-4 | a-7-1 |
| p-12-126 | d-12-4 | a-7-2 |
| p-12-127 | d-12-4 | a-7-3 |
| p-12-128 | d-12-4 | a-7-4 |
| p-12-129 | d-12-4 | a-7-5 |
| p-12-130 | d-12-4 | a-7-6 |
| p-12-131 | d-12-4 | a-7-7 |
| p-12-132 | d-12-4 | a-8-1 |
| p-12-133 | d-12-4 | a-8-2 |
| p-12-134 | d-12-4 | a-8-3 |
| p-12-135 | d-12-4 | a-8-4 |
| p-12-136 | d-12-4 | a-8-5 |
| p-12-137 | d-12-4 | a-8-6 |
| p-12-138 | d-12-4 | a-8-7 |
| p-12-139 | d-12-4 | a-8-8 |
| p-12-140 | d-12-4 | a-8-9 |
| p-12-141 | d-12-4 | a-8-10 |
| p-12-142 | d-12-4 | a-8-11 |
| p-12-143 | d-12-5 | a-1-1 |
| p-12-144 | d-12-5 | a-1-2 |
| p-12-145 | d-12-5 | a-1-3 |
| p-12-146 | d-12-5 | a-2-1 |
| p-12-147 | d-12-5 | a-2-2 |
| p-12-148 | d-12-5 | a-2-3 |
| p-12-149 | d-12-5 | a-2-4 |

TABLE 20-continued

| No. | D | A |
|---|---|---|
| p-12-150 | d-12-5 | a-2-5 |
| p-12-151 | d-12-5 | a-2-6 |
| p-12-152 | d-12-5 | a-2-7 |
| p-12-153 | d-12-5 | a-2-8 |
| p-12-154 | d-12-5 | a-2-9 |
| p-12-155 | d-12-5 | a-2-10 |
| p-12-156 | d-12-5 | a-2-11 |
| p-12-157 | d-12-5 | a-2-12 |
| p-12-158 | d-12-5 | a-2-13 |
| p-12-159 | d-12-5 | a-3-1 |
| p-12-160 | d-12-5 | a-3-2 |
| p-12-161 | d-12-5 | a-3-3 |
| p-12-162 | d-12-5 | a-3-4 |
| p-12-163 | d-12-5 | a-3-5 |
| p-12-164 | d-12-5 | a-3-6 |
| p-12-165 | d-12-5 | a-3-7 |
| p-12-166 | d-12-5 | a-4-1 |
| p-12-167 | d-12-5 | a-4-2 |
| p-12-168 | d-12-5 | a-4-3 |
| p-12-169 | d-12-5 | a-4-4 |
| p-12-170 | d-12-5 | a-4-5 |
| p-12-171 | d-12-5 | a-4-6 |
| p-12-172 | d-12-5 | a-5-1 |
| p-12-173 | d-12-5 | a-5-2 |
| p-12-174 | d-12-5 | a-5-3 |
| p-12-175 | d-12-5 | a-5-4 |
| p-12-176 | d-12-5 | a-5-5 |
| p-12-177 | d-12-5 | a-5-6 |
| p-12-178 | d-12-5 | a-5-7 |
| p-12-179 | d-12-5 | a-5-8 |
| p-12-180 | d-12-5 | a-5-9 |
| p-12-181 | d-12-5 | a-6-1 |
| p-12-182 | d-12-5 | a-6-2 |
| p-12-183 | d-12-5 | a-6-3 |
| p-12-184 | d-12-5 | a-6-4 |
| p-12-185 | d-12-5 | a-6-5 |
| p-12-186 | d-12-5 | a-6-6 |
| p-12-187 | d-12-5 | a-6-7 |
| p-12-188 | d-12-5 | a-7-1 |
| p-12-189 | d-12-5 | a-7-2 |
| p-12-190 | d-12-5 | a-7-3 |
| p-12-191 | d-12-5 | a-7-4 |
| p-12-192 | d-12-5 | a-7-5 |
| p-12-193 | d-12-5 | a-7-6 |
| p-12-194 | d-12-5 | a-7-7 |
| p-12-195 | d-12-5 | a-8-1 |
| p-12-196 | d-12-5 | a-8-2 |
| p-12-197 | d-12-5 | a-8-3 |
| p-12-198 | d-12-5 | a-8-4 |
| p-12-199 | d-12-5 | a-8-5 |
| p-12-200 | d-12-5 | a-8-6 |
| p-12-201 | d-12-5 | a-8-7 |
| p-12-202 | d-12-5 | a-8-8 |
| p-12-203 | d-12-5 | a-8-9 |
| p-12-204 | d-12-5 | a-8-10 |
| p-12-205 | d-12-5 | a-8-11 |
| p-12-206 | d-12-6 | a-1-1 |
| p-12-207 | d-12-6 | a-2-1 |
| p-12-208 | d-12-6 | a-3-1 |
| p-12-209 | d-12-6 | a-4-1 |
| p-12-210 | d-12-6 | a-5-1 |
| p-12-211 | d-12-6 | a-6-1 |
| p-12-212 | d-12-6 | a-7-1 |
| p-12-213 | d-12-6 | a-8-1 |
| p-12-214 | d-12-7 | a-1-1 |
| p-12-215 | d-12-7 | a-2-1 |
| p-12-216 | d-12-7 | a-3-1 |
| p-12-217 | d-12-7 | a-4-1 |
| p-12-218 | d-12-7 | a-5-1 |
| p-12-219 | d-12-7 | a-6-1 |
| p-12-220 | d-12-7 | a-7-1 |
| p-12-221 | d-12-7 | a-8-1 |
| p-12-222 | d-12-8 | a-1-1 |
| p-12-223 | d-12-8 | a-1-2 |
| p-12-224 | d-12-8 | a-1-3 |
| p-12-225 | d-12-8 | a-2-1 |

TABLE 21

| No. | D | A |
|---|---|---|
| p-12-226 | d-12-8 | a-2-2 |
| p-12-227 | d-12-8 | a-2-3 |
| p-12-228 | d-12-8 | a-2-4 |
| p-12-229 | d-12-8 | a-2-5 |
| p-12-230 | d-12-8 | a-2-6 |
| p-12-231 | d-12-8 | a-2-7 |
| p-12-232 | d-12-8 | a-2-8 |
| p-12-233 | d-12-8 | a-2-9 |
| p-12-234 | d-12-8 | a-2-10 |
| p-12-235 | d-12-8 | a-2-11 |
| p-12-236 | d-12-8 | a-2-12 |
| p-12-237 | d-12-8 | a-2-13 |
| p-12-238 | d-12-8 | a-3-1 |
| p-12-239 | d-12-8 | a-3-2 |
| p-12-240 | d-12-8 | a-3-3 |
| p-12-241 | d-12-8 | a-3-4 |
| p-12-242 | d-12-8 | a-3-5 |
| p-12-243 | d-12-8 | a-3-6 |
| p-12-244 | d-12-8 | a-3-7 |
| p-12-245 | d-12-8 | a-4-1 |
| p-12-246 | d-12-8 | a-4-2 |
| p-12-247 | d-12-8 | a-4-3 |
| p-12-248 | d-12-8 | a-4-4 |
| p-12-249 | d-12-8 | a-4-5 |
| p-12-250 | d-12-8 | a-4-6 |
| p-12-251 | d-12-8 | a-5-1 |
| p-12-252 | d-12-8 | a-5-2 |
| p-12-253 | d-12-8 | a-5-3 |
| p-12-254 | d-12-8 | a-5-4 |
| p-12-255 | d-12-8 | a-5-5 |
| p-12-256 | d-12-8 | a-5-6 |
| p-12-257 | d-12-8 | a-5-7 |
| p-12-258 | d-12-8 | a-5-8 |
| p-12-259 | d-12-8 | a-5-9 |
| p-12-260 | d-12-8 | a-6-1 |
| p-12-261 | d-12-8 | a-6-2 |
| p-12-262 | d-12-8 | a-6-3 |
| p-12-263 | d-12-8 | a-6-4 |
| p-12-264 | d-12-8 | a-6-5 |
| p-12-265 | d-12-8 | a-6-6 |
| p-12-266 | d-12-8 | a-6-7 |
| p-12-267 | d-12-8 | a-7-1 |
| p-12-268 | d-12-8 | a-7-2 |
| p-12-269 | d-12-8 | a-7-3 |
| p-12-270 | d-12-8 | a-7-4 |
| p-12-271 | d-12-8 | a-7-5 |
| p-12-272 | d-12-8 | a-7-6 |
| p-12-273 | d-12-8 | a-7-7 |
| p-12-274 | d-12-8 | a-8-1 |
| p-12-275 | d-12-8 | a-8-2 |
| p-12-276 | d-12-8 | a-8-3 |
| p-12-277 | d-12-8 | a-8-4 |
| p-12-278 | d-12-8 | a-8-5 |
| p-12-279 | d-12-8 | a-8-6 |
| p-12-280 | d-12-8 | a-8-7 |
| p-12-281 | d-12-8 | a-8-8 |
| p-12-282 | d-12-8 | a-8-9 |
| p-12-283 | d-12-8 | a-8-10 |
| p-12-284 | d-12-8 | a-8-11 |
| p-12-285 | d-12-9 | a-1-1 |
| p-12-286 | d-12-9 | a-2-1 |
| p-12-287 | d-12-9 | a-3-1 |
| p-12-288 | d-12-9 | a-4-1 |
| p-12-289 | d-12-9 | a-5-1 |
| p-12-290 | d-12-9 | a-6-1 |
| p-12-291 | d-12-9 | a-7-1 |
| p-12-292 | d-12-9 | a-8-1 |
| p-12-293 | d-12-10 | a-1-1 |
| p-12-294 | d-12-10 | a-2-1 |
| p-12-295 | d-12-10 | a-3-1 |
| p-12-296 | d-12-10 | a-4-1 |
| p-12-297 | d-12-10 | a-5-1 |
| p-12-298 | d-12-10 | a-6-1 |
| p-12-299 | d-12-10 | a-7-1 |
| p-12-300 | d-12-10 | a-8-1 |
| p-12-301 | d-12-11 | a-1-1 |
| p-12-302 | d-12-11 | a-2-1 |
| p-12-303 | d-12-11 | a-3-1 |

TABLE 21-continued

| No. | D | A |
|---|---|---|
| p-12-304 | d-12-11 | a-4-1 |
| p-12-305 | d-12-11 | a-5-1 |
| p-12-306 | d-12-11 | a-6-1 |
| p-12-307 | d-12-11 | a-7-1 |
| p-12-308 | d-12-11 | a-8-1 |
| p-12-309 | d-12-12 | a-1-1 |
| p-12-310 | d-12-12 | a-2-1 |
| p-12-311 | d-12-12 | a-3-1 |
| p-12-312 | d-12-12 | a-4-1 |
| p-12-313 | d-12-12 | a-5-1 |
| p-12-314 | d-12-12 | a-6-1 |
| p-12-315 | d-12-12 | a-7-1 |
| p-12-316 | d-12-12 | a-8-1 |
| p-12-317 | d-12-13 | a-1-1 |
| p-12-318 | d-12-13 | a-2-1 |
| p-12-319 | d-12-13 | a-3-1 |
| p-12-320 | d-12-13 | a-4-1 |
| p-12-321 | d-12-13 | a-5-1 |
| p-12-322 | d-12-13 | a-6-1 |
| p-12-323 | d-12-13 | a-7-1 |
| p-12-324 | d-12-13 | a-8-1 |
| p-12-325 | d-12-14 | a-1-1 |
| p-12-326 | d-12-14 | a-2-1 |
| p-12-327 | d-12-14 | a-3-1 |
| p-12-328 | d-12-14 | a-4-1 |
| p-12-329 | d-12-14 | a-5-1 |
| p-12-330 | d-12-14 | a-6-1 |
| p-12-331 | d-12-14 | a-7-1 |
| p-12-332 | d-12-14 | a-8-1 |

TABLE 22

| No. | D | A |
|---|---|---|
| p-13-1 | d-13-1 | a-1-1 |
| p-13-2 | d-13-1 | a-1-2 |
| p-13-3 | d-13-1 | a-1-3 |
| p-13-4 | d-13-1 | a-2-1 |
| p-13-5 | d-13-1 | a-2-2 |
| p-13-6 | d-13-1 | a-2-3 |
| p-13-7 | d-13-1 | a-2-4 |
| p-13-8 | d-13-1 | a-2-5 |
| p-13-9 | d-13-1 | a-2-6 |
| p-13-10 | d-13-1 | a-2-7 |
| p-13-11 | d-13-1 | a-2-8 |
| p-13-12 | d-13-1 | a-2-9 |
| p-13-13 | d-13-1 | a-2-10 |
| p-13-14 | d-13-1 | a-2-11 |
| p-13-15 | d-13-1 | a-2-12 |
| p-13-16 | d-13-1 | a-2-13 |
| p-13-17 | d-13-1 | a-3-1 |
| p-13-18 | d-13-1 | a-3-2 |
| p-13-19 | d-13-1 | a-3-3 |
| p-13-20 | d-13-1 | a-3-4 |
| p-13-21 | d-13-1 | a-3-5 |
| p-13-22 | d-13-1 | a-3-6 |
| p-13-23 | d-13-1 | a-3-7 |
| p-13-24 | d-13-1 | a-4-1 |
| p-13-25 | d-13-1 | a-4-2 |
| p-13-26 | d-13-1 | a-4-3 |
| p-13-27 | d-13-1 | a-4-4 |
| p-13-28 | d-13-1 | a-4-5 |
| p-13-29 | d-13-1 | a-4-6 |
| p-13-30 | d-13-1 | a-5-1 |
| p-13-31 | d-13-1 | a-5-2 |
| p-13-32 | d-13-1 | a-5-3 |
| p-13-33 | d-13-1 | a-5-4 |
| p-13-34 | d-13-1 | a-5-5 |
| p-13-35 | d-13-1 | a-5-6 |
| p-13-36 | d-13-1 | a-5-7 |
| p-13-37 | d-13-1 | a-5-8 |
| p-13-38 | d-13-1 | a-5-9 |
| p-13-39 | d-13-1 | a-6-1 |
| p-13-40 | d-13-1 | a-6-2 |
| p-13-41 | d-13-1 | a-6-3 |

TABLE 22-continued

| No. | D | A |
|---|---|---|
| p-13-42 | d-13-1 | a-6-4 |
| p-13-43 | d-13-1 | a-6-5 |
| p-13-44 | d-13-1 | a-6-6 |
| p-13-45 | d-13-1 | a-6-7 |
| p-13-46 | d-13-1 | a-7-1 |
| p-13-47 | d-13-1 | a-7-2 |
| p-13-48 | d-13-1 | a-7-3 |
| p-13-49 | d-13-1 | a-7-4 |
| p-13-50 | d-13-1 | a-7-5 |
| p-13-51 | d-13-1 | a-7-6 |
| p-13-52 | d-13-1 | a-7-7 |
| p-13-53 | d-13-1 | a-8-1 |
| p-13-54 | d-13-1 | a-8-2 |
| p-13-55 | d-13-1 | a-8-3 |
| p-13-56 | d-13-1 | a-8-4 |
| p-13-57 | d-13-1 | a-8-5 |
| p-13-58 | d-13-1 | a-8-6 |
| p-13-59 | d-13-1 | a-8-7 |
| p-13-60 | d-13-1 | a-8-8 |
| p-13-61 | d-13-1 | a-8-9 |
| p-13-62 | d-13-1 | a-8-10 |
| p-13-63 | d-13-1 | a-8-11 |
| p-13-64 | d-13-2 | a-1-1 |
| p-13-65 | d-13-2 | a-2-1 |
| p-13-66 | d-13-2 | a-3-1 |
| p-13-67 | d-13-2 | a-4-1 |
| p-13-68 | d-13-2 | a-5-1 |
| p-13-69 | d-13-2 | a-6-1 |
| p-13-70 | d-13-2 | a-7-1 |
| p-13-71 | d-13-2 | a-8-1 |
| p-13-72 | d-13-3 | a-1-1 |
| p-13-73 | d-13-3 | a-2-1 |
| p-13-74 | d-13-3 | a-3-1 |
| p-13-75 | d-13-3 | a-4-1 |
| p-13-76 | d-13-3 | a-5-1 |
| p-13-77 | d-13-3 | a-6-1 |
| p-13-78 | d-13-3 | a-7-1 |
| p-13-79 | d-13-3 | a-8-1 |
| p-13-80 | d-13-4 | a-1-1 |
| p-13-81 | d-13-4 | a-1-2 |
| p-13-82 | d-13-4 | a-1-3 |
| p-13-83 | d-13-4 | a-2-1 |
| p-13-84 | d-13-4 | a-2-2 |
| p-13-85 | d-13-4 | a-2-3 |
| p-13-86 | d-13-4 | a-2-4 |
| p-13-87 | d-13-4 | a-2-5 |
| p-13-88 | d-13-4 | a-2-6 |
| p-13-89 | d-13-4 | a-2-7 |
| p-13-90 | d-13-4 | a-2-8 |
| p-13-91 | d-13-4 | a-2-9 |
| p-13-92 | d-13-4 | a-2-10 |
| p-13-93 | d-13-4 | a-2-11 |
| p-13-94 | d-13-4 | a-2-12 |
| p-13-95 | d-13-4 | a-2-13 |
| p-13-96 | d-13-4 | a-3-1 |
| p-13-97 | d-13-4 | a-3-2 |
| p-13-98 | d-13-4 | a-3-3 |
| p-13-99 | d-13-4 | a-3-4 |
| p-13-100 | d-13-4 | a-3-5 |
| p-13-101 | d-13-4 | a-3-6 |
| p-13-102 | d-13-4 | a-3-7 |
| p-13-103 | d-13-4 | a-4-1 |
| p-13-104 | d-13-4 | a-4-2 |
| p-13-105 | d-13-4 | a-4-3 |
| p-13-106 | d-13-4 | a-4-4 |
| p-13-107 | d-13-4 | a-4-5 |
| p-13-108 | d-13-4 | a-4-6 |
| p-13-109 | d-13-4 | a-5-1 |
| p-13-110 | d-13-4 | a-5-2 |
| p-13-111 | d-13-4 | a-5-3 |
| p-13-112 | d-13-4 | a-5-4 |
| p-13-113 | d-13-4 | a-5-5 |
| p-13-114 | d-13-4 | a-5-6 |
| p-13-115 | d-13-4 | a-5-7 |
| p-13-116 | d-13-4 | a-5-8 |
| p-13-117 | d-13-4 | a-5-9 |
| p-13-118 | d-13-4 | a-6-1 |
| p-13-119 | d-13-4 | a-6-2 |

TABLE 22-continued

| No. | D | A |
|---|---|---|
| p-13-120 | d-13-4 | a-6-3 |
| p-13-121 | d-13-4 | a-6-4 |
| p-13-122 | d-13-4 | a-6-5 |
| p-13-123 | d-13-4 | a-6-6 |
| p-13-124 | d-13-4 | a-6-7 |
| p-13-125 | d-13-4 | a-7-1 |
| p-13-126 | d-13-4 | a-7-2 |
| p-13-127 | d-13-4 | a-7-3 |
| p-13-128 | d-13-4 | a-7-4 |
| p-13-129 | d-13-4 | a-7-5 |
| p-13-130 | d-13-4 | a-7-6 |
| p-13-131 | d-13-4 | a-7-7 |
| p-13-132 | d-13-4 | a-8-1 |
| p-13-133 | d-13-4 | a-8-2 |
| p-13-134 | d-13-4 | a-8-3 |
| p-13-135 | d-13-4 | a-8-4 |

TABLE 23

| No. | D | A |
|---|---|---|
| p-13-136 | d-13-4 | a-8-5 |
| p-13-137 | d-13-4 | a-8-6 |
| p-13-138 | d-13-4 | a-8-7 |
| p-13-139 | d-13-4 | a-8-8 |
| p-13-140 | d-13-4 | a-8-9 |
| p-13-141 | d-13-4 | a-8-10 |
| p-13-142 | d-13-4 | a-8-11 |
| p-13-143 | d-13-5 | a-1-1 |
| p-13-144 | d-13-5 | a-1-2 |
| p-13-145 | d-13-5 | a-1-3 |
| p-13-146 | d-13-5 | a-2-1 |
| p-13-147 | d-13-5 | a-2-2 |
| p-13-148 | d-13-5 | a-2-3 |
| p-13-149 | d-13-5 | a-2-4 |
| p-13-150 | d-13-5 | a-2-5 |
| p-13-151 | d-13-5 | a-2-6 |
| p-13-152 | d-13-5 | a-2-7 |
| p-13-153 | d-13-5 | a-2-8 |
| p-13-154 | d-13-5 | a-2-9 |
| p-13-155 | d-13-5 | a-2-10 |
| p-13-156 | d-13-5 | a-2-11 |
| p-13-157 | d-13-5 | a-2-12 |
| p-13-158 | d-13-5 | a-2-13 |
| p-13-159 | d-13-5 | a-3-1 |
| p-13-160 | d-13-5 | a-3-2 |
| p-13-161 | d-13-5 | a-3-3 |
| p-13-162 | d-13-5 | a-3-4 |
| p-13-163 | d-13-5 | a-3-5 |
| p-13-164 | d-13-5 | a-3-6 |
| p-13-165 | d-13-5 | a-3-7 |
| p-13-166 | d-13-5 | a-4-1 |
| p-13-167 | d-13-5 | a-4-2 |
| p-13-168 | d-13-5 | a-4-3 |
| p-13-169 | d-13-5 | a-4-4 |
| p-13-170 | d-13-5 | a-4-5 |
| p-13-171 | d-13-5 | a-4-6 |
| p-13-172 | d-13-5 | a-5-1 |
| p-13-173 | d-13-5 | a-5-2 |
| p-13-174 | d-13-5 | a-5-3 |
| p-13-175 | d-13-5 | a-5-4 |
| p-13-176 | d-13-5 | a-5-5 |
| p-13-177 | d-13-5 | a-5-6 |
| p-13-178 | d-13-5 | a-5-7 |
| p-13-179 | d-13-5 | a-5-8 |
| p-13-180 | d-13-5 | a-5-9 |
| p-13-181 | d-13-5 | a-6-1 |
| p-13-182 | d-13-5 | a-6-2 |
| p-13-183 | d-13-5 | a-6-3 |
| p-13-184 | d-13-5 | a-6-4 |
| p-13-185 | d-13-5 | a-6-5 |
| p-13-186 | d-13-5 | a-6-6 |
| p-13-187 | d-13-5 | a-6-7 |
| p-13-188 | d-13-5 | a-7-1 |
| p-13-189 | d-13-5 | a-7-2 |

TABLE 23-continued

| No. | D | A |
|---|---|---|
| p-13-190 | d-13-5 | a-7-3 |
| p-13-191 | d-13-5 | a-7-4 |
| p-13-192 | d-13-5 | a-7-5 |
| p-13-193 | d-13-5 | a-7-6 |
| p-13-194 | d-13-5 | a-7-7 |
| p-13-195 | d-13-5 | a-8-1 |
| p-13-196 | d-13-5 | a-8-2 |
| p-13-197 | d-13-5 | a-8-3 |
| p-13-198 | d-13-5 | a-8-4 |
| p-13-199 | d-13-5 | a-8-5 |
| p-13-200 | d-13-5 | a-8-6 |
| p-13-201 | d-13-5 | a-8-7 |
| p-13-202 | d-13-5 | a-8-8 |
| p-13-203 | d-13-5 | a-8-9 |
| p-13-204 | d-13-5 | a-8-10 |
| p-13-205 | d-13-5 | a-8-11 |
| p-13-206 | d-13-6 | a-1-1 |
| p-13-207 | d-13-6 | a-1-2 |
| p-13-208 | d-13-6 | a-1-3 |
| p-13-209 | d-13-6 | a-2-1 |
| p-13-210 | d-13-6 | a-2-2 |
| p-13-211 | d-13-6 | a-2-3 |
| p-13-212 | d-13-6 | a-2-4 |
| p-13-213 | d-13-6 | a-2-5 |
| p-13-214 | d-13-6 | a-2-6 |
| p-13-215 | d-13-6 | a-2-7 |
| p-13-216 | d-13-6 | a-2-8 |
| p-13-217 | d-13-6 | a-2-9 |
| p-13-218 | d-13-6 | a-2-10 |
| p-13-219 | d-13-6 | a-2-11 |
| p-13-220 | d-13-6 | a-2-12 |
| p-13-221 | d-13-6 | a-2-13 |
| p-13-222 | d-13-6 | a-3-1 |
| p-13-223 | d-13-6 | a-3-2 |
| p-13-224 | d-13-6 | a-3-3 |
| p-13-225 | d-13-6 | a-3-4 |
| p-13-226 | d-13-6 | a-3-5 |
| p-13-227 | d-13-6 | a-3-6 |
| p-13-228 | d-13-6 | a-3-7 |
| p-13-229 | d-13-6 | a-4-1 |
| p-13-230 | d-13-6 | a-4-2 |
| p-13-231 | d-13-6 | a-4-3 |
| p-13-232 | d-13-6 | a-4-4 |
| p-13-233 | d-13-6 | a-4-5 |
| p-13-234 | d-13-6 | a-4-6 |
| p-13-235 | d-13-6 | a-5-1 |
| p-13-236 | d-13-6 | a-5-2 |
| p-13-237 | d-13-6 | a-5-3 |
| p-13-238 | d-13-6 | a-5-4 |
| p-13-239 | d-13-6 | a-5-5 |
| p-13-240 | d-13-6 | a-5-6 |
| p-13-241 | d-13-6 | a-5-7 |
| p-13-242 | d-13-6 | a-5-8 |
| p-13-243 | d-13-6 | a-5-9 |
| p-13-244 | d-13-6 | a-6-1 |
| p-13-245 | d-13-6 | a-6-2 |
| p-13-246 | d-13-6 | a-6-3 |
| p-13-247 | d-13-6 | a-6-4 |
| p-13-248 | d-13-6 | a-6-5 |
| p-13-249 | d-13-6 | a-6-6 |
| p-13-250 | d-13-6 | a-6-7 |
| p-13-251 | d-13-6 | a-7-1 |
| p-13-252 | d-13-6 | a-7-2 |
| p-13-253 | d-13-6 | a-7-3 |
| p-13-254 | d-13-6 | a-7-4 |
| p-13-255 | d-13-6 | a-7-5 |
| p-13-256 | d-13-6 | a-7-6 |
| p-13-257 | d-13-6 | a-7-7 |
| p-13-258 | d-13-6 | a-8-1 |
| p-13-259 | d-13-6 | a-8-2 |
| p-13-260 | d-13-6 | a-8-3 |
| p-13-261 | d-13-6 | a-8-4 |
| p-13-262 | d-13-6 | a-8-5 |
| p-13-263 | d-13-6 | a-8-6 |
| p-13-264 | d-13-6 | a-8-7 |
| p-13-265 | d-13-6 | a-8-8 |
| p-13-266 | d-13-6 | a-8-9 |
| p-13-267 | d-13-6 | a-8-10 |

TABLE 23-continued

| No. | D | A |
|---|---|---|
| p-13-268 | d-13-6 | a-8-11 |
| p-13-269 | d-13-7 | a-1-1 |
| p-13-270 | d-13-7 | a-2-1 |

TABLE 24

| No. | D | A |
|---|---|---|
| p-13-271 | d-13-7 | a-3-1 |
| p-13-272 | d-13-7 | a-4-1 |
| p-13-273 | d-13-7 | a-5-1 |
| p-13-274 | d-13-7 | a-6-1 |
| p-13-275 | d-13-7 | a-7-1 |
| p-13-276 | d-13-7 | a-8-1 |
| p-14-1 | d-14-1 | a-1-1 |
| p-14-2 | d-14-1 | a-1-2 |
| p-14-3 | d-14-1 | a-1-3 |
| p-14-4 | d-14-1 | a-2-1 |
| p-14-5 | d-14-1 | a-2-2 |
| p-14-6 | d-14-1 | a-2-3 |
| p-14-7 | d-14-1 | a-2-4 |
| p-14-8 | d-14-1 | a-2-5 |
| p-14-9 | d-14-1 | a-2-6 |
| p-14-10 | d-14-1 | a-2-7 |
| p-14-11 | d-14-1 | a-2-8 |
| p-14-12 | d-14-1 | a-2-9 |
| p-14-13 | d-14-1 | a-2-10 |
| p-14-14 | d-14-1 | a-2-11 |
| p-14-15 | d-14-1 | a-2-12 |
| p-14-16 | d-14-1 | a-2-13 |
| p-14-17 | d-14-1 | a-3-1 |
| p-14-18 | d-14-1 | a-3-2 |
| p-14-19 | d-14-1 | a-3-3 |
| p-14-20 | d-14-1 | a-3-4 |
| p-14-21 | d-14-1 | a-3-5 |
| p-14-22 | d-14-1 | a-3-6 |
| p-14-23 | d-14-1 | a-3-7 |
| p-14-24 | d-14-1 | a-4-1 |
| p-14-25 | d-14-1 | a-4-2 |
| p-14-26 | d-14-1 | a-4-3 |
| p-14-27 | d-14-1 | a-4-4 |
| p-14-28 | d-14-1 | a-4-5 |
| p-14-29 | d-14-1 | a-4-6 |
| p-14-30 | d-14-1 | a-5-1 |
| p-14-31 | d-14-1 | a-5-2 |
| p-14-32 | d-14-1 | a-5-3 |
| p-14-33 | d-14-1 | a-5-4 |
| p-14-34 | d-14-1 | a-5-5 |
| p-14-35 | d-14-1 | a-5-6 |
| p-14-36 | d-14-1 | a-5-7 |
| p-14-37 | d-14-1 | a-5-8 |
| p-14-38 | d-14-1 | a-5-9 |
| p-14-39 | d-14-1 | a-6-1 |
| p-14-40 | d-14-1 | a-6-2 |
| p-14-41 | d-14-1 | a-6-3 |
| p-14-42 | d-14-1 | a-6-4 |
| p-14-43 | d-14-1 | a-6-5 |
| p-14-44 | d-14-1 | a-6-6 |
| p-14-45 | d-14-1 | a-6-7 |
| p-14-46 | d-14-1 | a-7-1 |
| p-14-47 | d-14-1 | a-7-2 |
| p-14-48 | d-14-1 | a-7-3 |
| p-14-49 | d-14-1 | a-7-4 |
| p-14-50 | d-14-1 | a-7-5 |
| p-14-51 | d-14-1 | a-7-6 |
| p-14-52 | d-14-1 | a-7-7 |
| p-14-53 | d-14-2 | a-1-1 |
| p-14-54 | d-14-2 | a-1-2 |
| p-14-55 | d-14-2 | a-1-3 |
| p-14-56 | d-14-2 | a-2-1 |
| p-14-57 | d-14-2 | a-2-2 |
| p-14-58 | d-14-2 | a-2-3 |
| p-14-59 | d-14-2 | a-2-4 |
| p-14-60 | d-14-2 | a-2-5 |
| p-14-61 | d-14-2 | a-2-6 |

TABLE 24-continued

| No. | D | A |
|---|---|---|
| p-14-62 | d-14-2 | a-2-7 |
| p-14-63 | d-14-2 | a-2-8 |
| p-14-64 | d-14-2 | a-2-9 |
| p-14-65 | d-14-2 | a-2-10 |
| p-14-66 | d-14-2 | a-2-11 |
| p-14-67 | d-14-2 | a-2-12 |
| p-14-68 | d-14-2 | a-2-13 |
| p-14-69 | d-14-2 | a-3-1 |
| p-14-70 | d-14-2 | a-3-2 |
| p-14-71 | d-14-2 | a-3-3 |
| p-14-72 | d-14-2 | a-3-4 |
| p-14-73 | d-14-2 | a-3-5 |
| p-14-74 | d-14-2 | a-3-6 |
| p-14-75 | d-14-2 | a-3-7 |
| p-14-76 | d-14-2 | a-4-1 |
| p-14-77 | d-14-2 | a-4-2 |
| p-14-78 | d-14-2 | a-4-3 |
| p-14-79 | d-14-2 | a-4-4 |

TABLE 25

| No. | D | A |
|---|---|---|
| p-14-80 | d-14-2 | a-4-5 |
| p-14-81 | d-14-2 | a-4-6 |
| p-14-82 | d-14-2 | a-5-1 |
| p-14-83 | d-14-2 | a-5-2 |
| p-14-84 | d-14-2 | a-5-3 |
| p-14-85 | d-14-2 | a-5-4 |
| p-14-86 | d-14-2 | a-5-5 |
| p-14-87 | d-14-2 | a-5-6 |
| p-14-88 | d-14-2 | a-5-7 |
| p-14-89 | d-14-2 | a-5-8 |
| p-14-90 | d-14-2 | a-5-9 |
| p-14-91 | d-14-2 | a-6-1 |
| p-14-92 | d-14-2 | a-6-2 |
| p-14-93 | d-14-2 | a-6-3 |
| p-14-94 | d-14-2 | a-6-4 |
| p-14-95 | d-14-2 | a-6-5 |
| p-14-96 | d-14-2 | a-6-6 |
| p-14-97 | d-14-2 | a-6-7 |
| p-14-98 | d-14-2 | a-7-1 |
| p-14-99 | d-14-2 | a-7-2 |
| p-14-100 | d-14-2 | a-7-3 |
| p-14-101 | d-14-2 | a-7-4 |
| p-14-102 | d-14-2 | a-7-5 |
| p-14-103 | d-14-2 | a-7-6 |
| p-14-104 | d-14-2 | a-7-7 |
| p-14-105 | d-14-3 | a-1-1 |
| p-14-106 | d-14-3 | a-2-1 |
| p-14-107 | d-14-3 | a-3-1 |
| p-14-108 | d-14-3 | a-4-1 |
| p-14-109 | d-14-3 | a-5-1 |
| p-14-110 | d-14-3 | a-6-1 |
| p-14-111 | d-14-3 | a-7-1 |
| p-14-112 | d-14-4 | a-1-1 |
| p-14-113 | d-14-4 | a-2-1 |
| p-14-114 | d-14-4 | a-3-1 |
| p-14-115 | d-14-4 | a-4-1 |
| p-14-116 | d-14-4 | a-5-1 |
| p-14-117 | d-14-4 | a-6-1 |
| p-14-118 | d-14-4 | a-7-1 |
| p-14-119 | d-14-5 | a-1-1 |
| p-14-120 | d-14-5 | a-1-2 |
| p-14-121 | d-14-5 | a-1-3 |
| p-14-122 | d-14-5 | a-2-1 |
| p-14-123 | d-14-5 | a-2-2 |
| p-14-124 | d-14-5 | a-2-3 |
| p-14-125 | d-14-5 | a-2-4 |
| p-14-126 | d-14-5 | a-2-5 |
| p-14-127 | d-14-5 | a-2-6 |
| p-14-128 | d-14-5 | a-2-7 |
| p-14-129 | d-14-5 | a-2-8 |
| p-14-130 | d-14-5 | a-2-9 |
| p-14-131 | d-14-5 | a-2-10 |

TABLE 25-continued

| No. | D | A |
|---|---|---|
| p-14-132 | d-14-5 | a-2-11 |
| p-14-133 | d-14-5 | a-2-12 |
| p-14-134 | d-14-5 | a-2-13 |
| p-14-135 | d-14-5 | a-3-1 |
| p-14-136 | d-14-5 | a-3-2 |
| p-14-137 | d-14-5 | a-3-3 |
| p-14-138 | d-14-5 | a-3-4 |
| p-14-139 | d-14-5 | a-3-5 |
| p-14-140 | d-14-5 | a-3-6 |
| p-14-141 | d-14-5 | a-3-7 |
| p-14-142 | d-14-5 | a-4-1 |
| p-14-143 | d-14-5 | a-4-2 |
| p-14-144 | d-14-5 | a-4-3 |
| p-14-145 | d-14-5 | a-4-4 |
| p-14-146 | d-14-5 | a-4-5 |
| p-14-147 | d-14-5 | a-4-6 |
| p-14-148 | d-14-5 | a-5-1 |
| p-14-149 | d-14-5 | a-5-2 |
| p-14-150 | d-14-5 | a-5-3 |
| p-14-151 | d-14-5 | a-5-4 |
| p-14-152 | d-14-5 | a-5-5 |
| p-14-153 | d-14-5 | a-5-6 |
| p-14-154 | d-14-5 | a-5-7 |
| p-14-155 | d-14-5 | a-5-8 |
| p-14-156 | d-14-5 | a-5-9 |
| p-14-157 | d-14-5 | a-6-1 |
| p-14-158 | d-14-5 | a-6-2 |
| p-14-159 | d-14-5 | a-6-3 |
| p-14-160 | d-14-5 | a-6-4 |
| p-14-161 | d-14-5 | a-6-5 |
| p-14-162 | d-14-5 | a-6-6 |
| p-14-163 | d-14-5 | a-6-7 |
| p-14-164 | d-14-5 | a-7-1 |
| p-14-165 | d-14-5 | a-7-2 |
| p-14-166 | d-14-5 | a-7-3 |
| p-14-167 | d-14-5 | a-7-4 |
| p-14-168 | d-14-5 | a-7-5 |
| p-14-169 | d-14-5 | a-7-6 |
| p-14-170 | d-14-5 | a-7-7 |
| p-14-171 | d-14-5 | a-8-1 |
| p-14-172 | d-14-5 | a-8-2 |
| p-14-173 | d-14-5 | a-8-3 |
| p-14-174 | d-14-5 | a-8-4 |
| p-14-175 | d-14-5 | a-8-5 |
| p-14-176 | d-14-5 | a-8-6 |
| p-14-177 | d-14-5 | a-8-7 |
| p-14-178 | d-14-5 | a-8-8 |
| p-14-179 | d-14-5 | a-8-9 |
| p-14-180 | d-14-5 | a-8-10 |
| p-14-181 | d-14-5 | a-8-11 |
| p-14-182 | d-14-6 | a-1-1 |
| p-14-183 | d-14-6 | a-1-2 |
| p-14-184 | d-14-6 | a-1-3 |
| p-14-185 | d-14-6 | a-2-1 |
| p-14-186 | d-14-6 | a-2-2 |
| p-14-187 | d-14-6 | a-2-3 |
| p-14-188 | d-14-6 | a-2-4 |
| p-14-189 | d-14-6 | a-2-5 |
| p-14-190 | d-14-6 | a-2-6 |
| p-14-191 | d-14-6 | a-2-7 |
| p-14-192 | d-14-6 | a-2-8 |
| p-14-193 | d-14-6 | a-2-9 |
| p-14-194 | d-14-6 | a-2-10 |
| p-14-195 | d-14-6 | a-2-11 |
| p-14-196 | d-14-6 | a-2-12 |
| p-14-197 | d-14-6 | a-2-13 |
| p-14-198 | d-14-6 | a-3-1 |
| p-14-199 | d-14-6 | a-3-2 |
| p-14-200 | d-14-6 | a-3-3 |
| p-14-201 | d-14-6 | a-3-4 |

TABLE 26

| No. | D | A |
|---|---|---|
| p-14-202 | d-14-6 | a-3-5 |
| p-14-203 | d-14-6 | a-3-6 |
| p-14-204 | d-14-6 | a-3-7 |
| p-14-205 | d-14-6 | a-4-1 |
| p-14-206 | d-14-6 | a-4-2 |
| p-14-207 | d-14-6 | a-4-3 |
| p-14-208 | d-14-6 | a-4-4 |
| p-14-209 | d-14-6 | a-4-5 |
| p-14-210 | d-14-6 | a-4-6 |
| p-14-211 | d-14-6 | a-5-1 |
| p-14-212 | d-14-6 | a-5-2 |
| p-14-213 | d-14-6 | a-5-3 |
| p-14-214 | d-14-6 | a-5-4 |
| p-14-215 | d-14-6 | a-5-5 |
| p-14-216 | d-14-6 | a-5-6 |
| p-14-217 | d-14-6 | a-5-7 |
| p-14-218 | d-14-6 | a-5-8 |
| p-14-219 | d-14-6 | a-5-9 |
| p-14-220 | d-14-6 | a-6-1 |
| p-14-221 | d-14-6 | a-6-2 |
| p-14-222 | d-14-6 | a-6-3 |
| p-14-223 | d-14-6 | a-6-4 |
| p-14-224 | d-14-6 | a-6-5 |
| p-14-225 | d-14-6 | a-6-6 |
| p-14-226 | d-14-6 | a-6-7 |
| p-14-227 | d-14-6 | a-7-1 |
| p-14-228 | d-14-6 | a-7-2 |
| p-14-229 | d-14-6 | a-7-3 |
| p-14-230 | d-14-6 | a-7-4 |
| p-14-231 | d-14-6 | a-7-5 |
| p-14-232 | d-14-6 | a-7-6 |
| p-14-233 | d-14-6 | a-7-7 |
| p-14-234 | d-14-6 | a-8-1 |
| p-14-235 | d-14-6 | a-8-2 |
| p-14-236 | d-14-6 | a-8-3 |
| p-14-237 | d-14-6 | a-8-4 |
| p-14-238 | d-14-6 | a-8-5 |
| p-14-239 | d-14-6 | a-8-6 |
| p-14-240 | d-14-6 | a-8-7 |
| p-14-241 | d-14-6 | a-8-8 |
| p-14-242 | d-14-6 | a-8-9 |
| p-14-243 | d-14-6 | a-8-10 |
| p-14-244 | d-14-6 | a-8-11 |
| p-14-245 | d-14-7 | a-1-1 |
| p-14-246 | d-14-7 | a-2-1 |
| p-14-247 | d-14-7 | a-3-1 |
| p-14-248 | d-14-7 | a-4-1 |
| p-14-249 | d-14-7 | a-5-1 |
| p-14-250 | d-14-7 | a-6-1 |
| p-14-251 | d-14-7 | a-7-1 |
| p-14-252 | d-14-7 | a-8-1 |
| p-14-253 | d-14-8 | a-1-1 |
| p-14-254 | d-14-8 | a-2-1 |
| p-14-255 | d-14-8 | a-3-1 |
| p-14-256 | d-14-8 | a-4-1 |
| p-14-257 | d-14-8 | a-5-1 |
| p-14-258 | d-14-8 | a-6-1 |
| p-14-259 | d-14-8 | a-7-1 |
| p-14-260 | d-14-8 | a-8-1 |
| p-14-261 | d-14-9 | a-1-1 |
| p-14-262 | d-14-9 | a-2-1 |
| p-14-263 | d-14-9 | a-3-1 |
| p-14-264 | d-14-9 | a-4-1 |
| p-14-265 | d-14-9 | a-5-1 |
| p-14-266 | d-14-9 | a-6-1 |
| p-14-267 | d-14-9 | a-7-1 |
| p-14-268 | d-14-9 | a-8-1 |
| p-14-269 | d-14-10 | a-1-1 |
| p-14-270 | d-14-10 | a-2-1 |
| p-14-271 | d-14-10 | a-3-1 |
| p-14-272 | d-14-10 | a-4-1 |
| p-14-273 | d-14-10 | a-5-1 |
| p-14-274 | d-14-10 | a-6-1 |
| p-14-275 | d-14-10 | a-7-1 |
| p-14-276 | d-14-10 | a-8-1 |
| p-14-277 | d-14-11 | a-1-1 |
| p-14-278 | d-14-11 | a-2-1 |
| p-14-279 | d-14-11 | a-3-1 |

TABLE 26-continued

| No. | D | A |
|---|---|---|
| p-14-280 | d-14-11 | a-4-1 |
| p-14-281 | d-14-11 | a-5-1 |
| p-14-282 | d-14-11 | a-6-1 |
| p-14-283 | d-14-11 | a-7-1 |
| p-14-284 | d-14-11 | a-8-1 |
| p-15-1 | d-14-1 | a-1-1 |
| p-15-2 | d-14-1 | a-1-2 |
| p-15-3 | d-14-1 | a-1-3 |
| p-15-4 | d-14-1 | a-2-1 |
| p-15-5 | d-14-1 | a-2-2 |
| p-15-6 | d-14-1 | a-2-3 |
| p-15-7 | d-14-1 | a-2-4 |
| p-15-8 | d-14-1 | a-2-5 |
| p-15-9 | d-14-1 | a-2-6 |
| p-15-10 | d-14-1 | a-2-7 |
| p-15-11 | d-14-1 | a-2-8 |
| p-15-12 | d-14-1 | a-2-9 |
| p-15-13 | d-14-1 | a-2-10 |
| p-15-14 | d-14-1 | a-2-11 |
| p-15-15 | d-14-1 | a-2-12 |
| p-15-16 | d-14-1 | a-2-13 |
| p-15-17 | d-14-1 | a-3-1 |
| p-15-18 | d-14-1 | a-3-2 |
| p-15-19 | d-14-1 | a-3-3 |
| p-15-20 | d-14-1 | a-3-4 |
| p-15-21 | d-14-1 | a-3-5 |
| p-15-22 | d-14-1 | a-3-6 |
| p-15-23 | d-14-1 | a-3-7 |
| p-15-24 | d-14-1 | a-4-1 |
| p-15-25 | d-14-1 | a-4-2 |
| p-15-26 | d-14-1 | a-4-3 |
| p-15-27 | d-14-1 | a-4-4 |
| p-15-28 | d-14-1 | a-4-5 |
| p-15-29 | d-14-1 | a-4-6 |
| p-15-30 | d-14-1 | a-5-1 |
| p-15-31 | d-14-1 | a-5-2 |
| p-15-32 | d-14-1 | a-5-3 |
| p-15-33 | d-14-1 | a-5-4 |
| p-15-34 | d-14-1 | a-5-5 |
| p-15-35 | d-14-1 | a-5-6 |
| p-15-36 | d-14-1 | a-5-7 |
| p-15-37 | d-14-1 | a-5-8 |
| p-15-38 | d-14-1 | a-5-9 |
| p-15-39 | d-14-1 | a-6-1 |
| p-15-40 | d-14-1 | a-6-2 |
| p-15-41 | d-14-1 | a-6-3 |
| p-15-42 | d-14-1 | a-6-4 |
| p-15-43 | d-14-1 | a-6-5 |
| p-15-44 | d-14-1 | a-6-6 |
| p-15-45 | d-14-1 | a-6-7 |

TABLE 27

| No. | D | A |
|---|---|---|
| p-15-46 | d-14-1 | a-7-1 |
| p-15-47 | d-14-1 | a-7-2 |
| p-15-48 | d-14-1 | a-7-3 |
| p-15-49 | d-14-1 | a-7-4 |
| p-15-50 | d-14-1 | a-7-5 |
| p-15-51 | d-14-1 | a-7-6 |
| p-15-52 | d-14-1 | a-7-7 |
| p-15-53 | d-14-1 | a-8-1 |
| p-15-54 | d-14-1 | a-8-2 |
| p-15-55 | d-14-1 | a-8-3 |
| p-15-56 | d-14-1 | a-8-4 |
| p-15-57 | d-14-1 | a-8-5 |
| p-15-58 | d-14-1 | a-8-6 |
| p-15-59 | d-14-1 | a-8-7 |
| p-15-60 | d-14-1 | a-8-8 |
| p-15-61 | d-14-1 | a-8-9 |
| p-15-62 | d-14-1 | a-8-10 |
| p-15-63 | d-14-1 | a-8-11 |
| p-15-64 | d-14-2 | a-1-1 |
| p-15-65 | d-14-2 | a-2-1 |

TABLE 27-continued

| No. | D | A |
|---|---|---|
| p-15-66 | d-14-2 | a-3-1 |
| p-15-67 | d-14-2 | a-4-1 |
| p-15-68 | d-14-2 | a-5-1 |
| p-15-69 | d-14-2 | a-6-1 |
| p-15-70 | d-14-2 | a-7-1 |
| p-15-71 | d-14-2 | a-8-1 |
| p-15-72 | d-14-3 | a-1-1 |
| p-15-73 | d-14-3 | a-2-1 |
| p-15-74 | d-14-3 | a-3-1 |
| p-15-75 | d-14-3 | a-4-1 |
| p-15-76 | d-14-3 | a-5-1 |
| p-15-77 | d-14-3 | a-6-1 |
| p-15-78 | d-14-3 | a-7-1 |
| p-15-79 | d-14-3 | a-8-1 |
| p-15-80 | d-14-4 | a-1-1 |
| p-15-81 | d-14-4 | a-1-2 |
| p-15-82 | d-14-4 | a-1-3 |
| p-15-83 | d-14-4 | a-2-1 |
| p-15-84 | d-14-4 | a-2-2 |
| p-15-85 | d-14-4 | a-2-3 |
| p-15-86 | d-14-4 | a-2-4 |
| p-15-87 | d-14-4 | a-2-5 |
| p-15-88 | d-14-4 | a-2-6 |
| p-15-89 | d-14-4 | a-2-7 |
| p-15-90 | d-14-4 | a-2-8 |
| p-15-91 | d-14-4 | a-2-9 |
| p-15-92 | d-14-4 | a-2-10 |
| p-15-93 | d-14-4 | a-2-11 |
| p-15-94 | d-14-4 | a-2-12 |
| p-15-95 | d-14-4 | a-2-13 |
| p-15-96 | d-14-4 | a-3-1 |
| p-15-97 | d-14-4 | a-3-2 |
| p-15-98 | d-14-4 | a-3-3 |
| p-15-99 | d-14-4 | a-3-4 |
| p-15-100 | d-14-4 | a-3-5 |
| p-15-101 | d-14-4 | a-3-6 |
| p-15-102 | d-14-4 | a-3-7 |
| p-15-103 | d-14-4 | a-4-1 |
| p-15-104 | d-14-4 | a-4-2 |
| p-15-105 | d-14-4 | a-4-3 |
| p-15-106 | d-14-4 | a-4-4 |
| p-15-107 | d-14-4 | a-4-5 |
| p-15-108 | d-14-4 | a-4-6 |
| p-15-109 | d-14-4 | a-5-1 |
| p-15-110 | d-14-4 | a-5-2 |
| p-15-111 | d-14-4 | a-5-3 |
| p-15-112 | d-14-4 | a-5-4 |
| p-15-113 | d-14-4 | a-5-5 |
| p-15-114 | d-14-4 | a-5-6 |
| p-15-115 | d-14-4 | a-5-7 |
| p-15-116 | d-14-4 | a-5-8 |
| p-15-117 | d-14-4 | a-5-9 |
| p-15-118 | d-14-4 | a-6-1 |
| p-15-119 | d-14-4 | a-6-2 |
| p-15-120 | d-14-4 | a-6-3 |
| p-15-121 | d-14-4 | a-6-4 |
| p-15-122 | d-14-4 | a-6-5 |
| p-15-123 | d-14-4 | a-6-6 |
| p-15-124 | d-14-4 | a-6-7 |
| p-15-125 | d-14-4 | a-7-1 |
| p-15-126 | d-14-4 | a-7-2 |
| p-15-127 | d-14-4 | a-7-3 |
| p-15-128 | d-14-4 | a-7-4 |
| p-15-129 | d-14-4 | a-7-5 |
| p-15-130 | d-14-4 | a-7-6 |
| p-15-131 | d-14-4 | a-7-7 |
| p-15-132 | d-14-4 | a-8-1 |
| p-15-133 | d-14-4 | a-8-2 |
| p-15-134 | d-14-4 | a-8-3 |
| p-15-135 | d-14-4 | a-8-4 |
| p-15-136 | d-14-4 | a-8-5 |
| p-15-137 | d-14-4 | a-8-6 |
| p-15-138 | d-14-4 | a-8-7 |
| p-15-139 | d-14-4 | a-8-8 |
| p-15-140 | d-14-4 | a-8-9 |
| p-15-141 | d-14-4 | a-8-10 |
| p-15-142 | d-14-4 | a-8-11 |
| p-15-143 | d-14-5 | a-1-1 |

TABLE 27-continued

| No. | D | A |
|---|---|---|
| p-15-144 | d-14-5 | a-1-2 |
| p-15-145 | d-14-5 | a-1-3 |
| p-15-146 | d-14-5 | a-2-1 |
| p-15-147 | d-14-5 | a-2-2 |
| p-15-148 | d-14-5 | a-2-3 |
| p-15-149 | d-14-5 | a-2-4 |
| p-15-150 | d-14-5 | a-2-5 |
| p-15-151 | d-14-5 | a-2-6 |
| p-15-152 | d-14-5 | a-2-7 |
| p-15-153 | d-14-5 | a-2-8 |
| p-15-154 | d-14-5 | a-2-9 |
| p-15-155 | d-14-5 | a-2-10 |
| p-15-156 | d-14-5 | a-2-11 |
| p-15-157 | d-14-5 | a-2-12 |
| p-15-158 | d-14-5 | a-2-13 |
| p-15-159 | d-14-5 | a-3-1 |
| p-15-160 | d-14-5 | a-3-2 |
| p-15-161 | d-14-5 | a-3-3 |
| p-15-162 | d-14-5 | a-3-4 |
| p-15-163 | d-14-5 | a-3-5 |
| p-15-164 | d-14-5 | a-3-6 |
| p-15-165 | d-14-5 | a-3-7 |
| p-15-166 | d-14-5 | a-4-1 |
| p-15-167 | d-14-5 | a-4-2 |
| p-15-168 | d-14-5 | a-4-3 |
| p-15-169 | d-14-5 | a-4-4 |
| p-15-170 | d-14-5 | a-4-5 |
| p-15-171 | d-14-5 | a-4-6 |
| p-15-172 | d-14-5 | a-5-1 |
| p-15-173 | d-14-5 | a-5-2 |
| p-15-174 | d-14-5 | a-5-3 |
| p-15-175 | d-14-5 | a-5-4 |
| p-15-176 | d-14-5 | a-5-5 |
| p-15-177 | d-14-5 | a-5-6 |
| p-15-178 | d-14-5 | a-5-7 |
| p-15-179 | d-14-5 | a-5-8 |
| p-15-180 | d-14-5 | a-5-9 |

TABLE 28

| No. | D | A |
|---|---|---|
| p-15-181 | d-14-5 | a-6-1 |
| p-15-182 | d-14-5 | a-6-2 |
| p-15-183 | d-14-5 | a-6-3 |
| p-15-184 | d-14-5 | a-6-4 |
| p-15-185 | d-14-5 | a-6-5 |
| p-15-186 | d-14-5 | a-6-6 |
| p-15-187 | d-14-5 | a-6-7 |
| p-15-188 | d-14-5 | a-7-1 |
| p-15-189 | d-14-5 | a-7-2 |
| p-15-190 | d-14-5 | a-7-3 |
| p-15-191 | d-14-5 | a-7-4 |
| p-15-192 | d-14-5 | a-7-5 |
| p-15-193 | d-14-5 | a-7-6 |
| p-15-194 | d-14-5 | a-7-7 |
| p-15-195 | d-14-5 | a-8-1 |
| p-15-196 | d-14-5 | a-8-2 |
| p-15-197 | d-14-5 | a-8-3 |
| p-15-198 | d-14-5 | a-8-4 |
| p-15-199 | d-14-5 | a-8-5 |
| p-15-200 | d-14-5 | a-8-6 |
| p-15-201 | d-14-5 | a-8-7 |
| p-15-202 | d-14-5 | a-8-8 |
| p-15-203 | d-14-5 | a-8-9 |
| p-15-204 | d-14-5 | a-8-10 |
| p-15-205 | d-14-5 | a-8-11 |
| p-15-206 | d-14-6 | a-1-1 |
| p-15-207 | d-14-6 | a-2-1 |
| p-15-208 | d-14-6 | a-3-1 |
| p-15-209 | d-14-6 | a-4-1 |
| p-15-210 | d-14-6 | a-5-1 |
| p-15-211 | d-14-6 | a-6-1 |
| p-15-212 | d-14-6 | a-7-1 |
| p-15-213 | d-14-6 | a-8-1 |

TABLE 28-continued

| No. | D | A |
|---|---|---|
| p-15-214 | d-14-7 | a-1-1 |
| p-15-215 | d-14-7 | a-1-2 |
| p-15-216 | d-14-7 | a-1-3 |
| p-15-217 | d-14-7 | a-2-1 |
| p-15-218 | d-14-7 | a-2-2 |
| p-15-219 | d-14-7 | a-2-3 |
| p-15-220 | d-14-7 | a-2-4 |
| p-15-221 | d-14-7 | a-2-5 |
| p-15-222 | d-14-7 | a-2-6 |
| p-15-223 | d-14-7 | a-2-7 |
| p-15-224 | d-14-7 | a-2-8 |
| p-15-225 | d-14-7 | a-2-9 |
| p-15-226 | d-14-7 | a-2-10 |
| p-15-227 | d-14-7 | a-2-11 |
| p-15-228 | d-14-7 | a-2-12 |
| p-15-229 | d-14-7 | a-2-13 |
| p-15-230 | d-14-7 | a-3-1 |
| p-15-231 | d-14-7 | a-3-2 |
| p-15-232 | d-14-7 | a-3-3 |
| p-15-233 | d-14-7 | a-3-4 |
| p-15-234 | d-14-7 | a-3-5 |
| p-15-235 | d-14-7 | a-3-6 |
| p-15-236 | d-14-7 | a-3-7 |
| p-15-237 | d-14-7 | a-4-1 |
| p-15-238 | d-14-7 | a-4-2 |
| p-15-239 | d-14-7 | a-4-3 |
| p-15-240 | d-14-7 | a-4-4 |
| p-15-241 | d-14-7 | a-4-5 |
| p-15-242 | d-14-7 | a-4-6 |
| p-15-243 | d-14-7 | a-5-1 |
| p-15-244 | d-14-7 | a-5-2 |
| p-15-245 | d-14-7 | a-5-3 |
| p-15-246 | d-14-7 | a-5-4 |
| p-15-247 | d-14-7 | a-5-5 |
| p-15-248 | d-14-7 | a-5-6 |
| p-15-249 | d-14-7 | a-5-7 |
| p-15-250 | d-14-7 | a-5-8 |
| p-15-251 | d-14-7 | a-5-9 |
| p-15-252 | d-14-7 | a-6-1 |
| p-15-253 | d-14-7 | a-6-2 |
| p-15-254 | d-14-7 | a-6-3 |
| p-15-255 | d-14-7 | a-6-4 |
| p-15-256 | d-14-7 | a-6-5 |
| p-15-257 | d-14-7 | a-6-6 |
| p-15-258 | d-14-7 | a-6-7 |
| p-15-259 | d-14-7 | a-7-1 |
| p-15-260 | d-14-7 | a-7-2 |
| p-15-261 | d-14-7 | a-7-3 |
| p-15-262 | d-14-7 | a-7-4 |
| p-15-263 | d-14-7 | a-7-5 |
| p-15-264 | d-14-7 | a-7-6 |
| p-15-265 | d-14-7 | a-7-7 |
| p-15-266 | d-14-7 | a-8-1 |
| p-15-267 | d-14-7 | a-8-2 |
| p-15-268 | d-14-7 | a-8-3 |
| p-15-269 | d-14-7 | a-8-4 |
| p-15-270 | d-14-7 | a-8-5 |
| p-15-271 | d-14-7 | a-8-6 |
| p-15-272 | d-14-7 | a-8-7 |
| p-15-273 | d-14-7 | a-8-8 |
| p-15-274 | d-14-7 | a-8-9 |
| p-15-275 | d-14-7 | a-8-10 |
| p-15-276 | d-14-7 | a-8-11 |

TABLE 29

| No. | D | A |
|---|---|---|
| p-16-1 | d-2-1 | a-9-1 |
| p-16-2 | d-2-1 | a-9-2 |
| p-16-3 | d-2-1 | a-9-3 |
| p-16-4 | d-2-1 | a-9-4 |
| p-16-5 | d-2-1 | a-9-5 |
| p-16-6 | d-2-1 | a-9-6 |
| p-16-7 | d-2-1 | a-9-7 |

TABLE 29-continued

| No. | D | A |
|---|---|---|
| p-16-8 | d-2-1 | a-9-8 |
| p-16-9 | d-2-1 | a-9-9 |
| p-16-10 | d-2-1 | a-9-10 |
| p-16-11 | d-2-1 | a-9-11 |
| p-16-12 | d-2-1 | a-9-12 |
| p-16-13 | d-2-1 | a-9-13 |
| p-16-14 | d-2-1 | a-9-14 |
| p-16-15 | d-5-1 | a-9-1 |
| p-16-16 | d-5-1 | a-9-2 |
| p-16-17 | d-5-1 | a-9-3 |
| p-16-18 | d-5-1 | a-9-4 |
| p-16-19 | d-5-1 | a-9-5 |
| p-16-20 | d-5-1 | a-9-6 |
| p-16-21 | d-5-1 | a-9-7 |
| p-16-22 | d-5-1 | a-9-8 |
| p-16-23 | d-5-1 | a-9-9 |
| p-16-24 | d-5-1 | a-9-10 |
| p-16-25 | d-5-1 | a-9-11 |
| p-16-26 | d-5-1 | a-9-12 |
| p-16-27 | d-5-1 | a-9-13 |
| p-16-28 | d-5-1 | a-9-14 |
| p-16-29 | d-5-4 | a-9-1 |
| p-16-30 | d-5-4 | a-9-2 |
| p-16-31 | d-5-4 | a-9-3 |
| p-16-32 | d-5-4 | a-9-4 |
| p-16-33 | d-5-4 | a-9-5 |
| p-16-34 | d-5-4 | a-9-6 |
| p-16-35 | d-5-4 | a-9-7 |
| p-16-36 | d-5-4 | a-9-8 |
| p-16-37 | d-5-4 | a-9-9 |
| p-16-38 | d-5-4 | a-9-10 |
| p-16-39 | d-5-4 | a-9-11 |
| p-16-40 | d-5-4 | a-9-12 |
| p-16-41 | d-5-4 | a-9-13 |
| p-16-42 | d-5-4 | a-9-14 |
| p-16-43 | d-6-1 | a-9-1 |
| p-16-44 | d-6-1 | a-9-2 |
| p-16-45 | d-6-1 | a-9-3 |
| p-16-46 | d-6-1 | a-9-4 |
| p-16-47 | d-6-1 | a-9-5 |
| p-16-48 | d-6-1 | a-9-6 |
| p-16-49 | d-6-1 | a-9-7 |
| p-16-50 | d-6-1 | a-9-8 |
| p-16-51 | d-6-1 | a-9-9 |
| p-16-52 | d-6-1 | a-9-10 |
| p-16-53 | d-6-1 | a-9-11 |
| p-16-54 | d-6-1 | a-9-12 |
| p-16-55 | d-6-1 | a-9-13 |
| p-16-56 | d-6-1 | a-9-14 |
| p-16-57 | d-7-1 | a-9-1 |
| p-16-58 | d-7-1 | a-9-2 |
| p-16-59 | d-7-1 | a-9-3 |
| p-16-60 | d-7-1 | a-9-4 |
| p-16-61 | d-7-1 | a-9-5 |
| p-16-62 | d-7-1 | a-9-6 |
| p-16-63 | d-7-1 | a-9-7 |
| p-16-64 | d-7-1 | a-9-8 |
| p-16-65 | d-7-1 | a-9-9 |
| p-16-66 | d-7-1 | a-9-10 |
| p-16-67 | d-7-1 | a-9-11 |
| p-16-68 | d-7-1 | a-9-12 |
| p-16-69 | d-7-1 | a-9-13 |
| p-16-70 | d-7-1 | a-9-14 |
| p-16-71 | d-9-2 | a-9-1 |
| p-16-72 | d-9-2 | a-9-2 |
| p-16-73 | d-9-2 | a-9-3 |
| p-16-74 | d-9-2 | a-9-4 |
| p-16-75 | d-9-2 | a-9-5 |
| p-16-76 | d-9-2 | a-9-6 |
| p-16-77 | d-9-2 | a-9-7 |
| p-16-78 | d-9-2 | a-9-8 |
| p-16-79 | d-9-2 | a-9-9 |
| p-16-80 | d-9-2 | a-9-10 |
| p-16-81 | d-9-2 | a-9-11 |
| p-16-82 | d-9-2 | a-9-12 |
| p-16-83 | d-9-2 | a-9-13 |
| p-16-84 | d-9-2 | a-9-14 |
| p-16-85 | d-9-3 | a-9-1 |

TABLE 29-continued

| No. | D | A |
|---|---|---|
| p-16-86 | d-9-3 | a-9-2 |
| p-16-87 | d-9-3 | a-9-3 |
| p-16-88 | d-9-3 | a-9-4 |
| p-16-89 | d-9-3 | a-9-5 |
| p-16-90 | d-9-3 | a-9-6 |
| p-16-91 | d-9-3 | a-9-7 |
| p-16-92 | d-9-3 | a-9-8 |
| p-16-93 | d-9-3 | a-9-9 |
| p-16-94 | d-9-3 | a-9-10 |
| p-16-95 | d-9-3 | a-9-11 |
| p-16-96 | d-9-3 | a-9-12 |
| p-16-97 | d-9-3 | a-9-13 |
| p-16-98 | d-9-3 | a-9-14 |
| p-16-99 | d-10-1 | a-9-1 |
| p-16-100 | d-10-1 | a-9-2 |
| p-16-101 | d-10-1 | a-9-3 |
| p-16-102 | d-10-1 | a-9-4 |
| p-16-103 | d-10-1 | a-9-5 |
| p-16-104 | d-10-1 | a-9-6 |
| p-16-105 | d-10-1 | a-9-7 |
| p-16-106 | d-10-1 | a-9-8 |
| p-16-107 | d-10-1 | a-9-9 |
| p-16-108 | d-10-1 | a-9-10 |
| p-16-109 | d-10-1 | a-9-11 |
| p-16-110 | d-10-1 | a-9-12 |
| p-16-111 | d-10-1 | a-9-13 |
| p-16-112 | d-10-1 | a-9-14 |
| p-16-113 | d-11-4 | a-9-1 |
| p-16-114 | d-11-4 | a-9-2 |
| p-16-115 | d-11-4 | a-9-3 |
| p-16-116 | d-11-4 | a-9-4 |
| p-16-117 | d-11-4 | a-9-5 |
| p-16-118 | d-11-4 | a-9-6 |
| p-16-119 | d-11-4 | a-9-7 |
| p-16-120 | d-11-4 | a-9-8 |
| p-16-121 | d-11-4 | a-9-9 |
| p-16-122 | d-11-4 | a-9-10 |
| p-16-123 | d-11-4 | a-9-11 |
| p-16-124 | d-11-4 | a-9-12 |
| p-16-125 | d-11-4 | a-9-13 |
| p-16-126 | d-11-4 | a-9-14 |
| p-16-127 | d-12-4 | a-9-1 |
| p-16-128 | d-12-4 | a-9-2 |
| p-16-129 | d-12-4 | a-9-3 |
| p-16-130 | d-12-4 | a-9-4 |
| p-16-131 | d-12-4 | a-9-5 |
| p-16-132 | d-12-4 | a-9-6 |
| p-16-133 | d-12-4 | a-9-7 |
| p-16-134 | d-12-4 | a-9-8 |
| p-16-135 | d-12-4 | a-9-9 |

TABLE 30

| No. | D | A |
|---|---|---|
| p-16-136 | d-12-4 | a-9-10 |
| p-16-137 | d-12-4 | a-9-11 |
| p-16-138 | d-12-4 | a-9-12 |
| p-16-139 | d-12-4 | a-9-13 |
| p-16-140 | d-12-4 | a-9-14 |
| p-16-141 | d-12-8 | a-9-1 |
| p-16-142 | d-12-8 | a-9-2 |
| p-16-143 | d-12-8 | a-9-3 |
| p-16-144 | d-12-8 | a-9-4 |
| p-16-145 | d-12-8 | a-9-5 |
| p-16-146 | d-12-8 | a-9-6 |
| p-16-147 | d-12-8 | a-9-7 |
| p-16-148 | d-12-8 | a-9-8 |
| p-16-149 | d-12-8 | a-9-9 |
| p-16-150 | d-12-8 | a-9-10 |
| p-16-151 | d-12-8 | a-9-11 |
| p-16-152 | d-12-8 | a-9-12 |
| p-16-153 | d-12-8 | a-9-13 |
| p-16-154 | d-12-8 | a-9-14 |
| p-16-155 | d-13-4 | a-9-1 |

TABLE 30-continued

| No. | D | A |
|---|---|---|
| p-16-156 | d-13-4 | a-9-2 |
| p-16-157 | d-13-4 | a-9-3 |
| p-16-158 | d-13-4 | a-9-4 |
| p-16-159 | d-13-4 | a-9-5 |
| p-16-160 | d-13-4 | a-9-6 |
| p-16-161 | d-13-4 | a-9-7 |
| p-16-162 | d-13-4 | a-9-8 |
| p-16-163 | d-13-4 | a-9-9 |
| p-16-164 | d-13-4 | a-9-10 |
| p-16-165 | d-13-4 | a-9-11 |
| p-16-166 | d-13-4 | a-9-12 |
| p-16-167 | d-13-4 | a-9-13 |
| p-16-168 | d-13-4 | a-9-14 |
| p-16-169 | d-14-5 | a-9-1 |
| p-16-170 | d-14-5 | a-9-2 |
| p-16-171 | d-14-5 | a-9-3 |
| p-16-172 | d-14-5 | a-9-4 |
| p-16-173 | d-14-5 | a-9-5 |
| p-16-174 | d-14-5 | a-9-6 |
| p-16-175 | d-14-5 | a-9-7 |
| p-16-176 | d-14-5 | a-9-8 |
| p-16-177 | d-14-5 | a-9-9 |
| p-16-178 | d-14-5 | a-9-10 |
| p-16-179 | d-14-5 | a-9-11 |
| p-16-180 | d-14-5 | a-9-12 |
| p-16-181 | d-14-5 | a-9-13 |
| p-16-182 | d-14-5 | a-9-14 |
| p-16-183 | d-15-4 | a-9-1 |
| p-16-184 | d-15-4 | a-9-2 |
| p-16-185 | d-15-4 | a-9-3 |
| p-16-186 | d-15-4 | a-9-4 |
| p-16-187 | d-15-4 | a-9-5 |
| p-16-188 | d-15-4 | a-9-6 |
| p-16-189 | d-15-4 | a-9-7 |
| p-16-190 | d-15-4 | a-9-8 |
| p-16-191 | d-15-4 | a-9-9 |
| p-16-192 | d-15-4 | a-9-10 |
| p-16-193 | d-15-4 | a-9-11 |
| p-16-194 | d-15-4 | a-9-12 |
| p-16-195 | d-15-4 | a-9-13 |
| p-16-196 | d-15-4 | a-9-14 |
| p-17-1 | d-2- | a-10-1 |
| p-17-2 | d-2-1 | a-10-2 |
| p-17-3 | d-2-1 | a-10-3 |
| p-17-4 | d-2-1 | a-10-4 |
| p-17-5 | d-2-1 | a-10-5 |
| p-17-6 | d-2-1 | a-10-6 |
| p-17-7 | d-2-1 | a-10-7 |
| p-17-8 | d-2-1 | a-10-8 |
| p-17-9 | d-2-1 | a-10-9 |
| p-17-10 | d-2-1 | a-10-10 |
| p-17-11 | d-2-1 | a-10-11 |
| p-17-12 | d-2-1 | a-10-12 |
| p-17-13 | d-2-1 | a-10-13 |
| p-17-14 | d-2-1 | a-10-14 |
| p-17-15 | d-7-1 | a-10-1 |
| p-17-16 | d-7-1 | a-10-2 |
| p-17-17 | d-7-1 | a-10-3 |
| p-17-18 | d-7-1 | a-10-4 |
| p-17-19 | d-7-1 | a-10-5 |
| p-17-20 | d-7-1 | a-10-6 |
| p-17-21 | d-7-1 | a-10-7 |
| p-17-22 | d-7-1 | a-10-8 |
| p-17-23 | d-7-1 | a-10-9 |
| p-17-24 | d-7-1 | a-10-10 |
| p-17-25 | d-7-1 | a-10-11 |
| p-17-26 | d-7-1 | a-10-12 |
| p-17-27 | d-7-1 | a-10-13 |
| p-17-28 | d-7-1 | a-10-14 |
| p-17-29 | d-9-2 | a-10-1 |
| p-17-30 | d-9-2 | a-10-2 |
| p-17-31 | d-9-2 | a-10-3 |
| p-17-32 | d-9-2 | a-10-4 |
| p-17-33 | d-9-2 | a-10-5 |
| p-17-34 | d-9-2 | a-10-6 |
| p-17-35 | d-9-2 | a-10-7 |
| p-17-36 | d-9-2 | a-10-8 |
| p-17-37 | d-9-2 | a-10-9 |

TABLE 30-continued

| No. | D | A |
|---|---|---|
| p-17-38 | d-9-2 | a-10-10 |
| p-17-39 | d-9-2 | a-10-11 |
| p-17-40 | d-9-2 | a-10-12 |
| p-17-41 | d-9-2 | a-10-13 |
| p-17-42 | d-9-2 | a-10-14 |
| p-17-43 | d-9-3 | a-10-1 |
| p-17-44 | d-9-3 | a-10-2 |
| p-17-45 | d-9-3 | a-10-3 |

TABLE 31

| No. | D | A |
|---|---|---|
| p-17-46 | d-9-3 | a-10-4 |
| p-17-47 | d-9-3 | a-10-5 |
| p-17-48 | d-9-3 | a-10-6 |
| p-17-49 | d-9-3 | a-10-7 |
| p-17-50 | d-9-3 | a-10-8 |
| p-17-51 | d-9-3 | a-10-9 |
| p-17-52 | d-9-3 | a-10-10 |
| p-17-53 | d-9-3 | a-10-11 |
| p-17-54 | d-9-3 | a-10-12 |
| p-17-55 | d-9-3 | a-10-13 |
| p-17-56 | d-9-3 | a-10-14 |
| p-17-57 | d-12-4 | a-10-1 |
| p-17-58 | d-12-4 | a-10-2 |
| p-17-59 | d-12-4 | a-10-3 |
| p-17-60 | d-12-4 | a-10-4 |
| p-17-61 | d-12-4 | a-10-5 |
| p-17-62 | d-12-4 | a-10-6 |
| p-17-63 | d-12-4 | a-10-7 |
| p-17-64 | d-12-4 | a-10-8 |
| p-17-65 | d-12-4 | a-10-9 |
| p-17-136 | d-12-4 | a-10-10 |
| p-17-137 | d-12-4 | a-10-11 |
| p-17-138 | d-12-4 | a-10-12 |
| p-17-139 | d-12-4 | a-10-13 |
| p-17-140 | d-12-4 | a-10-14 |
| p-17-141 | d-12-8 | a-10-1 |
| p-17-142 | d-12-8 | a-10-2 |
| p-17-143 | d-12-8 | a-10-3 |
| p-17-144 | d-12-8 | a-10-4 |
| p-17-145 | d-12-8 | a-10-5 |
| p-17-146 | d-12-8 | a-10-6 |
| p-17-147 | d-12-8 | a-10-7 |
| p-17-148 | d-12-8 | a-10-8 |
| p-17-149 | d-12-8 | a-10-9 |
| p-17-150 | d-12-8 | a-10-10 |
| p-17-151 | d-12-8 | a-10-11 |
| p-17-152 | d-12-8 | a-10-12 |
| p-17-153 | d-12-8 | a-10-13 |
| p-17-154 | d-12-8 | a-10-14 |
| p-17-155 | d-13-4 | a-10-1 |
| p-17-156 | d-13-4 | a-10-2 |
| p-17-157 | d-13-4 | a-10-3 |
| p-17-158 | d-13-4 | a-10-4 |
| p-17-159 | d-13-4 | a-10-5 |
| p-17-160 | d-13-4 | a-10-6 |
| p-17-161 | d-13-4 | a-10-7 |
| p-17-162 | d-13-4 | a-10-8 |
| p-17-163 | d-13-4 | a-10-9 |
| p-17-164 | d-13-4 | a-10-10 |
| p-17-165 | d-13-4 | a-10-11 |
| p-17-166 | d-13-4 | a-10-12 |
| p-17-167 | d-13-4 | a-10-13 |
| p-17-168 | d-13-4 | a-10-14 |
| p-17-169 | d-14-5 | a-10-1 |
| p-17-170 | d-14-5 | a-10-2 |
| p-17-171 | d-14-5 | a-10-3 |
| p-17-172 | d-14-5 | a-10-4 |
| p-17-173 | d-14-5 | a-10-5 |
| p-17-174 | d-14-5 | a-10-6 |
| p-17-175 | d-14-5 | a-10-7 |
| p-17-176 | d-14-5 | a-10-8 |
| p-17-177 | d-14-5 | a-10-9 |

TABLE 31-continued

| No. | D | A |
|---|---|---|
| p-17-178 | d-14-5 | a-10-10 |
| p-17-179 | d-14-5 | a-10-11 |
| p-17-180 | d-14-5 | a-10-12 |
| p-17-181 | d-14-5 | a-10-13 |
| p-17-182 | d-14-5 | a-10-14 |
| p-17-183 | d-15-4 | a-10-1 |
| p-17-184 | d-15-4 | a-10-2 |
| p-17-185 | d-15-4 | a-10-3 |
| p-17-186 | d-15-4 | a-10-4 |
| p-17-187 | d-15-4 | a-10-5 |
| p-17-188 | d-15-4 | a-10-6 |
| p-17-189 | d-15-4 | a-10-7 |
| p-17-190 | d-15-4 | a-10-8 |
| p-17-191 | d-15-4 | a-10-9 |
| p-17-192 | d-15-4 | a-10-10 |
| p-17-193 | d-15-4 | a-10-11 |
| p-17-194 | d-15-4 | a-10-12 |
| p-17-195 | d-15-4 | a-10-13 |
| p-17-196 | d-15-4 | a-10-14 |

TABLE 32

| No. | D | A |
|---|---|---|
| p-18-1 | d-16-1 | a-8-1 |
| p-18-2 | d-16-1 | a-8-2 |
| p-18-3 | d-16-1 | a-8-3 |
| p-18-4 | d-16-1 | a-8-4 |
| p-18-5 | d-16-1 | a-9-1 |
| p-18-6 | d-16-1 | a-9-2 |
| p-18-7 | d-16-1 | a-9-3 |
| p-18-8 | d-16-1 | a-9-4 |
| p-18-9 | d-16-1 | a-10-1 |
| p-18-10 | d-16-1 | a-10-2 |
| p-18-11 | d-16-1 | a-10-3 |
| p-18-12 | d-16-1 | a-10-4 |
| p-18-13 | d-16-1 | a-10-5 |
| p-18-14 | d-16-1 | a-10-6 |
| p-18-15 | d-16-1 | a-10-7 |
| p-18-16 | d-16-1 | a-10-8 |
| p-18-17 | d-16-1 | a-10-9 |
| p-18-18 | d-16-1 | a-10-10 |
| p-18-19 | d-16-1 | a-10-11 |
| p-18-20 | d-16-1 | a-10-12 |
| p-18-21 | d-16-1 | a-10-13 |
| p-18-22 | d-16-1 | a-10-14 |
| p-18-23 | d-16-2 | a-8-1 |
| p-18-24 | d-16-2 | a-8-2 |
| p-18-25 | d-16-2 | a-8-3 |
| p-18-26 | d-16-2 | a-8-4 |
| p-18-27 | d-16-2 | a-9-1 |
| p-18-28 | d-16-2 | a-9-2 |
| p-18-29 | d-16-2 | a-9-3 |
| p-18-30 | d-16-2 | a-9-4 |
| p-18-31 | d-16-2 | a-10-1 |
| p-18-32 | d-16-2 | a-10-2 |
| p-18-33 | d-16-2 | a-10-3 |
| p-18-34 | d-16-2 | a-10-4 |
| p-18-35 | d-16-2 | a-10-5 |
| p-18-36 | d-16-2 | a-10-6 |
| p-18-37 | d-16-2 | a-10-7 |
| p-18-38 | d-16-2 | a-10-8 |
| p-18-39 | d-16-2 | a-10-9 |
| p-18-40 | d-16-2 | a-10-10 |
| p-18-41 | d-16-2 | a-10-11 |
| p-18-42 | d-16-2 | a-10-12 |
| p-18-43 | d-16-2 | a-10-13 |
| p-18-44 | d-16-2 | a-10-14 |
| p-18-45 | d-16-3 | a-8-1 |
| p-18-46 | d-16-3 | a-8-2 |
| p-18-47 | d-16-3 | a-8-3 |
| p-18-48 | d-16-3 | a-8-4 |
| p-18-49 | d-16-3 | a-9-1 |
| p-18-50 | d-16-3 | a-9-2 |
| p-18-51 | d-16-3 | a-9-3 |

TABLE 32-continued

| No. | D | A |
|---|---|---|
| p-18-52 | d-16-3 | a-9-4 |
| p-18-53 | d-16-3 | a-10-1 |
| p-18-54 | d-16-3 | a-10-2 |
| p-18-55 | d-16-3 | a-10-3 |
| p-18-56 | d-16-3 | a-10-4 |
| p-18-57 | d-16-3 | a-10-5 |
| p-18-58 | d-16-3 | a-10-6 |
| p-18-59 | d-16-3 | a-10-7 |
| p-18-60 | d-16-3 | a-10-8 |
| p-18-61 | d-16-3 | a-10-9 |
| p-18-62 | d-16-3 | a-10-10 |
| p-18-63 | d-16-3 | a-10-11 |
| p-18-64 | d-16-3 | a-10-12 |
| p-18-65 | d-16-3 | a-10-13 |
| p-18-66 | d-16-3 | a-10-14 |
| p-18-67 | d-16-4 | a-8-1 |
| p-18-68 | d-16-4 | a-8-2 |
| p-18-69 | d-16-4 | a-8-3 |
| p-18-70 | d-16-4 | a-8-4 |
| p-18-71 | d-16-4 | a-9-1 |
| p-18-72 | d-16-4 | a-9-2 |
| p-18-73 | d-16-4 | a-9-3 |
| p-18-74 | d-16-4 | a-9-4 |
| p-18-75 | d-16-4 | a-10-1 |
| p-18-76 | d-16-4 | a-10-2 |
| p-18-77 | d-16-4 | a-10-3 |
| p-18-78 | d-16-4 | a-10-4 |
| p-18-79 | d-16-4 | a-10-5 |
| p-18-80 | d-16-4 | a-10-6 |
| p-18-81 | d-16-4 | a-10-7 |
| p-18-82 | d-16-4 | a-10-8 |
| p-18-83 | d-16-4 | a-10-9 |
| p-18-84 | d-16-4 | a-10-10 |
| p-18-85 | d-16-4 | a-10-11 |
| p-18-86 | d-16-4 | a-10-12 |
| p-18-87 | d-16-4 | a-10-13 |
| p-18-88 | d-16-4 | a-10-14 |
| p-18-89 | d-16-5 | a-8-1 |
| p-18-90 | d-16-5 | a-8-2 |
| p-18-91 | d-16-5 | a-8-3 |
| p-18-92 | d-16-5 | a-8-4 |
| p-18-93 | d-16-5 | a-9-1 |
| p-18-94 | d-16-5 | a-9-2 |
| p-18-95 | d-16-5 | a-9-3 |
| p-18-96 | d-16-5 | a-9-4 |
| p-18-97 | d-16-5 | a-10-1 |
| p-18-98 | d-16-5 | a-10-2 |
| p-18-99 | d-16-5 | a-10-3 |
| p-18-100 | d-16-5 | a-10-4 |
| p-18-101 | d-16-5 | a-10-5 |
| p-18-102 | d-16-5 | a-10-6 |
| p-18-103 | d-16-5 | a-10-7 |
| p-18-104 | d-16-5 | a-10-8 |
| p-18-105 | d-16-5 | a-10-9 |
| p-18-106 | d-16-5 | a-10-10 |
| p-18-107 | d-16-5 | a-10-11 |
| p-18-108 | d-16-5 | a-10-12 |
| p-18-109 | d-16-5 | a-10-13 |
| p-18-110 | d-16-5 | a-10-14 |
| p-18-111 | d-16-6 | a-8-1 |
| p-18-112 | d-16-6 | a-8-2 |
| p-18-113 | d-16-6 | a-8-3 |
| p-18-114 | d-16-6 | a-8-4 |
| p-18-115 | d-16-6 | a-9-1 |
| p-18-116 | d-16-6 | a-9-2 |
| p-18-117 | d-16-6 | a-9-3 |
| p-18-118 | d-16-6 | a-9-4 |
| p-18-119 | d-16-6 | a-10-1 |
| p-18-120 | d-16-6 | a-10-2 |
| p-18-121 | d-16-6 | a-10-3 |
| p-18-122 | d-16-6 | a-10-4 |
| p-18-123 | d-16-6 | a-10-5 |
| p-18-124 | d-16-6 | a-10-6 |
| p-18-125 | d-16-6 | a-10-7 |
| p-18-126 | d-16-6 | a-10-8 |
| p-18-127 | d-16-6 | a-10-9 |
| p-18-128 | d-16-6 | a-10-10 |
| p-18-129 | d-16-6 | a-10-11 |

TABLE 32-continued

| No. | D | A |
|---|---|---|
| p-18-130 | d-16-6 | a-10-12 |
| p-18-131 | d-16-6 | a-10-13 |
| p-18-132 | d-16-6 | a-10-14 |
| p-18-133 | d-16-7 | a-8-1 |
| p-18-134 | d-16-7 | a-8-2 |
| p-18-135 | d-16-7 | a-8-3 |

TABLE 33

| No. | D | A |
|---|---|---|
| p-18-136 | d-16-7 | a-8-4 |
| p-18-137 | d-16-7 | a-9-1 |
| p-18-138 | d-16-7 | a-9-2 |
| p-18-139 | d-16-7 | a-9-3 |
| p-18-140 | d-16-7 | a-9-4 |
| p-18-141 | d-16-7 | a-10-1 |
| p-18-142 | d-16-7 | a-10-2 |
| p-18-143 | d-16-7 | a-10-3 |
| p-18-144 | d-16-7 | a-10-4 |
| p-18-145 | d-16-7 | a-10-5 |
| p-18-146 | d-16-7 | a-10-6 |
| p-18-147 | d-16-7 | a-10-7 |
| p-18-148 | d-16-7 | a-10-8 |
| p-18-149 | d-16-7 | a-10-9 |
| p-18-150 | d-16-7 | a-10-10 |
| p-18-151 | d-16-7 | a-10-11 |
| p-18-152 | d-16-7 | a-10-12 |
| p-18-153 | d-16-7 | a-10-13 |
| p-18-154 | d-16-7 | a-10-14 |
| p-18-155 | d-16-8 | a-8-1 |
| p-18-156 | d-16-8 | a-8-2 |
| p-18-157 | d-16-8 | a-8-3 |
| p-18-158 | d-16-8 | a-8-4 |
| p-18-159 | d-16-8 | a-9-1 |
| p-18-160 | d-16-8 | a-9-2 |
| p-18-181 | d-16-8 | a-9-3 |
| p-18-162 | d-16-8 | a-9-4 |
| p-18-163 | d-16-8 | a-10-1 |
| p-18-164 | d-16-8 | a-10-2 |
| p-18-165 | d-16-8 | a-10-3 |
| p-18-166 | d-16-8 | a-10-4 |
| p-18-167 | d-16-8 | a-10-5 |
| p-18-168 | d-16-8 | a-10-6 |
| p-18-169 | d-16-8 | a-10-7 |
| p-18-170 | d-16-8 | a-10-8 |
| p-18-171 | d-16-8 | a-10-9 |
| p-18-172 | d-16-8 | a-10-10 |
| p-18-173 | d-16-8 | a-10-11 |
| p-18-174 | d-16-8 | a-10-12 |
| p-18-175 | d-16-8 | a-10-13 |
| p-18-176 | d-16-8 | a-10-14 |
| p-18-177 | d-16-9 | a-8-1 |
| p-18-178 | d-16-9 | a-8-2 |
| p-18-179 | d-16-9 | a-8-3 |
| p-18-180 | d-16-9 | a-8-4 |
| p-18-181 | d-16-9 | a-9-1 |
| p-18-182 | d-16-9 | a-9-2 |
| p-18-183 | d-16-9 | a-9-3 |
| p-18-134 | d-16-9 | a-9-4 |
| p-18-185 | d-16-9 | a-10-1 |
| p-18-188 | d-16-9 | a-10-2 |
| p-18-187 | d-16-9 | a-10-3 |
| p-18-188 | d-16-9 | a-10-4 |
| p-18-189 | d-16-9 | a-10-5 |
| p-18-190 | d-16-9 | a-10-6 |
| p-18-191 | d-16-9 | a-10-7 |
| p-18-192 | d-16-9 | a-10-8 |
| p-18-193 | d-16-9 | a-10-9 |
| p-18-194 | d-16-9 | a-10-10 |
| p-18-195 | d-16-9 | a-10-11 |
| p-18-190 | d-16-9 | a-10-12 |
| p-18-197 | d-16-9 | a-10-13 |
| p-18-198 | d-16-9 | a-10-14 |
| p-18-199 | d-16-10 | a-8-1 |

TABLE 33-continued

| No. | D | A |
|---|---|---|
| p-18-200 | d-16-10 | a-8-2 |
| p-18-201 | d-16-10 | a-8-3 |
| p-18-202 | d-16-10 | a-8-4 |
| p-18-203 | d-16-10 | a-9-1 |
| p-18-204 | d-16-10 | a-9-2 |
| p-18-205 | d-16-10 | a-9-3 |
| p-18-206 | d-16-10 | a-9-4 |
| p-18-207 | d-16-10 | a-10-1 |
| p-18-208 | d-16-10 | a-10-2 |
| p-18-209 | d-16-10 | a-10-3 |
| p-18-210 | d-16-10 | a-10-4 |
| p-18-211 | d-16-10 | a-10-5 |
| p-18-212 | d-16-10 | a-10-6 |
| p-18-213 | d-16-10 | a-10-7 |
| p-18-214 | d-16-10 | a-10-8 |
| p-18-215 | d-16-10 | a-10-9 |
| p-18-216 | d-16-10 | a-10-10 |
| p-18-217 | d-16-10 | a-10-11 |
| p-18-218 | d-16-10 | a-10-12 |
| p-18-219 | d-16-10 | a-10-13 |
| p-18-220 | d-16-10 | a-10-14 |
| p-18-221 | d-16-11 | a-8-1 |
| p-18-222 | d-15-11 | a-8-2 |
| p-18-223 | d-16-11 | a-8-3 |
| p-18-224 | d-16-11 | a-8-4 |
| p-18-225 | d-16-11 | a-9-1 |
| p-18-226 | d-16-11 | a-9-2 |
| p-18-227 | d-16-11 | a-9-3 |
| p-18-228 | d-16-11 | a-9-4 |
| p-18-229 | d-16-11 | a-10-1 |
| p-18-230 | d-16-11 | a-10-2 |
| p-18-231 | d-16-11 | a-10-3 |
| p-18-232 | d-16-11 | a-10-4 |
| p-18-233 | d-16-11 | a-10-5 |
| p-18-234 | d-16-11 | a-10-6 |
| p-18-235 | d-16-11 | a-10-7 |
| p-18-236 | d-16-11 | a-10-8 |
| p-18-237 | d-16-11 | a-10-9 |
| p-18-238 | d-16-11 | a-10-10 |
| p-18-239 | d-16-11 | a-10-11 |
| p-18-240 | d-16-11 | a-10-12 |
| p-18-241 | d-16-11 | a-10-13 |
| p-18-242 | d-16-11 | a-10-14 |
| p-18-243 | d-16-12 | a-8-1 |
| p-18-244 | d-16-12 | a-8-2 |
| p-18-245 | d-16-12 | a-8-3 |
| p-18-246 | d-16-12 | a-8-4 |
| p-18-247 | d-16-12 | a-9-1 |
| p-18-248 | d-16-12 | a-9-2 |
| p-18-249 | d-16-12 | a-9-3 |
| p-18-250 | d-16-12 | a-9-4 |
| p-18-251 | d-16-12 | a-10-1 |
| p-18-252 | d-16-12 | a-10-2 |
| p-18-253 | d-16-12 | a-10-3 |
| p-18-254 | d-16-12 | a-10-4 |
| p-18-255 | d-16-12 | a-10-5 |
| p-18-256 | d-16-12 | a-10-6 |
| p-18-257 | d-16-12 | a-10-7 |
| p-18-258 | d-16-12 | a-10-8 |
| p-18-259 | d-16-12 | a-10-9 |
| p-18-260 | d-16-12 | a-10-10 |
| p-18-261 | d-16-12 | a-10-11 |
| p-18-262 | d-16-12 | a-10-12 |
| p-18-263 | d-16-12 | a-10-13 |
| p-18-264 | d-16-12 | a-10-14 |
| p-18-265 | d-16-13 | a-8-1 |
| p-18-266 | d-16-13 | a-8-2 |
| p-18-267 | d-16-13 | a-8-3 |
| p-18-268 | d-16-13 | a-8-4 |
| p-18-269 | d-16-13 | a-9-1 |
| p-18-270 | d-16-13 | a-9-2 |

TABLE 34

| No. | D | A |
|---|---|---|
| p-18-271 | d-16-13 | a-9-3 |
| p-18-272 | d-16-13 | a-9-4 |
| p-18-273 | d-16-13 | a-10-1 |
| p-18-274 | d-16-13 | a-10-2 |
| p-18-275 | d-16-13 | a-10-3 |
| p-18-276 | d-16-13 | a-10-4 |
| p-18-277 | d-16-13 | a-10-5 |
| p-18-278 | d-16-13 | a-10-6 |
| p-18-279 | d-16-13 | a-10-7 |
| p-18-280 | d-16-13 | a-10-8 |
| p-18-281 | d-16-13 | a-10-9 |
| p-18-282 | d-16-13 | a-10-10 |
| p-18-283 | d-16-13 | a-10-11 |
| p-18-284 | d-16-13 | a-10-12 |
| p-18-285 | d-16-13 | a-10-13 |
| p-18-286 | d-16-13 | a-10-14 |
| p-18-287 | d-16-14 | a-8-1 |
| p-18-288 | d-16-14 | a-8-2 |
| p-18-289 | d-16-14 | a-8-3 |
| p-18-290 | d-16-14 | a-8-4 |
| p-18-291 | d-16-14 | a-9-1 |
| p-18-292 | d-16-14 | a-9-2 |
| p-18-293 | d-16-14 | a-9-3 |
| p-18-294 | d-16-14 | a-9-4 |
| p-18-295 | d-16-14 | a-10-1 |
| p-18-296 | d-16-14 | a-10-2 |
| p-18-297 | d-16-14 | a-10-3 |
| p-18-298 | d-16-14 | a-10-4 |
| p-18-299 | d-16-14 | a-10-5 |
| p-18-300 | d-16-14 | a-10-6 |
| p-18-301 | d-16-14 | a-10-7 |
| p-18-302 | d-16-14 | a-10-8 |
| p-18-303 | d-16-14 | a-10-9 |
| p-18-304 | d-16-14 | a-10-10 |
| p-18-305 | d-16-14 | a-10-11 |
| p-18-306 | d-16-14 | a-10-12 |
| p-18-307 | d-16-14 | a-10-13 |
| p-18-308 | d-16-14 | a-10-14 |
| p-18-309 | d-16-15 | a-8-1 |
| p-18-310 | d-16-15 | a-8-2 |
| p-18-311 | d-16-15 | a-8-3 |
| p-18-312 | d-16-15 | a-8-4 |
| p-18-313 | d-16-15 | a-9-1 |
| p-18-314 | d-16-15 | a-9-2 |
| p-18-315 | d-16-15 | a-9-3 |
| p-18-316 | d-16-15 | a-9-4 |
| p-18-317 | d-16-15 | a-10-1 |
| p-18-318 | d-16-15 | a-10-2 |
| p-18-319 | d-16-15 | a-10-3 |
| p-18-320 | d-16-15 | a-10-4 |
| p-18-321 | d-16-15 | a-10-5 |
| p-18-322 | d-16-15 | a-10-6 |
| p-18-323 | d-16-15 | a-10-7 |
| p-18-324 | d-16-15 | a-10-8 |
| p-18-325 | d-16-15 | a-10-9 |
| p-18-326 | d-16-15 | a-10-10 |
| p-18-327 | d-16-15 | a-10-11 |
| p-18-328 | d-16-15 | a-10-12 |
| p-18-329 | d-16-15 | a-10-13 |
| p-18-330 | d-16-15 | a-10-14 |
| p-18-331 | d-16-16 | a-8-1 |
| p-18-332 | d-16-16 | a-8-2 |
| p-18-333 | d-16-16 | a-8-3 |
| p-18-334 | d-16-16 | a-8-4 |
| p-18-335 | d-16-16 | a-9-1 |
| p-18-336 | d-16-16 | a-9-2 |
| p-18-337 | d-16-16 | a-9-3 |
| p-18-338 | d-16-16 | a-9-4 |
| p-18-339 | d-16-16 | a-10-1 |
| p-18-340 | d-16-16 | a-10-2 |
| p-18-341 | d-16-16 | a-10-3 |
| p-18-342 | d-16-16 | a-10-4 |
| p-18-343 | d-16-16 | a-10-5 |
| p-18-344 | d-16-16 | a-10-6 |
| p-18-345 | d-16-16 | a-10-7 |
| p-18-346 | d-16-16 | a-10-8 |
| p-18-347 | d-16-16 | a-10-9 |
| p-18-348 | d-16-16 | a-10-10 |

TABLE 34-continued

| No. | D | A |
|---|---|---|
| p-18-349 | d-16-16 | a-10-11 |
| p-18-350 | d-16-16 | a-10-12 |
| p-18-351 | d-16-16 | a-10-13 |
| p-18-352 | d-16-16 | a-10-14 |
| p-18-353 | d-16-17 | a-8-1 |
| p-18-354 | d-16-17 | a-8-2 |
| p-18-355 | d-16-17 | a-8-3 |
| p-18-356 | d-16-17 | a-8-4 |
| p-18-357 | d-16-17 | a-9-1 |
| p-18-358 | d-16-17 | a-9-2 |
| p-18-359 | d-16-17 | a-9-3 |
| p-18-360 | d-16-17 | a-9-4 |
| p-18-361 | d-16-17 | a-10-1 |
| p-18-362 | d-16-17 | a-10-2 |
| p-18-363 | d-16-17 | a-10-3 |
| p-18-364 | d-16-17 | a-10-4 |
| p-18-365 | d-16-17 | a-10-5 |
| p-18-366 | d-16-17 | a-10-6 |
| p-18-367 | d-16-17 | a-10-7 |
| p-18-368 | d-16-17 | a-10-8 |
| p-18-369 | d-16-17 | a-10-9 |
| p-18-370 | d-16-17 | a-10-10 |
| p-18-371 | d-16-17 | a-10-11 |
| p-18-372 | d-16-17 | a-10-12 |
| p-18-373 | d-16-17 | a-10-13 |
| p-18-374 | d-16-17 | a-10-14 |
| p-18-375 | d-16-18 | a-8-1 |
| p-18-376 | d-16-18 | a-8-2 |
| p-18-377 | d-16-18 | a-8-3 |
| p-18-378 | d-16-18 | a-8-4 |
| p-18-379 | d-16-18 | a-9-1 |
| p-18-380 | d-16-18 | a-9-2 |
| p-18-381 | d-16-18 | a-9-3 |
| p-18-382 | d-16-18 | a-9-4 |
| p-18-383 | d-16-18 | a-10-1 |
| p-18-384 | d-16-18 | a-10-2 |
| p-18-385 | d-16-18 | a-10-3 |
| p-18-386 | d-16-18 | a-10-4 |
| p-18-387 | d-16-18 | a-10-5 |
| p-18-388 | d-16-18 | a-10-6 |
| p-18-389 | d-16-18 | a-10-7 |
| p-18-390 | d-16-18 | a-10-8 |
| p-18-391 | d-16-18 | a-10-9 |
| p-18-392 | d-16-18 | a-10-10 |
| p-18-393 | d-16-18 | a-10-11 |
| p-18-394 | d-16-18 | a-10-12 |
| p-18-395 | d-16-18 | a-10-13 |
| p-18-396 | d-16-18 | a-10-14 |

TABLE 35

| No. | D | A |
|---|---|---|
| p-19-1 | d-1-1 | a-11-1 |
| p-19-2 | d-1-1 | a-11-2 |
| p-19-3 | d-1-1 | a-11-3 |
| p-19-4 | d-1-1 | a-11-4 |
| p-19-5 | d-1-1 | a-11-5 |
| p-19-6 | d-1-1 | a-11-6 |
| p-19-7 | d-1-1 | a-11-7 |
| p-19-8 | d-1-1 | a-11-8 |
| p-19-9 | d-1-1 | a-11-9 |
| p-19-10 | d-1-1 | a-11-10 |
| p-19-11 | d-1-1 | a-11-11 |
| p-19-12 | d-1-1 | a-11-12 |
| p-19-13 | d-2-1 | a-11-1 |
| p-19-14 | d-2-1 | a-11-2 |
| p-19-15 | d-2-1 | a-11-3 |
| p-19-16 | d-2-1 | a-11-4 |
| p-19-17 | d-2-1 | a-11-5 |
| p-19-18 | d-2-1 | a-11-6 |
| p-19-19 | d-2-1 | a-11-7 |
| p-19-20 | d-2-1 | a-11-8 |
| p-19-21 | d-2-1 | a-11-9 |
| p-19-22 | d-2-1 | a-11-10 |

TABLE 35-continued

| No. | D | A |
|---|---|---|
| p-19-23 | d-2-1 | a-11-11 |
| p-19-24 | d-2-1 | a-11-12 |
| p-19-25 | d-4-1 | a-11-1 |
| p-19-26 | d-4-1 | a-11-2 |
| p-19-27 | d-4-1 | a-11-3 |
| p-19-28 | d-4-1 | a-11-4 |
| p-19-29 | d-4-1 | a-11-5 |
| p-19-30 | d-4-1 | a-11-6 |
| p-19-31 | d-4-1 | a-11-7 |
| p-19-32 | d-4-1 | a-11-8 |
| p-19-33 | d-4-1 | a-11-9 |
| p-19-34 | d-4-1 | a-11-10 |
| p-19-35 | d-4-1 | a-11-11 |
| p-19-36 | d-4-1 | a-11-12 |
| p-19-37 | d-5-1 | a-11-1 |
| p-19-38 | d-5-1 | a-11-2 |
| p-19-39 | d-5-1 | a-11-3 |
| p-19-40 | d-5-1 | a-11-4 |
| p-19-41 | d-5-1 | a-11-5 |
| p-19-42 | d-5-1 | a-11-6 |
| p-19-43 | d-5-1 | a-11-7 |
| p-19-44 | d-5-1 | a-11-8 |
| p-19-45 | d-5-1 | a-11-9 |
| p-19-46 | d-5-1 | a-11-10 |
| p-19-47 | d-5-1 | a-11-11 |
| p-19-48 | d-5-1 | a-11-12 |
| p-19-49 | d-6-1 | a-11-1 |
| p-19-50 | d-6-1 | a-11-2 |
| p-19-51 | d-6-1 | a-11-3 |
| p-19-52 | d-6-1 | a-11-4 |
| p-19-53 | d-6-1 | a-11-5 |
| p-19-54 | d-6-1 | a-11-6 |
| p-19-55 | d-6-1 | a-11-7 |
| p-19-56 | d-6-1 | a-11-8 |
| p-19-57 | d-6-1 | a-11-9 |
| p-19-58 | d-6-1 | a-11-10 |
| p-19-59 | d-6-1 | a-11-11 |
| p-19-60 | d-6-1 | a-11-12 |
| p-19-61 | d-7-1 | a-11-1 |
| p-19-62 | d-7-1 | a-11-2 |
| p-19-63 | d-7-1 | a-11-3 |
| p-19-64 | d-7-1 | a-11-4 |
| p-19-65 | d-7-1 | a-11-5 |
| p-19-66 | d-7-1 | a-11-6 |
| p-19-67 | d-7-1 | a-11-7 |
| p-19-68 | d-7-1 | a-11-8 |
| p-19-69 | d-7-1 | a-11-9 |
| p-19-70 | d-7-1 | a-11-10 |
| p-19-71 | d-7-1 | a-11-11 |
| p-19-72 | d-7-1 | a-11-12 |
| p-19-73 | d-8-1 | a-11-1 |
| p-19-74 | d-8-1 | a-11-2 |
| p-19-75 | d-8-1 | a-11-3 |
| p-19-76 | d-8-1 | a-11-4 |
| p-19-77 | d-8-1 | a-11-5 |
| p-19-78 | d-8-1 | a-11-6 |
| p-19-79 | d-8-1 | a-11-7 |
| p-19-80 | d-8-1 | a-11-8 |
| p-19-81 | d-8-1 | a-11-9 |
| p-19-82 | d-8-1 | a-11-10 |
| p-19-83 | d-8-1 | a-11-11 |
| p-19-84 | d-8-1 | a-11-12 |
| p-19-85 | d-8-2 | a-11-1 |
| p-19-86 | d-8-2 | a-11-2 |
| p-19-87 | d-8-2 | a-11-3 |
| p-19-88 | d-8-2 | a-11-4 |
| p-19-89 | d-8-2 | a-11-5 |
| p-19-90 | d-8-2 | a-11-6 |
| p-19-91 | d-8-2 | a-11-7 |
| p-19-92 | d-8-2 | a-11-8 |
| p-19-93 | d-8-2 | a-11-9 |
| p-19-94 | d-8-2 | a-11-10 |
| p-19-95 | d-8-2 | a-11-11 |
| p-19-96 | d-8-2 | a-11-12 |
| p-19-97 | d-9-1 | a-11-1 |
| p-19-98 | d-9-1 | a-11-2 |
| p-19-99 | d-9-1 | a-11-3 |
| p-19-100 | d-9-1 | a-11-4 |

TABLE 35-continued

| No. | D | A |
|---|---|---|
| p-19-101 | d-9-1 | a-11-5 |
| p-19-102 | d-9-1 | a-11-6 |
| p-19-103 | d-9-1 | a-11-7 |
| p-19-104 | d-9-1 | a-11-8 |
| p-19-105 | d-9-1 | a-11-9 |
| p-19-106 | d-9-1 | a-11-10 |
| p-19-107 | d-9-1 | a-11-11 |
| p-19-108 | d-9-1 | a-11-12 |
| p-19-109 | d-9-2 | a-11-1 |
| p-19-110 | d-9-2 | a-11-2 |
| p-19-111 | d-9-2 | a-11-3 |
| p-19-112 | d-9-2 | a-11-4 |
| p-19-113 | d-9-2 | a-11-5 |
| p-19-114 | d-9-2 | a-11-6 |
| p-19-115 | d-9-2 | a-11-7 |
| p-19-116 | d-9-2 | a-11-8 |
| p-19-117 | d-9-2 | a-11-9 |
| p-19-118 | d-9-2 | a-11-10 |
| p-19-119 | d-9-2 | a-11-11 |
| p-19-120 | d-9-2 | a-11-12 |
| p-19-121 | d-9-10 | a-11-1 |
| p-19-122 | d-9-10 | a-11-2 |
| p-19-123 | d-9-10 | a-11-3 |
| p-19-124 | d-9-10 | a-11-4 |
| p-19-125 | d-9-10 | a-11-5 |
| p-19-126 | d-9-10 | a-11-6 |
| p-19-127 | d-9-10 | a-11-7 |
| p-19-128 | d-9-10 | a-11-8 |
| p-19-129 | d-9-10 | a-11-9 |
| p-19-130 | d-9-10 | a-11-10 |
| p-19-131 | d-9-10 | a-11-11 |
| p-19-132 | d-9-10 | a-11-12 |
| p-19-133 | d-10-1 | a-11-1 |
| p-19-134 | d-10-1 | a-11-2 |
| p-19-135 | d-10-1 | a-11-3 |

TABLE 36

| No. | D | A |
|---|---|---|
| p-19-136 | d-10-1 | a-11-4 |
| p-19-137 | d-10-1 | a-11-5 |
| p-19-138 | d-10-1 | a-11-6 |
| p-19-139 | d-10-1 | a-11-7 |
| p-19-140 | d-10-1 | a-11-8 |
| p-19-141 | d-10-1 | a-11-9 |
| p-19-142 | d-10-1 | a-11-10 |
| p-19-143 | d-10-1 | a-11-11 |
| p-19-144 | d-10-1 | a-11-12 |
| p-19-145 | d-11-1 | a-11-1 |
| p-19-146 | d-11-1 | a-11-2 |
| p-19-147 | d-11-1 | a-11-3 |
| p-19-148 | d-11-1 | a-11-4 |
| p-19-149 | d-11-1 | a-11-5 |
| p-19-150 | d-11-1 | a-11-6 |
| p-19-151 | d-11-1 | a-11-7 |
| p-19-152 | d-11-1 | a-11-8 |
| p-19-153 | d-11-1 | a-11-9 |
| p-19-154 | d-11-1 | a-11-10 |
| p-19-155 | d-11-1 | a-11-11 |
| p-19-156 | d-11-1 | a-11-12 |
| p-19-157 | d-11-4 | a-11-1 |
| p-19-158 | d-11-4 | a-11-2 |
| p-19-159 | d-11-4 | a-11-3 |
| p-19-160 | d-11-4 | a-11-4 |
| p-19-161 | d-11-4 | a-11-5 |
| p-19-162 | d-11-4 | a-11-6 |
| p-19-163 | d-11-4 | a-11-7 |
| p-19-164 | d-11-4 | a-11-8 |
| p-19-165 | d-11-4 | a-11-9 |
| p-19-166 | d-11-4 | a-11-10 |
| p-19-167 | d-11-4 | a-11-11 |
| p-19-168 | d-11-4 | a-11-12 |
| p-19-169 | d-11-10 | a-11-1 |
| p-19-170 | d-11-10 | a-11-2 |

TABLE 36-continued

| No. | D | A |
|---|---|---|
| p-19-171 | d-11-10 | a-11-3 |
| p-19-172 | d-11-10 | a-11-4 |
| P-19-173 | d-11-10 | a-11-5 |
| p-19-174 | d-11-10 | a-11-6 |
| p-19-175 | d-11-10 | a-11-7 |
| p-19-176 | d-11-10 | a-11-8 |
| p-19-177 | d-11-10 | a-11-9 |
| p-19-178 | d-11-10 | a-11-10 |
| p-19-179 | d-11-10 | a-11-11 |
| p-19-180 | d-11-10 | a-11-12 |
| p-19-181 | d-11-12 | a-11-1 |
| p-19-182 | d-11-12 | a-11-2 |
| p-19-183 | d-11-12 | a-11-3 |
| p-19-184 | d-11-12 | a-11-4 |
| p-19-185 | d-11-12 | a-11-5 |
| p-19-186 | d-11-12 | a-11-6 |
| p-19-187 | d-11-12 | a-11-7 |
| p-19-188 | d-11-12 | a-11-8 |
| p-19-189 | d-11-12 | a-11-9 |
| p-19-190 | d-11-12 | a-11-10 |
| p-19-191 | d-11-12 | a-11-11 |
| p-19-192 | d-11-12 | a-11-12 |
| p-19-193 | d-12-1 | a-11-1 |
| p-19-194 | d-12-1 | a-11-2 |
| p-19-195 | d-12-1 | a-11-3 |
| p-19-196 | d-12-1 | a-11-4 |
| p-19-197 | d-12-1 | a-11-5 |
| p-19-198 | d-12-1 | a-11-6 |
| p-19-199 | d-12-1 | a-11-7 |
| p-19-200 | d-12-1 | a-11-8 |
| p-19-201 | d-12-1 | a-11-9 |
| p-19-202 | d-12-1 | a-11-10 |
| p-19-203 | d-12-1 | a-11-11 |
| p-19-204 | d-12-1 | a-11-12 |
| p-19-205 | d-12-4 | a-11-1 |
| p-19-206 | d-12-4 | a-11-2 |
| p-19-207 | d-12-4 | a-11-3 |
| p-19-208 | d-12-4 | a-11-4 |
| p-19-209 | d-12-4 | a-11-5 |
| p-19-210 | d-12-4 | a-11-6 |
| p-19-211 | d-12-4 | a-11-7 |
| p-19-212 | d-12-4 | a-11-8 |
| p-19-213 | d-12-4 | a-11-9 |
| p-19-214 | d-12-4 | a-11-10 |
| p-19-215 | d-12-4 | a-11-11 |
| p-19-216 | d-12-4 | a-11-12 |
| p-19-217 | d-12-12 | a-11-1 |
| p-19-218 | d-12-12 | a-11-2 |
| p-19-219 | d-12-12 | a-11-3 |
| p-19-220 | d-12-12 | a-11-4 |
| p-19-221 | d-12-12 | a-11-5 |
| p-19-222 | d-12-12 | a-11-6 |
| p-19-223 | d-12-12 | a-11-7 |
| p-19-224 | d-12-12 | a-11-8 |
| p-19-225 | d-12-12 | a-11-9 |
| p-19-226 | d-12-12 | a-11-10 |
| p-19-227 | d-12-12 | a-11-11 |
| p-19-228 | d-12-12 | a-11-12 |
| p-19-229 | d-12-14 | a-11-1 |
| p-19-230 | d-12-14 | a-11-2 |
| p-19-231 | d-12-14 | a-11-3 |
| p-19-232 | d-12-14 | a-11-4 |
| p-19-233 | d-12-14 | a-11-5 |
| p-19-234 | d-12-14 | a-11-6 |
| p-19-235 | d-12-14 | a-11-7 |
| p-19-236 | d-12-14 | a-11-8 |
| p-19-237 | d-12-14 | a-11-9 |
| p-19-238 | d-12-14 | a-11-10 |
| p-19-239 | d-12-14 | a-11-11 |
| p-19-240 | d-12-14 | a-11-12 |
| p-19-241 | d-13-1 | a-11-1 |
| p-19-242 | d-13-1 | a-11-2 |
| p-19-243 | d-13-1 | a-11-3 |
| p-19-244 | d-13-1 | a-11-4 |
| p-19-245 | d-13-1 | a-11-5 |
| p-19-246 | d-13-1 | a-11-6 |
| p-19-247 | d-13-1 | a-11-7 |
| p-19-248 | d-13-1 | a-11-8 |

TABLE 36-continued

| No. | D | A |
|---|---|---|
| p-19-249 | d-13-1 | a-11-9 |
| p-19-250 | d-13-1 | a-11-10 |
| p-19-251 | d-13-1 | a-11-11 |
| p-19-252 | d-13-1 | a-11-12 |
| p-19-253 | d-13-4 | a-11-1 |
| p-19-254 | d-13-4 | a-11-2 |
| p-19-255 | d-13-4 | a-11-3 |
| p-19-256 | d-13-4 | a-11-4 |
| p-19-257 | d-13-4 | a-11-5 |
| p-19-258 | d-13-4 | a-11-6 |
| p-19-259 | d-13-4 | a-11-7 |
| p-19-260 | d-13-4 | a-11-8 |
| p-19-261 | d-13-4 | a-11-9 |
| p-19-262 | d-13-4 | a-11-10 |
| p-19-263 | d-13-4 | a-11-11 |
| p-19-264 | d-13-4 | a-11-12 |
| p-19-265 | d-14-1 | a-11-1 |
| p-19-266 | d-14-1 | a-11-2 |
| p-19-267 | d-14-1 | a-11-3 |
| p-19-268 | d-14-1 | a-11-4 |
| p-19-269 | d-14-1 | a-11-5 |
| p-19-270 | d-14-1 | a-11-6 |

TABLE 37

| No. | D | A |
|---|---|---|
| p-19-271 | d-14-1 | a-11-7 |
| p-19-272 | d-14-1 | a-11-8 |
| p-19-273 | d-14-1 | a-11-9 |
| p-19-274 | d-14-1 | a-11-10 |
| p-19-275 | d-14-1 | a-11-11 |
| p-19-276 | d-14-1 | a-11-12 |
| p-19-277 | d-14-5 | a-11-1 |
| p-19-278 | d-14-5 | a-11-2 |
| p-19-279 | d-14-5 | a-11-3 |
| p-19-280 | d-14-5 | a-11-4 |
| p-19-281 | d-14-5 | a-11-5 |
| p-19-282 | d-14-5 | a-11-6 |
| p-19-283 | d-14-5 | a-11-7 |
| p-19-284 | d-14-5 | a-11-8 |
| p-19-285 | d-14-5 | a-11-9 |
| p-19-286 | d-14-5 | a-11-10 |
| p-19-287 | d-14-5 | a-11-11 |
| p-19-288 | d-14-5 | a-11-12 |
| p-19-289 | d-15-1 | a-11-1 |
| p-19-290 | d-15-1 | a-11-2 |
| p-19-291 | d-15-1 | a-11-3 |
| p-19-292 | d-15-1 | a-11-4 |
| p-19-293 | d-15-1 | a-11-5 |
| p-19-294 | d-15-1 | a-11-6 |
| p-19-295 | d-15-1 | a-11-7 |
| p-19-296 | d-15-1 | a-11-8 |
| p-19-297 | d-15-1 | a-11-9 |
| p-19-298 | d-15-1 | a-11-10 |
| p-19-299 | d-15-1 | a-11-11 |
| p-19-300 | d-15-1 | a-11-12 |
| p-19-301 | d-16-4 | a-11-1 |
| p-19-302 | d-16-4 | a-11-2 |
| p-19-303 | d-16-4 | a-11-3 |
| p-19-304 | d-16-4 | a-11-4 |
| p-19-305 | d-16-4 | a-11-5 |
| p-19-306 | d-16-4 | a-11-6 |
| p-19-307 | d-16-4 | a-11-7 |
| p-19-308 | d-16-4 | a-11-8 |
| p-19-309 | d-16-4 | a-11-9 |
| p-19-310 | d-16-4 | a-11-10 |
| p-19-311 | d-16-4 | a-11-11 |
| p-19-312 | d-16-4 | a-11-12 |
| p-19-313 | d-16-5 | a-11-1 |
| p-19-314 | d-16-5 | a-11-2 |
| p-19-315 | d-16-5 | a-11-3 |
| p-19-316 | d-16-5 | a-11-4 |
| p-19-317 | d-16-5 | a-11-5 |
| p-19-318 | d-16-5 | a-11-6 |

TABLE 37-continued

| No. | D | A |
|---|---|---|
| p-19-319 | d-16-5 | a-11-7 |
| p-19-320 | d-16-5 | a-11-8 |
| p-19-321 | d-16-5 | a-11-9 |
| p-19-322 | d-16-5 | a-11-10 |
| p-19-323 | d-16-5 | a-11-11 |
| p-19-324 | d-16-5 | a-11-12 |
| p-19-325 | d-16-8 | a-11-1 |
| p-19-326 | d-16-8 | a-11-2 |
| p-19-327 | d-16-8 | a-11-3 |
| p-19-328 | d-16-8 | a-11-4 |
| p-19-329 | d-16-8 | a-11-5 |
| p-19-330 | d-16-8 | a-11-6 |
| p-19-331 | d-16-8 | a-11-7 |
| p-19-332 | d-16-8 | a-11-8 |
| p-19-333 | d-16-8 | a-11-9 |
| p-19-334 | d-16-8 | a-11-10 |
| p-19-335 | d-16-8 | a-11-11 |
| p-19-336 | d-16-8 | a-11-12 |
| p-19-337 | d-16-9 | a-11-1 |
| p-19-338 | d-16-9 | a-11-2 |
| p-19-339 | d-16-9 | a-11-3 |
| p-19-340 | d-16-9 | a-11-4 |
| p-19-341 | d-16-9 | a-11-5 |
| p-19-342 | d-16-9 | a-11-6 |
| p-19-343 | d-16-9 | a-11-7 |
| p-19-344 | d-16-9 | a-11-8 |
| p-19-345 | d-16-9 | a-11-9 |
| p-19-346 | d-16-9 | a-11-10 |
| P-19-347 | d-16-9 | a-11-11 |
| p-19-348 | d-16-9 | a-11-12 |
| p-19-349 | d-16-10 | a-11-1 |
| p-19-350 | d-16-10 | a-11-2 |
| p-19-351 | d-16-10 | a-11-3 |
| p-19-352 | d-16-10 | a-11-4 |
| p-19-353 | d-16-10 | a-11-5 |
| p-19-354 | d-16-10 | a-11-6 |
| p-19-355 | d-16-10 | a-11-7 |
| p-19-356 | d-16-10 | a-11-8 |
| p-19-357 | d-16-10 | a-11-9 |
| p-19-358 | d-16-10 | a-11-10 |
| p-19-359 | d-16-10 | a-11-11 |
| p-19-360 | d-16-10 | a-11-12 |
| p-19-361 | d-16-11 | a-11-1 |
| p-19-362 | d-16-11 | a-11-2 |
| p-19-363 | d-16-11 | a-11-3 |
| p-19-364 | d-16-11 | a-11-4 |
| p-19-365 | d-16-11 | a-11-5 |
| p-19-366 | d-16-11 | a-11-6 |
| p-19-367 | d-16-11 | a-11-7 |
| p-19-368 | d-16-11 | a-11-8 |
| p-19-369 | d-16-11 | a-11-9 |
| p-19-370 | d-16-11 | a-11-10 |
| p-19-371 | d-16-11 | a-11-11 |
| p-19-372 | d-16-11 | a-11-12 |
| p-19-373 | d-16-12 | a-11-1 |
| p-19-374 | d-16-12 | a-11-2 |
| p-19-375 | d-16-12 | a-11-3 |
| p-19-376 | d-16-12 | a-11-4 |
| p-19-377 | d-16-12 | a-11-5 |
| p-19-378 | d-16-12 | a-11-6 |
| p-19-379 | d-16-12 | a-11-7 |
| p-19-380 | d-16-12 | a-11-8 |
| p-19-381 | d-16-12 | a-11-9 |
| p-19-382 | d-16-12 | a-11-10 |
| p-19-383 | d-16-12 | a-11-11 |
| p-19-384 | d-16-12 | a-11-12 |
| p-19-385 | d-16-13 | a-11-1 |
| p-19-386 | d-16-13 | a-11-2 |
| p-19-387 | d-16-13 | a-11-3 |
| p-19-388 | d-16-13 | a-11-4 |
| p-19-389 | d-16-13 | a-11-5 |
| p-19-390 | d-16-13 | a-11-6 |
| p-19-391 | d-16-13 | a-11-7 |
| p-19-392 | d-16-13 | a-11-8 |
| p-19-393 | d-16-13 | a-11-9 |
| p-19-394 | d-16-13 | a-11-10 |
| p-19-395 | d-16-13 | a-11-11 |
| p-19-396 | d-16-13 | a-11-12 |

TABLE 37-continued

| No. | D | A |
|---|---|---|
| p-19-397 | d-16-14 | a-11-1 |
| p-19-398 | d-16-14 | a-11-2 |
| p-19-399 | d-16-14 | a-11-3 |
| p-19-400 | d-16-14 | a-11-4 |
| p-19-401 | d-16-14 | a-11-5 |
| p-19-402 | d-16-14 | a-11-6 |
| p-19-403 | d-16-14 | a-11-7 |
| p-19-404 | d-16-14 | a-11-8 |
| p-19-405 | d-16-14 | a-11-9 |
| p-19-406 | d-16-14 | a-11-10 |
| p-19-407 | d-16-14 | a-11-11 |
| p-19-408 | d-16-14 | a-11-12 |
| p-19-409 | d-16-15 | a-11-1 |
| p-19-410 | d-16-15 | a-11-2 |
| p-19-411 | d-16-15 | a-11-3 |
| p-19-412 | d-16-15 | a-11-4 |
| p-19-413 | d-16-15 | a-11-5 |
| p-19-414 | d-16-15 | a-11-6 |
| p-19-415 | d-16-15 | a-11-7 |
| p-19-416 | d-16-15 | a-11-8 |
| p-19-417 | d-16-15 | a-11-9 |
| p-19-418 | d-16-15 | a-11-10 |
| p-19-419 | d-16-15 | a-11-11 |
| p-19-420 | d-16-15 | a-11-12 |
| p-19-421 | d-16-16 | a-11-1 |
| p-19-422 | d-16-16 | a-11-2 |
| p-19-423 | d-16-16 | a-11-3 |
| p-19-424 | d-16-16 | a-11-4 |
| p-19-425 | d-16-16 | a-11-5 |
| p-19-426 | d-16-16 | a-11-6 |
| p-19-427 | d-16-16 | a-11-7 |
| p-19-428 | d-16-16 | a-11-8 |
| p-19-429 | d-16-16 | a-11-9 |
| p-19-430 | d-16-16 | a-11-10 |
| p-19-431 | d-16-16 | a-11-11 |
| p-19-432 | d-16-16 | a-11-12 |
| p-19-433 | d-16-17 | a-11-1 |
| p-19-434 | d-16-17 | a-11-2 |
| p-19-435 | d-16-17 | a-11-3 |
| p-19-436 | d-16-17 | a-11-4 |
| p-19-437 | d-16-17 | a-11-5 |
| p-19-438 | d-16-17 | a-11-6 |
| p-19-439 | d-16-17 | a-11-7 |
| p-19-440 | d-16-17 | a-11-8 |
| p-19-441 | d-16-17 | a-11-9 |
| p-19-442 | d-16-17 | a-11-10 |
| p-19-443 | d-16-17 | a-11-11 |
| p-19-444 | d-16-17 | a-11-12 |

TABLE 39

| No. | D | A |
|---|---|---|
| p-20-1 | d-12-1 | a-12-1 |
| p-20-2 | d-12-4 | a-12-2 |
| p-20-3 | d-12-4 | a-12-3 |
| p-20-4 | d-12-4 | a-12-4 |
| p-20-5 | d-12-4 | a-12-5 |
| p-20-6 | d-12-4 | a-12-6 |
| p-20-7 | d-12-4 | a-12-7 |
| p-20-8 | d-12-4 | a-12-8 |
| p-20-9 | d-12-4 | a-12-9 |
| p-20-10 | d-12-4 | a-12-10 |
| p-20-11 | d-12-4 | a-12-11 |
| p-20-12 | d-12-4 | a-12-12 |
| p-20-13 | d-12-4 | a-12-13 |
| p-20-14 | d-12-4 | a-12-14 |
| p-20-15 | d-12-4 | a-13-1 |
| p-20-16 | d-12-4 | a-13-2 |
| p-20-17 | d-12-4 | a-13-3 |
| p-20-18 | d-12-4 | a-13-4 |
| p-20-19 | d-12-4 | a-13-5 |
| p-20-20 | d-12-4 | a-13-6 |
| p-20-21 | d-12-4 | a-13-7 |
| p-20-22 | d-12-4 | a-13-8 |
| p-20-23 | d-12-4 | a-13-9 |
| p-20-24 | d-16-17 | a-12-2 |
| p-20-25 | d-16-17 | a-12-3 |
| p-20-26 | d-16-17 | a-12-4 |
| p-20-27 | d-16-17 | a-12-5 |
| p-20-28 | d-16-17 | a-12-6 |
| p-20-29 | d-16-17 | a-12-7 |
| p-20-30 | d-16-17 | a-12-8 |
| p-20-31 | d-16-17 | a-12-9 |
| p-20-32 | d-16-17 | a-12-10 |
| p-20-33 | d-16-17 | a-12-11 |
| p-20-34 | d-16-17 | a-12-12 |
| p-20-35 | d-16-17 | a-12-13 |
| p-20-36 | d-16-17 | a-12-14 |
| p-20-37 | d-16-17 | a-13-1 |
| P-20-38 | d-16-17 | a-13-2 |
| p-20-39 | d-16-17 | a-13-3 |
| p-20-40 | d-16-17 | a-13-4 |
| p-20-41 | d-16-17 | a-13-5 |
| p-20-42 | d-16-17 | a-13-6 |
| p-20-43 | d-16-17 | a-13-7 |
| p-20-44 | d-16-17 | a-13-8 |
| p-20-45 | d-16-17 | a-13-9 |
| p-20-46 | d-17-1 | a-8-2 |
| p-20-47 | d-17-1 | a-8-4 |
| p-20-48 | d-17-1 | a-10-1 |
| p-20-49 | d-17-1 | a-10-4 |
| p-20-50 | d-17-1 | a-10-5 |
| p-20-51 | d-17-1 | a-10-8 |
| p-20-52 | d-17-1 | a-10-9 |
| p-20-53 | d-17-2 | a-8-2 |
| p-20-54 | d-17-2 | a-8-4 |
| p-20-55 | d-17-2 | a-10-1 |
| p-20-56 | d-17-2 | a-10-4 |
| p-20-57 | d-17-2 | a-10-5 |
| p-20-58 | d-17-2 | a-10-8 |
| p-20-59 | d-17-2 | a-10-9 |
| p-20-60 | d-17-3 | a-12-2 |
| p-20-61 | d-17-3 | a-12-3 |
| p-20-62 | d-17-3 | a-12-4 |
| p-20-63 | d-17-3 | a-12-5 |
| p-20-64 | d-17-3 | a-12-6 |
| p-20-65 | d-17-3 | a-12-7 |
| p-20-66 | d-17-3 | a-12-8 |
| p-20-67 | d-17-3 | a-12-9 |
| p-20-68 | d-17-4 | a-12-2 |
| p-20-69 | d-17-4 | a-12-3 |
| p-20-70 | d-17-4 | a-12-4 |
| p-20-71 | d-17-4 | a-12-5 |
| p-20-72 | d-17-4 | a-12-6 |
| p-20-73 | d-17-4 | a-12-7 |
| p-20-74 | d-17-4 | a-12-8 |
| p-20-75 | d-17-4 | a-12-9 |
| p-20-76 | d-17-5 | a-12-2 |
| p-20-77 | d-17-5 | a-12-3 |
| p-20-78 | d-17-5 | a-12-4 |
| p-20-79 | d-17-5 | a-12-5 |
| p-20-80 | d-17-5 | a-12-6 |
| p-20-81 | d-17-5 | a-12-7 |
| p-20-82 | d-17-5 | a-12-8 |
| p-20-83 | d-17-5 | a-12-9 |

Second Embodiment of Specific Compound

A second embodiment of the specific compound is a compound represented by Formula (1A).

(1A)

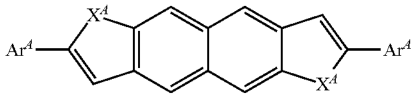

In Formula (1A), $X^A$ represents a sulfur atom or an oxygen atom.

A sulfur atom is preferable as $X^A$.

$Ar^A$ represents a group represented by any of Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1).

Among these, $Ar^A$ is preferably a group represented by any of Formula (4-1) to Formula (4-8), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), and more preferably the group represented by any of Formula (4-1) to Formula (4-8), Formula (6-1) and Formula (6-2), and Formula (9-1) to Formula (9-8).

(4-1)

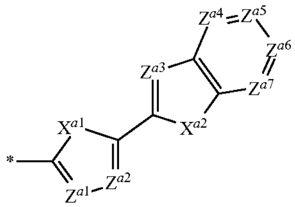

(4-2)

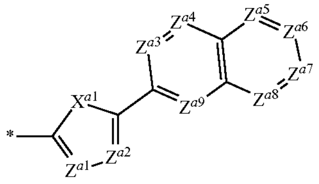

(4-3)

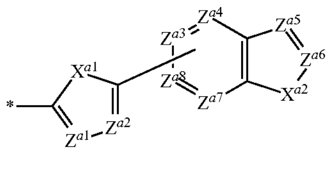

(4-4)

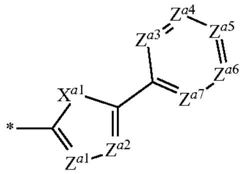

-continued (4-5)

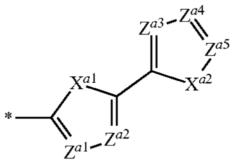

(4-6)

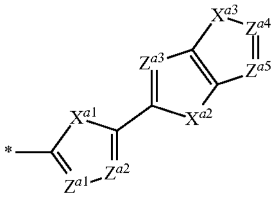

(4-7)

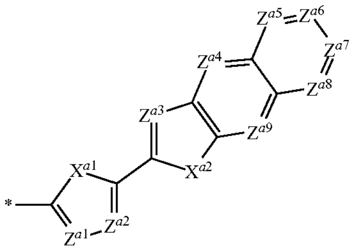

(4-8)

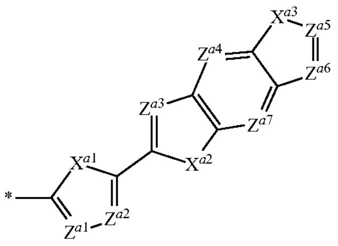

(5-1)

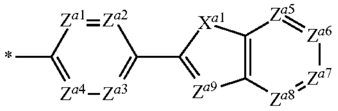

(5-2)

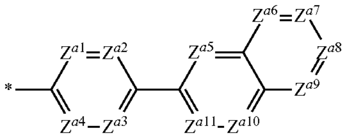

(5-3)

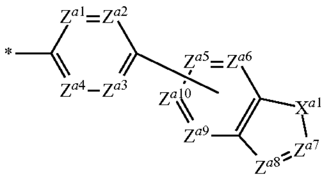

(5-4)

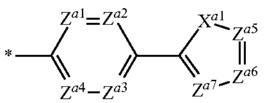

(5-5)

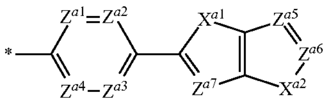

(5-6)

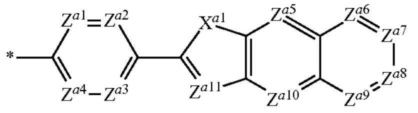

(5-7)

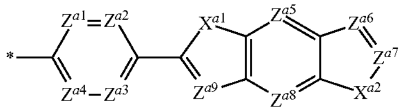

(6-1)

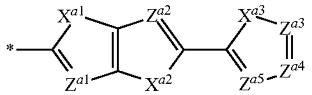

(6-2)

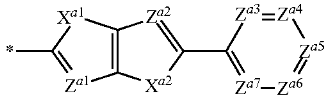

(7-1)

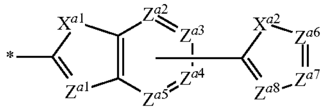

(7-2)

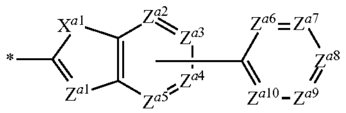

(8-1)

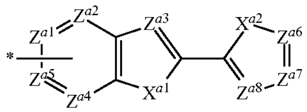

(8-2)

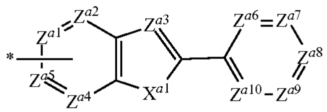

(9-1)

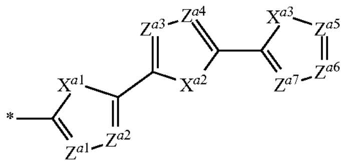

(9-2)

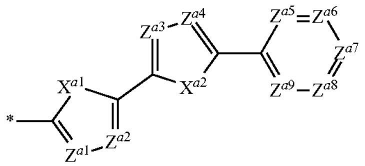

(9-3)

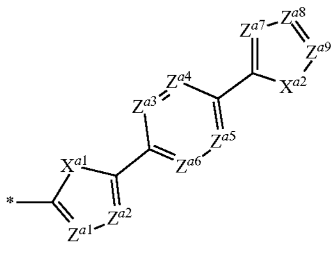

(9-4)

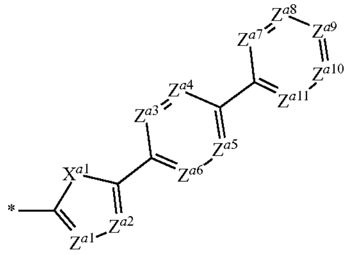

(9-5)

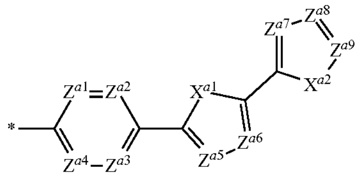

(9-6)

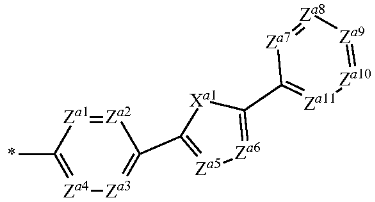

(9-7)

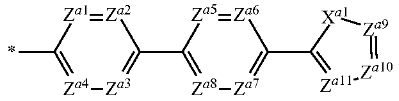

(9-8)

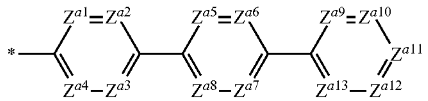

(10-1)

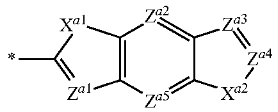

(10-2)

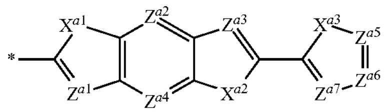

(10-3)

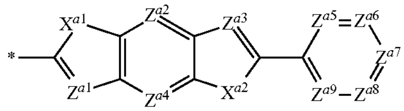

(11-1)

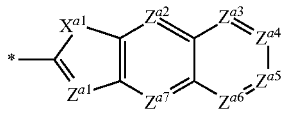

In Formula (4-1), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a8}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

In Formula (4-2), $X^{a1}$ represents a sulfur atom or an oxygen atom.

$X^{a1}$ preferably represents a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (4-3), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a5}$ each independently represent —CH═, —CF═, or —N═. Here, at least one of $Z^{a1}$ to $Z^{a8}$ is —CF═ or —N═.

Among these, it is preferable that one to three of $Z^{a1}$ to $Z^{a5}$ are —CF═ or —N═, and one or two of $Z^{a1}$ to $Z^{a8}$ are —CF═ or —N═.

In Formula (4-4), $X^{a1}$ represents a sulfur atom or an oxygen atom.

$X^{a1}$ preferably represents a sulfur atom.

$Z^{a1}$ to $Z^{a7}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

In Formula (4-5), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a5}$ each independently represent —CH═, —CF═, or —N═. Here, at least one of $Z^{a1}$ to $Z^{a5}$ is —CF═ or —N═.

Among these, it is preferable that one to three of $Z^{a1}$ to $Z^{a5}$ are —CF═ or —N═, and one or two of $Z^{a1}$ to $Z^{a5}$ are —CF═ or —N═.

In Formula (4-6), $X^{a1}$ to $X^{a3}$ each independently represent a sulfur atom or an oxygen atom.

$X^{a1}$ to $X^{a3}$ preferably represent groups having the same structure, and more preferably represent a sulfur atom.

$Z^{a1}$ to $Z^{a5}$ each independently represent —CH═, —CF═, or —N═. Here, at least one of $Z^{a1}$ to $Z^{a5}$ is —CF═ or —N═.

Among these, it is preferable that one to three of $Z^{a1}$ to $Z^{a5}$ are —CF═ or —N═, and one or two of $Z^{a1}$ to $Z^{a5}$ are —CF═ or —N═.

In Formula (4-7), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (4-8), $X^{a1}$ to $X^{a3}$ each independently represent a sulfur atom or an oxygen atom.

$X^{a1}$ to $X^{a3}$ preferably represent groups having the same structure, and more preferably represent a sulfur atom.

$Z^{a1}$ to $Z^{a7}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

In Formula (5-1), $X^{a1}$ represents a sulfur atom or an oxygen atom.

$X^{a1}$ preferably represents a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (5-2), $Z^{a1}$ to $Z^{a11}$ each independently represent —CH═, —CF═, or —N═. Here, at least one of $Z^{a1}$ to $Z^{a11}$ is —CF═ or —N═.

Among these, it is preferable that one to three of $Z^{a1}$ to $Z^{a11}$ are —CF═ or —N═, and one or two of $Z^{a1}$ to $Z^{a11}$ are —CF═ or —N═.

In Formula (5-3), $X^{a1}$ represents a sulfur atom or an oxygen atom.

$X^{a1}$ preferably represents a sulfur atom.

$Z^{a1}$ to $Z^{a10}$ each independently represent —CH═, —CF═, or —N═. Here, at least one of $Z^{a1}$ to $Z^{a10}$ is —CF═ or —N═.

Among these, it is preferable that one to three of $Z^{a1}$ to $Z^{a10}$ are —CF═ or —N═, and one or two of $Z^{a1}$ to $Z^{a10}$ are —CF═ or —N═.

In Formula (5-4), $X^{a1}$ represents a sulfur atom or an oxygen atom.

A sulfur atom is preferable as $X^{a1}$.

$Z^{a1}$ to $Z^{a7}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

In Formula (5-5), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a7}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

In Formula (5-6), $X^{a1}$ represents a sulfur atom or an oxygen atom.

$X^{a1}$ preferably represents a sulfur atom.

$Z^{a1}$ to $Z^{a11}$ each independently represent —CH═, —CF═, or —N═. Here, at least one of $Z^{a1}$ to $Z^{a11}$ is —CF═ or —N═.

Among these, it is preferable that one to three of $Z^{a1}$ to $Z^{a11}$ are —CF═ or —N═, and one or two of $Z^{a1}$ to $Z^{a11}$ are —CF═ or —N═.

In Formula (5-7), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (6-1), $X^{a1}$ to $X^{a3}$ each independently represent a sulfur atom or an oxygen atom.

$X^{a1}$ to $X^{a3}$ preferably represent groups having the same structure, and more preferably represent a sulfur atom.

$Z^{a1}$ to $Z^{a5}$ each independently represent —CH═, —CF═, or —N═. Here, at least one of $Z^{a1}$ to $Z^{a5}$ is —CF═ or —N═.

Among these, it is preferable that one to three of $Z^{a1}$ to $Z^{a5}$ are —CF═ or —N═, and one or two of $Z^{a1}$ to $Z^{a5}$ are —CF═ or —N═.

In Formula (6-2), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a7}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

In Formula (7-1), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a5}$ each independently represent —CH═, —CF═, or —N═. Here, at least one of $Z^{a1}$ to $Z^{a5}$ is —CF═ or —N═.

Among these, it is preferable that one to three of $Z^{a1}$ to $Z^{a8}$ are —CF═ or —N═, and one or two of $Z^{a1}$ to $Z^{a5}$ are —CF═ or —N═.

In Formula (7-2), $X^{a1}$ represents a sulfur atom or an oxygen atom.

$X^{a1}$ preferably represents a sulfur atom.

$Z^{a1}$ to $Z^{a10}$ each independently represent —CH═, —CF═, or —N═. Here, at least one of $Z^{a1}$ to $Z^{a10}$ is —CF═ or —N═.

Among these, it is preferable that one to three of $Z^{a1}$ to $Z^{a10}$ are —CF═ or —N═, and one or two of $Z^{a1}$ to $Z^{a10}$ are —CF═ or —N═.

In Formula (8-1), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a5}$ each independently represent —CH═, —CF═, or —N═. Here, at least one of $Z^{a1}$ to $Z^{a8}$ is —CF═ or —N═.

Among these, it is preferable that one to three of $Z^{a1}$ to $Z^{a8}$ are —CF═ or —N═, and one or two of $Z^{a1}$ to $Z^{a8}$ are —CF═ or —N═.

In Formula (8-2), $X^{a1}$ represents a sulfur atom or an oxygen atom.

$X^{a1}$ preferably represents a sulfur atom.

$Z^{a1}$ to $Z^{a10}$ each independently represent —CH═, —CF═, or —N═. Here, at least one of $Z^{a1}$ to $Z^{a10}$ is —CF═ or —N═.

Among these, it is preferable that one to three of $Z^{a1}$ to $Z^{a10}$ are —CF═ or —N═, and one or two of $Z^{a1}$ to $Z^{a10}$ are —CF═ or —N═.

In Formula (9-1), $X^{a1}$ to $X^{a3}$ each independently represent a sulfur atom or an oxygen atom.

$X^{a1}$ to $X^{a3}$ preferably represent groups having the same structure, and more preferably represent a sulfur atom.

$Z^{a1}$ to $Z^{a8}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

In Formula (9-2), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (9-3), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (9-4), $X^{a1}$ represents a sulfur atom or an oxygen atom.

$X^{a1}$ preferably represents a sulfur atom.

$Z^{a1}$ to $Z^{a1}$n each independently represent —CH═, —CF═, or —N═. Here, at least one of $Z^{a1}$ to $Z^{a11}$ is —CF═ or —N═.

Among these, it is preferable that one to three of $Z^{a1}$ to $Z^{a11}$ are —CF═ or —N═, and one or two of $Z^{a1}$ to $Z^{a11}$ are —CF═ or —N═.

In Formula (9-5), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (9-6), $X^{a1}$ represents a sulfur atom or an oxygen atom.

$X^{a1}$ preferably represents a sulfur atom.

$Z^{a1}$ to $Z^{a11}$ each independently represent —CH═, —CF═, or —N═. Here, at least one of $Z^{a1}$ to $Z^{a11}$ is —CF═ or —N═.

Among these, it is preferable that one to three of $Z^{a1}$ to $Z^{a11}$ are —CF═ or —N═, and one or two of $Z^{a1}$ to $Z^{a11}$ are —CF═ or —N═.

In Formula (9-7), $X^{a1}$ represents a sulfur atom or an oxygen atom.

$X^{a1}$ preferably represents a sulfur atom.

$Z^{a1}$ to $Z^{a11}$ each independently represent —CH═, —CF═, or —N═. Here, at least one of $Z^{a1}$ to $Z^{a11}$ is —CF═ or —N═.

Among these, it is preferable that one to three of $Z^{a1}$ to $Z^{a11}$ are —CF═ or —N═, and one or two of $Z^{a1}$ to $Z^{a11}$ are —CF═ or —N═.

In Formula (9-8), $Z^{a1}$ to $Z^{a11}$ each independently represent —CH═, —CF═, or —N═. Here, at least one of $Z^{a1}$ to $Z^{a13}$ is —CF═ or —N═.

Among these, it is preferable that one to three of $Z^{a1}$ to $Z^{a13}$ are —CF═ or —N═, and one or two of $Z^{a1}$ to $Z^{a13}$ are —CF═ or —N═.

In Formula (10-1), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a5}$ each independently represent —CH═, —CF═, or —N═. Here, at least one of $Z^{a1}$ to $Z^{a5}$ is —CF═ or —N═.

Among these, it is preferable that one to three of $Z^{a1}$ to $Z^{a5}$ are —CF═ or —N═, and one or two of $Z^{a1}$ to $Z^{a5}$ are —CF═ or —N═.

In Formula (10-2), $X^{a1}$ to $X^{a3}$ each independently represent a sulfur atom or an oxygen atom.

$X^{a1}$ to $X^{a3}$ preferably represent groups having the same structure, and more preferably represent a sulfur atom.

$Z^{a1}$ to $Z^{a7}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a8}$ are —CF═ or —N═, and one or two of $Z^{a1}$ to $Z^{a7}$ are —CF═ or —N═.

In Formula (10-3), $X^{a1}$ and $X^{a2}$ each independently represent a sulfur atom or an oxygen atom.

$X^{a1}$ and $X^{a2}$ preferably represent groups having the same structure, and more preferably represent a sulfur atom.

$Z^{a1}$ to $Z^{a9}$ each independently represent —CH═, —CF═, or —N═. Here, at least one of $Z^{a1}$ to $Z^{a9}$ is —CF═ or —N═.

Among these, it is preferable that one to three of $Z^{a1}$ to $Z^{a9}$ are —CF═ or —N═, and one or two of $Z^{a1}$ to $Z^{a9}$ are —CF═ or —N═.

In Formula (11-1), $X^{a1}$ represents a sulfur atom or an oxygen atom.

$X^{a1}$ preferably represents a sulfur atom.

$Z^{a1}$ to $Z^{a7}$ each independently represent —CH═, —CF═, or —N═. Here, at least one of $Z^{a1}$ to $Z^{a7}$ is —CF═ or —N═.

Among these, it is preferable that one to three of $Z^{a1}$ to $Z^{a7}$ are —CF═ or —N═, and one or two of $Z^{a1}$ to $Z^{a7}$ are —CF═ or —N═.

Here, two $X^A$'s present in Formula (1A) are each a group having the same structure, and two $Ar^A$'s present in Formula (1A) are each a group having the same structure.

"Two $X^A$'s present and two $Ar^A$'s present are groups having the same structure" means that the left $X^A$ and the right $X^A$ in Formula (1A) represent groups having the same structure, and the left $Ar^A$ and the right $Ar^A$ in Formula (1A) represent groups having the same structure. For example, in a case where $X^A$ represents a sulfur atom and $Ar^A$ represents Formula (4-1) described below, the compound represented by Formula (1A) is a compound below.

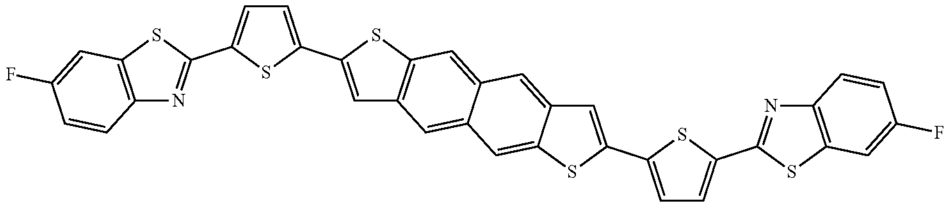 [SMILES: Fc1ccc2nc(-c3ccc(-c4cc5cc6cc7sc(-c8ccc(-c9nc%10ccc(F)cc%10s9)s8)cc7cc6cc5s4)s3)sc2c1]

Examples of the compound represented by the formula (1A) include compounds corresponding to the compound represented by Formula (1A) among the compounds exemplified in the first embodiment of the specific compound described above.

The molecular weight of the specific compound (the first embodiment or the second embodiment) is not particularly limited, and is preferably 400 to 1200, and more preferably 400 to 900. In a case where the molecular weight is 1200 or less, a vapor deposition temperature is not increased, and the compound is not easily decomposed. In a case where the molecular weight is 400 or more, a glass transition point of a vapor deposition film is not lowered, and the heat resistance of the photoelectric conversion element is improved.

The specific compound (the first embodiment or the second embodiment) is particularly useful as a material of the photoelectric conversion film used for the imaging element, the optical sensor, or the photoelectric cell. The specific compound can also be used as a coloring material, a liquid crystal material, an organic semiconductor material, a charge transport material, a pharmaceutical material, and a fluorescent diagnostic material.

The specific compound (the first embodiment or the second embodiment) is preferably a compound in which an ionization potential in a single film is −5.0 to −6.0 eV from the viewpoints of matching of energy levels between the compound and the n-type semiconductor material described later.

The maximum absorption wavelength of the specific compound (the first embodiment or the second embodiment) is not particularly limited and is, for example, preferably within a range of 350 to 550 nm and more preferably within a range of 400 to 550 nm.

The maximum absorption wavelength is a value measured in a solution state (solvent: chloroform) by an absorption spectrum of the specific compound being adjusted to a concentration having an absorbance of about 0.5 to 1.

The maximum absorption wavelength of the photoelectric conversion film is not particularly limited and is, for example, preferably within a range of 300 to 700 nm and more preferably within a range of 400 to 700 nm.

From the viewpoint of the responsiveness of the photoelectric conversion element, a content of the specific compound (the first embodiment or the second embodiment) in the photoelectric conversion film (=(film thickness of specific compound in terms of single layer/film thickness of photoelectric conversion film)×100) is preferably 15% to 75% by volume, more preferably 20% to 60% by volume, and still more preferably 25% to 40% by volume.

The specific compound (the first embodiment or the second embodiment) may be used alone or two or more thereof may be used in combination.

<Coloring Agent>

The photoelectric conversion film contains a coloring agent as another component in addition to the specific compound described above.

The coloring agent is preferably an organic coloring agent.

Examples of the coloring agent include a cyanine coloring agent, a styryl coloring agent, a hemicyanine coloring agent, a merocyanine coloring agent (including zeromethine merocyanine (simple merocyanine)), a rhodacyanine coloring agent, an allopolar coloring agent, an oxonol coloring agent, a hemioxonol coloring agent, a squarylium coloring agent, a croconium coloring agent, an azamethine coloring agent, a coumarin coloring agent, an arylidene coloring agent, an anthraquinone coloring agent, a triphenylmethane coloring agent, an azo coloring agent, an azomethine coloring agent, a metallocene coloring agent, a fluorenone coloring agent, a flugide coloring agent, a perylene coloring agent, a phenazine coloring agent, a phenothiazine coloring agent, a quinone coloring agent, a diphenylmethane coloring agent, a polyene coloring agent, an acridine coloring agent, an acridinone coloring agent, a quinoxaline coloring agent, a diphenylamine coloring agent, a quinophthalone coloring agent, a phenoxazine coloring agent, a phthaloperylene coloring agent, a dioxane coloring agent, a porphyrin coloring agent, a chlorophyll coloring agent, a phthalocyanine coloring agent, a subphthalocyanine coloring agent, a metal complex coloring agent, compounds disclosed in paragraphs [0083] to [0089] of JP2014-82483A, compounds disclosed in paragraphs [0029] to [0033] of JP2009-167348A, compounds disclosed in paragraphs [0197] to [0227] of JP2012-77064A, compounds disclosed in paragraphs [0035] to [0038] of WO2018-105269A, compounds disclosed in paragraphs [0041] to [0043] of WO2018-186389A, compounds disclosed in paragraphs [0059] to [0062] of WO2018-186397A, compounds disclosed in paragraphs [0078] to [0083] of WO2019-009249A, compounds disclosed in paragraphs [0054] to [0056] of WO2019-049946A, compounds disclosed in paragraphs [0059] to [0063] of WO2019-054327A, compounds disclosed in paragraphs [0086] to [0087] of WO2019-098161A, and compounds disclosed in paragraphs [0085] to [0114] of WO2020-013246A.

A content of the coloring agent with respect to the total content of the specific compound and the coloring agent in the photoelectric conversion film (=(film thickness of coloring agent in terms of single layer/(film thickness of specific compound in terms of single layer+film thickness of coloring agent in terms of single layer)×100) is preferably 15% to 75% by volume, more preferably 20% to 60% by volume, and still more preferably 25% to 50% by volume.

The coloring agent may be used alone, or two or more thereof may be used in combination.

<n-type Semiconductor Material>

The photoelectric conversion film preferably further includes the n-type semiconductor material as another component in addition to the specific compound and coloring agent described above.

The n-type semiconductor material is an acceptor-property organic semiconductor material (a compound), and refers to an organic compound having a property of easily accepting an electron.

More specifically, the n-type semiconductor material is preferably an organic compound having a higher electron affinity than that of the specific compound in a case where the n-type semiconductor material is used by being brought in contact with the above-described specific compound.

In the present specification, a value (value multiplied by −1) of a reciprocal number of the LUMO value obtained by the calculation of B3LYP/6-31G (d) using Gaussian '09 (software manufactured by Gaussian, Inc.) as a value of the electron affinity.

In addition, the n-type semiconductor material is preferably an organic compound having a higher electron affinity than the coloring agent in a case where the n-type semiconductor material is used by being brought in contact with the above-described coloring agent.

The electron affinity of the n-type semiconductor material is preferably 3.0 to 5.0 eV.

Examples of the n-type semiconductor material include fullerenes selected from the group consisting of a fullerene and derivatives thereof, fused aromatic carbocyclic compounds (for example, a naphthalene derivative, an anthracene derivative, a phenanthrene derivative, a tetracene derivative, a pyrene derivative, a perylene derivative, and a fluoranthene derivative); a heterocyclic compound having a 5- to 7-membered ring having at least one of a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, and thiazole); polyarylene compounds; fluorene compounds; cyclopentadiene compounds; silyl compounds; 1,4,5,8-naphthalenetetracarboxylic acid anhydride; 1,4,5,8-naphthalenetetracarboxylic acid anhydride imide derivative; oxadiazole derivative; anthraquinodimethane derivatives; diphenylquinone derivatives; bathocuproine, bathophenanthroline, and derivatives thereof; triazole compounds; a distyrylarylene derivative; a metal complex having a nitrogen-containing heterocyclic compound as a ligand; a silole compound; and compounds disclosed in paragraphs [0056] to [0057] of JP2006-100767A.

Among these, it is preferable that examples of the n-type semiconductor material include fullerenes selected from the group consisting of a fullerene and derivatives thereof.

Examples of the fullerenes include a fullerene $C_{60}$, a fullerene $C_{70}$, a fullerene $C_{76}$, a fullerene $C_{78}$, a fullerene $C_{80}$, a fullerene $C_{82}$, a fullerene $C_{84}$, a fullerene $C_{90}$, a fullerene $C_{96}$, a fullerene $C_{240}$, a fullerene $C_{540}$, and a mixed fullerene.

Examples of the fullerene derivatives include compounds in which a substituent is added to the above fullerenes. The substituent is preferably an alkyl group, an aryl group, or a heterocyclic group. The fullerene derivative is preferably compounds described in JP2007-123707A.

In a case where the photoelectric conversion film includes the n-type semiconductor material, a content of the n-type semiconductor material with respect to the total content of the specific compound, the coloring agent, and the n-type semiconductor material (=(film thicknesses of n-type semiconductor material in terms of single layer/(film thickness of specific compound in terms of single layer+film thicknesses of coloring agent in terms of single layer+film thickness of n-type semiconductor material in terms of single layer)×100) is preferably 15% to 75% by volume, more preferably 20% to 60% by volume, and still more preferably 25% to 50% by volume.

In addition, it is also preferable that the photoelectric conversion film contains each component in the following content.

Contents of components with respect to the total content of the specific compound, the coloring agent, and the n-type semiconductor material (=(film thickness of each component in terms of single layer/(film thickness of specific compound in terms of single layer+film thickness of coloring agent in terms of single layer+film thickness of n-type semiconductor material in terms of single layer)×100) are preferably respectively a content of the specific compound of 30% to 50% by volume, a content of the coloring agent of 30% to 50% by volume, and a content of the n-type semiconductor material of preferably 10% to 40% by volume, and more preferably respectively a content of the specific compound of 30% to 40% by volume, a content of the coloring agent of 30% to 40% by volume, and a content of the n-type semiconductor material of 20% to 35% by volume.

The n-type semiconductor material may be used alone, or two or more thereof may be used in combination.

In addition, in a case where the n-type semiconductor material includes fullerenes, a content of the fullerenes to a total content of the n-type semiconductor material (=(film thickness of fullerenes in terms of single layer/total film thickness of n-type semiconductor materials in terms of single layer)×100) is preferably 50% to 100% by volume, and more preferably 80% to 100% by volume.

The fullerenes may be used alone, or two or more thereof may be used in combination.

The molecular weight of the n-type semiconductor material is preferably 200 to 1200, and more preferably 200 to 1000.

The photoelectric conversion film is substantially preferably composed of the specific compound, the coloring agent, and the n-type semiconductor material. "The photoelectric conversion film is substantially composed of only the specific compound, the coloring agent, and the n-type semiconductor material" is "the total content of the specific compound, the coloring agent, and the n-type semiconductor material with respect to the total mass of the photoelectric conversion film is 95% by mass or more".

The photoelectric conversion film is preferably a mixture layer formed in a state where the specific compound and the coloring agent are mixed.

In addition, in a case where the photoelectric conversion film contains an n-type semiconductor material, the photoelectric conversion film is preferably a mixture layer formed in a state where the specific compound, the coloring agent, and the n-type semiconductor material are mixed.

The mixture layer is a layer in which two or more materials are mixed in a single layer.

The photoelectric conversion film containing the specific compound is a non-light emitting film, and has a feature different from organic light emitting diodes (OLEDs). The non-light emitting film means a film having a light emission quantum efficiency of 1% or less, and the light emission quantum efficiency is preferably 0.5% or less, and more preferably 0.1% or less.

<Film Formation Method>

The photoelectric conversion film can be formed mostly by a dry film formation method. Examples of the dry film formation method include a physical vapor deposition method such as a vapor deposition method (in particular, a vacuum vapor deposition method), a sputtering method, and an ion plating method, a molecular beam epitaxy (MBE) method, and a chemical vapor deposition (CVD) method such as plasma polymerization. Among these, the vacuum vapor deposition method is preferable. In a case where the photoelectric conversion film is formed by the vacuum vapor deposition method, manufacturing conditions such as a degree of vacuum and a vapor deposition temperature can be set according to the normal method.

The thickness of the photoelectric conversion film is preferably 10 to 1000 nm, more preferably 50 to 800 nm, still more preferably 50 to 500 nm, and particularly preferably 50 to 400 nm.

<Electrode>

Electrodes (the upper electrode (the transparent conductive film) 15 and the lower electrode (the conductive film) 11) are formed of conductive materials. Examples of the conductive material include metals, alloys, metal oxides, electrically conductive compounds, and mixtures thereof.

Since light is incident through the upper electrode 15, the upper electrode 15 is preferably transparent to light to be detected. Examples of the materials constituting the upper electrode 15 include conductive metal oxides such as tin oxide (antimony tin oxide (ATO), fluorine doped tin oxide (FTO)) doped with antimony, fluorine, or the like, tin oxide, zinc oxide, indium oxide, indium tin oxide (ITO), and indium zinc oxide (IZO); metal thin films such as gold, silver, chromium, and nickel; mixtures or laminates of these metals and the conductive metal oxides; and organic conductive materials such as polyaniline, polythiophene, and polypyrrole. Among these, conductive metal oxides are preferable from the viewpoints of high conductivity, transparency, and the like.

In general, in a case where the conductive film is made to be thinner than a certain range, a resistance value is rapidly increased. However, in the solid-state imaging element into which the photoelectric conversion element according to the present embodiment is incorporated, the sheet resistance is, for example, 100 to 10000Ω/□, and a degree of freedom of a range of the film thickness that can be thinned is large. In addition, as the thickness of the upper electrode (the transparent conductive film) 15 is thinner, the amount of light that the upper electrode absorbs is smaller, and the light transmittance usually increases. The increase in the light transmittance causes an increase in light absorbance in the photoelectric conversion film and an increase in the photoelectric conversion ability, which is preferable.

Considering the suppression of leakage current, an increase in the resistance value of the thin film, and an increase in transmittance accompanied by the thinning, the film thickness of the upper electrode 15 is preferably 5 to 100 nm, and more preferably 5 to 20 nm.

There is a case where the lower electrode 11 has transparency or an opposite case where the lower electrode does not have transparency and reflects light, depending on the application. Examples of a material constituting the lower electrode 11 include conductive metal oxides such as tin oxide (ATO, FTO) doped with antimony, fluorine, or the like, tin oxide, zinc oxide, indium oxide, indium tin oxide (ITO), and indium zinc oxide (IZO); metals such as gold, silver, chromium, nickel, titanium, tungsten, and aluminum, conductive compounds (for example, titanium nitride (TiN)) such as oxides or nitrides of these metals; mixtures or laminates of these metals and conductive metal oxides; and organic conductive materials such as polyaniline, polythiophene, and polypyrrole.

The method of forming electrodes is not particularly limited, and can be appropriately selected in accordance with the electrode material. Specific examples thereof include a wet method such as a printing method and a coating method; a physical method such as a vacuum vapor deposition method, a sputtering method, and an ion plating method; and a chemical method such as a CVD method and a plasma CVD method.

In a case where the material of the electrode is ITO, examples thereof include an electron beam method, a sputtering method, a resistance heating vapor deposition method, a chemical reaction method (such as a sol-gel method), and a coating method with a dispersion of indium tin oxide.

<Charge Blocking Film: Electron Blocking Film and Positive Hole Blocking Film>

It is also preferable that the photoelectric conversion element according to the embodiment of the present invention has one or more interlayers between the conductive film and the transparent conductive film, in addition to the photoelectric conversion film. An example of the interlayer includes a charge blocking film. In a case where the photoelectric conversion element has this film, the characteristics (such as photoelectric conversion efficiency and responsiveness) of the obtained photoelectric conversion element are more excellent. Examples of the charge blocking film include an electron blocking film and a positive hole blocking film. Hereinafter, each of the films will be described in detail.

(Electron Blocking Film)

The electron blocking film is a donor organic semiconductor material (compound), and a p-type organic semiconductor described below can be used, for example. The p-type organic semiconductor may be used alone, or two or more thereof may be used in combination.

Examples of the p-type organic semiconductor include triarylamine compounds (for example, N,N'-bis (3-methylphenyl)-(1,1'-biphenyl)-4,4'-diamine (TPD), 4,4'-bis [N-(naphthyl)-N-Phenyl-amino] biphenyl (α-NPD), compounds disclosed in paragraphs [0128] to [0148] of JP2011-228614A, compounds disclosed in paragraphs [0052] to [0063] of JP2011-176259A, compounds disclosed in paragraphs [0119] to [0158] of JP2011-225544A, compounds disclosed in paragraphs [0044] to [0051] of JP2015-153910A, and compounds disclosed in paragraphs [0086] to [0090] of JP2012-94660A, pyrazoline compounds, styrylamine compounds, hydrazone compounds, polysilane compounds, thiophene compounds (for example, a thienothiophene derivative, a dibenzothiophene derivative, a benzodithiophene derivative, a dithienothiophene derivative, a [1] benzothieno [3,2-b] thiophene (BTBT) derivative, a thieno [3,2-f: 4,5-f] bis [1] benzothiophene (TBBT) derivative, compounds disclosed in paragraphs [0031] to [0036] of JP2018-14474A, compounds disclosed in paragraphs [0043] to [0045] of WO2016-194630A, compounds disclosed in paragraphs [0025] to [0037], and [0099] to [0109] of WO2017-159684A, compounds disclosed in paragraphs [0029] to [0034] of JP2017-076766A, compounds disclosed in paragraphs [0015] to [0025] of WO2018-207722A, compounds disclosed in paragraphs [0045] to [0053] of JP2019-54228A, compounds disclosed in paragraphs [0045] to [0055] of WO2019-058995A, compounds disclosed in paragraphs [0063] to [0089] of WO2019-081416A, compounds disclosed in paragraphs [0033] to [0036] of JP2019-80052A, compounds disclosed in paragraphs [0044] to [0054] of WO2019-054125A, compounds disclosed in paragraphs [0041] to [0046] of WO2019-093188A, and the like), a cyanine compound, an oxonol compound, a polyamine compound, an indole compound, a pyrrole compound, a pyrazole compound, a polyarylene compound, a fused aromatic carbocyclic compound (for example, a naphthalene derivative, an anthracene derivative, a phenanthrene derivative, a tetracene derivative, a pentacene derivative, a pyrene derivative, a perylene derivative, and a fluoranthene derivative), a porphyrin compound, a phthalocyanine compound, a triazole compound, an oxadiazole compound, an imidazole compound, a polyarylalkane compound, a pyrazolone compound, an amino-substituted chalcone compound, an oxazole compound, a fluorenone compound, a silazane compound, and a metal complex having nitrogen-containing heterocyclic compounds as ligands.

Examples of the p-type organic semiconductor include compounds having an ionization potential smaller than that of the n-type semiconductor material, and in a case where this condition is satisfied, the above-mentioned coloring agents can be used.

A polymer material can also be used as the electron blocking film.

Examples of the polymer material include a polymer such as phenylenevinylene, fluorene, carbazole, indole, pyrene, pyrrole, picoline, thiophene, acetylene, and diacetylene, and a derivative thereof.

The electron blocking film may be formed of a plurality of films.

The electron blocking film may be formed of an inorganic material. In general, since an inorganic material has a dielectric constant larger than that of an organic material, in a case where the inorganic material is used in the electron blocking film, a large voltage is applied to the photoelectric conversion film. Therefore, the photoelectric conversion efficiency increases. Examples of the inorganic material that can be used for the electron blocking film include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, and iridium oxide.

(Positive Hole Blocking Film)

A positive hole blocking film is an acceptor-property organic semiconductor material (compound), and the n-type semiconductor material and other materials described above can be used.

The method of manufacturing the charge blocking film is not particularly limited, and examples thereof include a dry film formation method and a wet film formation method. Examples of the dry film formation method include a vapor deposition method and a sputtering method. The vapor deposition method may be any of a physical vapor deposition (PVD) method and a chemical vapor deposition (CVD) method, and the physical vapor deposition method such as a vacuum vapor deposition method is preferable. Examples of the wet film formation method include an ink jet method, a spray method, a nozzle printing method, a spin coating method, a dip coating method, a casting method, a die coating method, a roll coating method, a bar coating method, and a gravure coating method, and an ink jet method is preferable from the viewpoint of high accuracy patterning.

Each thickness of the charge blocking films (the electron blocking film and the positive hole blocking film) is preferably 3 to 200 nm, more preferably 5 to 100 nm, and still more preferably 5 to 30 nm.

<Substrate>

The photoelectric conversion element may further include a substrate. Kinds of the substrate to be used are not particularly limited, and examples of the substrate include a semiconductor substrate, a glass substrate, and a plastic substrate.

A position of the substrate is not particularly limited, and in general, the conductive film, the photoelectric conversion film, and the transparent conductive film are laminated on the substrate in this order.

<Sealing Layer>

The photoelectric conversion element may further include a sealing layer. The performance of a photoelectric conversion material may deteriorate noticeably due to the presence of deterioration factors such as water molecules. The deterioration can be prevented by coating and sealing the entirety of the photoelectric conversion film with the sealing layer such as diamond-like carbon (DLC) or ceramics such as metal oxide, or metal nitride, and metal nitride oxide which are dense and into which water molecules do not permeate.

The material of the sealing layer may be selected and the sealing layer may be manufactured according to the description in paragraphs [0210] to [0215] of JP2011-082508A.

[Imaging Element and Optical Sensor]

An example of the application of the photoelectric conversion element includes an imaging element. The imaging element is an element that converts optical information of an image into an electric signal. In general, a plurality of the photoelectric conversion elements are arranged in a matrix on the same plane shape, and an optical signal is converted into an electric signal in each photoelectric conversion element (pixel) to sequentially output the electric signal to the outside of the imaging element for each pixel. Therefore, each pixel is formed of one or more photoelectric conversion elements and one or more transistors.

The imaging element is mounted on an imaging element such as a digital camera and a digital video camera, an electronic endoscope, and imaging modules such as a cellular phone.

The photoelectric conversion element according to the embodiment of the present invention is also preferably used for an optical sensor including the photoelectric conversion element according to the embodiment of the present invention. The photoelectric conversion element may be used alone as the optical sensor, and the photoelectric conversion element may be used as a line sensor in which the photoelectric conversion elements are linearly arranged or as a two-dimensional sensor in which the photoelectric conversion elements are arranged in a plane shape.

[Compound]

The present invention also relates to a compound.

In the above-described General Formula (1), the compound according to the embodiment of the present invention is identical to the above-described specific compound, except that D is a group represented by any of Formula (1-1) to Formula (1-9) and Formula (1-11) to Formula (1-15) described above, and preferred conditions and the like are also the same.

EXAMPLES

The present invention will be described in more detail based on Examples below. Materials, used amounts, ratios, treatment contents, treatment procedures, and the like described in the following Examples can be appropriately changed within the range that does not depart from the gist of the present invention. Therefore, the range of the present invention should not be limitatively interpreted by the following Examples.

[Compound (Compound for Evaluation)]

<Synthesis of Compound (D-1)>

A compound (D-1) was synthesized according to the following scheme.

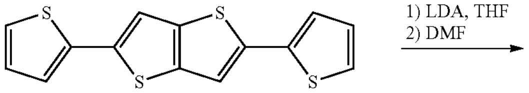

e1

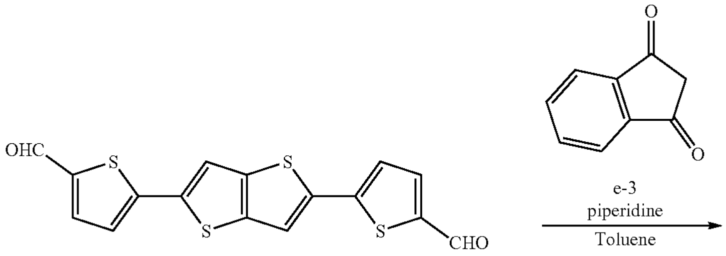

e-2

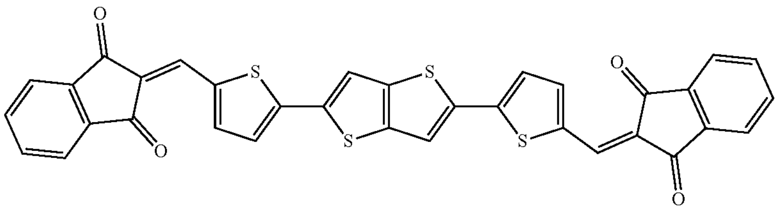

D-1

A compound e-1 (5 g, 16.42 mmol) was charged into a three-necked flask. 150 ml of tetrahydrofuran was added to the flask under a nitrogen atmosphere, and the mixture was stirred and cooled to −40° C. 2.1 equivalent of a solution of lithium diisopropylamide in tetrahydrofuran to the compound e-1 was added to the flask and stirred for 30 minutes, 1.05 equivalent of dimethylformamide was added dropwise to the flask, and stirred for 30 minutes, and thereafter, the mixture was stirred at room temperature for 1 hour.

A saturated ammonium chloride aqueous solution and chloroform were added, the mixture was separated and extracted, and an organic phase was dried with magnesium sulfate and then filtered. After filtration, the filtrate was concentrated. A residue thus obtained was purified by silica gel column chromatography to obtain a compound e-2 (4.44 g).

The compound e-2 (4 g) was charged into a three-necked flask. 120 ml of toluene was added to the flask under a nitrogen atmosphere and stirred, and 2.1 equivalent of a compound e-3 and 1.05 equivalent of piperidine were added thereto, and the mixture was heated at 100° C. and stirred for 8 hours. Thereafter, the temperature was lowered to 60° C., and then filtration was performed. A residue thus obtained was suspended and washed with chloroform and then filtered. A residue thus obtained was dried under reduced pressure and sublimated and purified to obtain a compound (D-1) (3.21 g).

<Synthesis of Compound (D-2)>

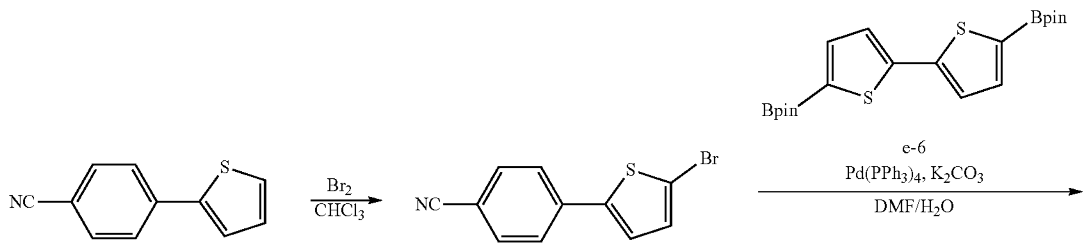

e-4 e-5

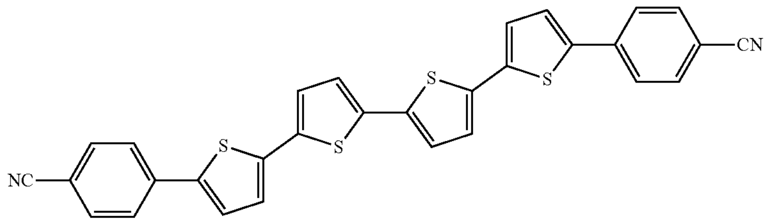

D-2

A compound e-4 (5 g, 26.99 mmol) was charged into a three-necked flask. 100 ml of chloroform was added to the flask under a nitrogen atmosphere, and the mixture was then stirred, and 1.1 equivalent of bromine was added dropwise under ice-cooling. The contents of the flask were stirred at room temperature for 1 hour, a saturated ammonium chloride aqueous solution and chloroform were added thereto, the mixture was separated and extracted, an organic phase was dried with magnesium sulfate and filtered, and the filtrate was then concentrated. A residue thus obtained was purified by silica gel column chromatography to obtain a compound e-5 (6.31 g).

The compound e-5 (6 g) was charged into a three-necked flask, 0.5 equivalent of the compound e-6, 3 equivalent of potassium carbonate, 90 ml of dimethylformamide, and 9 ml of water were added to the flask, and the mixture was stirred and then degassed under reduced pressure to be substituted with nitrogen. Thereafter, 0.05 equivalent of tetrakis(triphenylphosphine)palladium(0) was added to the flask, and the mixture was heated at 130° C. and stirred for 8 hours. Thereafter, the temperature was lowered to room temperature, and the mixture was filtered. A residue thus obtained was suspended and washed with chloroform and then filtered. A residue thus obtained was dried under reduced pressure and sublimated and purified to obtain a compound (D-2) (3.82 g).

The above-described compound D-1 and compound D-2 correspond to the specific compound.

Other specific compounds were also synthesized with reference to the above-described synthesis method.

A measurement result of each of the synthesized specific compounds by LDI-MS (laser desorption ionization mass analysis) was as follows.

| Compound | LDI-MS measurement result (m/z (M+)) |
|---|---|
| D-1 | 615.99 |
| D-2 | 532.02 |
| D-3 | 671.93 |
| D-4 | 566.04 |
| D-5 | 630.10 |
| D-6 | 450.03 |
| D-7 | 560.02 |
| D-8 | 671.97 |
| D-9 | 642.01 |
| D-10 | 506.00 |
| D-11 | 617.95 |
| D-12 | 701.89 |
| D-13 | 640.01 |
| D-14 | 574.08 |
| D-15 | 682.08 |
| D-16 | 515.97 |
| D-17 | 667.96 |
| D-18 | 572.00 |
| D-19 | 572.00 |
| D-20 | 530.06 |
| D-21 | 486.01 |
| D-22 | 520.11 |
| D-23 | 606.04 |
| D-24 | 565.92 |
| D-25 | 630.05 |
| D-26 | 641.97 |
| D-27 | 604.09 |
| D-28 | 561.98 |
| D-29 | 847.86 |
| D-30 | 747.86 |
| D-31 | 783.94 |
| D-32 | 791.88 |
| D-33 | 642.00 |
| D-34 | 777.98 |
| D-35 | 985.93 |
| D-36 | 753.95 |
| D-37 | 797.88 |
| D-38 | 725.92 |
| D-39 | 606.09 |
| D-40 | 728.00 |
| D-41 | 728.00 |
| D-42 | 835.94 |
| D-43 | 735.95 |
| D-44 | 835.94 |
| D-45 | 735.95 |
| D-46 | 772.06 |
| D-47 | 704.01 |
| D-48 | 783.97 |
| D-49 | 719.96 |
| D-50 | 872.05 |
| D-51 | 744.03 |
| D-52 | 621.95 |
| D-53 | 560.03 |
| D-54 | 571.94 |
| D-55 | 616.00 |
| D-56 | 619.96 |
| D-57 | 655.94 |
| D-58 | 633.87 |
| D-59 | 619.96 |
| D-60 | 558.04 |
| D-61 | 665.98 |
| D-62 | 562.02 |
| D-63 | 571.94 |
| D-64 | 669.98 |
| D-65 | 527.88 |
| D-66 | 682.00 |
| D-67 | 558.04 |
| D-68 | 597.98 |
| D-69 | 605.93 |
| D-70 | 599.97 |
| D-71 | 621.95 |
| D-72 | 619.96 |
| D-73 | 619.96 |
| D-74 | 655.94 |
| D-75 | 619.96 |
| D-76 | 633.87 |
| D-77 | 633.87 |
| D-78 | 669.85 |
| D-79 | 633.87 |
| D-80 | 667.86 |
| D-81 | 705.96 |
| D-82 | 707.95 |
| D-83 | 703.97 |
| D-84 | 705.96 |
| D-85 | 672.02 |
| D-86 | 674.01 |
| D-87 | 638.03 |
| D-88 | 674.01 |
| D-89 | 674.01 |
| D-90 | 703.97 |
| D-91 | 739.95 |
| D-92 | 703.97 |
| D-93 | 775.93 |
| D-94 | 705.96 |
| D-95 | 672.02 |
| D-96 | 708.00 |
| D-97 | 708.00 |
| D-98 | 672.02 |
| D-99 | 674.01 |
| D-100 | 705.96 |
| D-101 | 739.95 |
| D-102 | 658.07 |
| D-103 | 658.07 |
| D-104 | 671.97 |
| D-105 | 692.06 |
| D-106 | 703.97 |
| D-107 | 705.96 |
| D-108 | 592.03 |
| D-109 | 603.94 |

-continued

-continued

| Compound | LDI-MS measurement result (m/z (M+)) |
|---|---|
| D-110 | 605.93 |
| D-111 | 569.95 |
| D-112 | 751.86 |
| D-113 | 715.88 |
| D-114 | 717.87 |
| D-115 | 681.89 |
| D-116 | 692.06 |
| D-117 | 680.14 |
| D-118 | 692.06 |
| D-119 | 592.03 |
| D-120 | 703.97 |
| D-121 | 669.98 |
| D-122 | 715.88 |
| D-123 | 703.97 |
| D-124 | 703.97 |
| D-125 | 669.98 |
| D-126 | 692.06 |
| D-127 | 669.98 |
| D-128 | 692.06 |
| D-129 | 803.90 |
| D-130 | 769.90 |
| D-131 | 756.00 |
| D-132 | 756.00 |
| D-133 | 744.09 |
| D-134 | 756.00 |
| D-135 | 744.09 |
| D-136 | 744.09 |
| D-137 | 768.16 |

-continued

| Compound | LDI-MS measurement result (m/z (M+)) |
|---|---|
| D-138 | 651.94 |
| D-139 | 640.03 |
| D-140 | 526.08 |
| D-141 | 796.12 |
| D-142 | 764.16 |
| D-143 | 728.18 |
| D-144 | 760.13 |
| D-145 | 762.12 |
| D-146 | 796.12 |
| D-147 | 804.00 |
| D-148 | 772.05 |
| D-149 | 740.09 |
| D-150 | 708.14 |
| D-151 | 770.01 |
| D-152 | 808.03 |
| D-153 | 817.90 |
| D-154 | 839.98 |
| D-155 | 815.91 |
| D-156 | 791.98 |

Hereinbelow, the compounds (D-1) to (D-156) that are specific compounds, and the compounds (R-1) and (R-47) for comparison are illustrated.

Hereinafter, the specific compound and the Comparative compound are collectively referred to as a compound for evaluation.

D-1

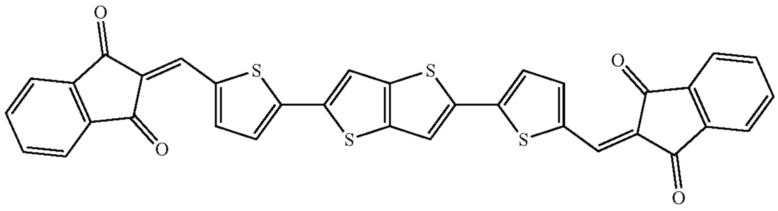

D-2

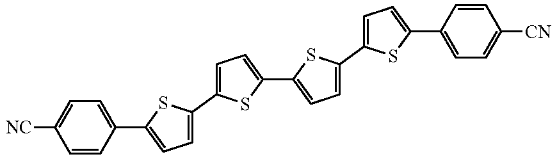

D-3

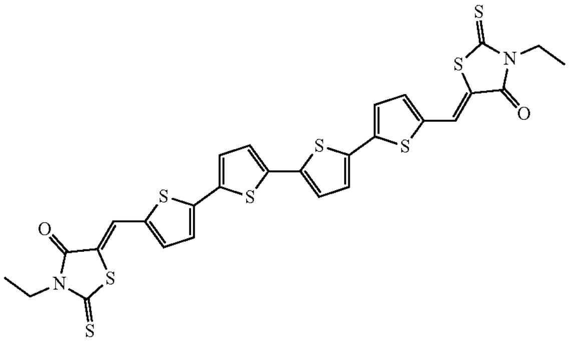

-continued
D-4
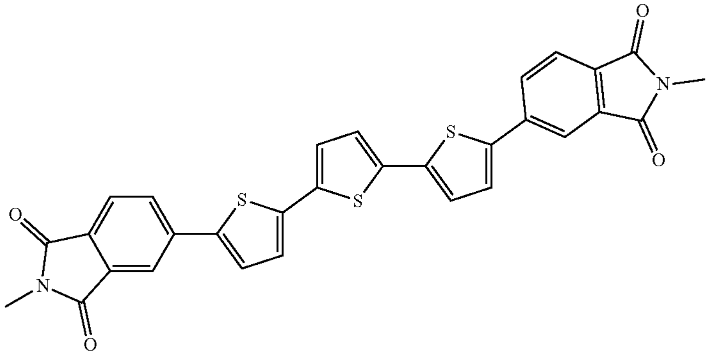
D-5
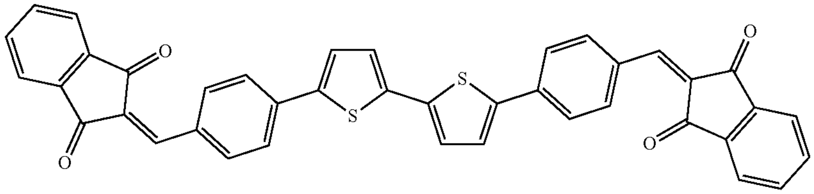
D-6
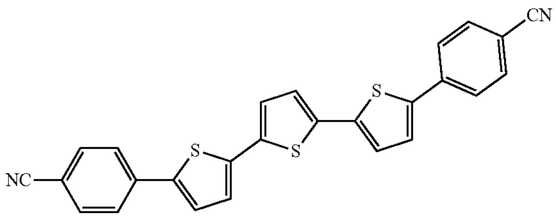
D-7
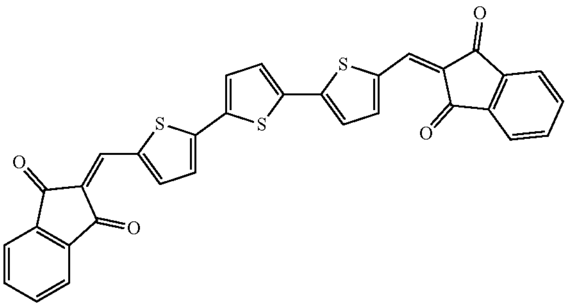
D-8
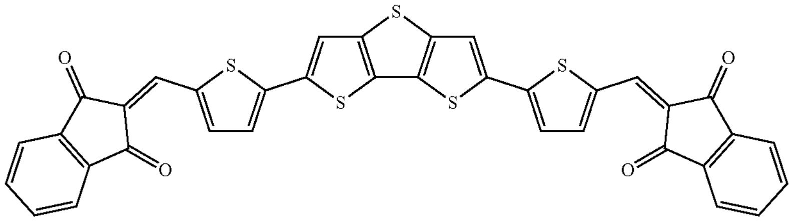
D-9
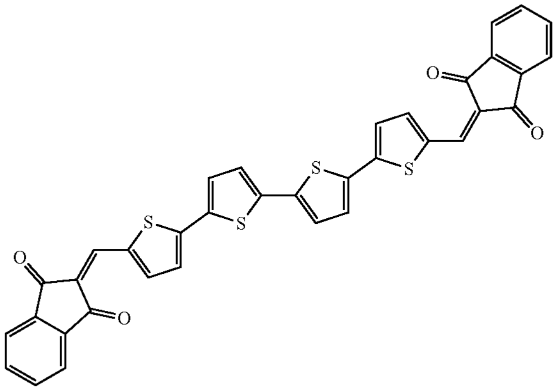
D-10
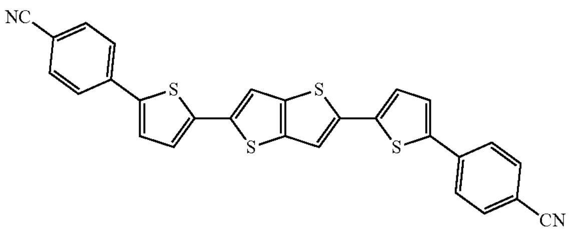
D-11
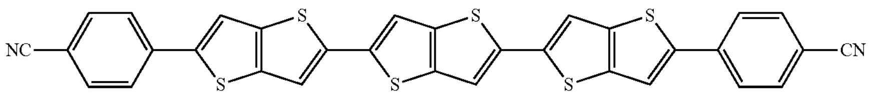

-continued
D-12
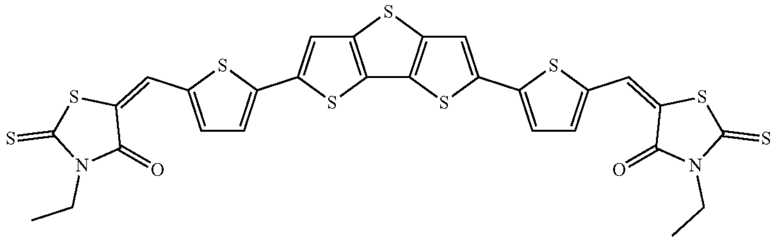
D-13
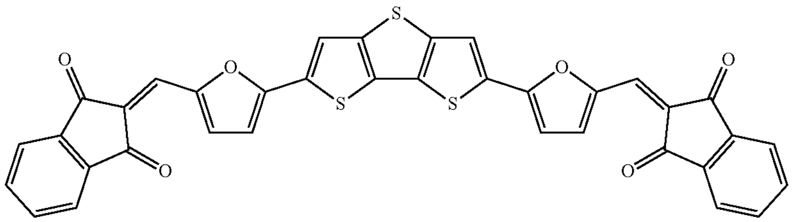
D-14
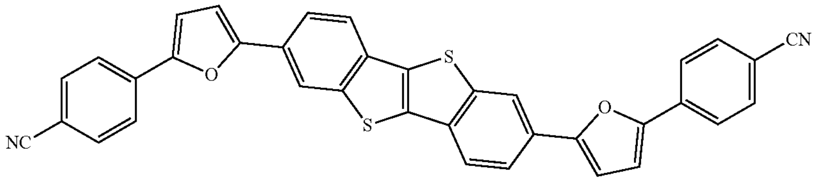
D-15
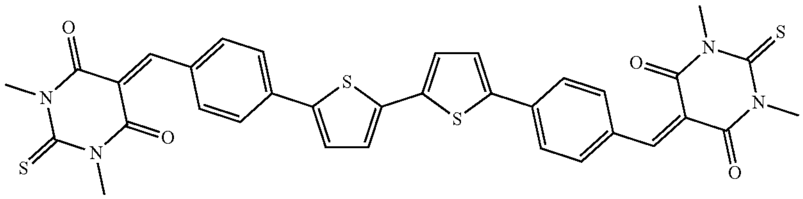
D-16
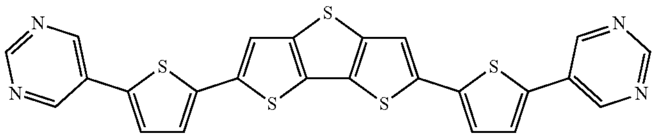
D-17
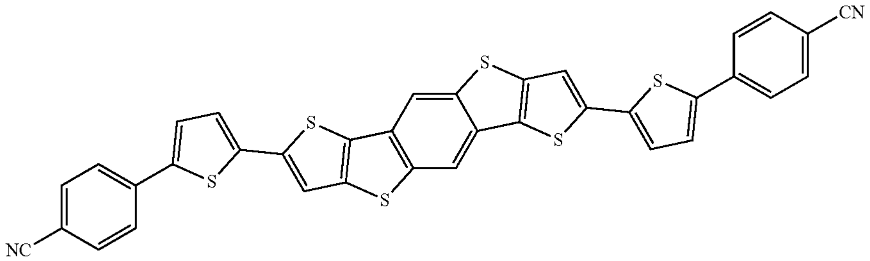
D-18
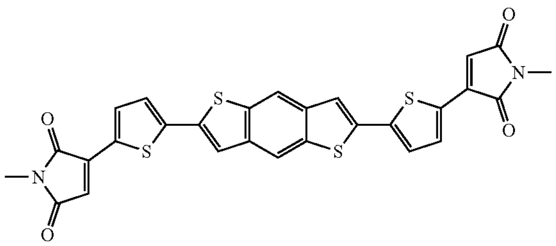
D-19
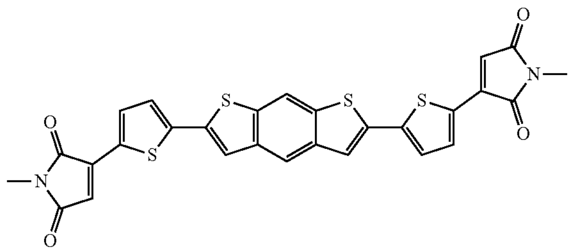

-continued
D-20
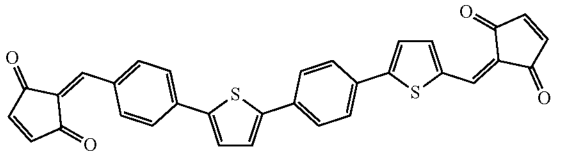
D-21
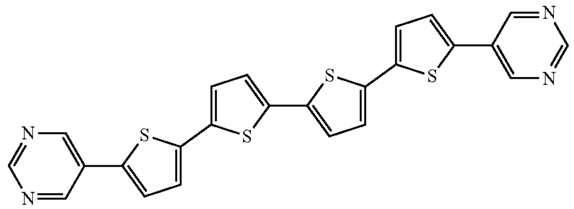
D-22
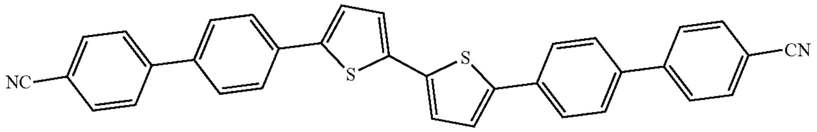
D-23
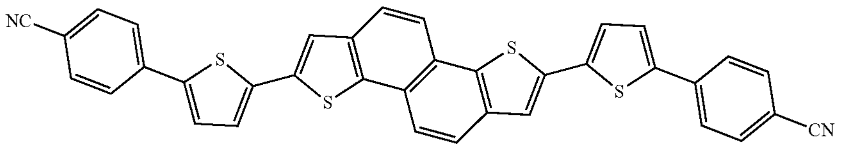
D-24
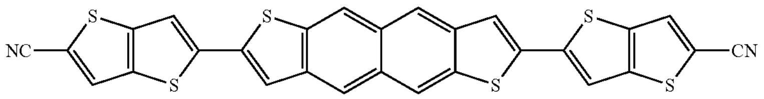
D-25
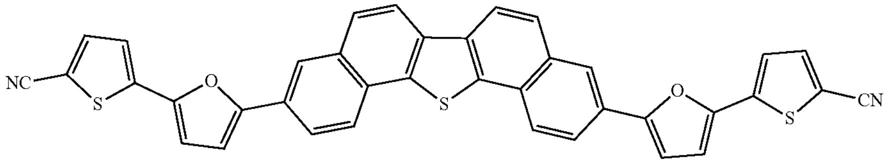
D-26
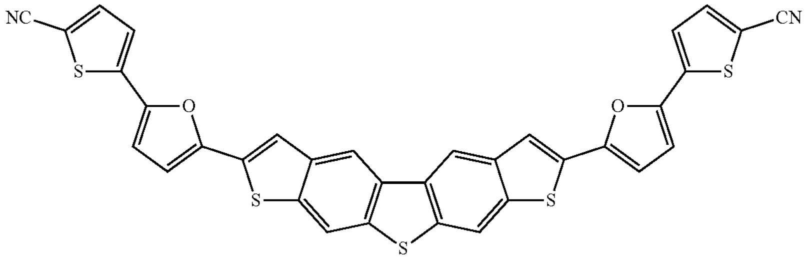
D-27
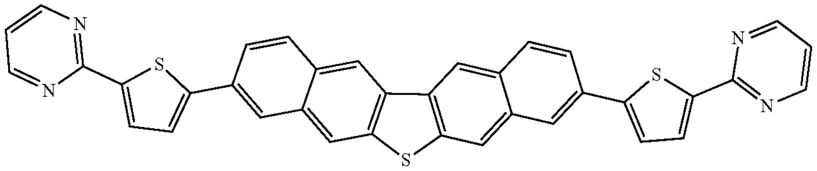
D-28
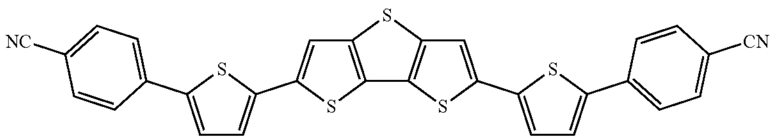
D-29
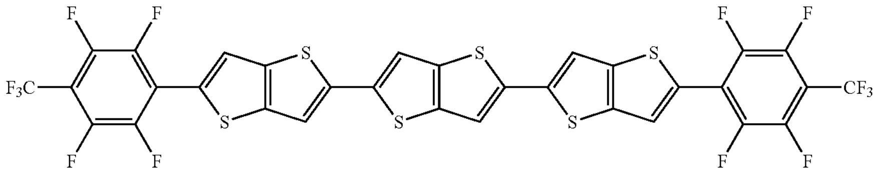

-continued
D-30
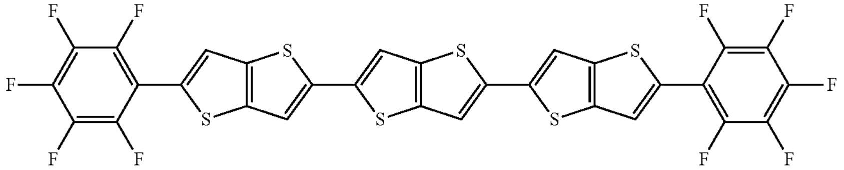
D-31
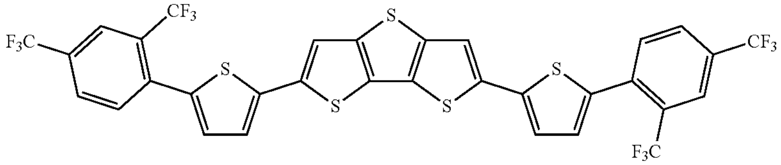
D-32
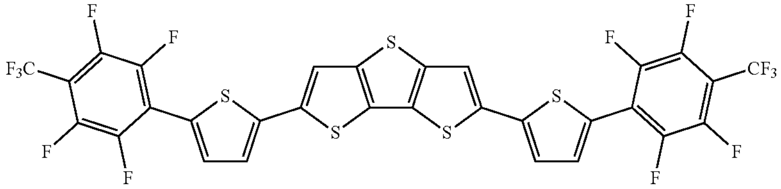
D-33
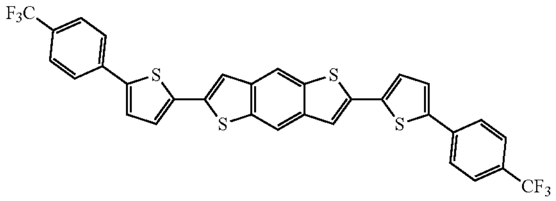
D-34
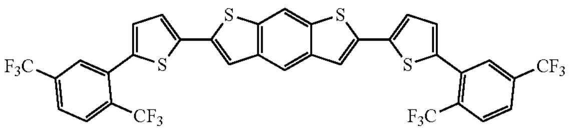
D-35
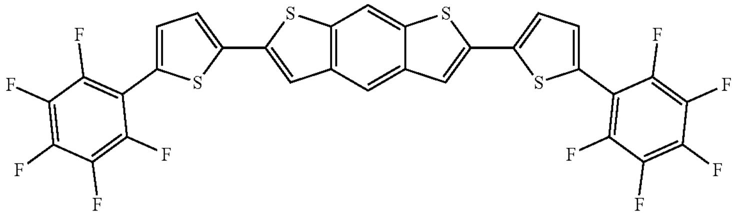
D-36
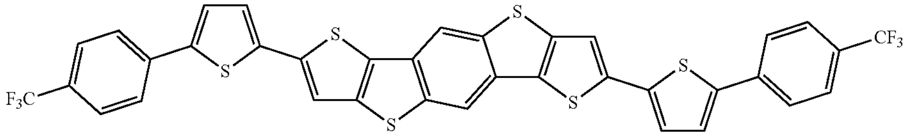
D-37
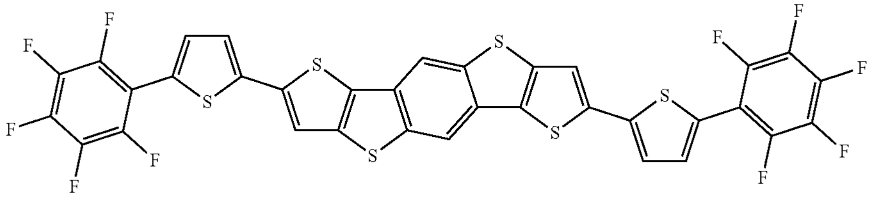
D-38
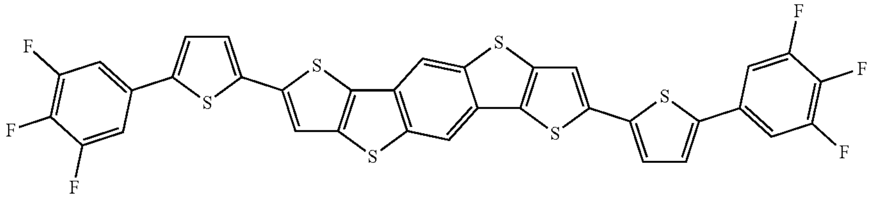

-continued
D-39
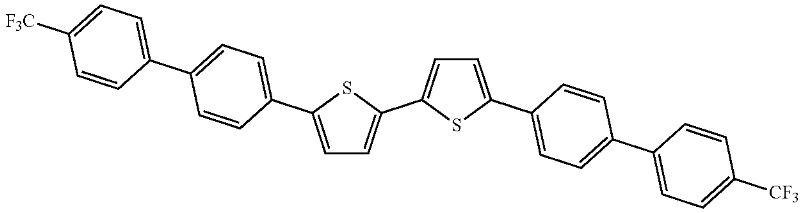
D-40
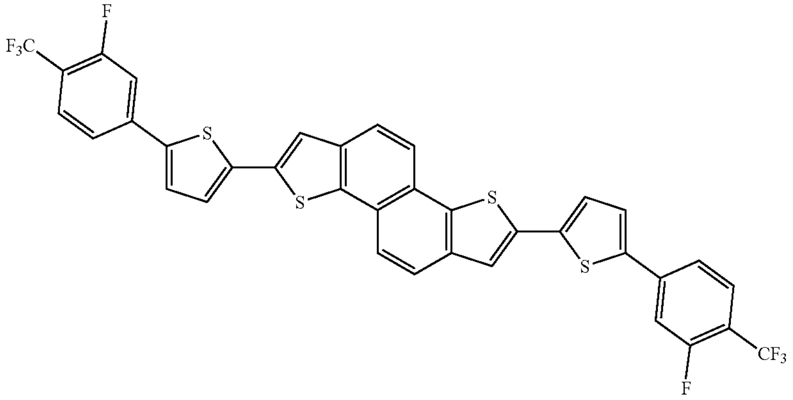
D-41
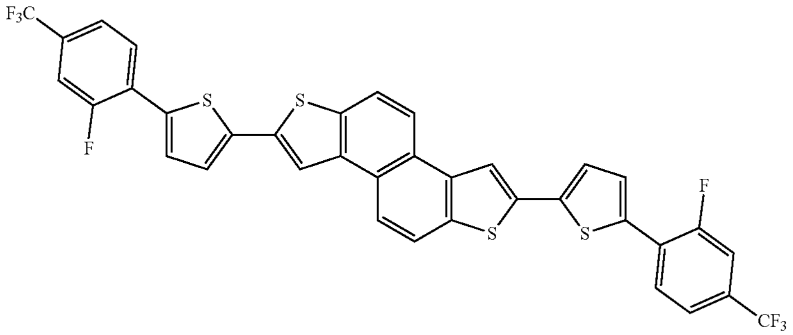
D-42
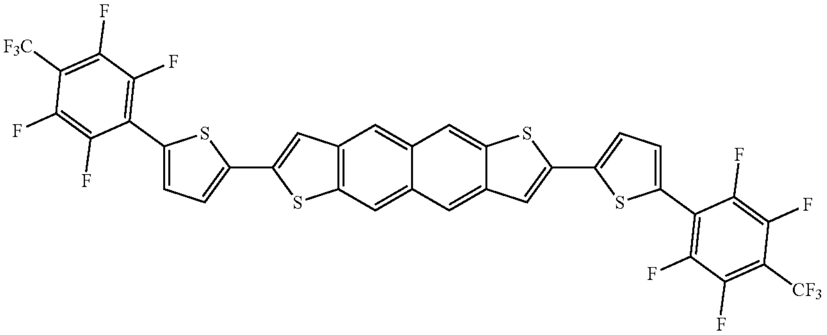
D-43
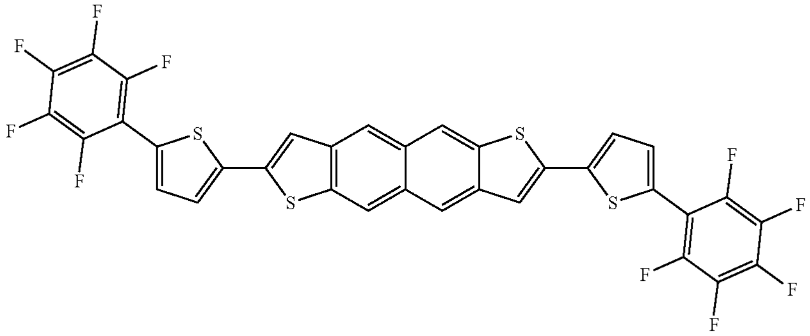

-continued
D-44
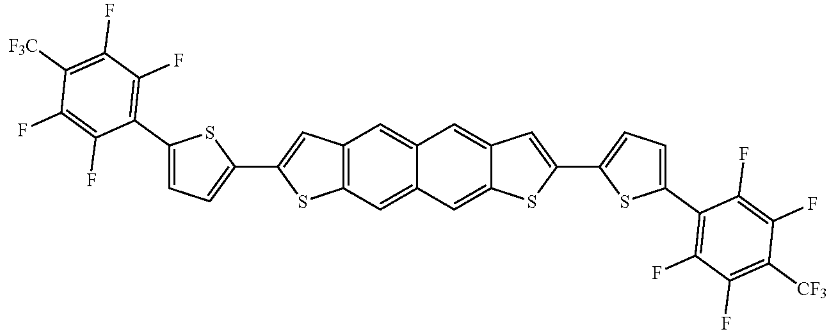
D-45
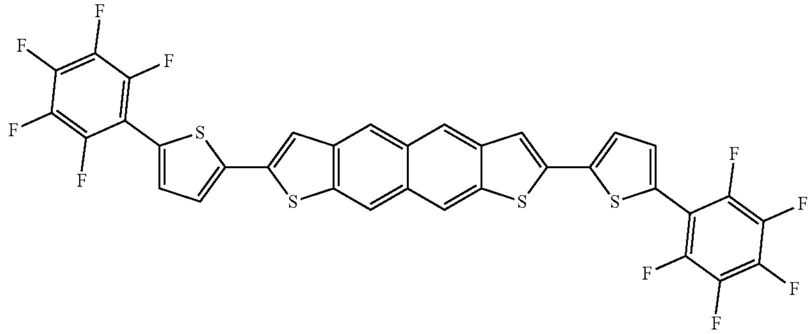
D-46
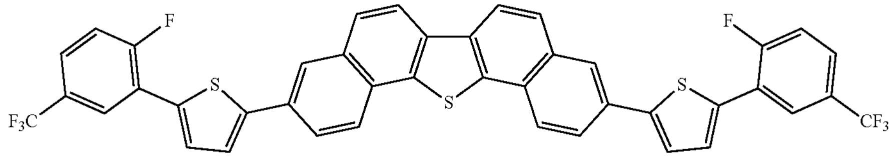
D-47
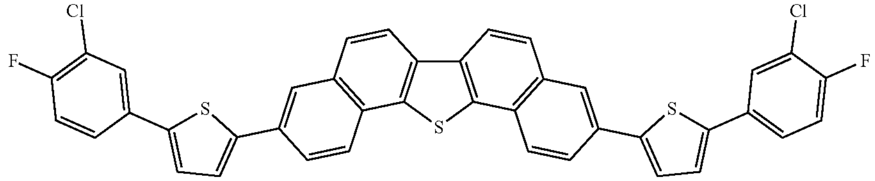
D-48
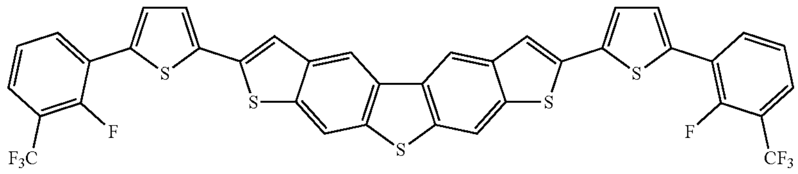
D-49
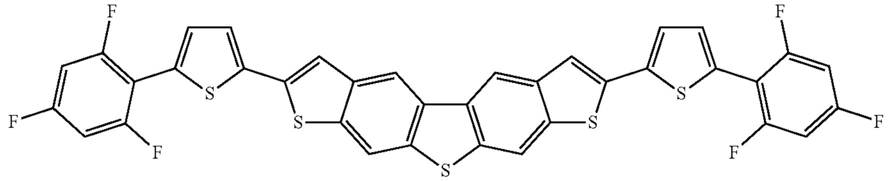
D-50
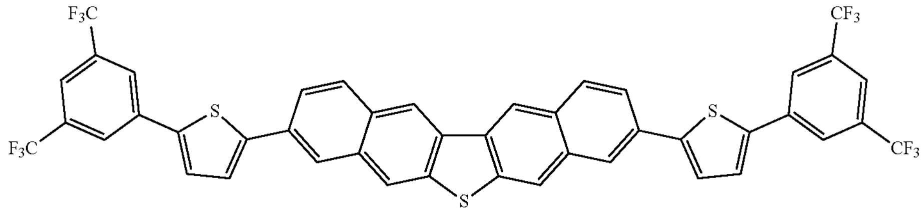

-continued
D-51
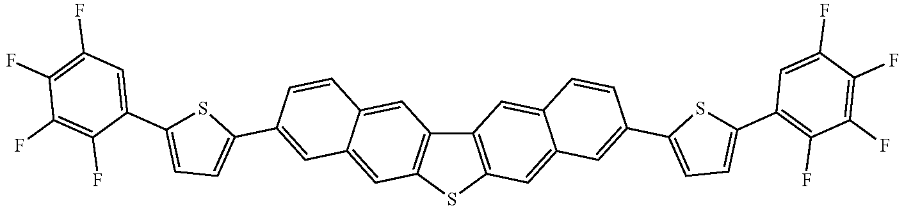
D-52
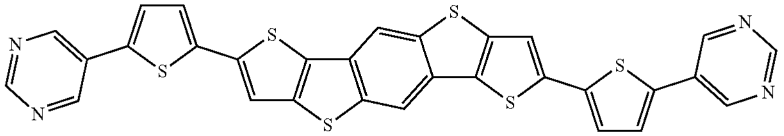
D-53
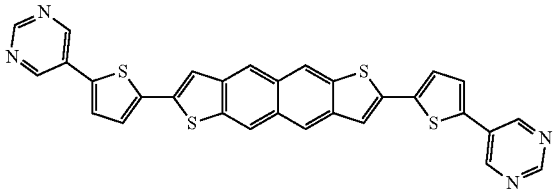
D-54
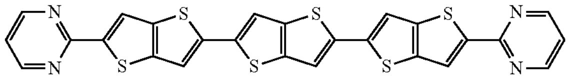
D-55
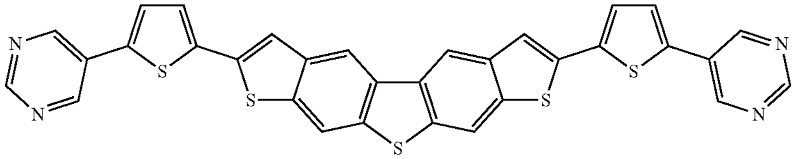
D-56
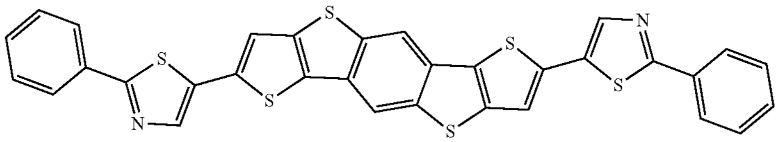
D-57
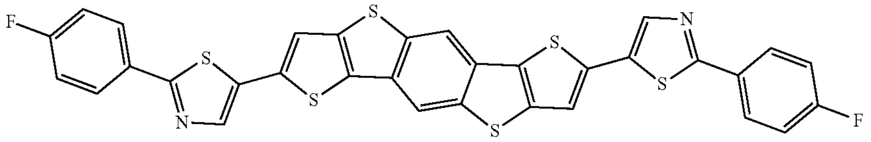
D-58
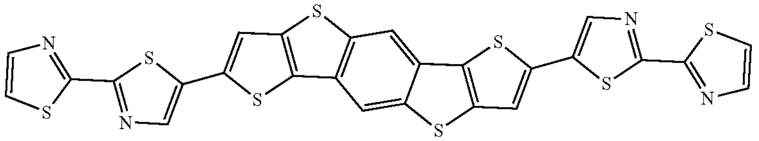
D-59
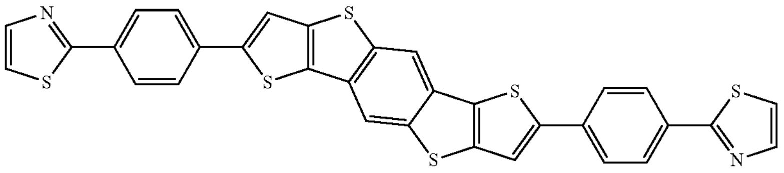
D-60
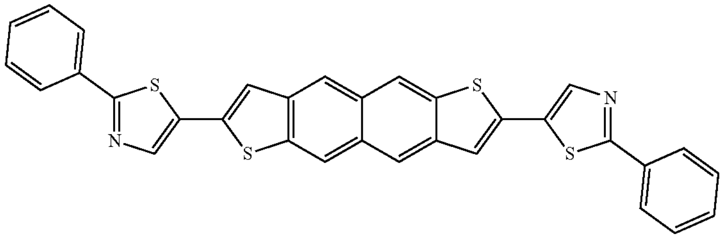

-continued
D-61
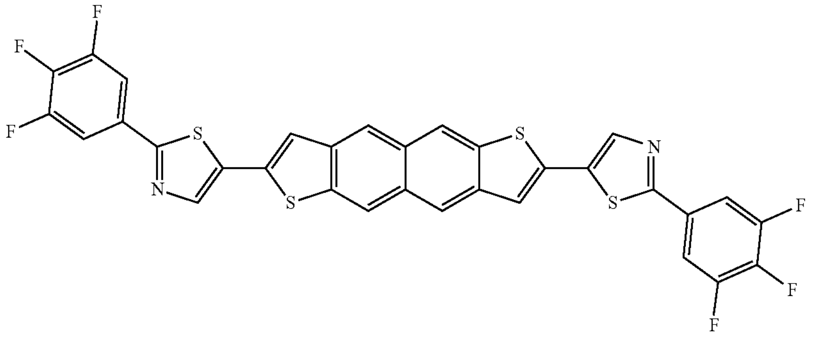
D-62
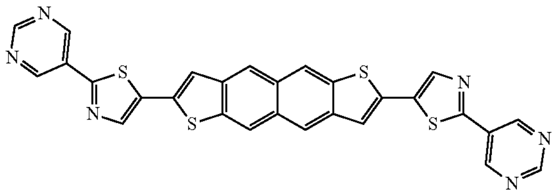
D-63
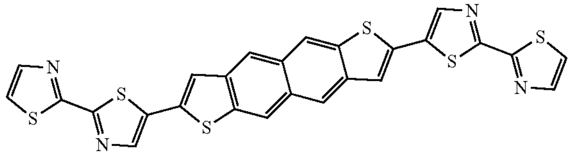
D-64
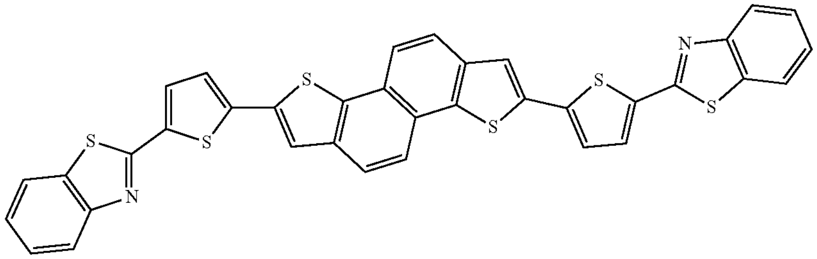
D-65
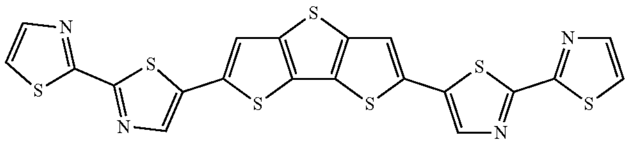
D-66
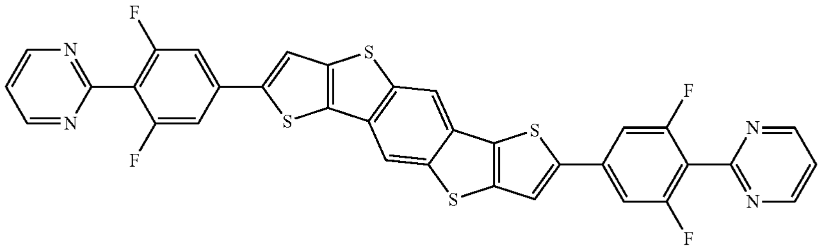
D-67
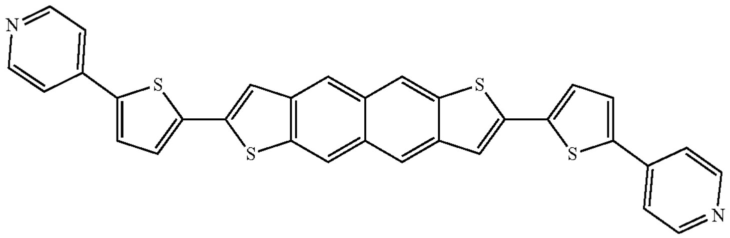

-continued
D-68
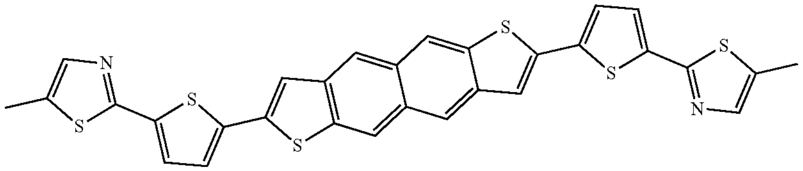
D-69
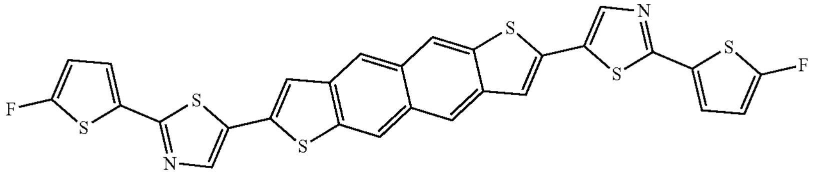
D-70
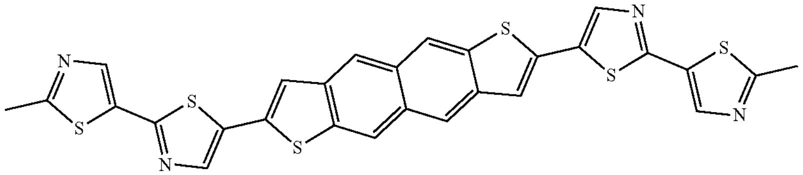
D-71
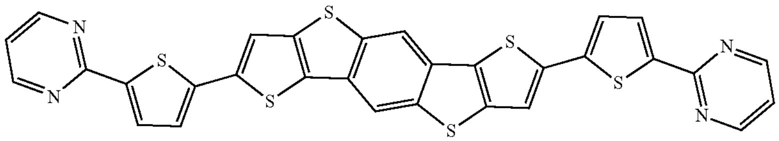
D-72
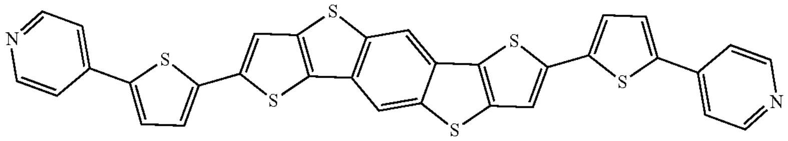
D-73
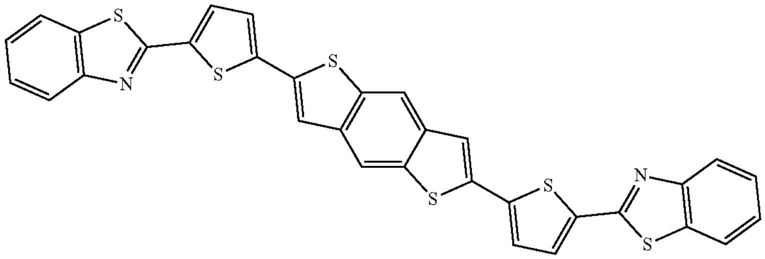
D-74
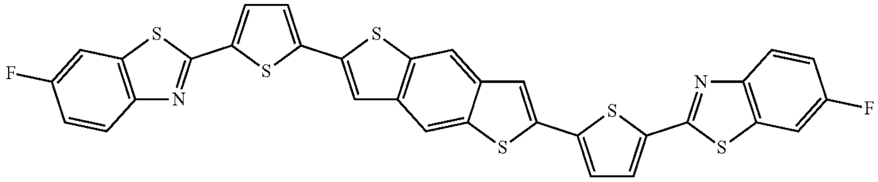
D-75
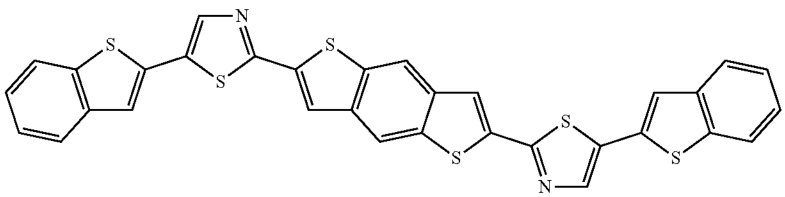

-continued
D-76
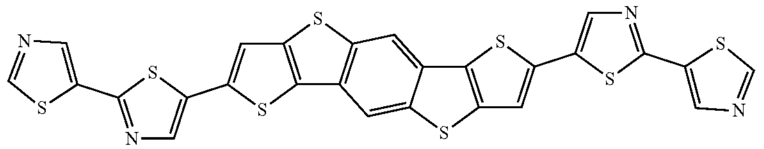
D-77
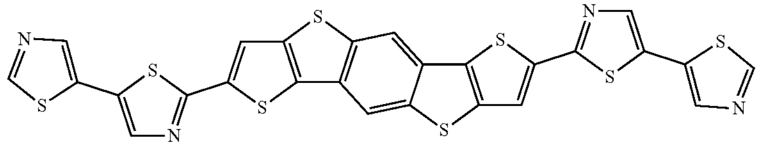
D-78
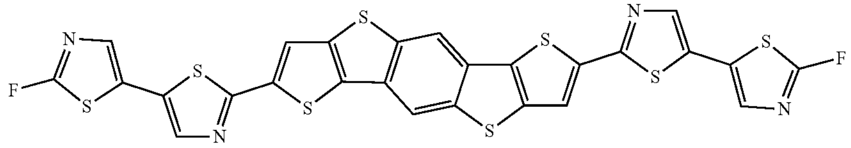
D-79
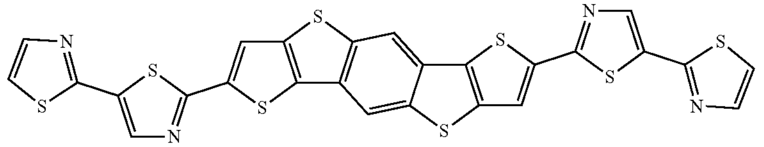
D-80
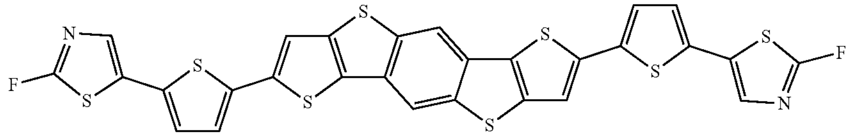
D-81
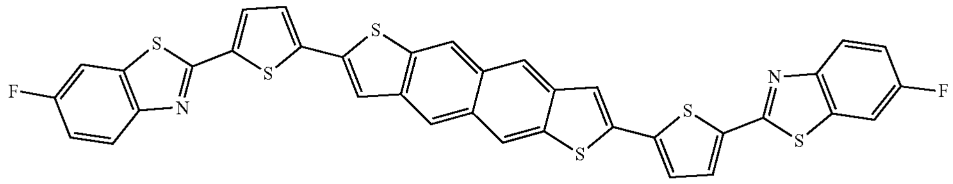
D-82
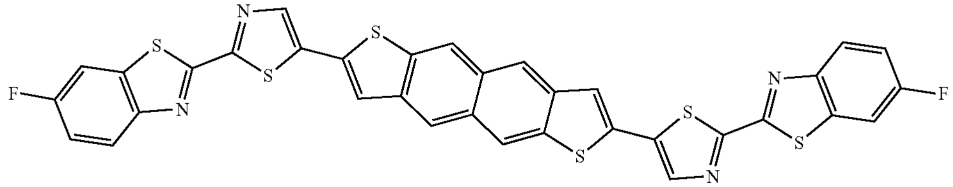
D-83
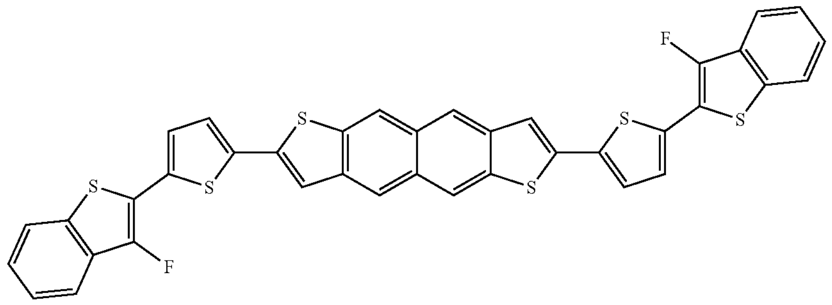

-continued
D-84
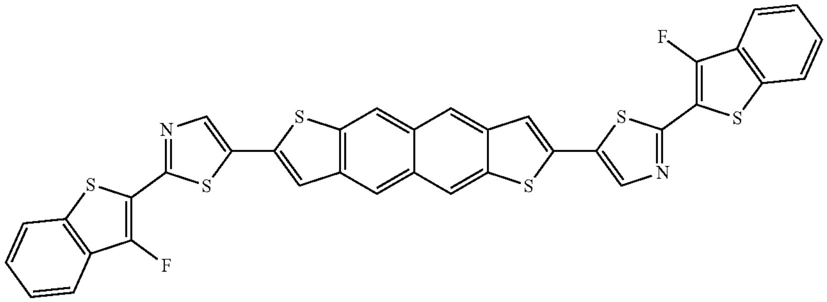
D-85
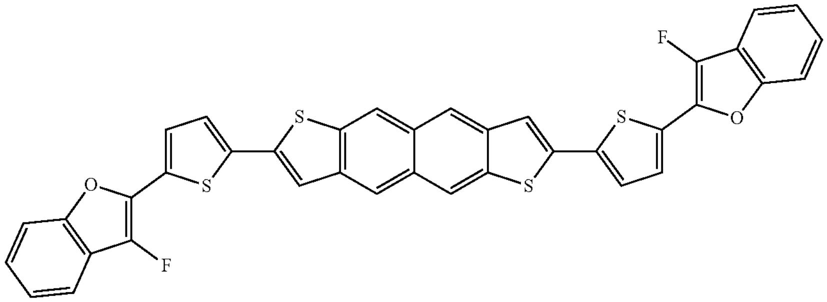
D-86
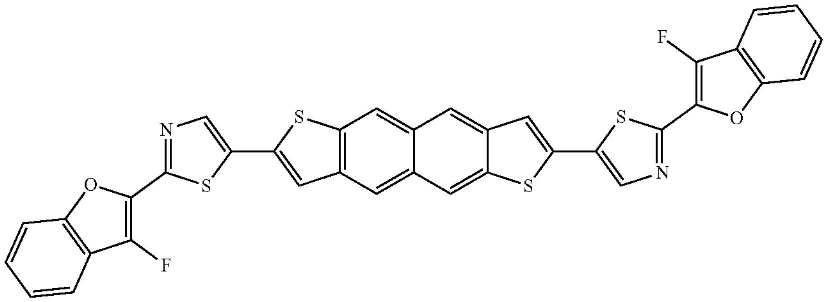
D-87
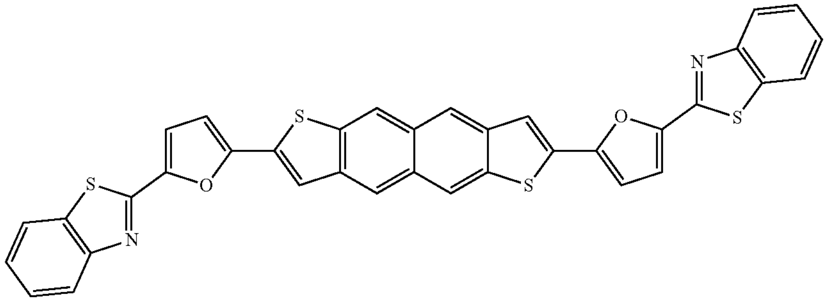
D-88
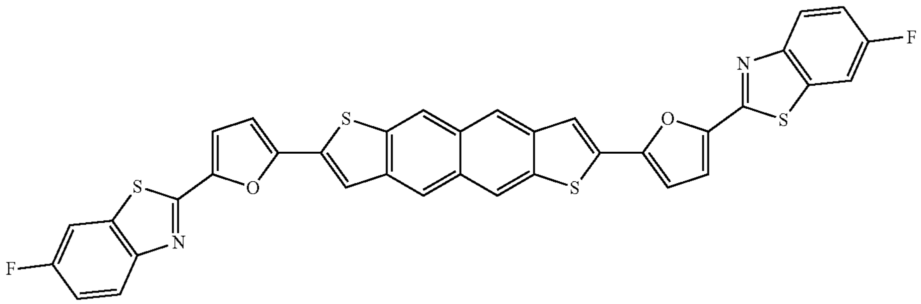

-continued
D-89
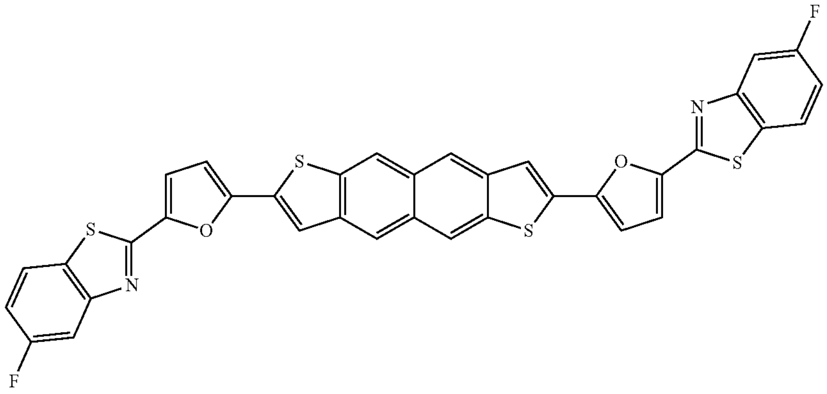
D-90
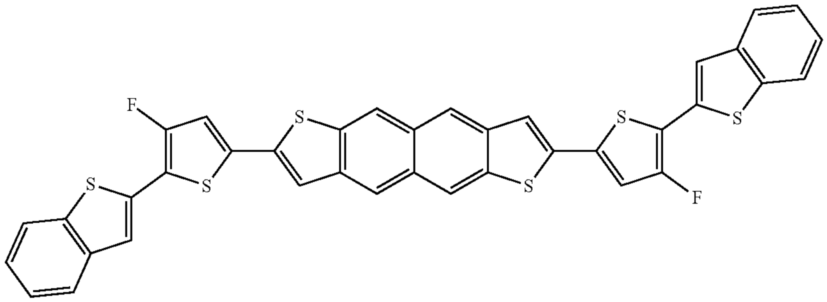
D-91
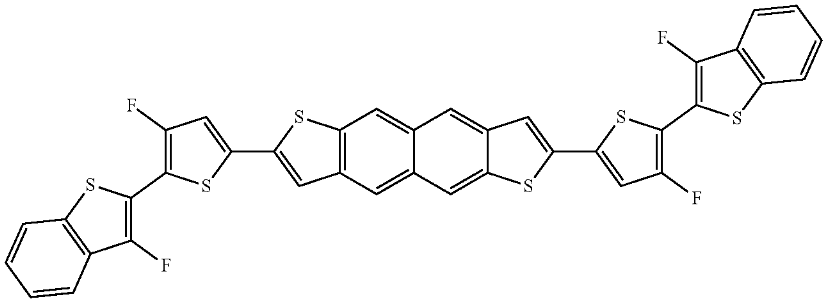
D-92
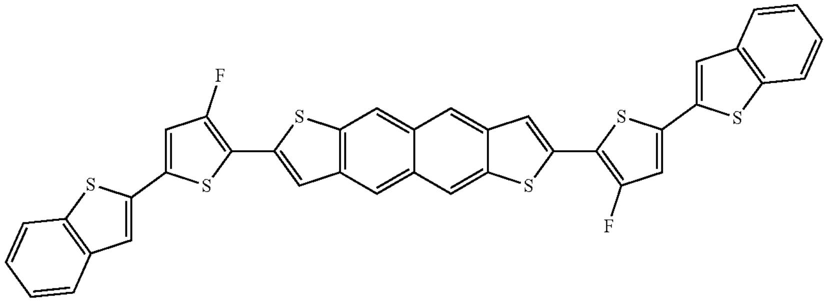
D-93
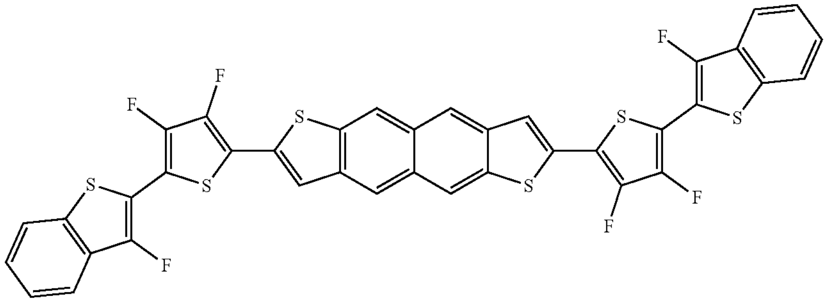

-continued
D-94
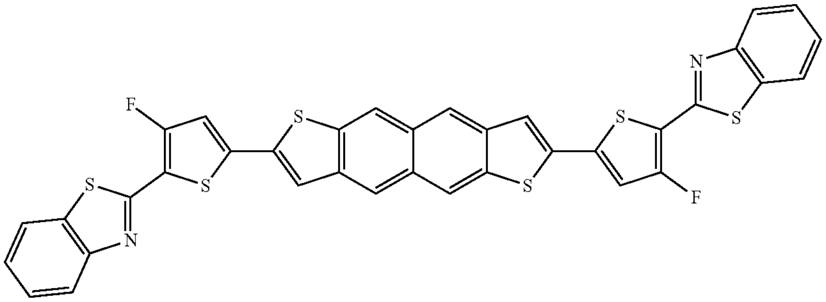
D-95
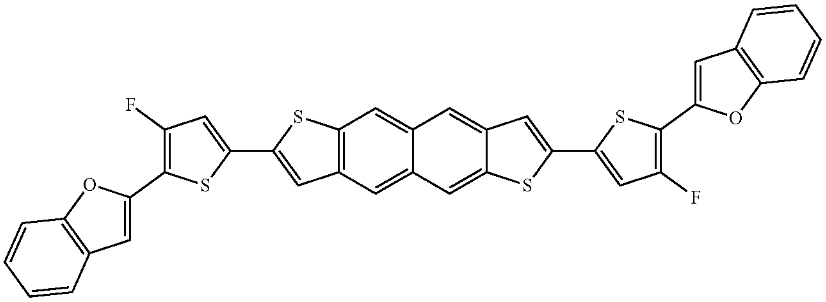
D-96
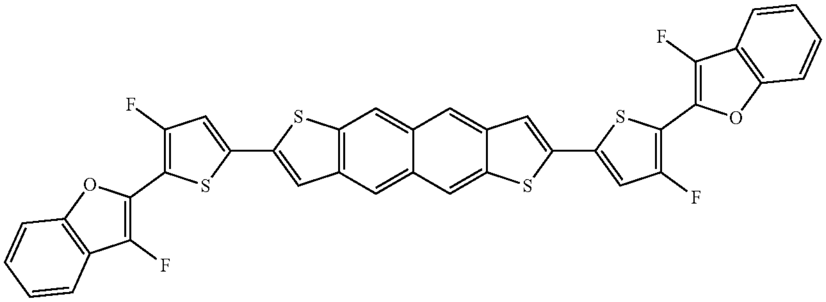
D-97
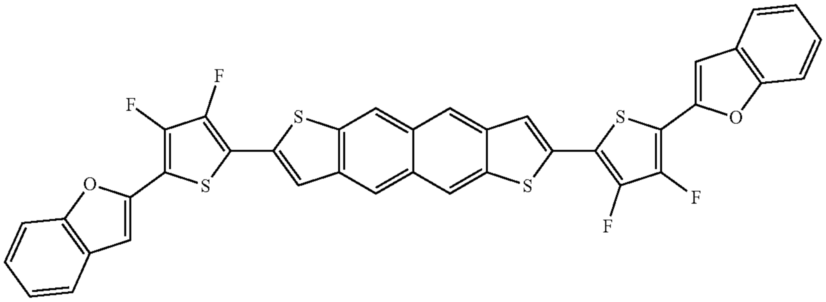
D-98
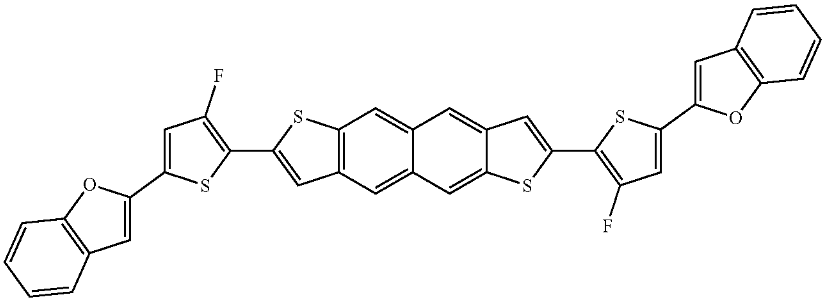

-continued
D-99
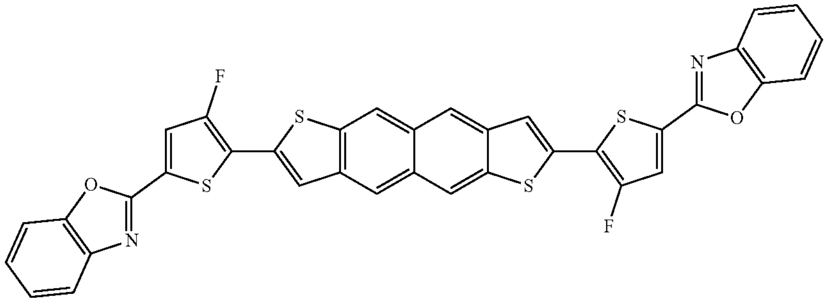
D-100
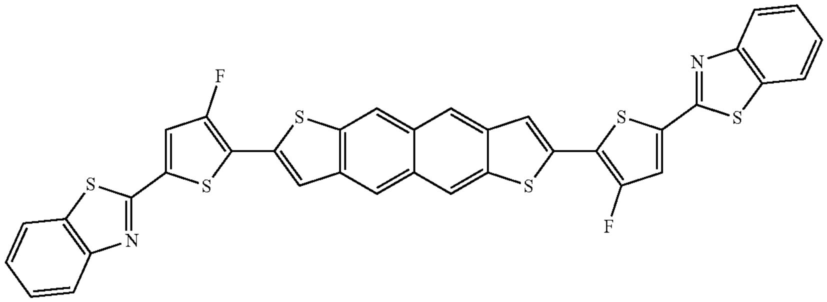
D-101
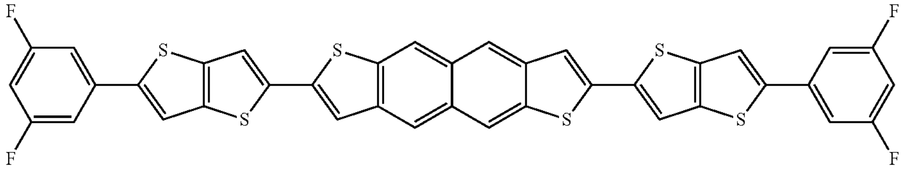
D-102
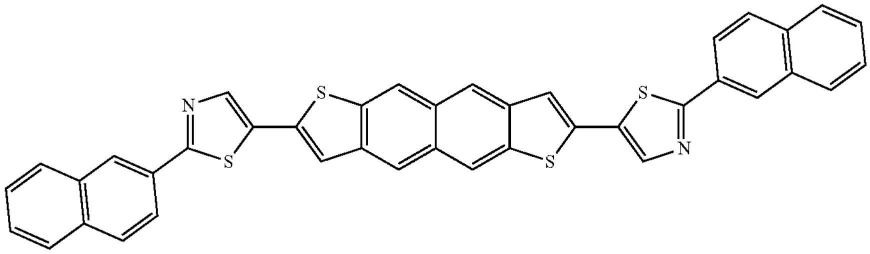
D-103
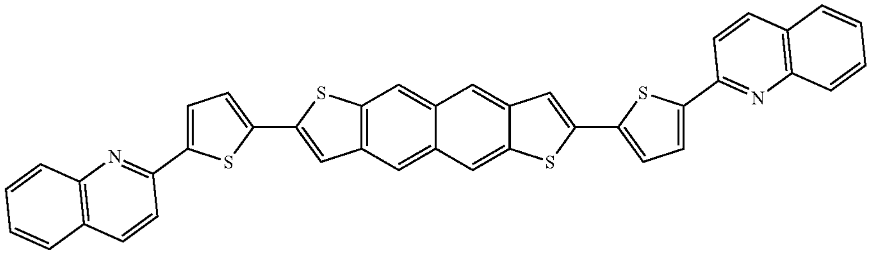
D-104
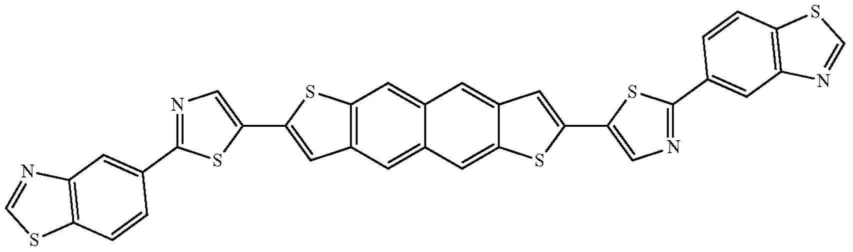

-continued
D-105
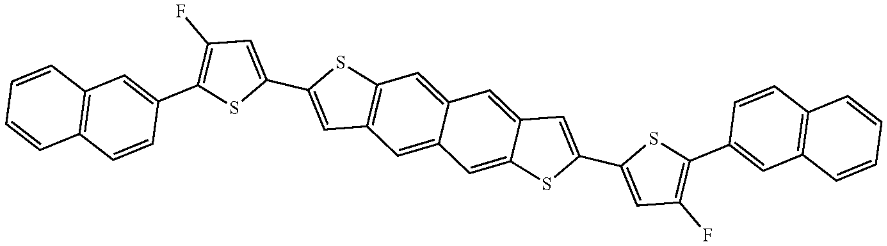
D-106
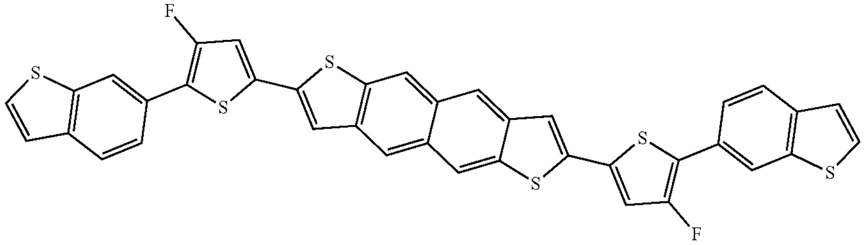
D-107
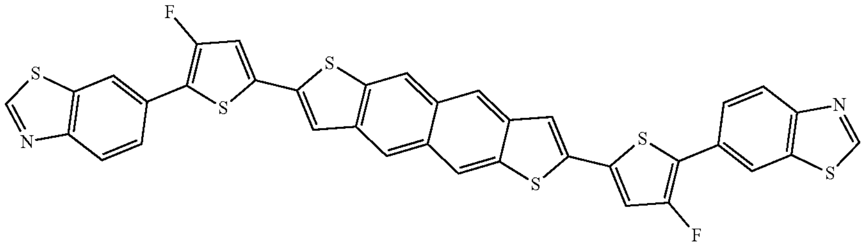
D-108
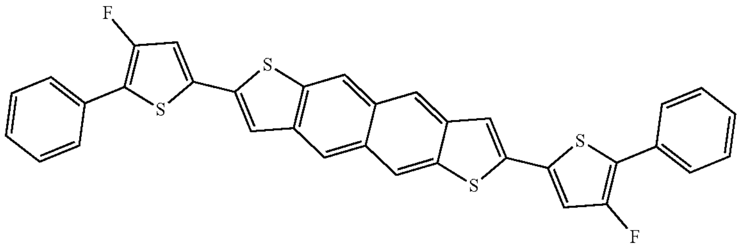
D-109
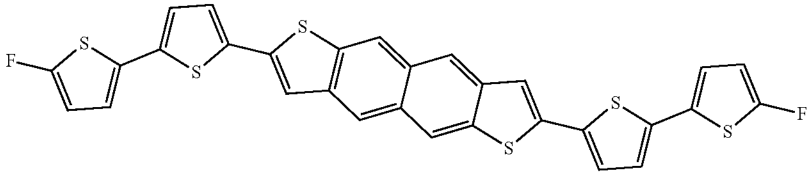
D-110
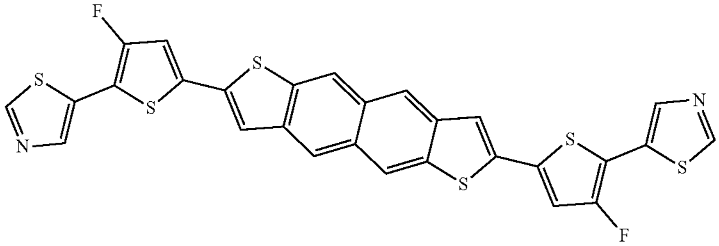
D-111
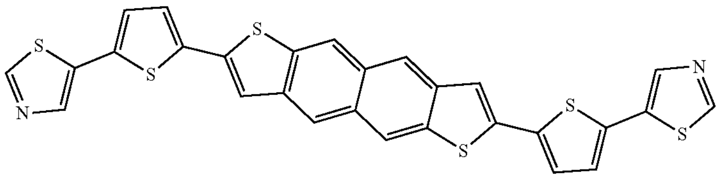

-continued
D-112
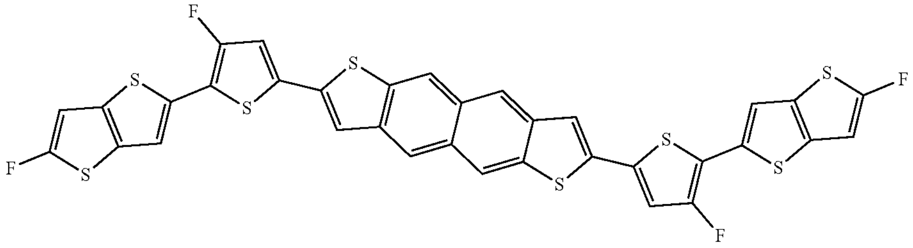
D-113
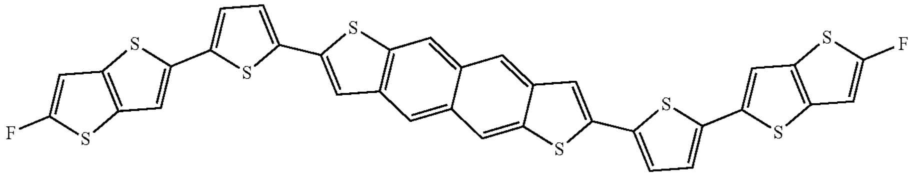
D-114
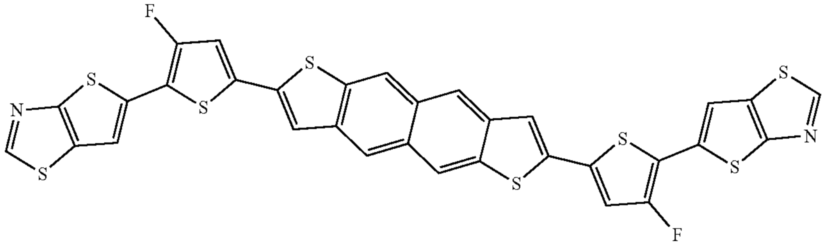
D-115
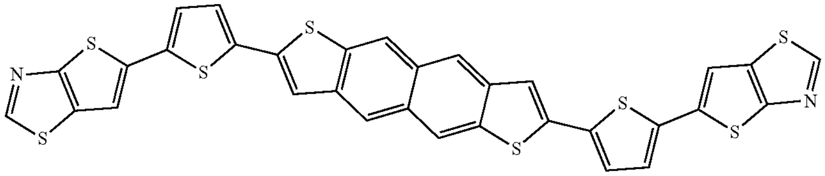
D-116
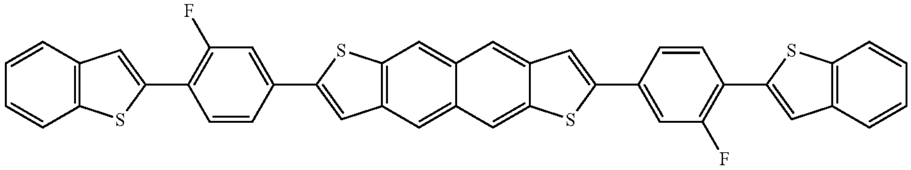
D-117
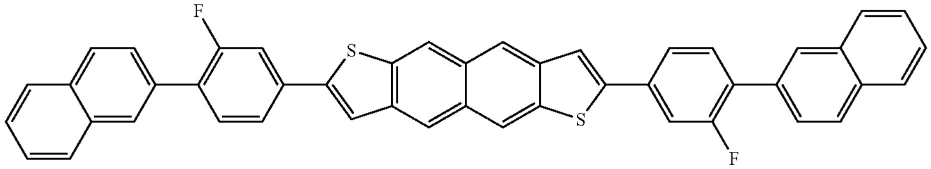
D-118
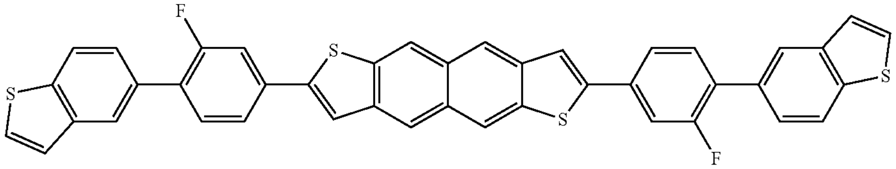
D-119
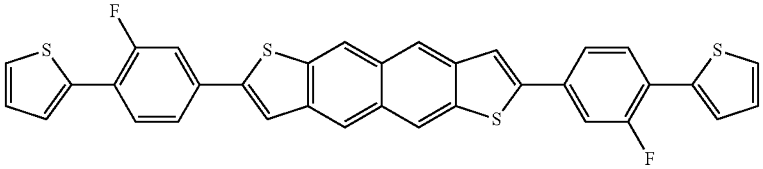

-continued
D-120
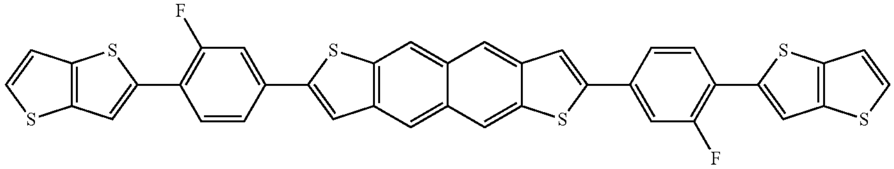
D-121
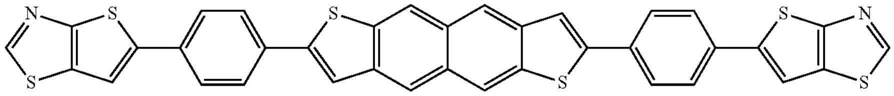
D-122
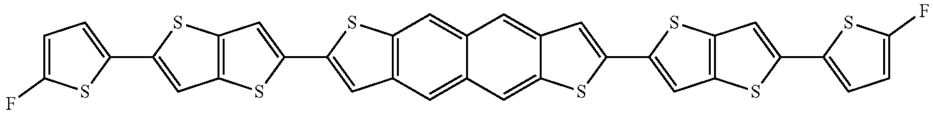
D-123
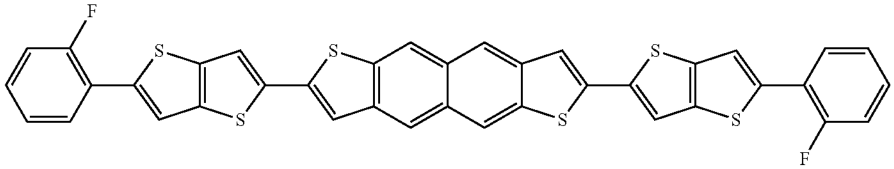
D-124
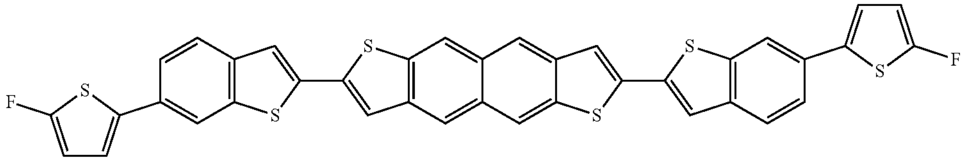
D-125
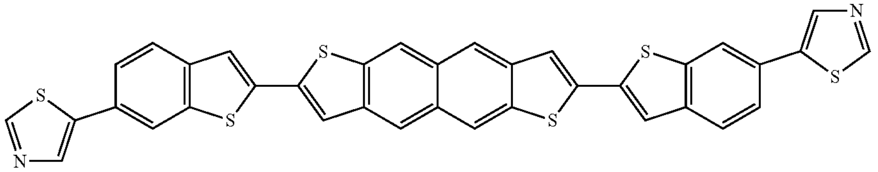
D-126
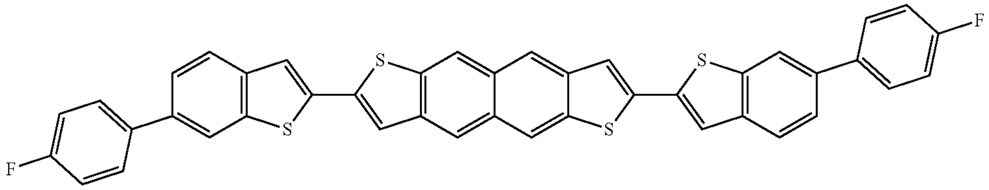
D-127
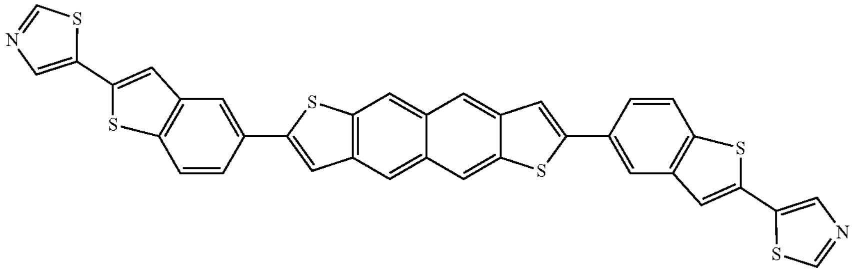

-continued
D-128
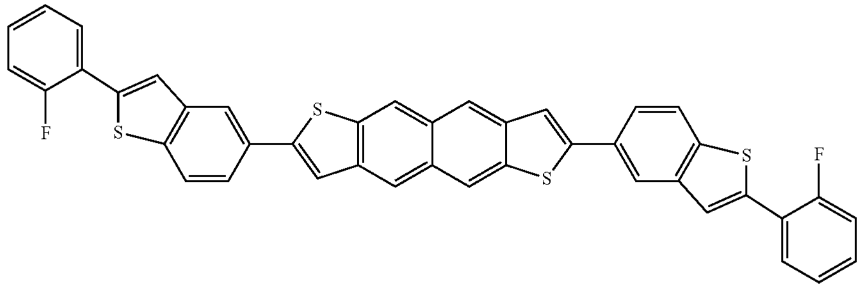
D-129
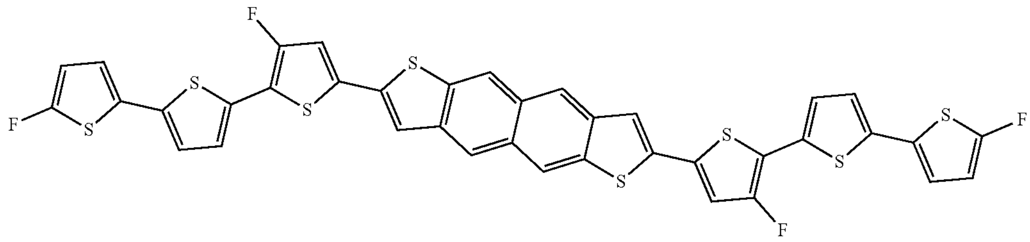
D-130
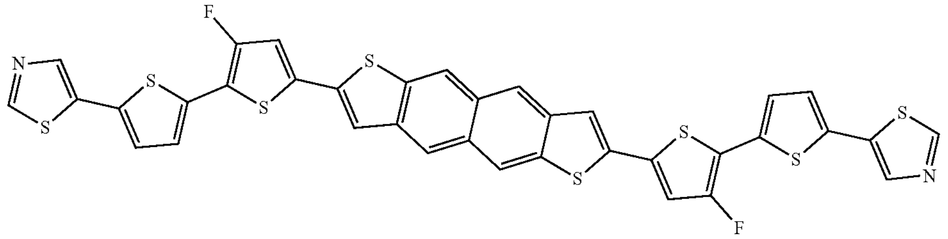
D-131
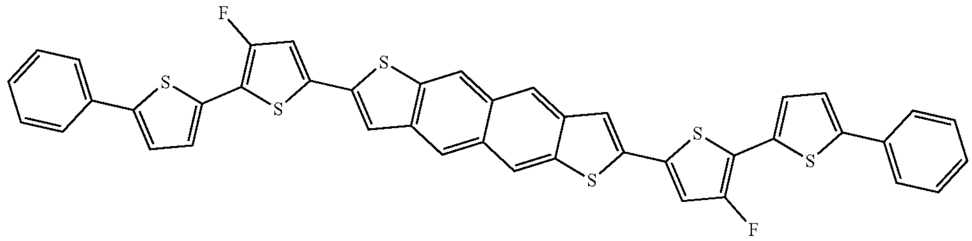
D-132
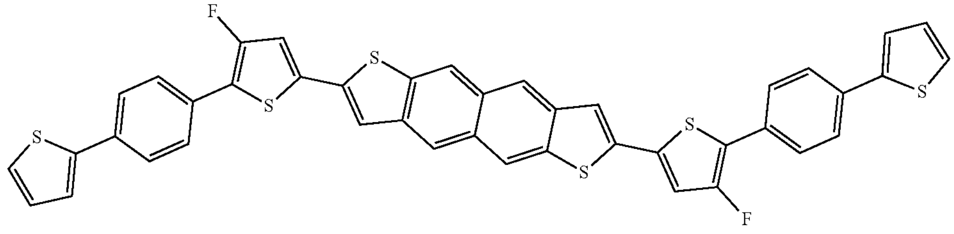
D-133
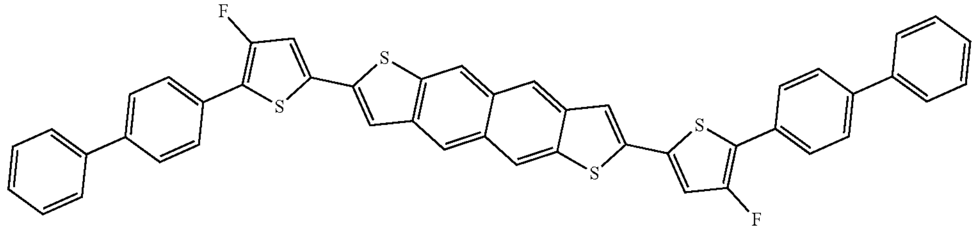

-continued
D-134
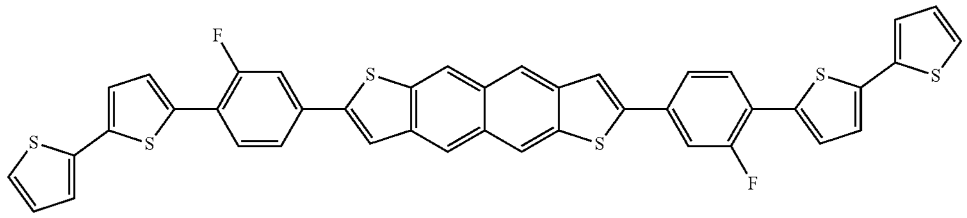
D-135
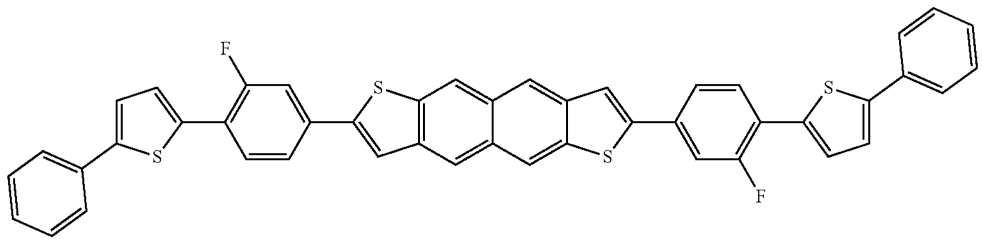
D-136
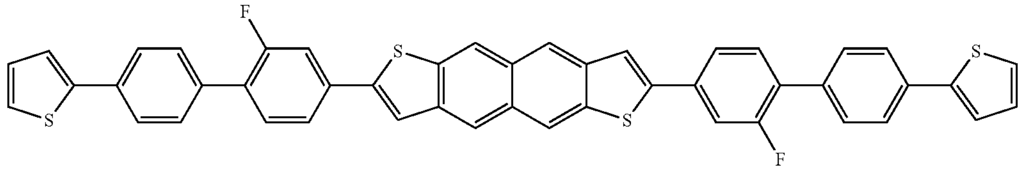
D-137
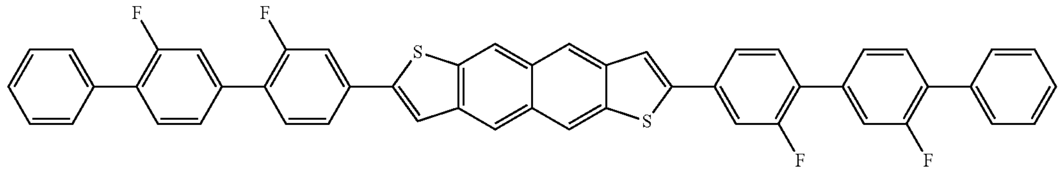
D-138
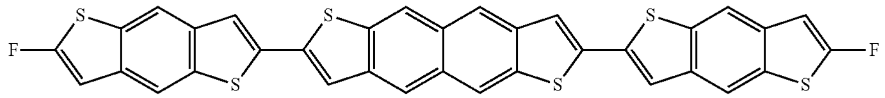
D-139
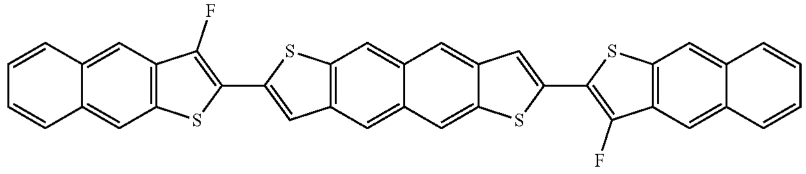
D-140
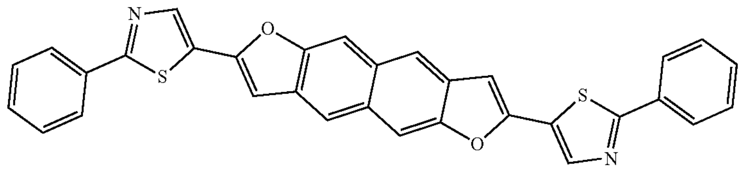
D-141
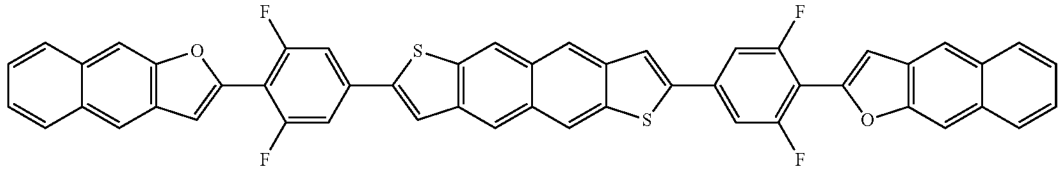

-continued
D-142
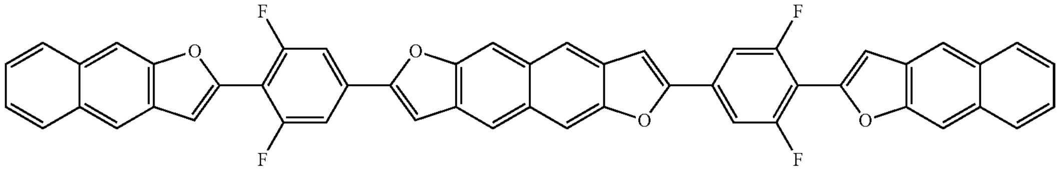
D-143
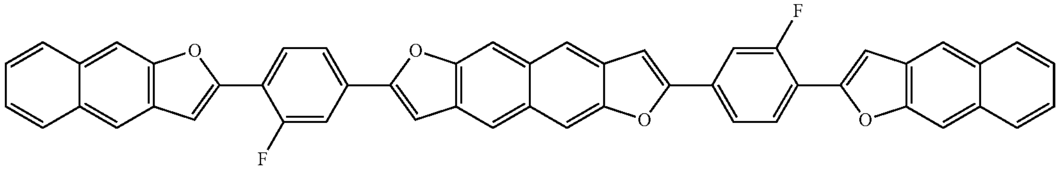
D-144
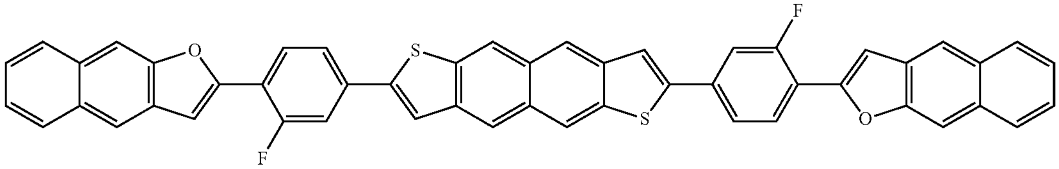
D-145
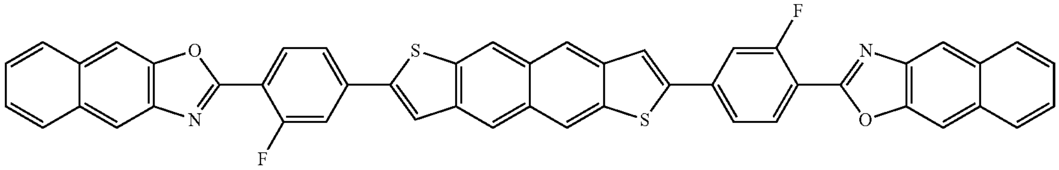
D-146
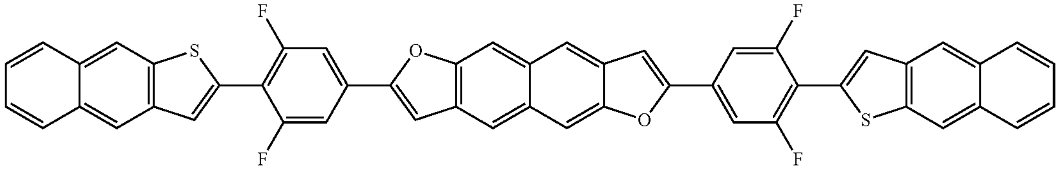
D-147
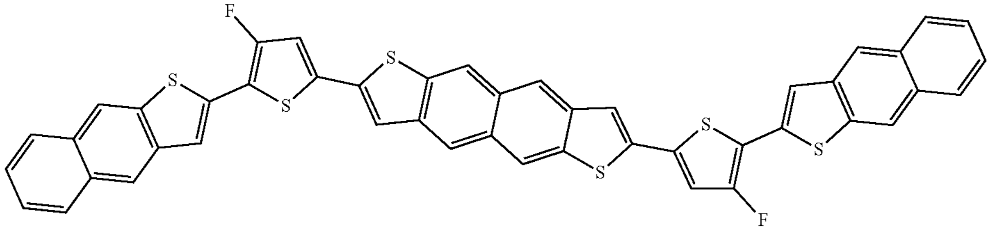
D-148
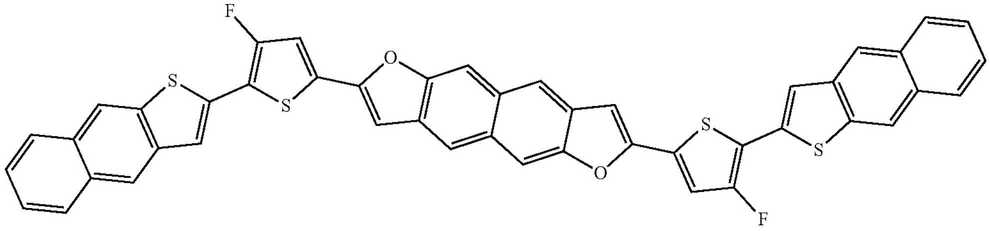
D-149
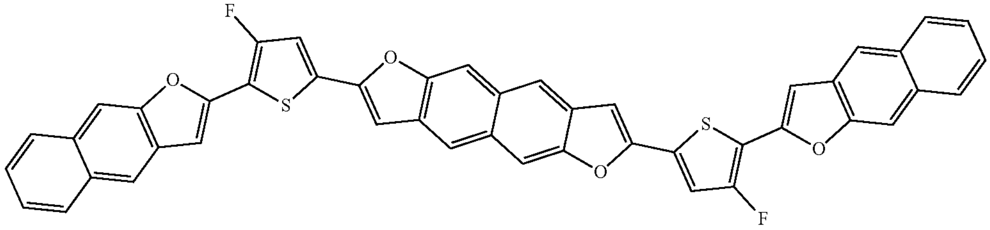

-continued
D-150
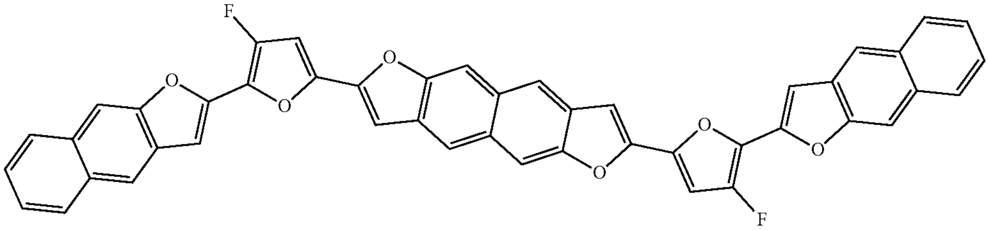
D-151
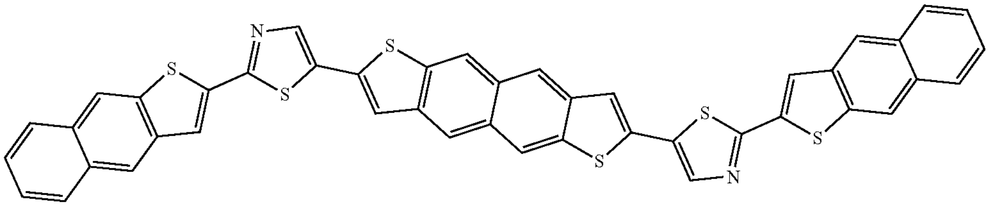
D-152
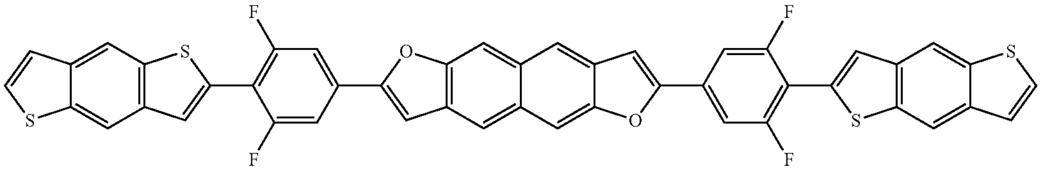
D-153
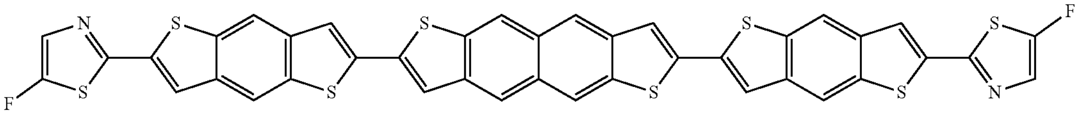
D-154
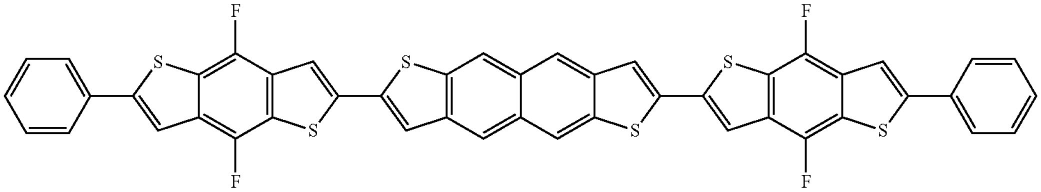
D-155
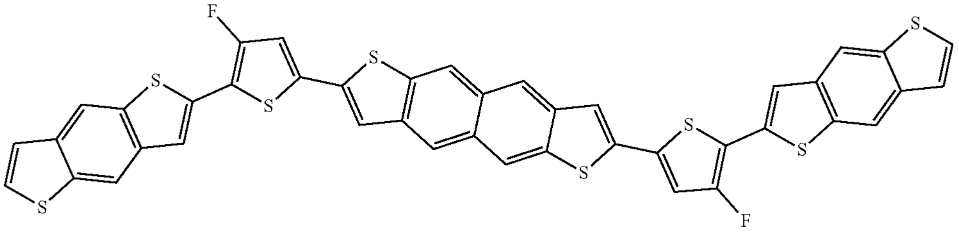
D-156
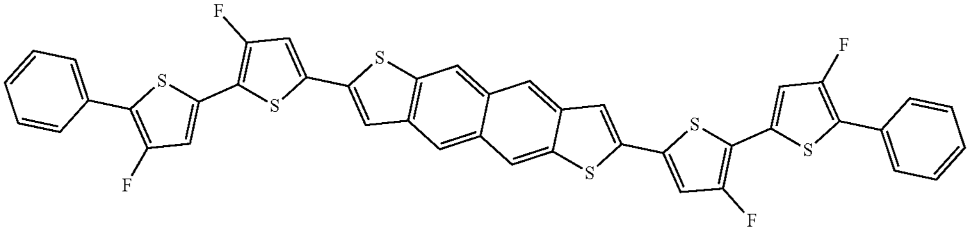

-continued
R-1
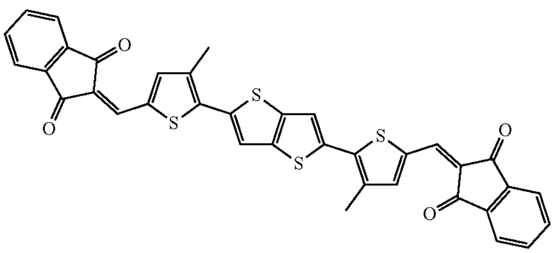
R-2
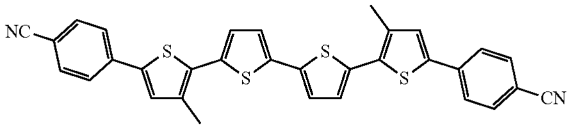
R-3
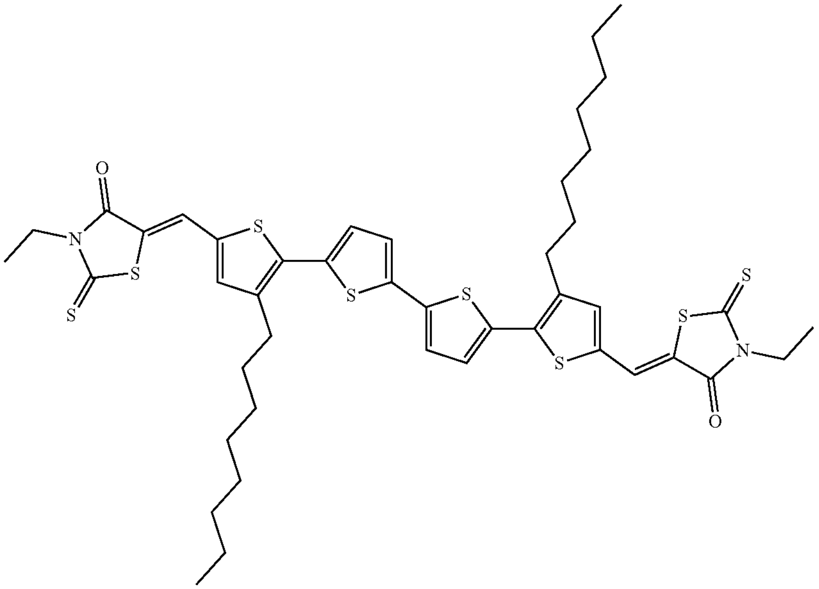
R-4
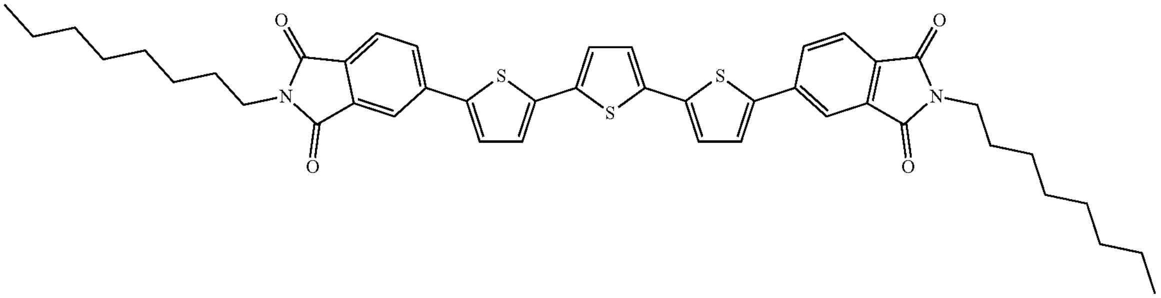
R-5
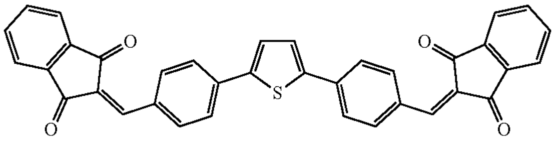
R-6
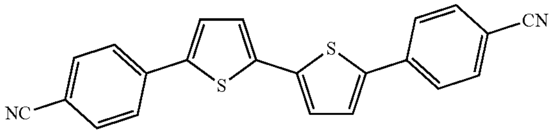
R-7
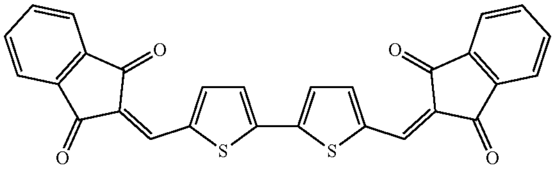
R-8
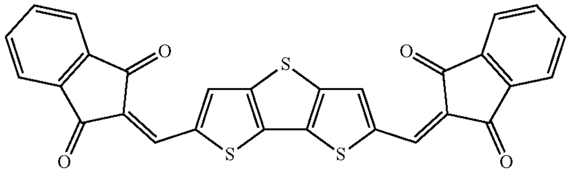

-continued
R-9
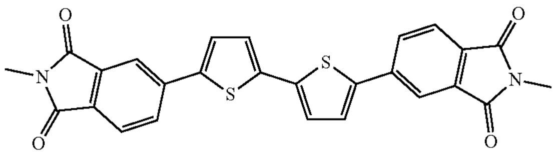
R-10
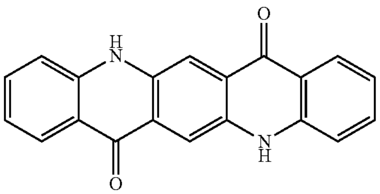
R-11
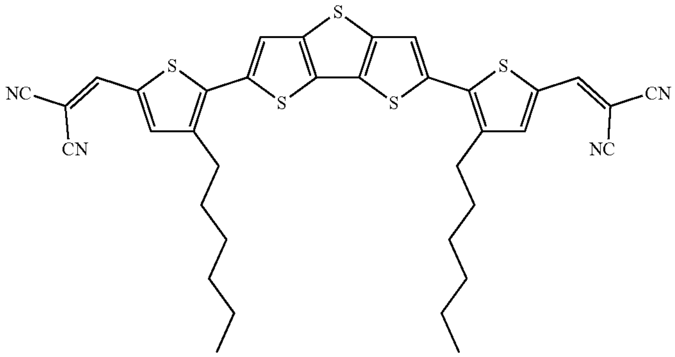
R-12
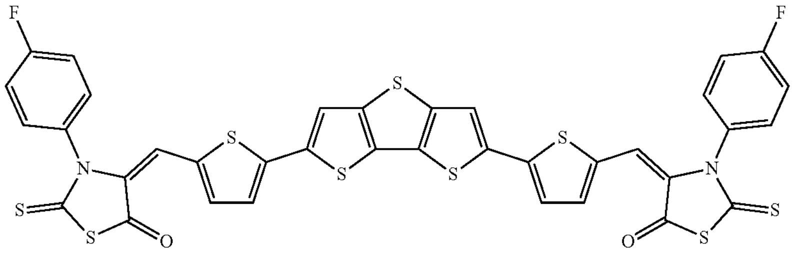
R-13
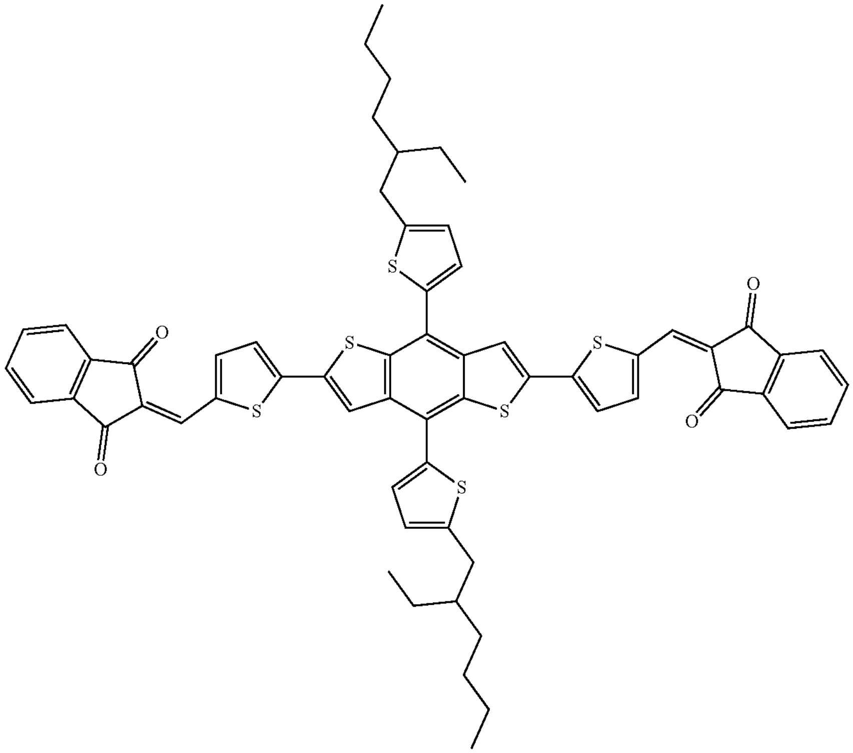

-continued
R-14
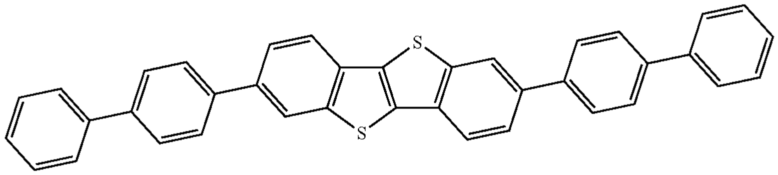
R-15
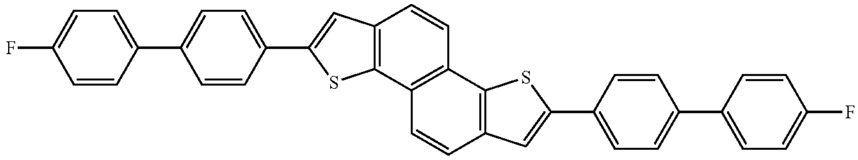
R-16
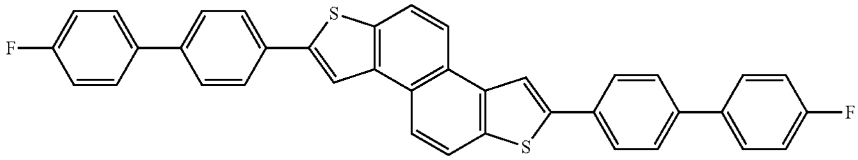
R-17
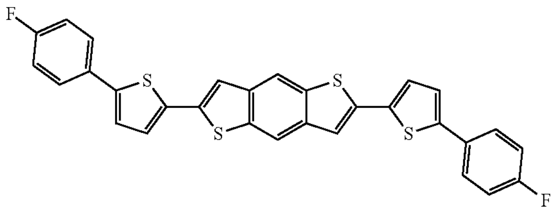
R-18
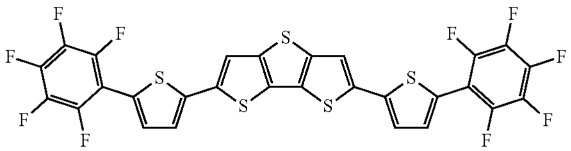
R-19
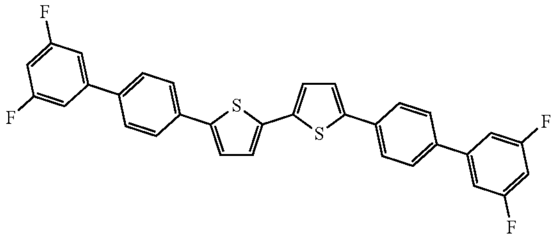
R-20
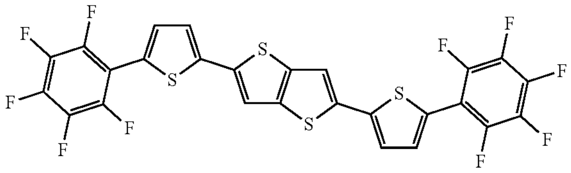
R-21
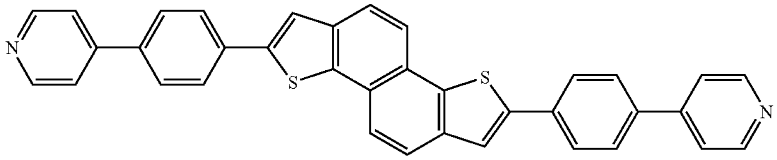
R-22
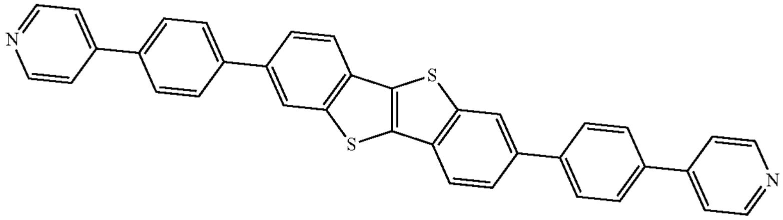
R-23
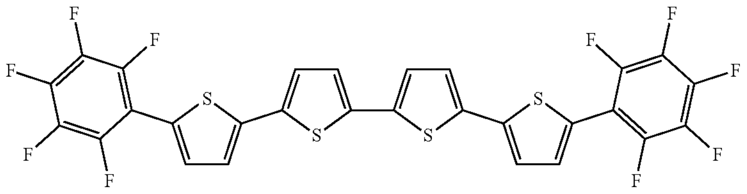

-continued
R-24
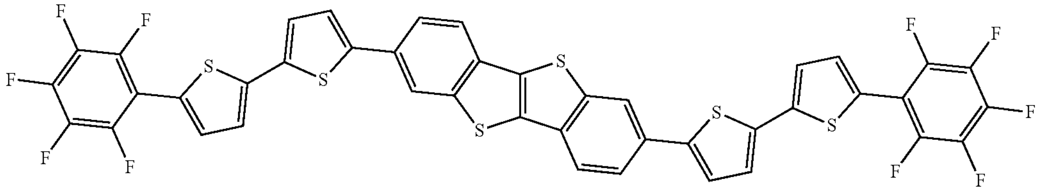
R-25
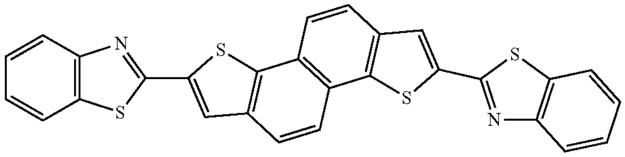
R-26
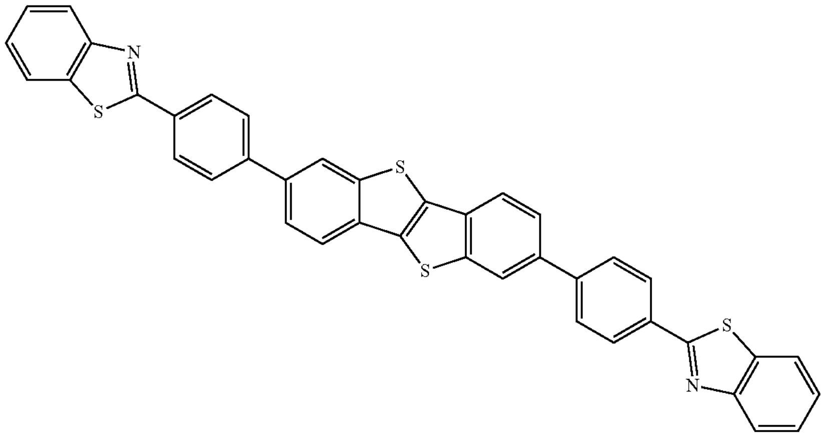
R-27
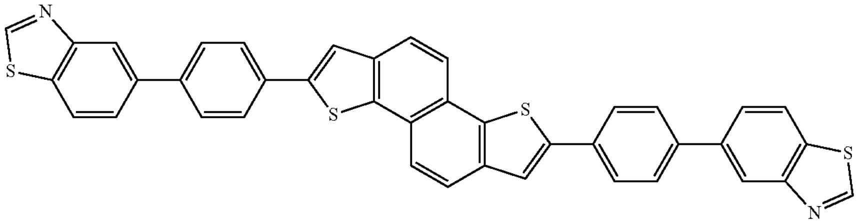
R-28
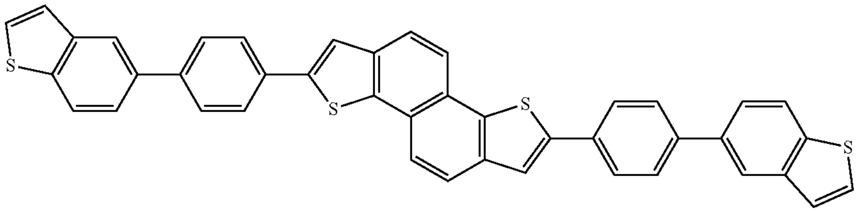
R-29
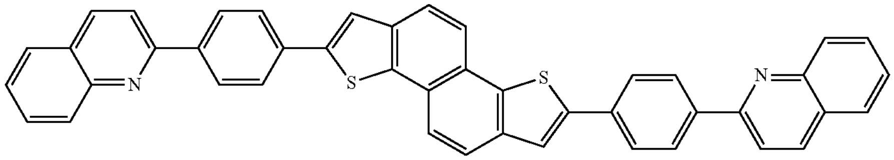
R-30
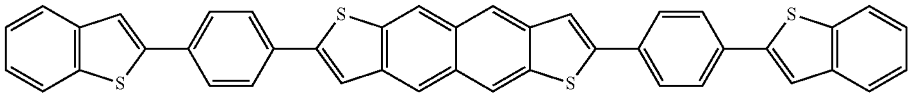

-continued
R-31
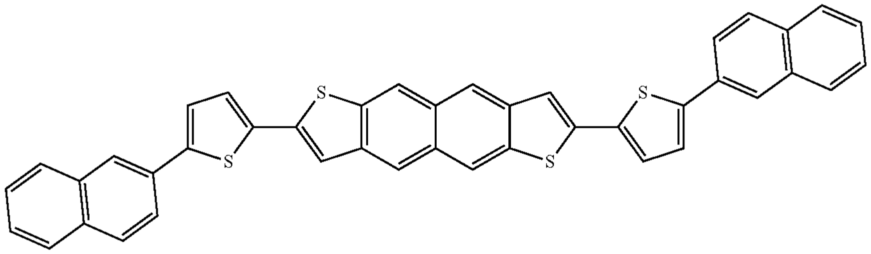
R-32
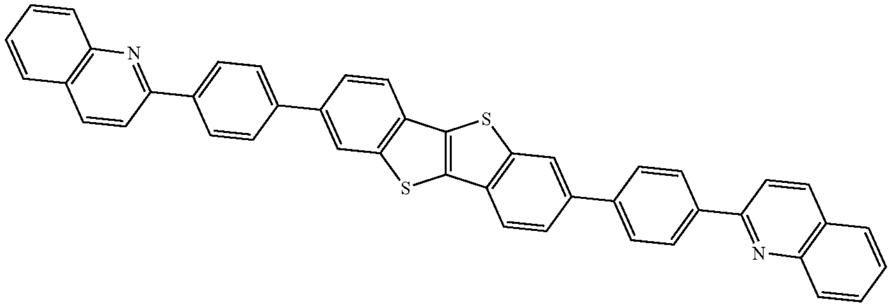
R-33
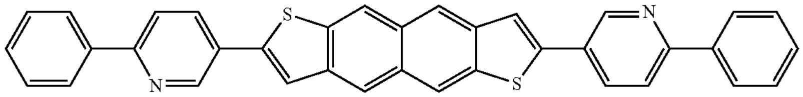
R-34
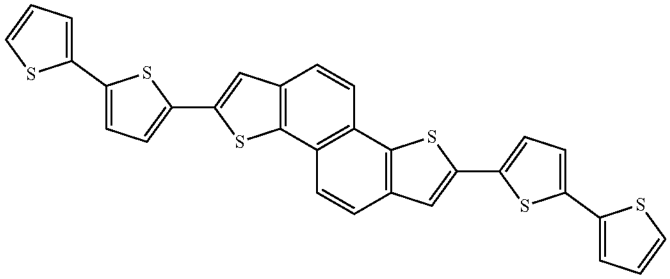
R-35
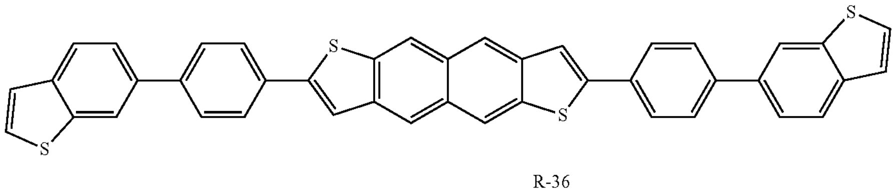
R-36
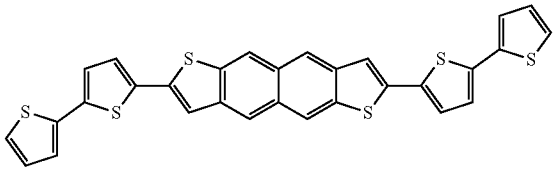
R-37
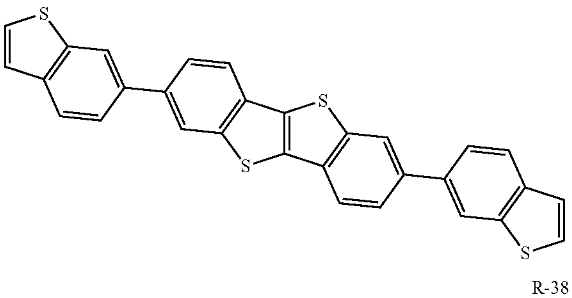
R-38
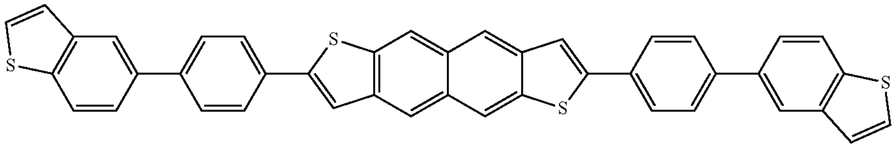

-continued
R-39
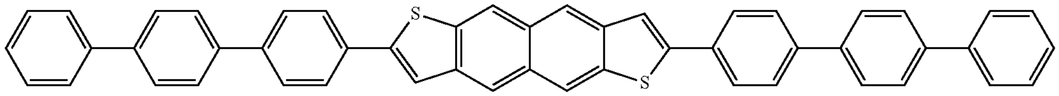
R-40
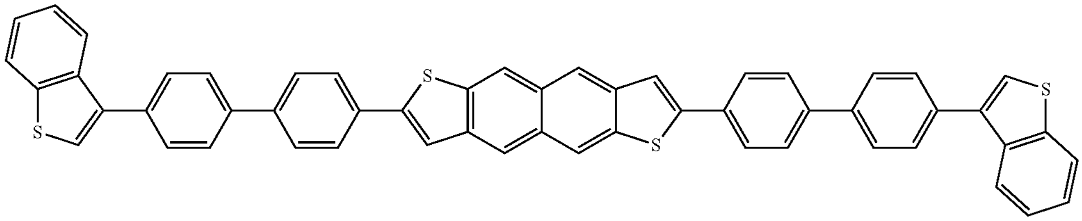
R-41
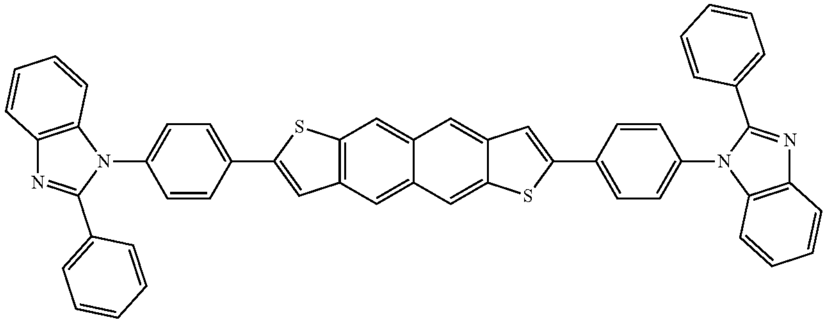
R-42
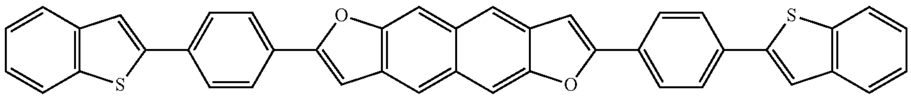
R-43
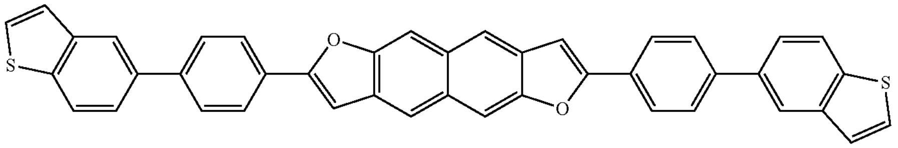
R-44
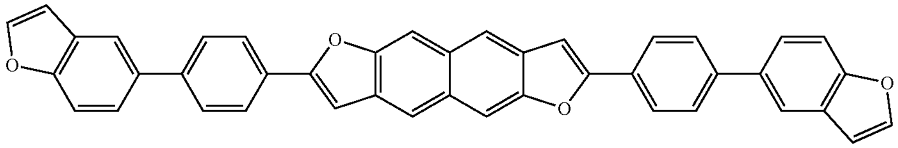
R-45
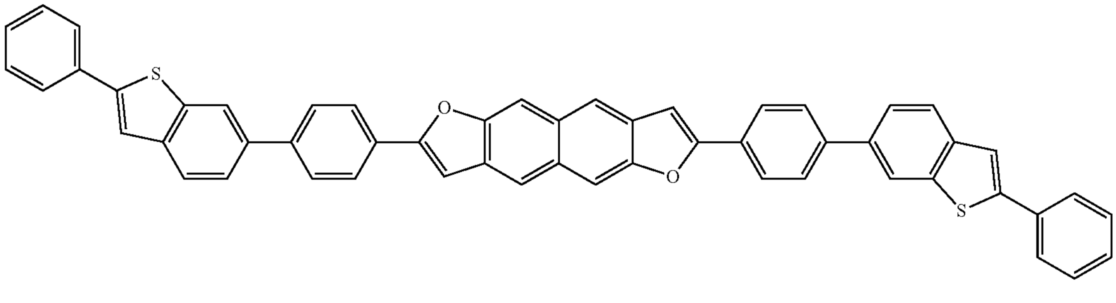

-continued

R-46

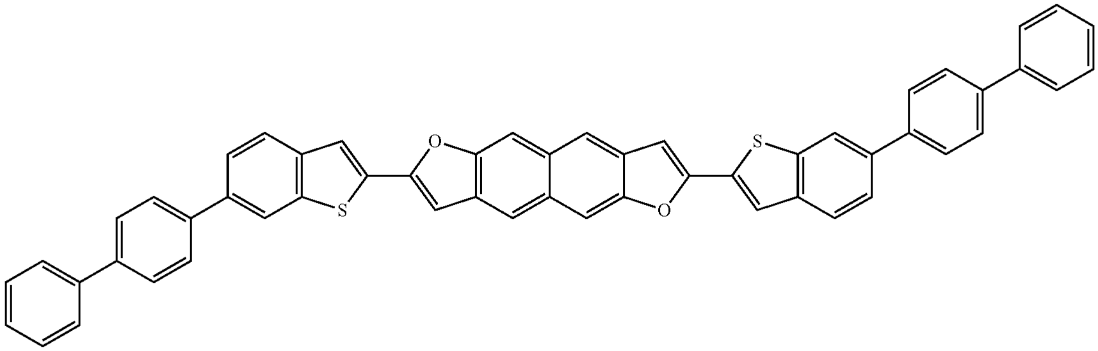

R-47

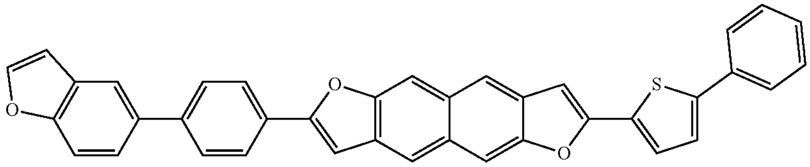

[Coloring Agent (Coloring Agent for Evaluation)]

Coloring agents shown below were coloring agents for evaluation used in the evaluation in Examples, and were used in the production of photoelectric conversion elements described later.

A compound (B-1), which is a coloring agent for evaluation, is the same compound as (R-10), which is a comparative compound.

B-1

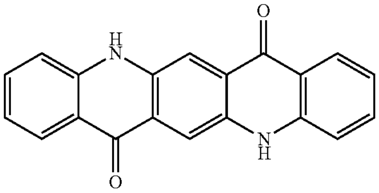

B-2

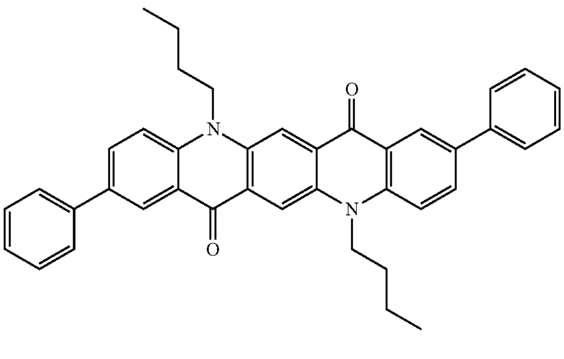

-continued

B-3

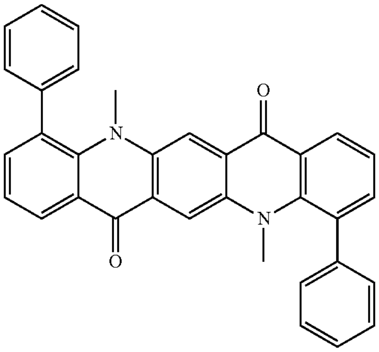

B-4

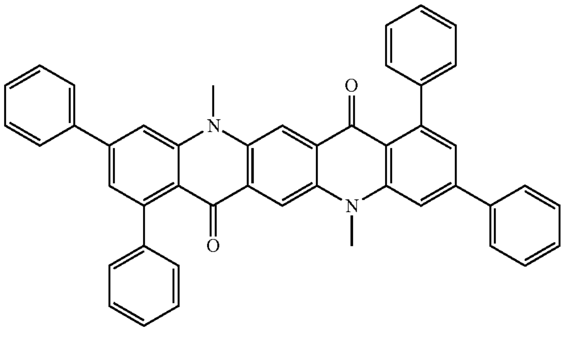

-continued
B-5
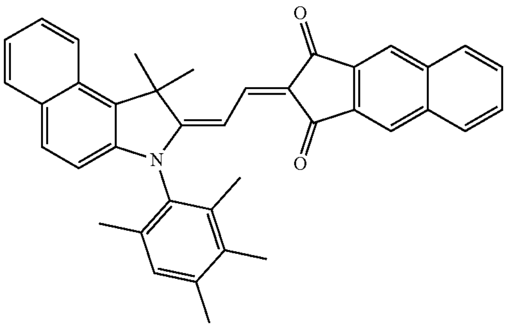
B-6
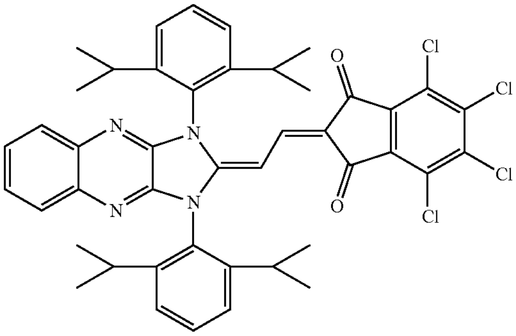
B-7
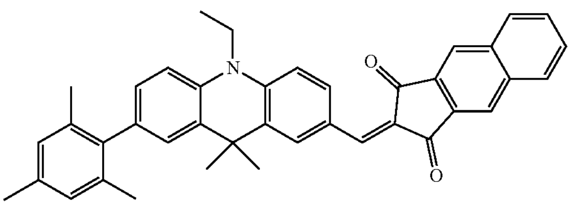
B-8
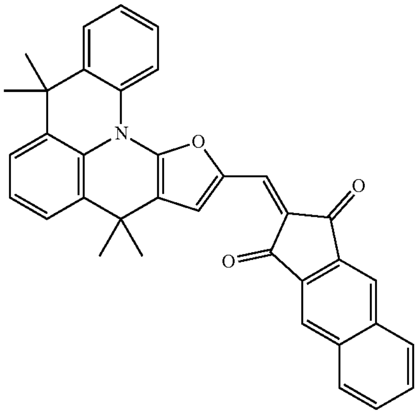
-continued
B-9
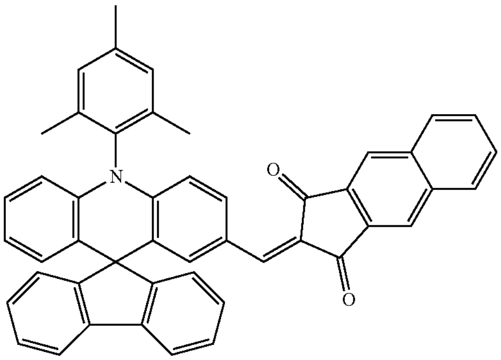
B-10
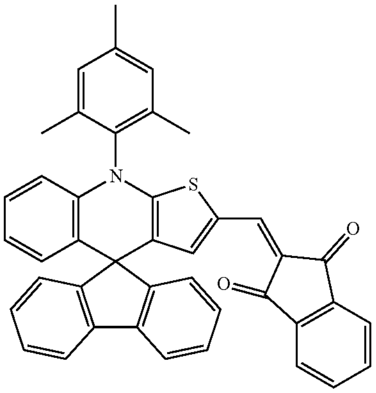
B-11
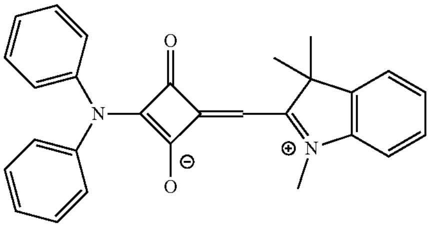
B-12
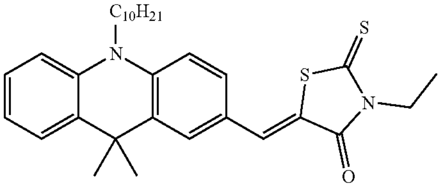
B-13
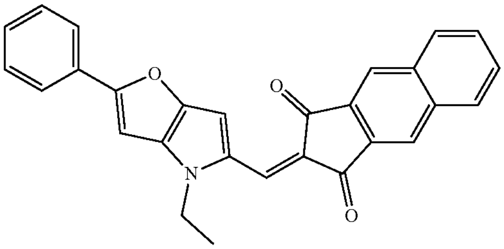

-continued
B-14
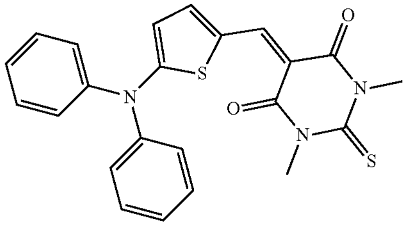
B-15
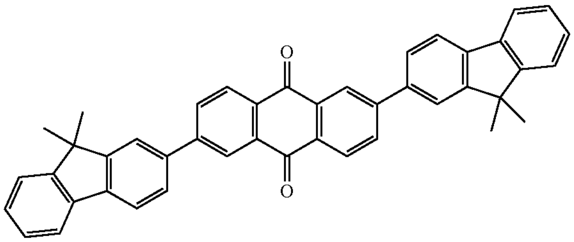
B-16
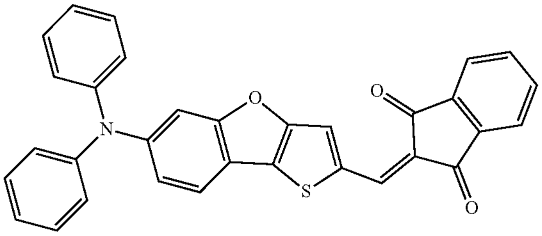
B-17
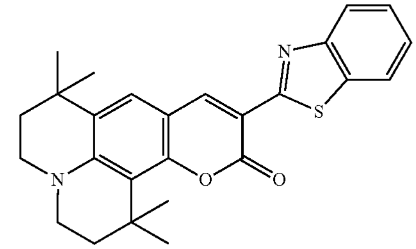
B-18
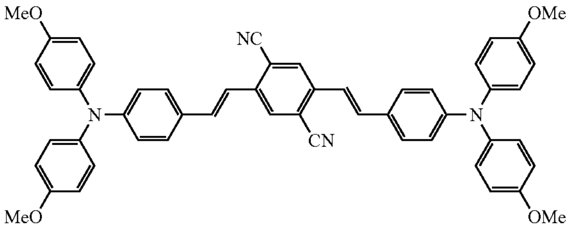
B-19
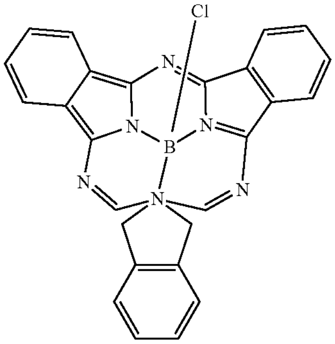
-continued
B-20
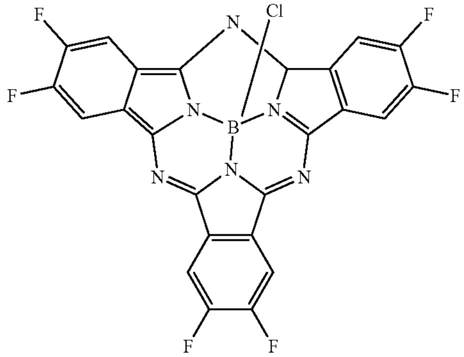
B-21
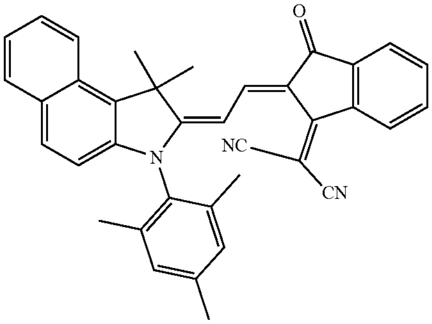
B-22
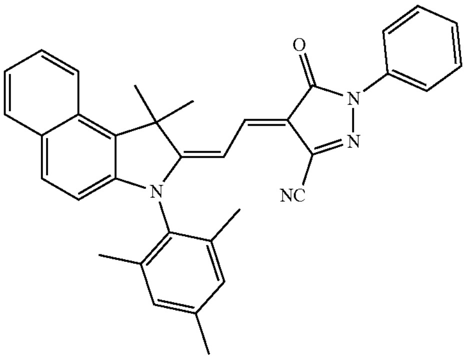
B-23
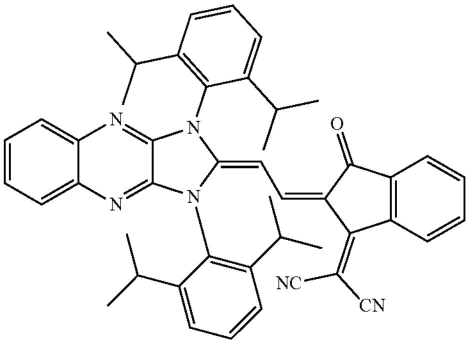

-continued
B-24
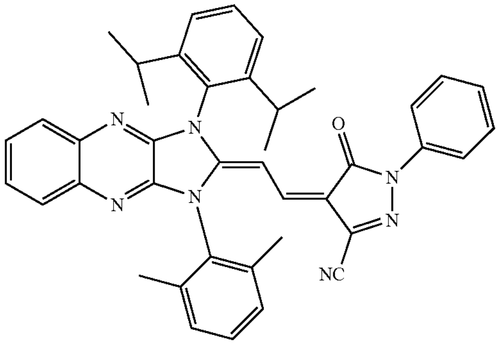
B-25
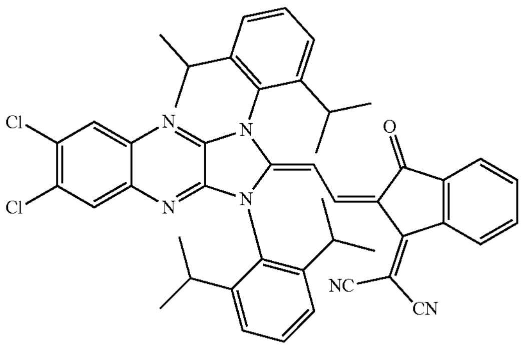
B-26
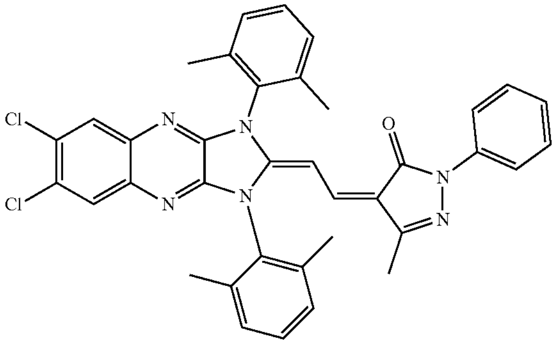
B-27
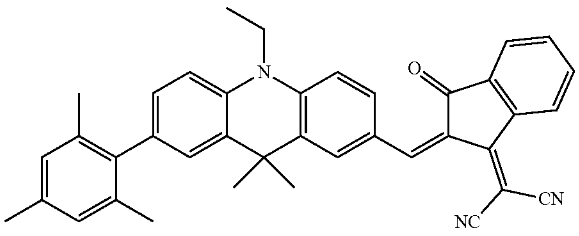
-continued
B-28
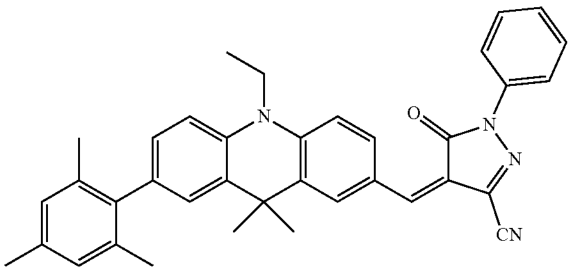
B-29
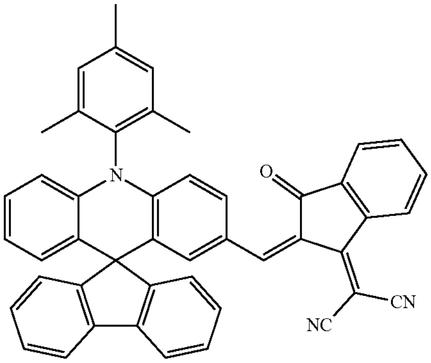
B-30
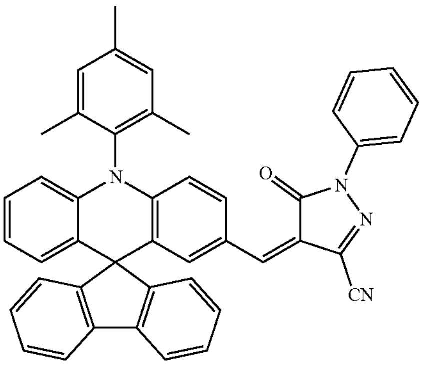
B-31
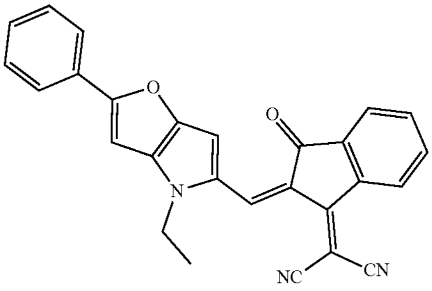
B-32
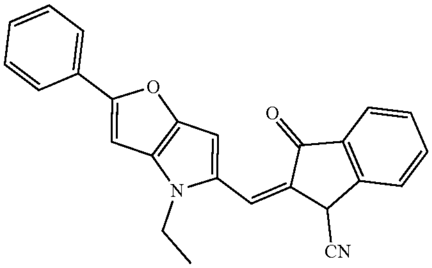

-continued

B-33

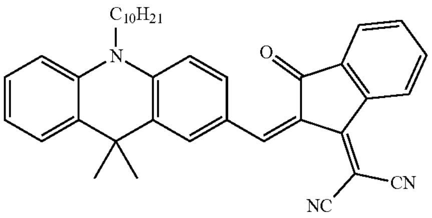

B-34

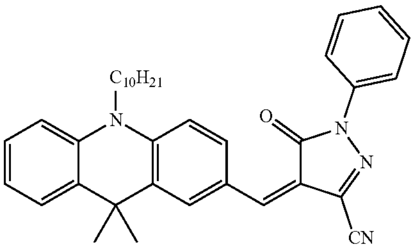

B-35

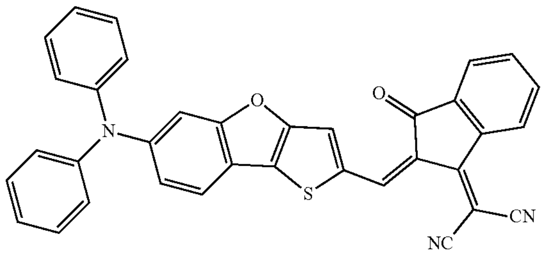

B-36

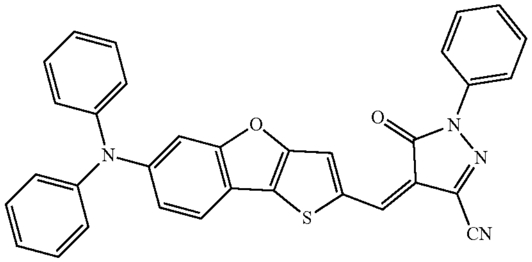

[n-type Semiconductor Material]

Fullerene $C_{60}$ was used for the production of photoelectric conversion elements described later, as a n-type semiconductor material used for evaluations in Examples.

Tests

Examples and Comparative Examples: Production of Photoelectric Conversion Element The photoelectric conversion element of the form illustrated in FIG. 2 was produced using the obtained compounds. Here, the photoelectric conversion element includes a lower electrode 11, an electron blocking film 16A, a photoelectric conversion film 12, a positive hole blocking film 16B, and an upper electrode 15.

Specifically, an amorphous ITO was formed into a film on a glass substrate by a sputtering method to form the lower electrode 11 (thickness: 30 nm). Furthermore, a compound (C-1) described below was formed into a film on the lower electrode 11 by a vacuum thermal vapor deposition method to form the electron blocking film 16A (thickness: 10 nm).

Furthermore, in a state where the temperature of the substrate is controlled to 25° C., the compound for evaluation (any of the above-described compounds for evaluation), the n-type semiconductor material (fullerene $C_{60}$), and the coloring agent (any of the coloring agents for evaluation described above) were set on the electron blocking film 16A at a vapor deposition rate of 2.0 Å/sec, and co-vapor deposition was carried out by a vacuum vapor deposition method so that each of them had a thickness of 100 nm in terms of a single layer, and a photoelectric conversion film 12 of which the total thickness was 300 nm, which is the mixture layer, was formed (photoelectric conversion film forming step).

Furthermore, a compound (C-2) described below was formed into a film on the photoelectric conversion film 12 to form the positive hole blocking film 16B (thickness: 10 nm).

Furthermore, amorphous ITO was formed into a film on the positive hole blocking film 16B by a sputtering method to form the upper electrode 15 (the transparent conductive film) (thickness: 10 nm). A SiO film was formed as a sealing layer on the upper electrode 15 by a vacuum vapor deposition method, and thereafter, an aluminum oxide ($Al_2O_3$) layer was formed thereon by an atomic layer chemical vapor deposition (ALCVD) method to produce a photoelectric conversion element (simply referred to as an “element”) obtained in each of Examples or Comparative Examples.

By using the same combination of the compounds for evaluation and the coloring agents for evaluation, 10 elements of the same kind prepared in the same procedure were produced and subjected to evaluations described below.

C-1

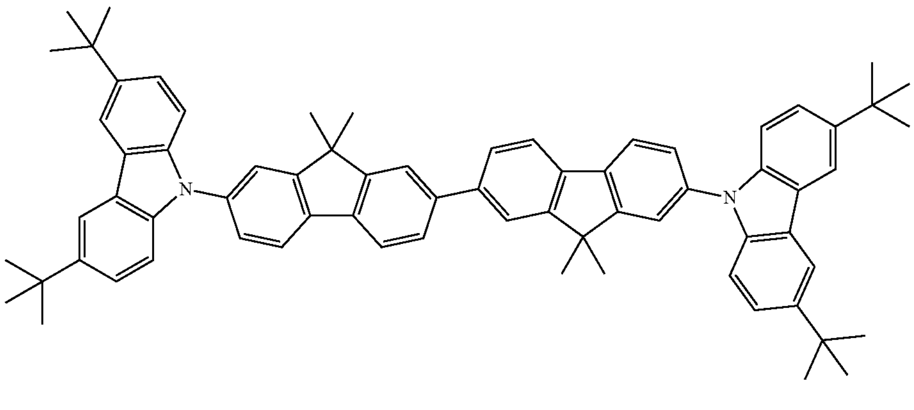

-continued

C-2

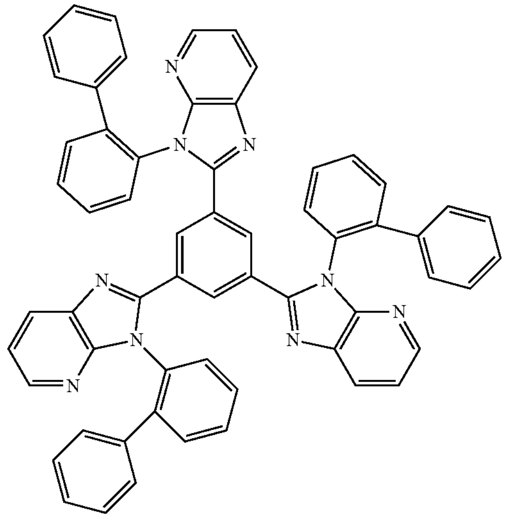

<Evaluation of Photoelectric Conversion Efficiency (Sensitivity)>

The drive of each of the obtained elements was confirmed. A voltage was applied to each element to have an electric field strength of $2.0\times10^5$ V/cm. Thereafter, light was emitted from the upper electrode (transparent conductive film) side to evaluate the photoelectric conversion efficiency (external quantum efficiency) at 450 nm. The external quantum efficiency was measured using a constant energy quantum efficiency measuring device manufactured by Optel Co., Ltd. The amount of light emitted was 50 μW/$cm^2$.

An external quantum efficiency of each of the ten manufactured elements of the same kind were measured, and an average external quantum efficiency was used as the external quantum efficiency of the elements of that kind.

The external quantum efficiency was evaluated as “AA” in a case of 95% or more, evaluated as “A” in a case of 92% or more and less than 95%, evaluated as “B” in a case of 90% or more and less than 92%, evaluated as “C” in a case of 87% or more and less than 90%, “D” in a case of 85% or more and less than 87%, evaluated as “E” in a case of 82% or more and less than 85%, and evaluated as “F” in a case of less than 82%.

Practically, the evaluations of “A”, “B”, “C”, and “D” are preferable.

<Measurement of Responsiveness>

Each of the obtained elements was used to perform the following evaluation of responsiveness.

Specifically, a voltage was applied to each element to have a strength of $2.0\times10^5$ V/cm. Thereafter, light emitting diodes (LEDs) were instantaneously turned on to emit light from an upper electrode (transparent conductive film) side, and a photocurrent at that time was measured with an oscilloscope. At this time, assuming that the current intensity (signal intensity) before light emission was 0%, and the maximum signal intensity measured by light emission was 100%, a time (rise time) until the signal intensity reached from 0% to 97% after light emission was determined for each element.

The rise time of each of the produced 10 elements of the same kind was measured, and an average rise time was used as the rise time of the elements of that kind.

A relative value of a rise time of each element was obtained, where a rise time of an element of Comparative Example 1 was set to 1.

The responsiveness was evaluated as “AA” in a case where the relative value of the rise time is less than 0.10, evaluated as “A” in a case of 0.10 or more and less than 0.15, evaluated as “B” in a case of 0.15 or more and less than 0.20, evaluated as “C” in a case of 0.20 or more and less than 0.25, evaluated as “D” in a case of 0.25 or more and less than 0.30, evaluated as “E” in a case of 0.30 or more and less than 1.00, and evaluated as “F” in a case of 1.00 or more.

Practically, the evaluations of “A”, “B”, “C”, and “D” are preferable.

<Evaluation of Preventing Properties of Variation in Response>

A rise time was measured for each of the produced ten elements of the same kind in the same manner as in the above-described <Measurement of Responsiveness>. An average value of the rise times of the 10 elements was standardized as 1, and the standard deviation of the rise times of the 10 elements was obtained to evaluate preventing properties of variation in response.

The preventing properties of variation in response was evaluated as “AA” in a case where a value of the standard deviation is less than 0.01, evaluated as “A” in a case of 0.01 or more and less than 0.02, evaluated as “B” in a case of 0.02 or more and less than 0.03, evaluated as “C” in a case of 0.03 or more and less than 0.04, evaluated as “D” in a case of 0.04 or more and less than 0.05, evaluated as “E” in a case of 0.05 or more and less than 0.10, and evaluated as “F” in a case of 0.10 or more.

The standard deviation can be calculated by the following Equation.

s: Standard deviation n: 10 x: 1 xi: Rise time of i-th element in a case where the average value of the rise times of the 10 elements is standardized as 1.

$$s=\sqrt{\frac{1}{n}\sum_{i=1}^{n}(x_i-x)^2}$$

<Evaluation of Preventing Properties of Variation in Sensitivity>

Each external quantum efficiency of the produced 10 elements of the same kind was measured in the same as in the above-described <Evaluation of Photoelectric Conversion Efficiency (Sensitivity)>. An average value of the sensitivities (external quantum efficiencies) of the 10 elements at 450 nm was standardized as 1, and a standard deviation of the sensitivities of the 10 elements was obtained to evaluate preventing properties of variation in sensitivity.

In Equation shown in the evaluation method of <Evaluation of Preventing Properties of Variation in Response>, the standard deviation for evaluating the preventing properties of variation in sensitivity can be calculated by a calculation equation in which xi is substituted with a "sensitivity of the i-th element in the case where the average value of the sensitivities of the 10 elements was standardized as 1".

The preventing properties of variation in sensitivity was evaluated as "A" in a case where a value of the standard deviation is less than 0.0100, evaluated as "B" in a case of 0.0100 or more and less than 0.0125, evaluated as "C" in a case of 0.0125 or more and less than 0.0150, evaluated as "D" in a case of 0.0150 or more and less than 0.0175, evaluated as "E" in a case of 0.0175 or more and less than 0.0200, evaluated as "F" in a case of 0.0200 or more and less than 0.0225, evaluated as "G" in a case of 0.0225 or more and less than 0.0250, evaluated as "H" in a case of 0.0250 or more and less than 0.0275, evaluated as "I" in a case of 0.0275 or more and less than 0.0300, evaluated as "J" in a case of 0.0300 or more and less than 0.0350, evaluated as "K" in a case of 0.0350 or more and less than 0.0400, evaluated as "L" in a case of 0.0400 or more and less than 0.0500, and evaluated as "M" in a case of 0.0500 or more.

<Evaluation of Photoelectric Conversion Efficiency (Sensitivity) to Wavelength of 480 nm>

The sensitivity to a wavelength of 480 nm was evaluated by the same procedure as in <Evaluation of Photoelectric Conversion Efficiency (Sensitivity)> using a wavelength of 450 nm, except that the photoelectric conversion efficiency (external quantum efficiency) at 480 nm was evaluated by emitting light from the upper electrode (transparent conductive film) side.

<Measurement of Responsiveness at Wavelength of 480 nm>

The responsiveness was evaluated in the same procedure as in <Measurement of Responsiveness> using a wavelength of 450 nm, except that individual elements obtained in <Evaluation of Photoelectric Conversion Efficiency (Sensitivity) to Wavelength of 480 nm> were used.

<Ratio of Each Component>

Elements were produced in the same procedure, except for the following procedure employed in <Examples and Comparative Examples: Production of Photoelectric Conversion Element>.

The compound for evaluation (any of the above-described compounds for evaluation), the n-type semiconductor material (fullerene $C_{60}$), and the coloring agent (any of the coloring agents for evaluation described above) were set on the electron blocking film 16A at the vapor deposition rate to have the ratio of each predetermined component shown in Table 3, and co-vapor deposition was carried out by a vacuum vapor deposition method in terms of a single layer, and a photoelectric conversion film 12 of which the total thickness was 300 nm, which is the mixture layer, was formed (photoelectric conversion film forming step).

<Evaluation of Photoelectric Conversion Efficiency (Sensitivity) to Wavelength of 480 nm> and <Measurement of Responsiveness at Wavelength of 480 nm> of the obtained elements were evaluated.

The features of the photoelectric conversion element of each of Examples and Comparative Examples and the results of tests conducted using the photoelectric conversion element of each Examples and Comparative Examples are shown in Tables 1 to 3 below.

In Tables, the "Kind" column in the "Compound" column indicates the kinds of the compounds used as the compounds for evaluation in the production of the elements.

In the "D" column in the "Compound" column, in a case where the specific compound is used as the compound for evaluation, the group represented by D in the specific compound is any of the groups represented by Formula (1-1) to Formula (1-15).

In the "A" column in the "Compound" column, in a case where the specific compound is used as the compound for evaluation, the group represented by D in the specific compound is any of the groups represented by Formula (3-1) to Formula (3-14).

In the "$Ar^A$ Formula" column in the "Compound" column, in a case where the specific compound represented by Formula (1A) is used as the compound for evaluation, the group represented by $Ar^A$ in the specific compound represents the corresponding Formula.

The "coloring agent" column and the "n-type semiconductor material" column indicate the kind of the coloring agent or the n-type semiconductor material used in the production of the elements, respectively.

The "Specific compound:Coloring agent:n-type semiconductor material" column indicates that the film thickness of the specific compound in terms of a single layer:the film thickness of the coloring agent in terms of a single layer:the film thickness of the n-type semiconductor material in terms of a single layer.

TABLE 1

| | Compound | | | Coloring | n-Type semiconductor | Evaluation | | | |
|---|---|---|---|---|---|---|---|---|---|
| | Kind | D | A | agent | material | Sensitivity | Responsiveness | Preventing properties of variation in response | Preventing properties of variation in sensitivity |
| Example 1 | D-2 | 1-1 | 3-5 | B-1 | Fullerene C60 | AA | A | A | J |
| Example 2 | D-2 | 1-1 | 3-5 | B-2 | Fullerene C60 | AA | A | A | J |
| Example 3 | D-2 | 1-1 | 3-5 | B-3 | Fullerene C60 | AA | A | A | J |

TABLE 1-continued

| | Compound | | | Coloring | n-Type semiconductor | Evaluation | | | |
|---|---|---|---|---|---|---|---|---|---|
| | Kind | D | A | agent | material | Sensitivity | Responsiveness | Preventing properties of variation in response | Preventing properties of variation in sensitivity |
| Example 4 | D-2 | 1-1 | 3-5 | B-4 | Fullerene C60 | AA | A | A | J |
| Example 5 | D-2 | 1-1 | 3-5 | B-5 | Fullerene C60 | AA | A | A | J |
| Example 6 | D-2 | 1-1 | 3-5 | B-6 | Fullerene C60 | AA | A | A | J |
| Example 7 | D-2 | 1-1 | 3-5 | B-7 | Fullerene C60 | AA | A | A | J |
| Example 8 | D-2 | 1-1 | 3-5 | B-8 | Fullerene C60 | AA | A | A | J |
| Example 9 | D-2 | 1-1 | 3-5 | B-9 | Fullerene C60 | AA | A | A | J |
| Example 10 | D-2 | 1-1 | 3-5 | B-10 | Fullerene C60 | AA | A | A | J |
| Example 11 | D-2 | 1-1 | 3-5 | B-11 | Fullerene C60 | AA | A | A | J |
| Example 12 | D-2 | 1-1 | 3-5 | B-12 | Fullerene C60 | AA | A | A | J |
| Example 13 | D-2 | 1-1 | 3-5 | B-13 | Fullerene C60 | AA | A | A | J |
| Example 14 | D-2 | 1-1 | 3-5 | B-14 | Fullerene C60 | AA | A | A | J |
| Example 15 | D-2 | 1-1 | 3-5 | B-15 | Fullerene C60 | AA | A | A | J |
| Example 16 | D-2 | 1-1 | 3-5 | B-16 | Fullerene C60 | AA | A | A | J |
| Example 17 | D-2 | 1-1 | 3-5 | B-17 | Fullerene C60 | AA | A | A | J |
| Example 18 | D-2 | 1-1 | 3-5 | B-18 | Fullerene C60 | AA | A | A | J |
| Example 19 | D-2 | 1-1 | 3-5 | B-19 | Fullerene C60 | AA | A | A | J |
| Example 20 | D-2 | 1-1 | 3-5 | B-20 | Fullerene C60 | AA | A | A | J |
| Example 21 | D-3 | 1-1 | 3-3 | B-5 | Fullerene C60 | AA | A | A | K |
| Example 22 | D-4 | 1-1 | 3-6 | B-6 | Fullerene C60 | AA | A | A | K |
| Example 23 | D-6 | 1-1 | 3-5 | B-7 | Fullerene C60 | AA | A | A | J |
| Example 24 | D-7 | 1-1 | 3-2 | B-8 | Fullerene C60 | A | B | B | K |
| Example 25 | D-9 | 1-1 | 3-2 | B-9 | Fullerene C60 | A | B | B | K |
| Example 26 | D-12 | 1-5 | 3-3 | B-10 | Fullerene C60 | AA | A | A | J |
| Example 27 | D-8 | 1-5 | 3-2 | B-2 | Fullerene C60 | D | B | B | J |
| Example 28 | D-13 | 1-5 | 3-2 | B-3 | Fullerene C60 | A | B | B | J |
| Example 29 | D-14 | 1-8 | 3-5 | B-4 | Fullerene C60 | AA | A | A | J |
| Example 30 | D-16 | 1-5 | 3-8 | B-14 | Fullerene C60 | C | D | D | H |
| Example 31 | D-17 | 1-9 | 3-5 | B-20 | Fullerene C60 | AA | A | A | G |
| Example 32 | D-11 | 1-2 | 3-5 | B-11 | Fullerene C60 | A | B | B | J |
| Example 33 | D-10 | 1-4 | 3-5 | B-15 | Fullerene C60 | AA | A | A | J |
| Example 34 | D-1 | 1-4 | 3-2 | B-18 | Fullerene C60 | D | D | D | K |
| Example 35 | D-20 | 1-3 | 3-1 | B-12 | Fullerene C60 | C | D | D | K |
| Example 36 | D-18 | 1-6 | 3-7 | B-13 | Fullerene C60 | C | D | D | J |
| Example 37 | D-19 | 1-7 | 3-7 | B-14 | Fullerene C60 | C | D | D | J |
| Example 38 | D-15 | 1-10 | 3-4 | B-16 | Fullerene C60 | D | D | D | L |
| Example 39 | D-15 | 1-10 | 3-4 | B-17 | Fullerene C60 | D | D | D | L |
| Example 40 | D-5 | 1-10 | 3-2 | B-1 | Fullerene C60 | C | D | D | K |
| Example 41 | D-21 | 1-1 | 3-8 | B-1 | Fullerene C60 | AA | A | A | I |
| Example 42 | D-22 | 1-10 | 3-5 | B-1 | Fullerene C60 | D | D | D | J |
| Example 43 | D-23 | 1-11 | 3-5 | B-3 | Fullerene C60 | C | C | C | J |
| Example 44 | D-24 | 1-12 | 3-5 | B-6 | Fullerene C60 | D | C | D | E |
| Example 45 | D-25 | 1-13 | 3-5 | B-9 | Fullerene C60 | D | D | C | F |
| Example 46 | D-26 | 1-14 | 3-5 | B-10 | Fullerene C60 | D | D | D | H |
| Example 47 | D-27 | 1-15 | 3-8 | B-14 | Fullerene C60 | C | C | C | E |
| Example 48 | D-28 | 1-5 | 3-5 | B-2 | Fullerene C60 | AA | A | A | I |
| Example 49 | D-29 | 1-2 | 3-9 | B-1 | Fullerene C60 | B | C | C | J |
| Example 50 | D-30 | 1-2 | 3-10 | B-1 | Fullerene C60 | B | C | C | H |
| Example 51 | D-31 | 1-5 | 3-9 | B-2 | Fullerene C60 | C | D | D | I |
| Example 52 | D-32 | 1-5 | 3-9 | B-2 | Fullerene C60 | C | D | D | I |
| Example 53 | D-33 | 1-6 | 3-9 | B-3 | Fullerene C60 | C | D | D | I |
| Example 54 | D-34 | 1-7 | 3-9 | B-4 | Fullerene C60 | D | D | D | I |
| Example 55 | D-35 | 1-7 | 3-10 | B-4 | Fullerene C60 | D | D | D | G |
| Example 56 | D-36 | 1-9 | 3-9 | B-5 | Fullerene C60 | A | B | B | G |
| Example 57 | D-37 | 1-9 | 3-10 | B-5 | Fullerene C60 | A | B | B | E |
| Example 58 | D-38 | 1-9 | 3-10 | B-5 | Fullerene C60 | A | B | B | E |
| Example 59 | D-39 | 1-10 | 3-9 | B-6 | Fullerene C60 | D | D | D | J |
| Example 60 | D-40 | 1-11 | 3-9 | B-7 | Fullerene C60 | C | D | D | I |
| Example 61 | D-41 | 1-11 | 3-9 | B-7 | Fullerene C60 | C | D | D | J |
| Example 62 | D-42 | 1-12 | 3-9 | B-8 | Fullerene C60 | B | C | C | E |
| Example 63 | D-43 | 1-12 | 3-10 | B-8 | Fullerene C60 | B | C | C | C |
| Example 64 | D-44 | 1-12 | 3-9 | B-8 | Fullerene C60 | B | C | C | E |
| Example 65 | D-45 | 1-12 | 3-10 | B-8 | Fullerene C60 | B | C | C | C |
| Example 66 | D-46 | 1-13 | 3-9 | B-9 | Fullerene C60 | D | D | D | F |
| Example 67 | D-47 | 1-13 | 3-10 | B-9 | Fullerene C60 | D | D | D | D |
| Example 68 | D-48 | 1-14 | 3-9 | B-10 | Fullerene C60 | C | D | D | H |
| Example 69 | D-49 | 1-14 | 3-10 | B-10 | Fullerene C60 | C | D | D | F |
| Example 70 | D-50 | 1-15 | 3-9 | B-11 | Fullerene C60 | C | D | D | F |
| Example 71 | D-51 | 1-15 | 3-10 | B-11 | Fullerene C60 | C | D | D | D |
| Example 72 | D-52 | 1-9 | 3-8 | B-14 | Fullerene C60 | A | B | B | F |
| Example 73 | D-53 | 1-12 | 3-8 | B-14 | Fullerene C60 | B | C | C | D |
| Example 74 | D-54 | 1-2 | 3-8 | B-14 | Fullerene C60 | B | C | C | I |
| Example 75 | D-55 | 1-14 | 3-8 | B-14 | Fullerene C60 | C | D | D | G |

TABLE 1-continued

| | Compound | | | Coloring | n-Type semiconductor | Evaluation | | | |
|---|---|---|---|---|---|---|---|---|---|
| | Kind | D | A | agent | material | Sensitivity | Responsiveness | Preventing properties of variation in response | Preventing properties of variation in sensitivity |
| Example 76 | D-56 | 1-9 | 3-11 | B-6 | Fullerene C60 | A | B | B | C |
| Example 77 | D-57 | 1-9 | 3-10 | B-6 | Fullerene C60 | A | B | B | E |
| Example 78 | D-58 | 1-9 | 3-11 | B-6 | Fullerene C60 | A | B | B | C |
| Example 79 | D-59 | 1-9 | 3-11 | B-6 | Fullerene C60 | A | B | B | C |
| Example 80 | D-60 | 1-12 | 3-11 | B-6 | Fullerene C60 | B | C | C | A |
| Example 81 | D-61 | 1-12 | 3-10 | B-6 | Fullerene C60 | B | C | C | C |
| Example 82 | D-62 | 1-12 | 3-8 | B-6 | Fullerene C60 | B | C | C | D |
| Example 83 | D-63 | 1-12 | 3-11 | B-6 | Fullerene C60 | B | C | C | A |
| Example 84 | D-64 | 1-11 | 3-11 | B-6 | Fullerene C60 | D | D | D | F |
| Example 85 | D-65 | 1-5 | 3-11 | B-6 | Fullerene C60 | C | D | D | E |
| Example 86 | D-66 | 1-9 | 3-8 | B-6 | Fullerene C60 | A | B | B | F |
| Example 87 | D-67 | 1-12 | 3-8 | B-6 | Fullerene C60 | B | C | C | D |
| Example 88 | D-68 | 1-12 | 3-11 | B-6 | Fullerene C60 | B | C | C | A |
| Example 89 | D-69 | 1-12 | 3-11 | B-6 | Fullerene C60 | B | C | C | A |
| Example 90 | D-70 | 1-12 | 3-11 | B-6 | Fullerene C60 | B | C | C | A |
| Example 91 | D-71 | 1-9 | 3-8 | B-6 | Fullerene C60 | B | C | C | F |
| Example 92 | D-72 | 1-9 | 3-8 | B-6 | Fullerene C60 | B | C | C | F |
| Example 93 | D-73 | 1-6 | 3-11 | B-6 | Fullerene C60 | B | C | C | E |
| Example 94 | D-74 | 1-9 | 3-11 | B-6 | Fullerene C60 | B | C | C | E |
| Example 95 | D-75 | 1-9 | 3-11 | B-6 | Fullerene C60 | B | C | C | E |
| Example 96 | D-76 | 1-9 | 3-11 | B-6 | Fullerene C60 | B | C | C | C |
| Example 97 | D-77 | 1-9 | 3-11 | B-6 | Fullerene C60 | B | C | C | C |
| Example 98 | D-78 | 1-9 | 3-11 | B-6 | Fullerene C60 | B | C | C | C |
| Example 99 | D-79 | 1-9 | 3-11 | B-6 | Fullerene C60 | B | C | C | C |
| Example 100 | D-80 | 1-9 | 3-11 | B-6 | Fullerene C60 | B | C | C | C |
| Example 101 | D-81 | 1-12 | 3-11 | B-6 | Fullerene C60 | B | C | C | A |
| Example 102 | D-82 | 1-12 | 3-11 | B-6 | Fullerene C60 | B | C | C | A |
| Example 103 | D-83 | 1-12 | 3-11 | B-6 | Fullerene C60 | B | C | C | A |
| Example 104 | D-84 | 1-12 | 3-11 | B-6 | Fullerene C60 | B | C | C | A |
| Example 105 | D-85 | 1-12 | 3-11 | B-6 | Fullerene C60 | B | C | C | A |
| Example 106 | D-86 | 1-12 | 3-11 | B-6 | Fullerene C60 | B | C | C | A |
| Example 107 | D-87 | 1-12 | 3-11 | B-6 | Fullerene C60 | B | C | C | A |
| Example 108 | D-88 | 1-12 | 3-11 | B-6 | Fullerene C60 | B | C | C | A |
| Example 109 | D-89 | 1-12 | 3-11 | B-6 | Fullerene C60 | B | C | C | A |
| Example 110 | D-90 | 1-12 | 3-11 | B-6 | Fullerene C60 | B | C | C | A |
| Example 111 | D-91 | 1-12 | 3-11 | B-6 | Fullerene C60 | B | C | C | A |
| Example 112 | D-92 | 1-12 | 3-11 | B-6 | Fullerene C60 | B | C | C | A |
| Example 113 | D-93 | 1-12 | 3-11 | B-6 | Fullerene C60 | B | C | C | A |
| Example 114 | D-94 | 1-12 | 3-11 | B-6 | Fullerene C60 | B | C | C | A |
| Example 115 | D-95 | 1-12 | 3-11 | B-6 | Fullerene C60 | B | C | C | A |
| Example 116 | D-96 | 1-12 | 3-11 | B-6 | Fullerene C60 | B | C | C | A |
| Example 117 | D-97 | 1-12 | 3-11 | B-6 | Fullerene C60 | B | C | C | A |
| Example 118 | D-98 | 1-12 | 3-11 | B-6 | Fullerene C60 | B | C | C | A |
| Example 119 | D-99 | 1-12 | 3-11 | B-6 | Fullerene C60 | B | C | C | A |
| Example 120 | D-100 | 1-12 | 3-11 | B-6 | Fullerene C60 | B | C | C | A |
| Example 121 | D-101 | 1-12 | 3-10 | B-6 | Fullerene C60 | B | C | C | C |
| Example 122 | D-102 | 1-12 | 3-11 | B-6 | Fullerene C60 | B | C | C | A |
| Example 123 | D-103 | 1-12 | 3-13 | B-6 | Fullerene C60 | B | C | C | D |
| Example 124 | D-104 | 1-12 | 3-12 | B-6 | Fullerene C60 | B | C | C | B |
| Example 125 | D-90 | 1-12 | 3-11 | B-21 | Fullerene C60 | B | C | C | |
| Example 126 | D-90 | 1-12 | 3-11 | B-22 | Fullerene C60 | B | C | C | |
| Example 127 | D-90 | 1-12 | 3-11 | B-23 | Fullerene C60 | B | C | C | |
| Example 128 | D-90 | 1-12 | 3-11 | B-24 | Fullerene C60 | B | C | C | |
| Example 129 | D-90 | 1-12 | 3-11 | B-25 | Fullerene C60 | B | C | C | |
| Example 130 | D-90 | 1-12 | 3-11 | B-26 | Fullerene C60 | B | C | C | |
| Example 131 | D-90 | 1-12 | 3-11 | B-27 | Fullerene C60 | B | C | C | |
| Example 132 | D-90 | 1-12 | 3-11 | B-28 | Fullerene C60 | B | C | C | |
| Example 133 | D-90 | 1-12 | 3-11 | B-29 | Fullerene C60 | B | C | C | |
| Example 134 | D-90 | 1-12 | 3-11 | B-30 | Fullerene C60 | B | C | C | |
| Example 135 | D-90 | 1-12 | 3-11 | B-31 | Fullerene C60 | B | C | C | |
| Example 136 | D-90 | 1-12 | 3-11 | B-32 | Fullerene C60 | B | C | C | |
| Example 137 | D-90 | 1-12 | 3-11 | B-33 | Fullerene C60 | B | C | C | |
| Example 138 | D-90 | 1-12 | 3-11 | B-34 | Fullerene C60 | B | C | C | |
| Example 139 | D-90 | 1-12 | 3-11 | B-35 | Fullerene C60 | B | C | C | |
| Example 140 | D-90 | 1-12 | 3-11 | B-36 | Fullerene C60 | B | C | C | |
| Example 141 | D-140 | 1-12 | 3-11 | B-6 | Fullerene C60 | C | D | D | |
| Comparative Example 1 | R-1 | — | — | B-2 | Fullerene C60 | F | F | F | M |
| Comparative Example 2 | R-2 | — | — | B-4 | Fullerene C60 | E | F | F | M |
| Comparative Example 3 | R-3 | — | — | B-8 | Fullerene C60 | E | F | E | M |
| Comparative Example 4 | R-4 | — | — | B-4 | Fullerene C60 | F | E | F | M |
| Comparative Example 5 | R-5 | — | — | B-6 | Fullerene C60 | F | F | F | M |
| Comparative Example 6 | R-6 | — | — | B-12 | Fullerene C60 | E | E | F | M |

TABLE 1-continued

| | Compound | | | Coloring | n-Type semiconductor | Evaluation | | | |
|---|---|---|---|---|---|---|---|---|---|
| | Kind | D | A | agent | material | Sensitivity | Responsiveness | Preventing properties of variation in response | Preventing properties of variation in sensitivity |
| Comparative Example 7 | R-7 | — | — | B-17 | Fullerene C60 | F | F | E | M |
| Comparative Example 8 | R-8 | — | — | B-15 | Fullerene C60 | E | F | E | M |
| Comparative Example 9 | R-9 | — | — | B-16 | Fullerene C60 | F | F | E | M |
| Comparative Example 10 | R-1 | — | — | B-19 | — | E | E | F | M |
| Comparative Example 11 | R-10 | — | — | B-20 | Fullerene C60 | E | E | F | M |
| Comparative Example 12 | R-11 | — | — | B-2 | Fullerene C60 | F | F | F | M |
| Comparative Example 13 | R-12 | — | — | B-10 | Fullerene C60 | E | F | F | M |
| Comparative Example 14 | R-13 | — | — | B-13 | Fullerene C60 | E | F | F | M |
| Comparative Example 15 | R-14 | — | — | B-4 | Fullerene C60 | E | F | F | M |
| Comparative Example 16 | R-15 | — | — | B-7 | Fullerene C60 | E | F | F | M |
| Comparative Example 17 | R-16 | — | — | B-7 | Fullerene C60 | E | F | F | M |
| Comparative Example 18 | R-17 | — | — | B-3 | Fullerene C60 | E | F | F | M |
| Comparative Example 19 | R-18 | — | — | B-2 | Fullerene C60 | E | F | F | M |
| Comparative Example 20 | R-19 | — | — | B-6 | Fullerene C60 | F | F | F | M |
| Comparative Example 21 | R-20 | — | — | B-5 | Fullerene C60 | E | F | F | M |
| Comparative Example 22 | R-21 | — | — | B-14 | Fullerene C60 | F | F | F | M |
| Comparative Example 23 | R-22 | — | — | B-14 | Fullerene C60 | E | F | F | M |
| Comparative Example 24 | R-23 | — | — | B-5 | Fullerene C60 | F | F | F | M |
| Comparative Example 25 | R-24 | — | — | B-5 | Fullerene C60 | E | F | F | M |
| Comparative Example 26 | R-25 | — | — | B-6 | Fullerene C60 | E | F | F | M |
| Comparative Example 27 | R-26 | — | — | B-6 | Fullerene C60 | E | F | F | M |
| Comparative Example 28 | R-27 | — | — | B-6 | Fullerene C60 | E | F | F | M |
| Comparative Example 29 | R-28 | — | — | B-6 | Fullerene C60 | E | F | F | M |
| Comparative Example 30 | R-29 | — | — | B-6 | Fullerene C60 | E | F | F | M |
| Comparative Example 31 | R-30 | — | — | B-6 | Fullerene C60 | E | F | F | M |
| Comparative Example 32 | R-31 | — | — | B-6 | Fullerene C60 | E | F | F | M |
| Comparative Example 33 | R-32 | — | — | B-6 | Fullerene C60 | E | F | F | M |
| Comparative Example 34 | R-33 | — | — | B-6 | Fullerene C60 | E | F | F | M |
| Comparative Example 35 | R-34 | — | — | B-6 | Fullerene C60 | E | F | F | M |
| Comparative Example 36 | R-35 | — | — | B-6 | Fullerene C60 | E | F | F | M |
| Comparative Example 37 | R-36 | — | — | B-6 | Fullerene C60 | E | F | F | M |
| Comparative Example 38 | R-37 | — | — | B-6 | Fullerene C60 | E | F | F | M |
| Comparative Example 39 | R-38 | — | — | B-6 | Fullerene C60 | E | F | F | M |
| Comparative Example 40 | R-39 | — | — | B-6 | Fullerene C60 | E | F | F | M |
| Comparative Example 41 | R-40 | — | — | B-4 | Fullerene C60 | E | F | F | M |
| Comparative Example 42 | R-41 | — | — | B-6 | Fullerene C60 | E | F | F | M |
| Comparative Example 43 | R-42 | — | — | B-6 | Fullerene C60 | E | F | F | M |
| Comparative Example 44 | R-43 | — | — | B-6 | Fullerene C60 | E | F | F | M |
| Comparative Example 45 | R-44 | — | — | B-6 | Fullerene C60 | E | F | F | M |
| Comparative Example 46 | R-45 | — | — | B-6 | Fullerene C60 | E | F | F | M |
| Comparative Example 47 | R-46 | — | — | B-6 | Fullerene C60 | E | F | F | M |
| Comparative Example 48 | R-47 | — | — | B-6 | Fullerene C60 | E | F | F | M |

TABLE 2

| | Compound | | Coloring | n-Type semiconductor | Evaluation | |
|---|---|---|---|---|---|---|
| | Kind | $Ar^4$ Formula | agent | material | Sensitivity to wavelength of 480 nm | Responsiveness to wavelength of 480 nm |
| Example 201 | D-81 | 4-1 | B-6 | Fullerene C60 | A | A |
| Example 202 | D-82 | 4-1 | B-6 | Fullerene C60 | A | A |
| Example 202 | D-83 | 4-1 | B-6 | Fullerene C60 | A | A |
| Example 204 | D-84 | 4-1 | B-6 | Fullerene C60 | A | A |
| Example 205 | D-85 | 4-1 | B-6 | Fullerene C60 | A | A |
| Example 206 | D-86 | 4-1 | B-6 | Fullerene C60 | A | A |
| Example 207 | D-87 | 4-1 | B-6 | Fullerene C60 | A | A |
| Example 208 | D-88 | 4-1 | B-6 | Fullerene C60 | A | A |
| Example 209 | D-89 | 4-1 | B-6 | Fullerene C60 | A | A |
| Example 210 | D-90 | 4-1 | B-6 | Fullerene C60 | A | A |
| Example 211 | D-91 | 4-1 | B-6 | Fullerene C60 | A | A |
| Example 212 | D-92 | 4-1 | B-6 | Fullerene C60 | A | A |
| Example 213 | D-93 | 4-1 | B-6 | Fullerene C60 | A | A |
| Example 214 | D-94 | 4-1 | B-6 | Fullerene C60 | A | A |
| Example 215 | D-95 | 4-1 | B-6 | Fullerene C60 | A | A |
| Example 216 | D-96 | 4-1 | B-6 | Fullerene C60 | A | A |
| Example 217 | D-97 | 4-1 | B-6 | Fullerene C60 | A | A |
| Example 218 | D-98 | 4-1 | B-6 | Fullerene C60 | A | A |

TABLE 2-continued

| | Compound | | Coloring | n-Type semiconductor | Evaluation | |
|---|---|---|---|---|---|---|
| | Kind | $Ar^4$ Formula | agent | material | Sensitivity to wavelength of 480 nm | Responsiveness to wavelength of 480 nm |
| Example 219 | D-99 | 4-1 | B-6 | Fullerene C60 | A | A |
| Example 220 | D-100 | 4-1 | B-6 | Fullerene C60 | A | A |
| Example 221 | D-102 | 4-2 | B-6 | Fullerene C60 | A | A |
| Example 222 | D-103 | 4-2 | B-6 | Fullerene C60 | A | A |
| Example 223 | D-105 | 4-2 | B-6 | Fullerene C60 | A | A |
| Example 224 | D-104 | 4-3 | B-6 | Fullerene C60 | A | A |
| Example 225 | D-106 | 4-3 | B-6 | Fullerene C60 | A | A |
| Example 226 | D-107 | 4-3 | B-6 | Fullerene C60 | A | A |
| Example 227 | D-43 | 4-4 | B-6 | Fullerene C60 | A | A |
| Example 228 | D-60 | 4-4 | B-6 | Fullerene C60 | A | A |
| Example 229 | D-61 | 4-4 | B-6 | Fullerene C60 | A | A |
| Example 230 | D-62 | 4-4 | B-6 | Fullerene C60 | A | A |
| Example 231 | D-67 | 4-4 | B-6 | Fullerene C60 | A | A |
| Example 232 | D-108 | 4-4 | B-6 | Fullerene C60 | A | A |
| Example 233 | D-140 | 4-4 | B-6 | Fullerene C60 | A | A |
| Example 234 | D-63 | 4-5 | B-6 | Fullerene C60 | A | A |
| Example 235 | D-69 | 4-5 | B-6 | Fullerene C60 | A | A |
| Example 236 | D-109 | 4-5 | B-6 | Fullerene C60 | A | A |
| Example 237 | D-110 | 4-5 | B-6 | Fullerene C60 | A | A |
| Example 238 | D-111 | 4-5 | B-6 | Fullerene C60 | A | A |
| Example 239 | D-112 | 4-6 | B-6 | Fullerene C60 | A | A |
| Example 240 | D-113 | 4-6 | B-6 | Fullerene C60 | A | A |
| Example 241 | D-114 | 4-6 | B-6 | Fullerene C60 | A | A |
| Example 242 | D-115 | 4-6 | B-6 | Fullerene C60 | A | A |
| Example 243 | D-147 | 4-7 | B-6 | Fullerene C60 | A | A |
| Example 244 | D-148 | 4-7 | B-6 | Fullerene C60 | A | A |
| Example 245 | D-149 | 4-7 | B-6 | Fullerene C60 | A | A |
| Example 246 | D-150 | 4-7 | B-6 | Fullerene C60 | A | A |
| Example 247 | D-151 | 4-7 | B-6 | Fullerene C60 | A | A |
| Example 248 | D-155 | 4-8 | B-6 | Fullerene C60 | A | A |
| Example 249 | D-116 | 5-1 | B-6 | Fullerene C60 | C | C |
| Example 250 | D-117 | 5-2 | B-6 | Fullerene C60 | C | C |
| Example 251 | D-118 | 5-3 | B-6 | Fullerene C60 | C | C |
| Example 252 | D-119 | 5-4 | B-6 | Fullerene C60 | C | C |
| Example 253 | D-120 | 5-5 | B-6 | Fullerene C60 | C | C |
| Example 254 | D-121 | 5-5 | B-6 | Fullerene C60 | C | C |
| Example 255 | D-141 | 5-6 | B-6 | Fullerene C60 | C | C |
| Example 256 | D-142 | 5-6 | B-6 | Fullerene C60 | C | C |
| Example 257 | D-143 | 5-6 | B-6 | Fullerene C60 | C | C |
| Example 258 | D-144 | 5-6 | B-6 | Fullerene C60 | C | C |
| Example 259 | D-145 | 5-6 | B-6 | Fullerene C60 | C | C |
| Example 260 | D-146 | 5-6 | B-6 | Fullerene C60 | C | C |
| Example 261 | D-152 | 5-7 | B-6 | Fullerene C60 | C | C |
| Example 262 | D-122 | 6-1 | B-6 | Fullerene C60 | A | A |
| Example 263 | D-101 | 6-2 | B-6 | Fullerene C60 | A | A |
| Example 264 | D-123 | 6-2 | B-6 | Fullerene C60 | A | A |
| Example 265 | D-124 | 7-1 | B-6 | Fullerene C60 | B | B |
| Example 266 | D-125 | 7-1 | B-6 | Fullerene C60 | B | B |
| Example 267 | D-126 | 7-2 | B-6 | Fullerene C60 | B | B |
| Example 268 | D-127 | 8-1 | B-6 | Fullerene C60 | B | B |
| Example 269 | D-128 | 8-2 | B-6 | Fullerene C60 | B | B |
| Example 270 | D-129 | 9-1 | B-6 | Fullerene C60 | A | A |
| Example 271 | D-130 | 9-1 | B-6 | Fullerene C60 | A | A |
| Example 272 | D-131 | 9-2 | B-6 | Fullerene C60 | A | A |
| Example 273 | D-156 | 9-2 | B-6 | Fullerene C60 | A | A |
| Example 274 | D-132 | 9-3 | B-6 | Fullerene C60 | A | A |
| Example 275 | D-133 | 9-4 | B-6 | Fullerene C60 | A | A |
| Example 276 | D-134 | 9-5 | B-6 | Fullerene C60 | A | A |
| Example 277 | D-135 | 9-6 | B-6 | Fullerene C60 | A | A |
| Example 278 | D-136 | 9-7 | B-6 | Fullerene C60 | A | A |
| Example 279 | D-137 | 9-8 | B-6 | Fullerene C60 | A | A |
| Example 280 | D-138 | 10-1 | B-6 | Fullerene C60 | B | B |
| Example 281 | D-153 | 10-2 | B-6 | Fullerene C60 | B | B |
| Example 282 | D-154 | 10-3 | B-6 | Fullerene C60 | B | B |
| Example 283 | D-139 | 11-1 | B-6 | Fullerene C60 | B | B |
| Example 284 | D-116 | 5-1 | B-21 | Fullerene C60 | C | C |
| Example 285 | D-116 | 5-1 | B-22 | Fullerene C60 | C | C |
| Example 286 | D-116 | 5-1 | B-23 | Fullerene C60 | C | C |
| Example 287 | D-116 | 5-1 | B-24 | Fullerene C60 | C | C |
| Example 288 | D-116 | 5-1 | B-25 | Fullerene C60 | C | C |
| Example 289 | D-116 | 5-1 | B-26 | Fullerene C60 | C | C |
| Example 290 | D-116 | 5-1 | B-27 | Fullerene C60 | C | C |
| Example 291 | D-116 | 5-1 | B-28 | Fullerene C60 | C | C |
| Example 292 | D-116 | 5-1 | B-29 | Fullerene C60 | C | C |

TABLE 2-continued

| | Compound | | Coloring | n-Type semiconductor | Evaluation | |
|---|---|---|---|---|---|---|
| | Kind | $Ar^A$ Formula | agent | material | Sensitivity to wavelength of 480 nm | Responsiveness to wavelength of 480 nm |
| Example 293 | D-116 | 5-1 | B-30 | Fullerene C60 | C | C |
| Example 294 | D-116 | 5-1 | B-31 | Fullerene C60 | C | C |
| Example 295 | D-116 | 5-1 | B-32 | Fullerene C60 | C | C |
| Example 296 | D-116 | 5-1 | B-33 | Fullerene C60 | C | C |
| Example 297 | D-116 | 5-1 | B-34 | Fullerene C60 | C | C |
| Example 298 | D-116 | 5-1 | B-35 | Fullerene C60 | C | C |
| Example 299 | D-116 | 5-1 | B-36 | Fullerene C60 | C | C |
| Example 300 | D-130 | 9-1 | B-21 | Fullerene C60 | A | A |
| Example 301 | D-130 | 9-1 | B-22 | Fullerene C60 | A | A |
| Example 302 | D-130 | 9-1 | B-23 | Fullerene C60 | A | A |
| Example 303 | D-130 | 9-1 | B-24 | Fullerene C60 | A | A |
| Example 304 | D-130 | 9-1 | B-25 | Fullerene C60 | A | A |
| Example 305 | D-130 | 9-1 | B-26 | Fullerene C60 | A | A |
| Example 306 | D-130 | 9-1 | B-27 | Fullerene C60 | A | A |
| Example 307 | D-130 | 9-1 | B-28 | Fullerene C60 | A | A |
| Example 308 | D-130 | 9-1 | B-29 | Fullerene C60 | A | A |
| Example 309 | D-130 | 9-1 | B-30 | Fullerene C60 | A | A |
| Example 310 | D-130 | 9-1 | B-31 | Fullerene C60 | A | A |
| Example 311 | D-130 | 9-1 | B-32 | Fullerene C60 | A | A |
| Example 312 | D-130 | 9-1 | B-33 | Fullerene C60 | A | A |
| Example 313 | D-130 | 9-1 | B-34 | Fullerene C60 | A | A |
| Example 314 | D-130 | 9-1 | B-35 | Fullerene C60 | A | A |
| Example 315 | D-130 | 9-1 | B-36 | Fullerene C60 | A | A |
| Comparative Example 201 | R-30 | — | B-6 | Fullerene C60 | E | E |
| Comparative Example 202 | R-31 | — | B-6 | Fullerene C60 | E | E |
| Comparative Example 203 | R-33 | — | B-6 | Fullerene C60 | E | E |
| Comparative Example 204 | R-35 | — | B-6 | Fullerene C60 | E | E |
| Comparative Example 205 | R-36 | — | B-6 | Fullerene C60 | E | E |
| Comparative Example 206 | R-38 | — | B-6 | Fullerene C60 | E | E |
| Comparative Example 207 | R-39 | — | B-6 | Fullerene C60 | E | E |
| Comparative Example 208 | R-40 | — | B-6 | Fullerene C60 | E | E |
| Comparative Example 209 | R-41 | — | B-6 | Fullerene C60 | E | E |
| Comparative Example 210 | R-42 | — | B-6 | Fullerene C60 | E | E |
| Comparative Example 211 | R-43 | — | B-6 | Fullerene C60 | E | E |
| Comparative Example 212 | R-44 | — | B-6 | Fullerene C60 | E | E |
| Comparative Example 213 | R-45 | — | B-6 | Fullerene C60 | E | E |
| Comparative Example 214 | R-46 | — | B-6 | Fullerene C60 | E | E |
| Comparative Example 215 | R-47 | — | B-6 | Fullerene C60 | E | E |

TABLE 49

| | Compound | | | | Ratio of specific | Evaluation | |
|---|---|---|---|---|---|---|---|
| Table 3 | Kind | $Ar^A$ Formula | Coloring agent | n-Type semiconductor material | compound:coloring agent:n-type semiconductor material | Sensitivity to wavelength of 480 nm | Responsiveness to wavelength of 480 nm |
| Example 251 | D-118 | 5-3 | B-6 | Fullerene C60 | 1:1:1 | C | C |
| Example 401 | D-118 | 5-3 | B-6 | Fullerene C60 | 1:1:0.5 | C | C |
| Example 402 | D-118 | 5-3 | B-6 | Fullerene C60 | 1:1:0.3 | D | D |
| Example 403 | D-118 | 5-3 | B-6 | Fullerene C60 | 1.5:1:0.5 | D | D |
| Example 404 | D-146 | 5-6 | B-21 | Fullerene C60 | 1:1:1 | C | C |
| Example 405 | D-146 | 5-6 | B-21 | Fullerene C60 | 1:1:05 | C | C |
| Example 406 | D-146 | 5-6 | B-21 | Fullerene C60 | 1:1:0.3 | D | D |
| Example 407 | D-146 | 5-6 | B-21 | Fullerene C60 | 1.5:1:0.5 | D | D |
| Example 408 | D-122 | 6-1 | B-22 | Fullerene C60 | 1:1:1 | A | A |
| Example 409 | D-122 | 6-1 | B-22 | Fullerene C60 | 1:1:0.5 | A | A |
| Example 410 | D-122 | 6-1 | B-22 | Fullerene C60 | 1:1:0.3 | B | B |
| Example 411 | D-122 | 6-1 | B-22 | Fullerene C60 | 1.5:1:0.5 | B | B |
| Example 412 | D-109 | 4-5 | B-23 | Fullerene C60 | 1:1:1 | A | A |
| Example 413 | D-109 | 4-5 | B-23 | Fullerene C60 | 1:1:0.5 | A | A |
| Example 414 | D-109 | 4-5 | B-23 | Fullerene C60 | 1:1:0.3 | B | B |
| Example 415 | D-109 | 4-5 | B-23 | Fullerene C60 | 1.5:1:0.5 | B | B |
| Example 416 | D-125 | 7-1 | B-24 | Fullerene C60 | 1:1:1 | B | B |
| Example 417 | D-125 | 7-1 | B-24 | Fullerene C60 | 1:1:0.5 | B | B |
| Example 418 | D-125 | 7-1 | B-24 | Fullerene C60 | 1:1:0.3 | C | C |
| Example 419 | D-125 | 7-1 | B-24 | Fullerene C60 | 1.5:1:0.5 | C | C |
| Example 420 | D-153 | 10-2 | B-25 | Fullerene C60 | 1:1:1 | B | B |
| Example 421 | D-153 | 10-2 | B-25 | Fullerene C60 | 1:1:0.5 | B | B |

TABLE 49-continued

| Table 3 | Compound Kind | Compound Ar^A Formula | Coloring agent | n-Type semiconductor material | Ratio of specific compound:coloring agent:n-type semiconductor material | Evaluation Sensitivity to wavelength of 480 nm | Evaluation Responsiveness to wavelength of 480 nm |
|---|---|---|---|---|---|---|---|
| Example 422 | D-153 | 10-2 | B-25 | Fullerene C60 | 1:1:0.3 | C | C |
| Example 423 | D-153 | 10-2 | B-25 | Fullerene C60 | 1.5:1:0.5 | C | C |
| Example 424 | D-89 | 4-1 | B-26 | Fullerene C60 | 1:1:1 | A | A |
| Example 425 | D-89 | 4-1 | B-26 | Fullerene C60 | 1:1:0.5 | A | A |
| Example 426 | D-89 | 4-1 | B-26 | Fullerene C60 | 1:1:0.3 | B | B |
| Example 427 | D-89 | 4-1 | B-26 | Fullerene C60 | 1.5:1:0.5 | B | B |
| Example 428 | D-101 | 6-2 | B-27 | Fullerene C60 | 1:1:1 | A | A |
| Example 429 | D-101 | 6-2 | B-27 | Fullerene C60 | 1:1:0.5 | A | A |
| Example 430 | D-101 | 6-2 | B-27 | Fullerene C60 | 1:1:0.3 | B | B |
| Example 431 | D-101 | 6-2 | B-27 | Fullerene C60 | 1.5:1:0.5 | B | B |
| Example 432 | D-137 | 9-8 | B-28 | Fullerene C60 | 1:1:1 | A | A |
| Example 433 | D-137 | 9-8 | B-28 | Fullerene C60 | 1:1:0.5 | A | A |
| Example 434 | D-137 | 9-8 | B-28 | Fullerene C60 | 1:1:0.3 | B | B |
| Example 435 | D-137 | 9-8 | B-28 | Fullerene C60 | 1.5:1:0.5 | B | B |

From the results illustrated in Table 1, it was confirmed that the photoelectric conversion element according to the embodiment of the present invention using the specific compound for the photoelectric conversion film was excellent to exhibit the effect of the present invention.

On the other hand, in a case where the compounds different from the specific compounds were used, the sensitivity, responsiveness, preventing properties of variation in response, and preventing properties of variation in sensitivity of the obtained photoelectric conversion elements deteriorated as compared to that of the photoelectric conversion element according to the embodiment of the present invention.

EXPLANATION OF REFERENCES

10*a*, 10*b*: Photoelectric conversion element
11: Conductive film (lower electrode)
12: Photoelectric conversion film
15: Transparent conductive film (upper electrode)
16A: Electron blocking film
16B: Positive hole blocking film

What is claimed is:

1. A photoelectric conversion element comprising, in the following order:

a conductive film;

a photoelectric conversion film; and a transparent conductive film, wherein the photoelectric conversion film contains a compound represented by Formula (1) and a coloring agent,

A-D-A (1)

in Formula (1), D is a group represented by any of Formula (1-1) to Formula (1-15), A is a group represented by any of Formula (3-1) to Formula (3-14), in a case where D is a group represented by Formula (1-6), A is a group represented by any one of formula (3-1) to Formula (3-9) and formula (3-11) to Formula (3-14), where, two A's present in Formula (1) are each a group having the same structure, (1-1)

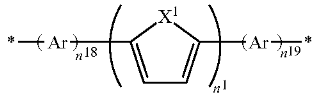

(1-2)

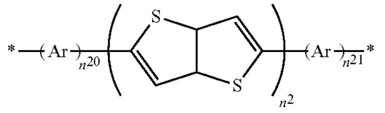

(1-3)

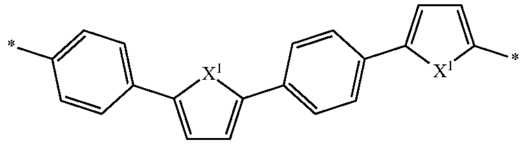

(1-4)

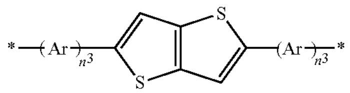

(1-5)

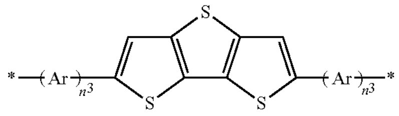

(1-6)

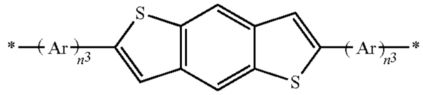

(1-7)

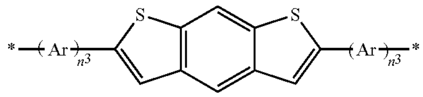

(1-8)

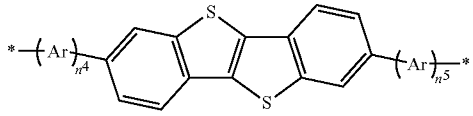

-continued (1-9)

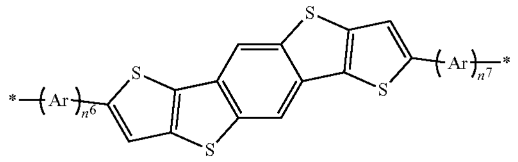

(1-11)

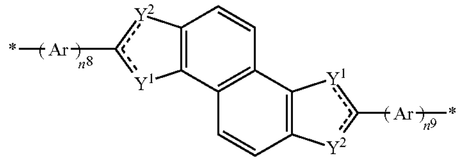

(1-12)

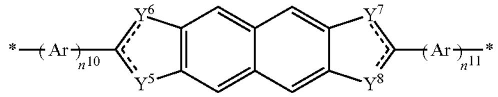

(1-13)

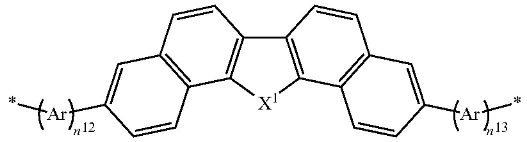

(1-14)

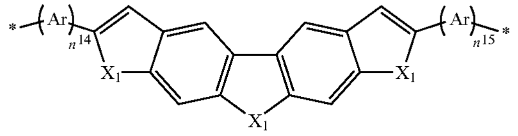

(1-15)

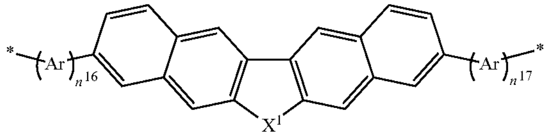

in Formula (1-1) to Formula (1-15), * represents a bonding position, $X^1$ represents a sulfur atom, an oxygen atom, a selenium atom, or a tellurium atom, one of $Y^1$ and $Y^2$ represents a sulfur atom, an oxygen atom, a selenium atom, or a tellurium atom, and another one represents —CH═, one of $Y^3$ and $Y^4$ represents a sulfur atom, an oxygen atom, a selenium atom, or a tellurium atom, and another one represents —CH═, one of $Y^5$ and $Y^6$ represents a sulfur atom, an oxygen atom, a selenium atom, or a tellurium atom, and another one represents —CH═, one of $Y^7$ and $Y^8$ represents a sulfur atom, an oxygen atom, a selenium atom, or a tellurium atom, and another one represents —CH═, $n^1$ represents an integer of 3 to 5, $n^2$ represents an integer of 3 to 5, $n^3$ represents an integer of 0 to 2, where, at least one of two $n^3$'s present in each of Formula (1-4) to Formula (1-7) represents an integer of 1 or 2, $n^4$ to $n^{21}$ each independently represent an integer of 0 to 2, Ar in Formula (1-1) and Formula (1-2) is a group represented by Formula (2-3), Ar in Formula (1-4) is a group represented by any of Formula (2-1) to Formula (2-3), Ar in Formula (1-5) to Formula (1-9) and Formula (1-11) to Formula (1-15) is a group represented by any of Formula (2-1) to Formula (2-4), (2-1)

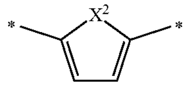

(2-2)

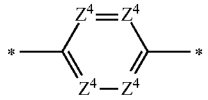

(2-3)

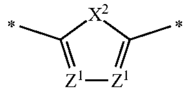

(2-4)

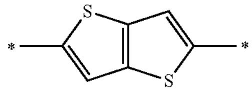

in Formula (2-1) to Formula (2-4), * represents a bonding position, $X^2$ represents a sulfur atom, an oxygen atom, a selenium atom, or a tellurium atom, $Z^1$ represents —CH═ or —N═, where, at least one of two $Z^1$'s in Formula (2-3) is —N═, $Z^4$ represents —CH═ or —N═, one or more of —CH═ included in a ring structure in a group represented by D in Formula (1) may be substituted with —$CR^3$═, $R^3$ represents a halogen atom, (3-1)

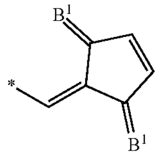

(3-2)

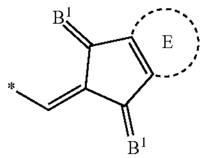

(3-3)

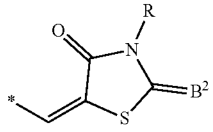

(3-4)

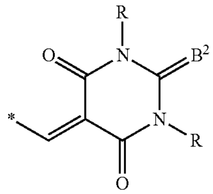

(3-5)

*—ArL—CN

-continued (3-6)

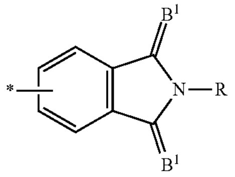

(3-7)

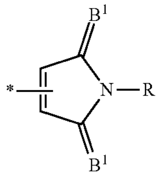

(3-8)

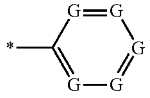

(3-9)

$*—ArL—(CF_3)_{m1}$ (3-10)

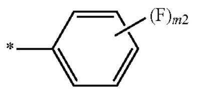

(3-11)

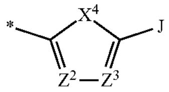

(3-12)

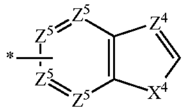

(3-13)

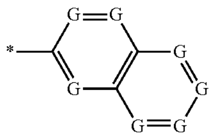

(3-14)

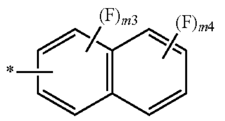

ArL =

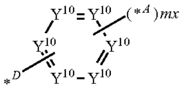

(Ar1)

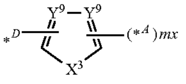

(Ar2)

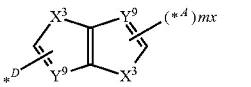

(Ar3)

in Formula (3-1) to Formula (3-14), * represents a bonding position, $B^1$ and $B^2$ each independently represent a sulfur atom, an oxygen atom, $=C(CN)_2$, or $=C(CN)(CO_2R^1)$, $R^1$ represents an alkyl group having 1 or 2 carbon atoms, which may have a halogen atom as a substituent, E represents an aromatic ring, which may have a group selected from the group consisting of a halogen atom, a methyl group, an ethyl group, and a methoxy group, as a substituent, where the methyl group, the ethyl group, and the methoxy group each may further have a halogen atom as a substituent, R represents an alkyl group having 1 or 2 carbon atoms, which may have a halogen atom as a substituent, G represents $—CR^G=$ or $—N=$, $R^G$ represents a hydrogen atom, a halogen atom, or a cyano group, where, at least one of five G's in Formula (3-8) is $—N=$, and at least one of seven G's in Formula (3-13) is $—N=$, m1 represents an integer of 1 to 5, m2 represents an integer of 1 to 5, m3 represents an integer of 0 to 3, m4 represents an integer of 0 to 4, where, in Formula (3-14), m3+m4 is 1 or more, one or more of $—CH=$ included in a ring structure in a group represented by Formula (3-10) and Formula (3-14) may be substituted with $—CR^4=$, $R^4$ represents a halogen atom other than a fluorine atom, $X^4$ represents a sulfur atom, an oxygen atom, a selenium atom, or a tellurium atom, $Z^2$ to $Z^5$ each independently represent $—CR^Z=$ or $—N=$, $R^Z$ represents a hydrogen atom or a halogen atom, where, at least one of $Z^2$ and $Z^3$ in Formula (3-11) is $—N=$, one of four $Z^5$'s in Formula (3-12) is a substituent including a carbon atom, J represents a hydrogen atom, a halogen atom, an aryl group, a heteroaryl group, or an alkyl group having 1 or 2 carbon atoms, which may have a halogen atom as a substituent, the aryl group and the heteroaryl group that are represented by J may have, as a substituent, one or both of a halogen atom and an alkyl group having 1 or 2 carbon atoms, which has a halogen atom as a further substituent, J and $Z^3$ may be bonded to each other to form an aromatic ring, which may have a halogen atom as a substituent, in a case where J and $Z^3$ are bonded to each other to form the aromatic ring, both $Z^2$ and $Z^3$ may be other than $—N=$, ArL is a group represented by any of Formula (Ar1) to Formula (Ar3), in Formula (Ar1) to Formula (Ar3), $*^D$ represents a bonding position with respect to a group represented by D, and $*^A$ represents a bonding position with respect to a group other than the group represented by D, mx is 1 in a group represented by any of Formula (Ar1) to Formula (Ar3) as ArL in Formula (3-5), and is the same value as m1 in a group represented by any of Formula (Ar1) to Formula (Ar3) as ArL in Formula (3-9), $X^3$ represents a sulfur atom, an oxygen atom, a selenium atom, or a tellurium atom, $Y^9$ represents $—CH=$, $—CR^2=$, or $—N=$, $R^2$ represents a halogen atom or an alkyl group having 1 or 2 carbon atoms, which may have a halogen atom as a substituent, $Y^{10}$ represents $—CH=$ or $—CR^3=$, $R^3$ represents a halogen atom, in a case where A is a group represented by Formula (3-5) and D is a group represented by Formula (1-8) in which $n^4$ and $n^5$ are each independently an integer of 1 or 2 and all Ar's are a group represented by Formula (2-1), ArL in Formula (3-5) is a group represented by Formula (Ar1) or Formula (Ar3), in a case where A is a group represented by Formula (3-8), D is a group represented by Formula (1-1) to Formula (1-7), a group represented by Formula (1-8) in which $n^4$ and $n^5$ are each independently an integer of 1 or 2 and Ar is a group represented by Formula (2-3), a group represented by Formula (1-9), a group represented by formula (1-11) in which $n^8$ and $n^9$ are each independently an integer of 1 or 2 and Ar is a group represented by Formula (2-3), a group represented by Formula (1-12) or Formula (1-13), a group represented by Formula (1-14) in which $n^{14}$ and $n^{15}$ are each independently an integer of 1 or 2, or a group represented by Formula (1-15), in a case where A is a group represented by Formula (3-9), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2, a group represented by Formula (1-6) in which $n^3$ is an integer of 1 or 2, a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-10), a group represented by Formula (1-11) in which $n^8$ and $n^9$ are each independently an integer of 1 or 2, a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, in a case where A is a group represented by Formula (3-10), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2 and Ar is a group represented by Formula (2-3), a group represented by Formula (1-6) in which $n^3$ is an integer of 1 or 2 and Ar is a group represented by Formula (2-3) or Formula (2-4), a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-11) in which $n^8$ and $n^9$ are each independently an integer of 1 or 2 and Ar is a group represented by Formula (2-3), a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, in a case where A is a group represented by Formula (3-11) and D is a group represented by Formula (1-8), J and $Z^3$ in Formula (3-11) may not be bonded to each other to form an aromatic ring, in a case where A is a group represented by Formula (3-11) and D is a group represented by Formula (1-11) in which $n^8$ and $n^9$ both are 0, J and $Z^3$ in Formula (3-11) may not be bonded to each other to form an aromatic ring, in a case where A is a group represented by Formula (3-11), and D is a group represented by Formula (1-12) in which $n^{10}$ and $n^{11}$ both are 1 and all Ar's are a group represented by Formula (2-2), J and $Z^3$ in Formula (3-11) may not be bonded to each other to form an aromatic ring, in a case where A is a group represented by Formula (3-12), D is a group represented by Formula (1-1) to Formula (1-7), a group represented by Formula (1-8) in which $n^4$ and $n^5$ are each independently an integer of 1 or 2, a group represented by Formula (1-9) or Formula (1-10), a group represented by formula (1-11) in which $n^8$ and $n^9$ are each independently an integer of 1 or 2 and Ar is a group represented by Formula (2-3) or Formula (2-4), or a group represented by Formula (1-12) to Formula (1-15), when A is a group represented by Formula (3-12) and D is a group represented by Formula (1-12), a case that $n^{10}$ and $n^{11}$ both are 1, and all Ar's are a group represented by Formula (2-2) is excluded, and in a case where A is a group represented by Formula (3-13), D is a group represented by Formula (1-1) to Formula (1-7), a group represented by Formula (1-8) in which $n^4$ and $n^5$ are each independently an integer of 1 or 2 and Ar is a group represented by Formula (2-3) or Formula (2-4), a group represented by Formula (1-9) or Formula (1-10), a group represented by formula (1-11) in which $n^8$ and $n^9$ are each independently an integer of 1 or 2 and Ar is a group represented by Formula (2-1), Formula (2-3) or Formula (2-4), or a group represented by Formula (1-12) to Formula (1-15).

2. The photoelectric conversion element according to claim 1, wherein the D is a group represented by any of Formula (1-5) to Formula (1-7), Formula (1-9), and Formula (1-12) to Formula (1-15).

3. The photoelectric conversion element according to claim 1, wherein the D is a group represented by any of Formula (1-9) and Formula (1-12) to Formula (1-15).

4. The photoelectric conversion element according to claim 1, wherein the D is a group represented by any of Formula (1-9), Formula (1-12), Formula (1-13), and Formula (1-15).

5. The photoelectric conversion element according to claim 1, wherein the D is a group represented by any of Formula (1-12), Formula (1-13), and Formula (1-15).

6. The photoelectric conversion element according to claim 1, wherein the D is a group represented by Formula (1-12).

7. The photoelectric conversion element according to claim 1, wherein the A is a group represented by any of Formula (3-1) to Formula (3-3), and Formula (3-5) to Formula (3-14).

8. The photoelectric conversion element according to claim 1, wherein the A is a group represented by any of Formula (3-5) and Formula (3-8) to Formula (3-14).

9. The photoelectric conversion element according to claim 1, wherein the A is a group represented by any of Formula (3-8) and Formula (3-10) to Formula (3-14).

10. The photoelectric conversion element according to claim 1, wherein the A is a group represented by any of Formula (3-10) to Formula (3-12), and Formula (3-14).

11. The photoelectric conversion element according to claim 1, wherein the A is a group represented by any of Formula (3-11) and Formula (3-12).

12. The photoelectric conversion element according to claim 1, wherein the A is a group represented by Formula (3-11).

13. The photoelectric conversion element according to claim 1, wherein the compound represented by Formula (1) has a molecular weight of 400 to 900.

14. The photoelectric conversion element according to claim 1, wherein the photoelectric conversion film is a mixture layer formed in a state where the compound represented by Formula (1) and the coloring agent are mixed.

15. A photoelectric conversion element comprising, in the following order:

a conductive film;

a photoelectric conversion film; and a transparent conductive film, wherein the photoelectric conversion film contains a compound represented by Formula (1A) and a coloring agent, (1A)

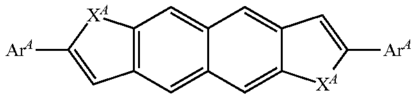

in Formula (1A), $X^A$ represents a sulfur atom or an oxygen atom, $Ar^A$ represents a group represented by any of Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), where, two $X^A$'s present in Formula (1A) are each a group having the same structure, and two $Ar^A$'s present in Formula (1A) are each a group having the same structure, (4-1)

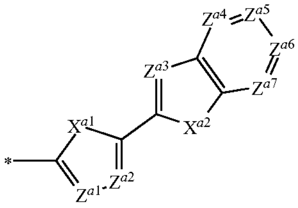

(4-2)

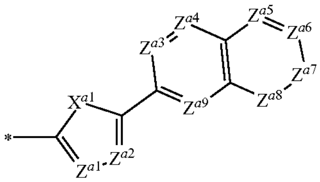

-continued (4-3)

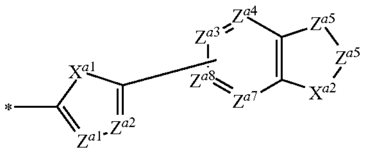

(4-4)

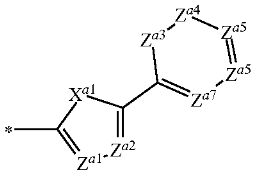

(4-5)

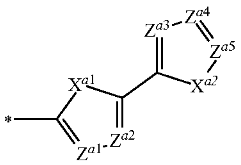

(4-6)

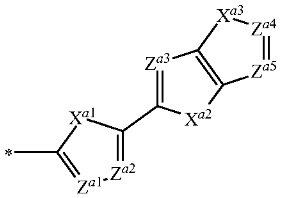

(4-7)

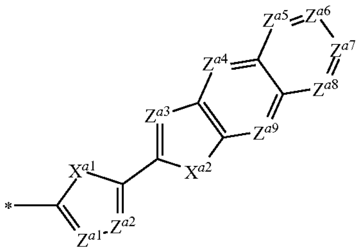

(4-8)

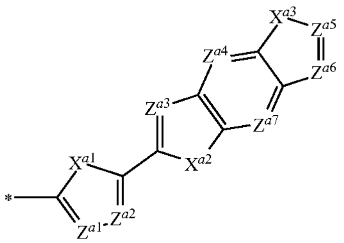

(5-1)

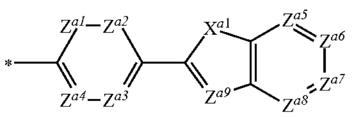

(5-2)

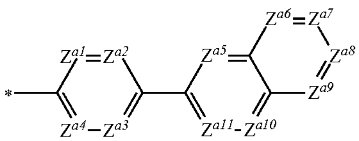

-continued
(5-3)
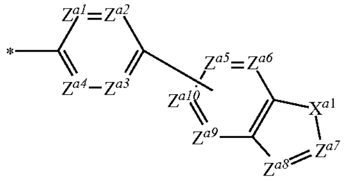
(5-4)
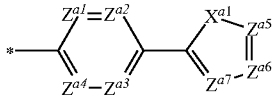
(5-5)
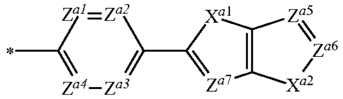
(5-6)
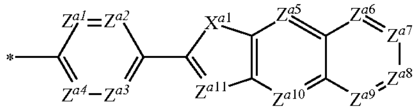
(5-7)
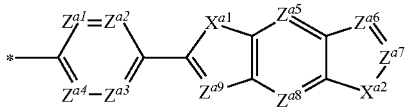
(6-1)
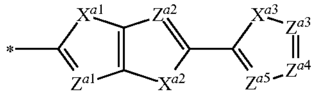
(6-2)
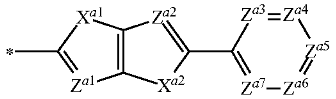
(7-1)
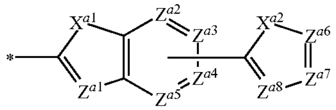
(7-2)
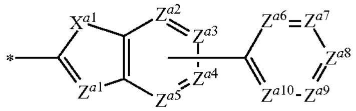
(8-1)
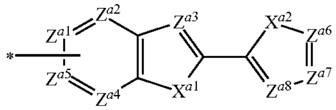
(8-2)
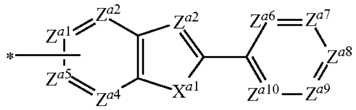
(9-1)
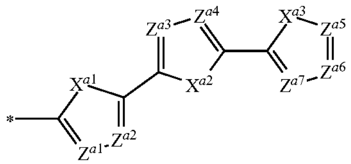
-continued
(9-2)
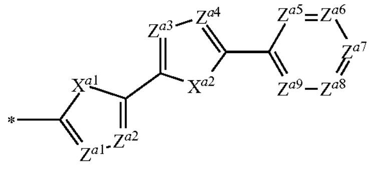
(9-3)
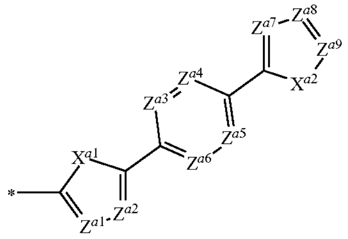
(9-4)
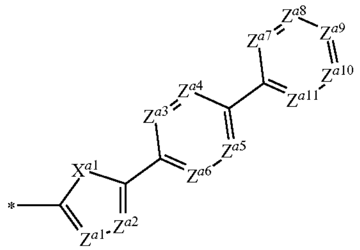
(9-5)
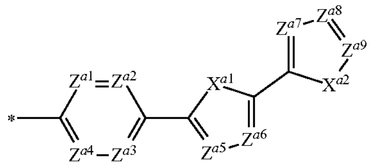
(9-6)
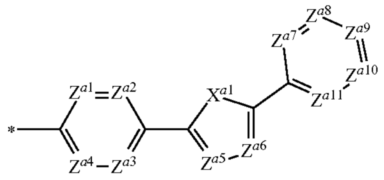
(9-7)
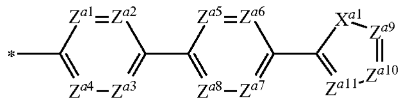
(9-8)
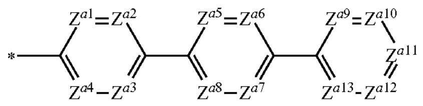
(10-1)
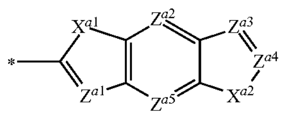
(10-2)
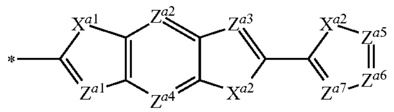

-continued (10-3)

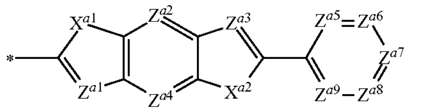

(11-1)

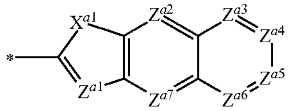

in Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), * represents a bonding position, $X^{a1}$ to $X^{a3}$ each independently represent a sulfur atom or an oxygen atom, $Z^{a1}$ to $Z^{a13}$ each independently represent —CH═, —CF═, or —N═, in Formula (4-1), at least one of $Z^{a1}$ to $Z^{a7}$ is —CF═ or —N═, in Formula (4-2), at least one of $Z^{a1}$ to $Z^{a9}$ is —CF═ or —N═, in Formula (4-3), at least one of $Z^{a1}$ to $Z^{a8}$ is —CF═ or —N═, in Formula (4-4), at least one of $Z^{a1}$ to $Z^{a7}$ is —CF═ or —N═, in Formula (4-5), at least one of $Z^{a1}$ to $Z^{a5}$ is —CF═ or —N═, in Formula (4-6), at least one of $Z^{a1}$ to $Z^{a5}$ is —CF═ or —N═, in Formula (4-7), at least one of $Z^{a1}$ to $Z^{a9}$ is —CF═ or —N═, in Formula (4-8), at least one of $Z^{a1}$ to $Z^{a7}$ is —CF═ or —N═, in Formula (5-1), at least one of $Z^{a1}$ to $Z^{a9}$ is —CF═ or —N═, in Formula (5-2), at least one of $Z^{a1}$ to $Z^{a11}$ is —CF═ or —N═, in Formula (5-3), at least one of $Z^{a1}$ to $Z^{a10}$ is —CF═ or —N═, in Formula (5-4), at least one of $Z^{a1}$ to $Z^{a7}$ is —CF═ or —N═, in Formula (5-5), at least one of $Z^{a1}$ to $Z^{a7}$ is —CF═ or —N═, in Formula (5-6), at least one of $Z^{a1}$ to $Z^{a11}$ is —CF═ or —N═, in Formula (5-7), at least one of $Z^{a1}$ to $Z^{a9}$ is —CF═ or —N═, in Formula (6-1), at least one of $Z^{a1}$ to $Z^{a5}$ is —CF═ or —N═, in Formula (6-2), at least one of $Z^{a1}$ to $Z^{a7}$ is —CF═ or —N═, in Formula (7-1), at least one of $Z^{a1}$ to $Z^{a8}$ is —CF═ or —N═, in Formula (7-2), at least one of $Z^{a1}$ to $Z^{a10}$ is —CF═ or —N═, in Formula (8-1), at least one of $Z^{a1}$ to $Z^{a8}$ is —CF═ or —N═, in Formula (8-2), at least one of $Z^{a1}$ to $Z^{a10}$ is —CF═ or —N═, in Formula (9-1), at least one of $Z^{a1}$ to $Z^{a7}$ is —CF═ or —N═, in Formula (9-2), at least one of $Z^{a1}$ to $Z^{a9}$ is —CF═ or —N═, in Formula (9-3), at least one of $Z^{a1}$ to $Z^{a9}$ is —CF═ or —N═, in Formula (9-4), at least one of $Z^{a1}$ to $Z^{a11}$ is —CF═ or —N═, in Formula (9-5), at least one of $Z^{a1}$ to $Z^{a9}$ is —CF═ or —N═, in Formula (9-6), at least one of $Z^{a1}$ to $Z^{a11}$ is —CF═ or —N═, in Formula (9-7), at least one of $Z^{a1}$ to $Z^{a11}$ is —CF═ or —N═, in Formula (9-8), at least one of $Z^{a1}$ to $Z^{a13}$ is —CF═ or —N═, in Formula (10-1), at least one of $Z^{a1}$ to $Z^{a5}$ is —CF═ or —N═, in Formula (10-2), at least one of $Z^{a1}$ to $Z^{a7}$ is —CF═ or —N═, in Formula (10-3), at least one of $Z^{a1}$ to $Z^{a9}$ is —CF═ or —N═, in Formula (11-1), at least one of $Z^{a1}$ to $Z^{a7}$ is —CF═ or —N═.

16. The photoelectric conversion element according to claim 15, wherein the $Ar^A$ is a group represented by any of Formula (4-1) to Formula (4-8), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1).

17. The photoelectric conversion element according to claim 15, wherein the $Ar^A$ is a group represented by any of Formula (4-1) to Formula (4-8), Formula (6-1) and Formula (6-2), and Formula (9-1) to Formula (9-8).

18. The photoelectric conversion element according to claim 15, wherein the compound represented by Formula (1A) has a molecular weight of 400 to 900.

19. The photoelectric conversion element according to claim 15, wherein the photoelectric conversion film is a mixture layer formed in a state where the compound represented by Formula (1A) and the coloring agent are mixed.

20. The photoelectric conversion element according to claim 1, further comprising one or more interlayers between the conductive film and the transparent conductive film, in addition to the photoelectric conversion film.

21. The photoelectric conversion element according to claim 1, wherein the photoelectric conversion film further contains a n-type semiconductor material.

22. The photoelectric conversion element according to claim 21, wherein the n-type semiconductor material includes fullerenes selected from the group consisting of a fullerene and a derivative thereof.

23. An imaging element comprising the photoelectric conversion element according to claim 1.

24. An optical sensor comprising the photoelectric conversion element according to claim 1.

25. A compound represented by Formula (1),

A-D-A (1)

in Formula (1), D is a group represented by any of Formula (1-1) to Formula (1-9) and Formula (1-11) to Formula (1-15), A is a group represented by any of Formula (3-1) to Formula (3-14), in a case where D is a group represented by Formula (1-6), A is a group represented by any one of formula (3-1) to Formula (3-9) and formula (3-11) to Formula (3-14), where, two A's present in Formula (1) are each a group having the same structure, (1-1)

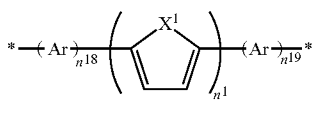

(1-2)

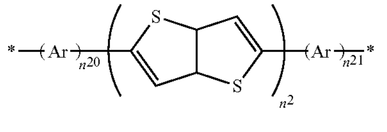

(1-3)

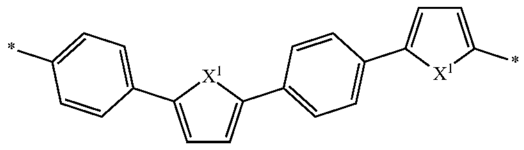

-continued (1-4)

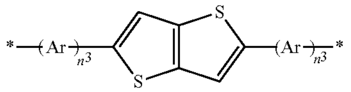

(1-5)

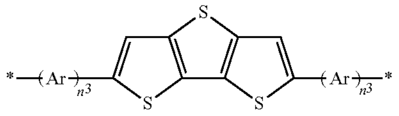

(1-6)

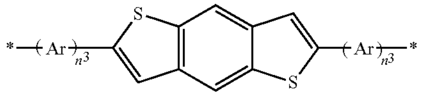

(1-7)

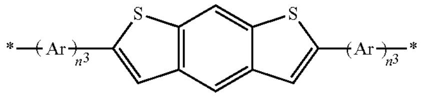

(1-8)

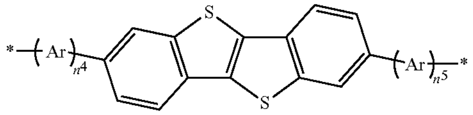

(1-9)

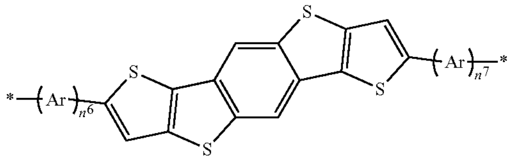

(1-11)

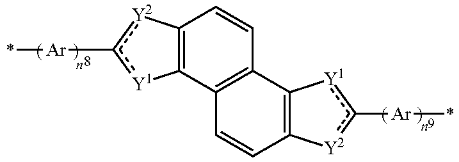

(1-12)

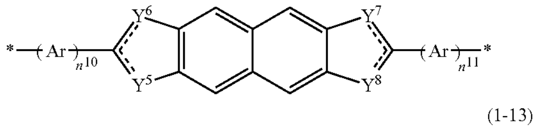

(1-13)

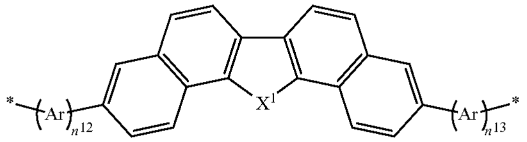

(1-14)

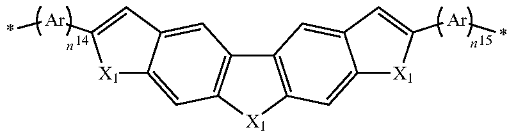

(1-15)

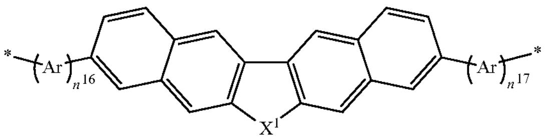

in Formula (1-1) to Formula (1-15), * represents a bonding position, $X^1$ represents a sulfur atom, an oxygen atom, a selenium atom, or a tellurium atom, one of $Y^1$ and $Y^2$ represents a sulfur atom, an oxygen atom, a selenium atom, or a tellurium atom, and another one represents —CH═, one of $Y^3$ and $Y^4$ represents a sulfur atom, an oxygen atom, a selenium atom, or a tellurium atom, and another one represents —CH═, one of $Y^5$ and $Y^6$ represents a sulfur atom, an oxygen atom, a selenium atom, or a tellurium atom, and another one represents —CH═, one of $Y^7$ and $Y^8$ represents a sulfur atom, an oxygen atom, a selenium atom, or a tellurium atom, and another one represents —CH═, $n^1$ represents an integer of 3 to 5, $n^2$ represents an integer of 3 to 5, $n^3$ represents an integer of 0 to 2, where, at least one of two $n^3$'s present in each of Formula (1-4) to Formula (1-7) represents an integer of 1 or 2, $n^4$ to $n^{21}$ each independently represent an integer of 0 to 2, Ar in Formula (1-1) and Formula (1-2) is a group represented by Formula (2-3), Ar in Formula (1-4) is a group represented by any of Formula (2-1) to Formula (2-3), Ar in Formula (1-5) to Formula (1-9) and Formula (1-11) to Formula (1-15) is a group represented by any of Formula (2-1) to Formula (2-4), (2-1)

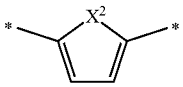

(2-2)

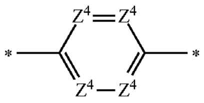

(2-3)

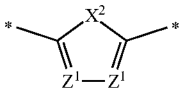

(2-4)

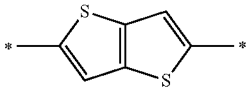

in Formula (2-1) to Formula (2-4), * represents a bonding position, $X^2$ represents a sulfur atom, an oxygen atom, a selenium atom, or a tellurium atom, $Z^1$ represents —CH═ or —N═, where, at least one of two $Z^1$'s in Formula (2-3) is —N═, $Z^4$ represents —CH═ or —N═, one or more of —CH═ included in a ring structure in a group represented by D in Formula (1) may be substituted with —$CR^3$═, $R^3$ represents a halogen atom, (3-1)

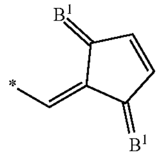

(3-2)

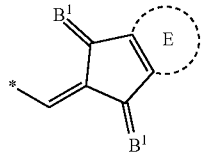

(3-3)

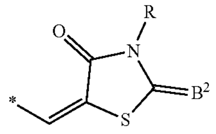

(3-4)

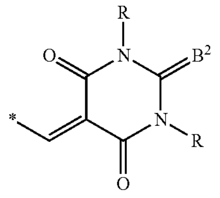

(3-5)

*—ArL—CN (3-6)

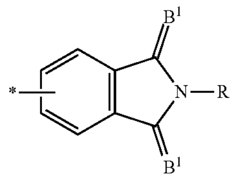

(3-7)

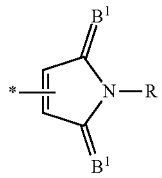

(3-8)

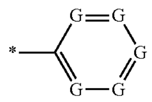

(3-9)

*—ArL—$(CF_3)_{m1}$ (3-10)

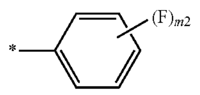

(3-11)

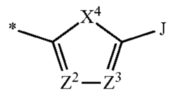

(3-12)

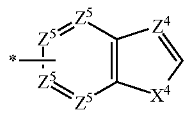

-continued (3-13)

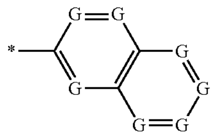

(3-14)

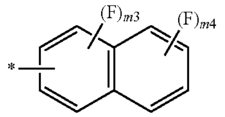

ArL =

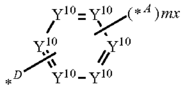

(Ar1)

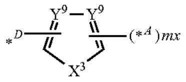

(Ar2)

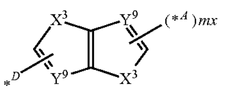

(Ar3)

in Formula (3-1) to Formula (3-14), * represents a bonding position, $B^1$ and $B^2$ each independently represent a sulfur atom, an oxygen atom, $=C(CN)_2$, or $=C(CN)(CO_2R^1)$, $R^1$ represents an alkyl group having 1 or 2 carbon atoms, which may have a halogen atom as a substituent, E represents an aromatic ring, which may have a group selected from the group consisting of a halogen atom, a methyl group, an ethyl group, and a methoxy group, as a substituent, where the methyl group, the ethyl group, and the methoxy group each may further have a halogen atom as a substituent, R represents an alkyl group having 1 or 2 carbon atoms, which may have a halogen atom as a substituent, G represents $—CR^G=$ or —N=, $R^G$ represents a hydrogen atom, a halogen atom, or a cyano group, where, at least one of five G's in Formula (3-8) is —N=, and at least one of seven G's in Formula (3-13) is —N=, m1 represents an integer of 1 to 5, m2 represents an integer of 1 to 5, m3 represents an integer of 0 to 3, m4 represents an integer of 0 to 4, where, in Formula (3-14), m3+m4 is 1 or more, one or more of —CH= included in a ring structure in a group represented by Formula (3-10) and Formula (3-14) may be substituted with $—CR^4=$, $R^4$ represents a halogen atom other than a fluorine atom, $X^4$ represents a sulfur atom, an oxygen atom, a selenium atom, or a tellurium atom, $Z^2$ to $Z^5$ each independently represent $—CR^Z=$ or —N=, $R^2$ represents a hydrogen atom or a halogen atom, where, at least one of $Z^2$ and $Z^3$ in Formula (3-11) is —N=, one of four $Z^5$'s in Formula (3-12) is a substituent including a carbon atom, J represents a hydrogen atom, a halogen atom, an aryl group, a heteroaryl group, or an alkyl group having 1 or 2 carbon atoms, which may have a halogen atom as a substituent, the aryl group and the heteroaryl group that are represented by J may have one or both of a halogen atom and an alkyl group having 1 or 2 carbon atoms, which has a halogen atom as a further substituent, J and $Z^3$ may be bonded to each other to form an aromatic ring, which may have a halogen atom as a substituent, in a case where J and $Z^3$ are bonded to each other to form the aromatic ring, both $Z^2$ and $Z^3$ may be other than —N═, ArL is a group represented by any of Formula (Ar1) to Formula (Ar3), in Formula (Ar1) to Formula (Ar3), $*^D$ represents a bonding position with respect to a group represented by D, and $*^A$ represents a bonding position with respect to a group other than the group represented by D, mx is 1 in a group represented by any of Formula (Ar1) to Formula (Ar3) as ArL in Formula (3-5), and is the same value as m1 in a group represented by any of Formula (Ar1) to Formula (Ar3) as ArL in Formula (3-9), $X^3$ represents a sulfur atom, an oxygen atom, a selenium atom, or a tellurium atom, $Y^9$ represents —CH═, —$CR^2$═, or —N═, $R^2$ represents a halogen atom or an alkyl group having 1 or 2 carbon atoms, which may have a halogen atom as a substituent, $Y^{10}$ represents —CH═ or —$CR^3$═, $R^3$ represents a halogen atom, in a case where A is a group represented by Formula (3-5) and D is a group represented by Formula (1-8) in which $n^4$ and $n^5$ are each independently an integer of 1 or 2 and all Ar's are a group represented by Formula (2-1), ArL in Formula (3-5) is a group represented by Formula (Ar1) or Formula (Ar3), in a case where A is a group represented by Formula (3-8), D is a group represented by Formula (1-1) to Formula (1-7), a group represented by Formula (1-8) in which $n^4$ and $n^5$ are each independently an integer of 1 or 2 and Ar is a group represented by Formula (2-3), a group represented by Formula (1-9), a group represented by formula (1-11) in which $n^8$ and $n^9$ are each independently an integer of 1 or 2 and Ar is a group represented by Formula (2-3), a group represented by Formula (1-12) or Formula (1-13), a group represented by Formula (1-14) in which $n^{14}$ and $n^{15}$ are each independently an integer of 1 or 2, or a group represented by Formula (1-15), in a case where A is a group represented by Formula (3-9), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2, a group represented by Formula (1-6) in which $n^3$ is an integer of 1 or 2, a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-10), a group represented by Formula (1-11) in which $n^8$ and $n^9$ are each independently an integer of 1 or 2, a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, in a case where A is a group represented by Formula (3-10), D is a group represented by Formula (1-1) in which $n^{18}$ and $n^{19}$ are each independently an integer of 1 or 2, a group represented by Formula (1-2), a group represented by Formula (1-4) in which $n^3$ is an integer of 1 or 2 and Ar that is directly bonded to A is a group represented by Formula (2-3), a group represented by Formula (1-5) in which $n^3$ is an integer of 1 or 2 and Ar is a group represented by Formula (2-3), a group represented by Formula (1-6) in which $n^3$ is an integer of 1 or 2 and Ar is a group represented by Formula (2-3) or Formula (2-4), a group represented by Formula (1-7) in which $n^3$ is an integer of 1 or 2, a group represented by Formula (1-8) in which $n^4$ and $n^5$ are each independently an integer of 1 or 2 and Ar is a group represented by Formula (2-3), a group represented by Formula (1-9) in which $n^6$ and $n^7$ are each independently an integer of 1 or 2, a group represented by Formula (1-11) in which $n^8$ and $n^9$ are each independently an integer of 1 or 2 and Ar is a group represented by Formula (2-3), a group represented by Formula (1-12) in which $n^{10}$ and $n^{11}$ are each independently an integer of 1 or 2, a group represented by Formula (1-13) in which $n^{12}$ and $n^{13}$ are each independently an integer of 1 or 2, a group represented by Formula (1-14) in which $n^{14}$ and $n^{15}$ are each independently an integer of 1 or 2, or a group represented by Formula (1-15) in which $n^{16}$ and $n^{17}$ are each independently an integer of 1 or 2, In a case where A is a group represented by Formula (3-11) and D is a group represented by Formula (1-8), J and $Z^3$ in Formula (3-11) may not be bonded to each other to form an aromatic ring, in a case where A is a group represented by Formula (3-11) and D is a group represented by Formula (1-11) in which $n^8$ and $n^9$ both are 0, J and $Z^3$ in Formula (3-11) may not be bonded to each other to form an aromatic ring, in a case where A is a group represented by Formula (3-11), and D is a group represented by Formula (1-12) in which $n^{10}$ and $n^{11}$ both are 1 and all Ar's are a group represented by Formula (2-2), J and $Z^3$ in Formula (3-11) may not be bonded to each other to form an aromatic ring, in a case where A is a group represented by Formula (3-12), D is a group represented by Formula (1-1) to Formula (1-7), a group represented by Formula (1-8) in which $n^4$ and $n^5$ are each independently an integer of 1 or 2, a group represented by Formula (1-9), a group represented by formula (1-11) in which $n^8$ and $n^9$ are each independently an integer of 1 or 2 and Ar is a group represented by Formula (2-3) or Formula (2-4), or a group represented by Formula (1-12) to Formula (1-15), when A is a group represented by Formula (3-12) and D is a group represented by Formula (1-12), a case that $n^{10}$ and $n^{11}$ both are 1, and all Ar's are a group represented by Formula (2-2) is excluded, and in a case where A is a group represented by Formula (3-13), D is a group represented by Formula (1-1) to Formula (1-7), a group represented by Formula (1-8) in which $n^4$ and $n^5$ are each independently an integer of 1 or 2 and Ar is a group represented by Formula (2-3) or Formula (2-4), a group represented by Formula (1-9), a group represented by formula (1-11) in which $n^8$ and $n^9$ are each independently an integer of 1 or 2 and Ar is a group represented by Formula (2-1), Formula (2-3) or Formula (2-4), or a group represented by Formula (1-12) to Formula (1-15).

26. The compound according to claim 25, wherein the D is a group represented by any of Formula (1-5) to Formula (1-7), Formula (1-9), and Formula (1-12) to Formula (1-15).

27. The compound according to claim 25, wherein the D is a group represented by any of Formula (1-9) and Formula (1-12) to Formula (1-15).

28. The compound according to claim 25, wherein the D is a group represented by any of Formula (1-9), Formula (1-12), Formula (1-13), and Formula (1-15).

29. The compound according to claim 25, wherein the D is a group represented by any of Formula (1-12), Formula (1-13), and Formula (1-15).

30. The compound according to claim 25, wherein the D is a group represented by Formula (1-12).

31. The compound according to claim 25, wherein the A is a group represented by any of Formula (3-1) to Formula (3-3), and Formula (3-5) to Formula (3-14).

32. The compound according to claim 25, wherein the A is a group represented by any of Formula (3-5) and Formula (3-8) to Formula (3-14).

33. The compound according to claim 25, wherein the A is a group represented by any of Formula (3-8) and Formula (3-10) to Formula (3-14).

34. The compound according to claim 25, wherein the A is a group represented by any of Formula (3-10) to Formula (3-12), and Formula (3-14).

35. The compound according to claim 25, wherein the A is a group represented by any of Formula (3-11) and Formula (3-12).

36. The compound according to claim 25, wherein the A is a group represented by Formula (3-11).

37. The compound according to claim 25, wherein the compound represented by Formula (1) has a molecular weight of 400 to 900.

38. A compound represented by Formula (1A), (1A)

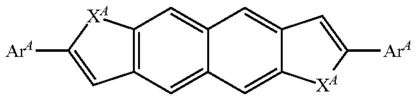

in Formula (1A), $X^A$ represents a sulfur atom or an oxygen atom, $Ar^A$ represents a group represented by any of Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), where, two $X^A$'s present in Formula (1A) are each a group having the same structure, and two $Ar^A$'s present in Formula (1A) are each a group having the same structure, (4-1)

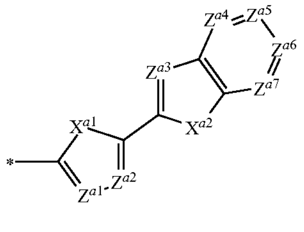

-continued (4-2)

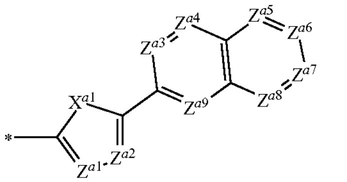

(4-3)

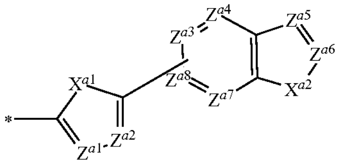

(4-4)

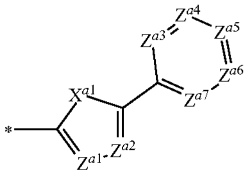

(4-5)

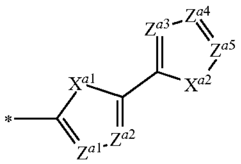

(4-6)

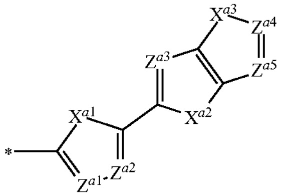

(4-7)

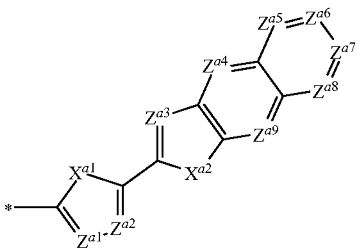

(4-8)

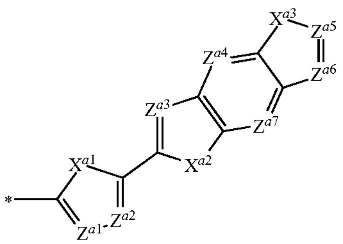

(5-1)

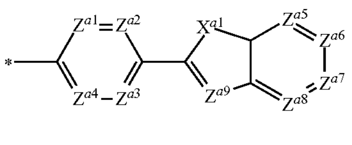

-continued
(5-2)
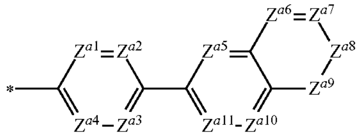
(5-3)
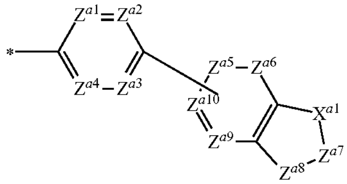
(5-4)
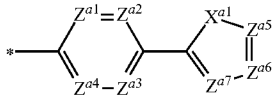
(5-5)
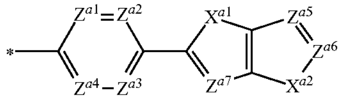
(5-6)
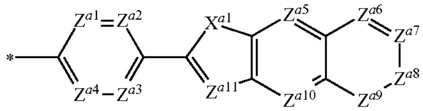
(5-7)
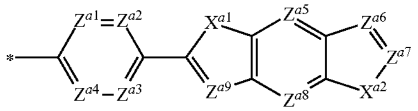
(6-1)
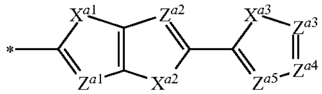
(6-2)
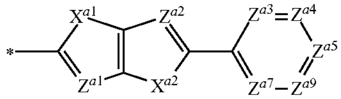
(7-1)
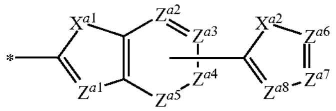
(7-2)
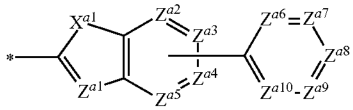
(8-1)
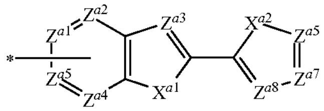
(8-2)
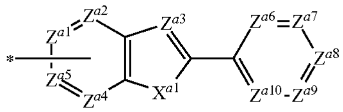
-continued
(9-1)
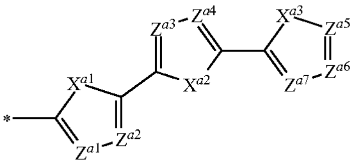
(9-2)
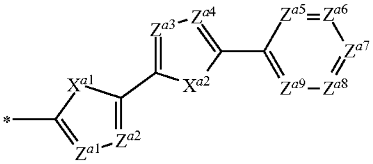
(9-3)
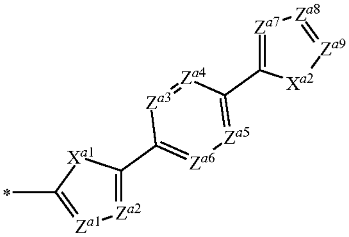
(9-4)
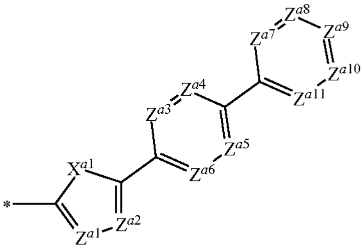
(9-5)
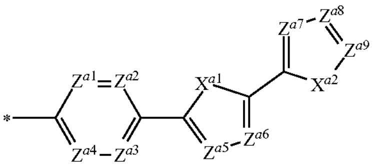
(9-6)
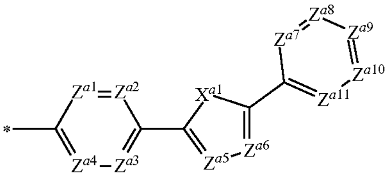
(9-7)
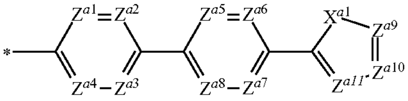
(9-8)
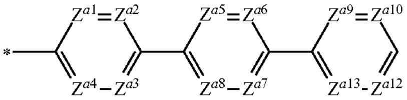
(10-1)
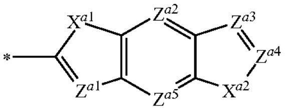

-continued

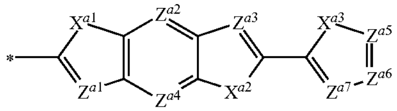

(10-2)

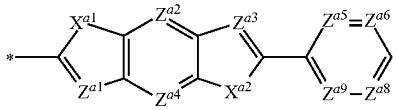

(10-3)

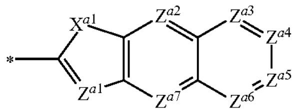

(11-1)

in Formula (4-1) to Formula (4-8), Formula (5-1) to Formula (5-7), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1), * represents a bonding position, $X^{a1}$ to $X^{a3}$ each independently represent a sulfur atom or an oxygen atom, $Z^{a1}$ to $Z^{a13}$ each independently represent —CH═, —CF═, or —N═, in Formula (4-1), at least one of $Z^{a1}$ to $Z^{a7}$ is —CF═ or —N═, in Formula (4-2), at least one of $Z^{a1}$ to $Z^{a9}$ is —CF═ or —N═, in Formula (4-3), at least one of $Z^{a1}$ to $Z^{a8}$ is —CF═ or —N═, in Formula (4-4), at least one of $Z^{a1}$ to $Z^{a7}$ is —CF═ or —N═, in Formula (4-5), at least one of $Z^{a1}$ to $Z^{a5}$ is —CF═ or —N═, in Formula (4-6), at least one of $Z^{a1}$ to $Z^{a5}$ is —CF═ or —N═, in Formula (4-7), at least one of $Z^{a1}$ to $Z^{a9}$ is —CF═ or —N═, in Formula (4-8), at least one of $Z^{a1}$ to $Z^{a7}$ is —CF═ or —N═, in Formula (5-1), at least one of $Z^{a1}$ to $Z^{a9}$ is —CF═ or —N═, in Formula (5-2), at least one of $Z^{a1}$ to $Z^{a11}$ is —CF═ or —N═, in Formula (5-3), at least one of $Z^{a1}$ to $Z^{a10}$ is —CF═ or —N═, in Formula (5-4), at least one of $Z^{a1}$ to $Z^{a7}$ is —CF═ or —N═, in Formula (5-5), at least one of $Z^{a1}$ to $Z^{a7}$ is —CF═ or —N═, in Formula (5-6), at least one of $Z^{a1}$ to $Z^{a11}$ is —CF═ or —N═, in Formula (5-7), at least one of $Z^{a1}$ to $Z^{a9}$ is —CF═ or —N═, in Formula (6-1), at least one of $Z^{a1}$ to $Z^{a5}$ is —CF═ or —N═, in Formula (6-2), at least one of $Z^{a1}$ to $Z^{a7}$ is —CF═ or —N═, in Formula (7-1), at least one of $Z^{a1}$ to $Z^{a8}$ is —CF═ or —N═, in Formula (7-2), at least one of $Z^{a1}$ to $Z^{a10}$ is —CF═ or —N═, in Formula (8-1), at least one of $Z^{a1}$ to $Z^{a8}$ is —CF═ or —N═, in Formula (8-2), at least one of $Z^{a1}$ to $Z^{a10}$ is —CF═ or —N═, in Formula (9-1), at least one of $Z^{a1}$ to $Z^{a7}$ is —CF═ or —N═, in Formula (9-2), at least one of $Z^{a1}$ to $Z^{a9}$ is —CF═ or —N═, in Formula (9-3), at least one of $Z^{a1}$ to $Z^{a9}$ is —CF═ or —N═, in Formula (9-4), at least one of $Z^{a1}$ to $Z^{a11}$ is —CF═ or —N═, in Formula (9-5), at least one of $Z^{a1}$ to $Z^{a9}$ is —CF═ or —N═, in Formula (9-6), at least one of $Z^{a1}$ to $Z^{a11}$ is —CF═ or —N═, in Formula (9-7), at least one of $Z^{a1}$ to $Z^{a11}$ is —CF═ or —N═, in Formula (9-8), at least one of $Z^{a1}$ to $Z^{a13}$ is —CF═ or —N═, in Formula (10-1), at least one of $Z^{a1}$ to $Z^{a5}$ is —CF═ or —N═, in Formula (10-2), at least one of $Z^{a1}$ to $Z^{a7}$ is —CF═ or —N═, in Formula (10-3), at least one of $Z^{a1}$ to $Z^{a9}$ is —CF═ or —N═, in Formula (11-1), at least one of $Z^{a1}$ to $Z^{a7}$ is —CF═ or —N═.

39. The compound according to claim 38, wherein the $Ar^4$ is a group represented by any of Formula (4-1) to Formula (4-8), Formula (6-1) and Formula (6-2), Formula (7-1) and Formula (7-2), Formula (8-1) and Formula (8-2), Formula (9-1) to Formula (9-8), Formula (10-1) to Formula (10-3), and Formula (11-1).

40. The compound according to claim 38, wherein the $Ar^4$ is a group represented by any of Formula (4-1) to Formula (4-8), Formula (6-1) and Formula (6-2), and Formula (9-1) to Formula (9-8).

41. The compound according to claim 38, wherein the compound represented by Formula (1A) has a molecular weight of 400 to 900.

* * * * *